United States Patent
Rathi et al.

(10) Patent No.: US 12,029,043 B1
(45) Date of Patent: Jul. 2, 2024

(54) PLANAR AND TRENCH CAPACITORS WITH HYDROGEN BARRIER DIELECTRIC FOR LOGIC AND MEMORY APPLICATIONS AND METHODS OF FABRICATION

(71) Applicant: Kepler Computing Inc., San Francisco, CA (US)

(72) Inventors: Somilkumar J. Rathi, San Jose, CA (US); Noriyuki Sato, Hillsboro, OR (US); Niloy Mukherjee, San Ramon, CA (US); Rajeev Kumar Dokania, Beaverton, OR (US); Amrita Mathuriya, Portland, OR (US); Tanay Gosavi, Portland, OR (US); Pratyush Pandey, Kensington, CA (US); Jason Y. Wu, Albany, CA (US); Sasikanth Manipatruni, Portland, OR (US)

(73) Assignee: KEPLER COMPUTING INC., San Francisco, CA (US)

( * ) Notice: Subject to any disclaimer, the term of this patent is extended or adjusted under 35 U.S.C. 154(b) by 34 days.

(21) Appl. No.: 17/552,330

(22) Filed: Dec. 15, 2021

Related U.S. Application Data

(63) Continuation of application No. 17/550,899, filed on Dec. 14, 2021.

(51) Int. Cl.
H10B 53/30 (2023.01)

(52) U.S. Cl.
CPC .................................. *H10B 53/30* (2023.02)

(58) Field of Classification Search
CPC ............... H01L 28/91; H01L 21/3212; H01L 21/76843; H01L 28/92; H10B 53/30; G11C 11/2221
See application file for complete search history.

(56) References Cited

U.S. PATENT DOCUMENTS

| | | |
|---|---|---|
| 5,739,563 A | 4/1998 | Kawakubo et al. |
| 6,165,864 A | 12/2000 | Shen et al. |
| (Continued) | | |

FOREIGN PATENT DOCUMENTS

| | | |
|---|---|---|
| DE | 102015015854 A1 | 6/2017 |
| JP | 2006352005 A | 12/2006 |
| (Continued) | | |

OTHER PUBLICATIONS

Coll et al., "Nanocrystalline Ferroelectric BiFeO3 Thin Films by Low-Temperature Atomic Layer Deposition," Chem. Mater. 2015, 27, 18, 6322-6328Publication Date: Aug. 20, 2015. https://doi.org/10.1021/acs.chemmater.5b02093.
(Continued)

*Primary Examiner* — Thanhha S Pham
(74) *Attorney, Agent, or Firm* — MUGHAL GAUDRY & FRANKLIN PC

(57) ABSTRACT

A device includes, in a first region, a first conductive interconnect, an electrode structure on the first conductive interconnect, where the electrode structure includes a first conductive hydrogen barrier layer and a first conductive fill material. A trench capacitor including a ferroelectric material or a paraelectric material is on the electrode structure. A second dielectric includes an amorphous, greater than 90% film density hydrogen barrier material laterally surrounds the memory device. A via electrode including a second conductive hydrogen barrier material is on at least a portion of the memory device. A second region includes a conductive interconnect structure embedded within a less than 90% film density dielectric material.

19 Claims, 55 Drawing Sheets

(56) References Cited

U.S. PATENT DOCUMENTS

| | | | |
|---|---|---|---|
| 6,177,351 | B1 | 1/2001 | Beratan et al. |
| 6,211,035 | B1 | 4/2001 | Moise et al. |
| 6,365,927 | B1 | 4/2002 | Cuchiaro et al. |
| 6,368,910 | B1 | 4/2002 | Sheu et al. |
| 6,548,343 | B1 | 4/2003 | Summerfelt et al. |
| 6,613,586 | B2 | 9/2003 | Bailey |
| 6,699,725 | B2 | 3/2004 | Lee |
| 6,753,193 | B2 | 6/2004 | Kim |
| 7,075,134 | B2 | 7/2006 | Araujo et al. |
| 7,754,501 | B2 | 7/2010 | Urushido |
| 7,977,720 | B2 | 7/2011 | Fukada |
| 8,440,508 | B2 | 5/2013 | Udayakumar et al. |
| 8,916,872 | B1 | 12/2014 | Tran et al. |
| 9,847,338 | B2 | 12/2017 | Nakao |
| 9,875,784 | B1 | 1/2018 | Li et al. |
| 10,847,201 | B2 | 11/2020 | Manipatruni et al. |
| 11,043,472 | B1 | 6/2021 | Dokania et al. |
| 11,063,131 | B2 | 7/2021 | Haratipour et al. |
| 11,139,270 | B2 | 10/2021 | Manipatruni et al. |
| 11,164,976 | B2 | 11/2021 | Ramamoorthy et al. |
| 11,659,714 | B1 | 5/2023 | Mukherjee et al. |
| 2001/0013614 | A1 | 8/2001 | Joshi et al. |
| 2002/0045279 | A1 | 4/2002 | Kwon et al. |
| 2002/0098645 | A1 | 7/2002 | Jung et al. |
| 2003/0030084 | A1 | 2/2003 | Moise et al. |
| 2005/0020054 | A1 | 1/2005 | Hilliger et al. |
| 2006/0133129 | A1 | 6/2006 | Rodriguez et al. |
| 2007/0045690 | A1 | 3/2007 | Fukada |
| 2008/0057641 | A1 | 3/2008 | Wang |
| 2008/0121959 | A1* | 5/2008 | Izumi ............ H10B 53/00 257/E29.345 |
| 2008/0197502 | A1 | 8/2008 | Kikuchi et al. |
| 2009/0026514 | A1 | 1/2009 | Wang |
| 2010/0102404 | A1 | 4/2010 | Li et al. |
| 2010/0224961 | A1 | 9/2010 | Summerfelt et al. |
| 2010/0320518 | A1 | 12/2010 | Ozaki |
| 2011/0062550 | A1 | 3/2011 | Udayakumar et al. |
| 2013/0149794 | A1 | 6/2013 | Wang |
| 2013/0264620 | A1 | 10/2013 | Yu et al. |
| 2020/0051833 | A1 | 2/2020 | Chen et al. |
| 2020/0235111 | A1 | 11/2020 | Calderoni et al. |
| 2020/0395460 | A1 | 12/2020 | Haratipour et al. |
| 2021/0202510 | A1 | 7/2021 | Thareja et al. |
| 2021/0202511 | A1 | 7/2021 | Yeong et al. |
| 2021/0202689 | A1 | 7/2021 | Thareja et al. |
| 2021/0233920 | A1 | 7/2021 | Sukekawa |
| 2021/0343731 | A1 | 11/2021 | Chen et al. |
| 2021/0398991 | A1 | 12/2021 | Manfrini et al. |
| 2021/0398992 | A1 | 12/2021 | Wu et al. |
| 2022/0199634 | A1 | 6/2022 | Calderoni et al. |
| 2022/0285376 | A1 | 9/2022 | Chen et al. |
| 2022/0344338 | A1 | 10/2022 | Yang et al. |
| 2022/0376075 | A1 | 11/2022 | Manfrini et al. |
| 2022/0399352 | A1 | 12/2022 | Leng |
| 2023/0187476 | A1 | 6/2023 | Sato et al. |
| 2023/0189532 | A1 | 6/2023 | Müller |

FOREIGN PATENT DOCUMENTS

| | | | |
|---|---|---|---|
| JP | 4428500 | B2 | 3/2010 |
| KR | 100481867 | B1 | 4/2005 |
| KR | 100601953 | B1 | 7/2006 |
| KR | 100791074 | B1 | 1/2008 |
| KR | 100991950 | B1 | 6/2009 |
| WO | 2004076166 | A2 | 9/2004 |

OTHER PUBLICATIONS

Chowdhury et al., "Alumina as a Hydrogen Barrier Layer for FeRAM Devices," 2007 Non-Volatile Memory Technology Symposium, 2007, pp. 49-52, doi: 10.1109/NVMT.2007.4389944.
Mauersberger et al., "Single-Step Reactive Ion Etching Process for Device integration of Hafnium-Zirconium-Oxide (HZO)/Titanium Nitride (TiN) Stacks." 2021 Semicond. Sci. Technol. 36 095025, https://doi.org/10.1088/1361-6641/ac1827 (7 pages).
Walters, "Scaling and Design of Thin Film Ferroelectric Hafnium Oxide for Memory and Logic Devices," Dissertation for PhD Philosophy, University of Florida, 2020 (170 pages).
Yeh et al., "Fabrication and Investigation of Three-Dimensional Ferroelectric Capacitors for the Application of FeRAM," AIP Advances, 6 035128(2016); doi: 10.1063/1.4945405. 13 pages.
Yu et al., "Atomic layer deposited ultrathin metal nitride barrier layers for ruthenium interconnect applications" Journal of Vacuum Science & Technology A 35, 03E109 (2017); https://doi.org/10.1116/1.4979709.
U.S. Appl. No. 17/396,609, filed Aug. 6, 2021, Debraj Guhabiswas.
U.S. Appl. No. 17/449,750, filed Oct. 1, 2021, Noriyuki Sato.
U.S. Appl. No. 17/465,796, filed Sep. 2, 2021, Noriyuki Sato.
"Perovskite memory devices with ultra-fast switching speed," News Release Jun. 22, 2021, Pohang University of Science & Technology (POSTECH), Downloaded on Oct. 19, 2021 from https://www.eurekalert.org/news-releases/603724. (2 pages).
Desu et al., "Reactive ion etching of ferroelectric SrBi2TaxNb2-xO9 thin films," Appl. Phys. Lett. 68, 566 (1996); https://doi.org/10.1063/1.116402. (3 pages).
Final Office Action dated Apr. 6, 2023 for U.S. Appl. No. 17/396,609.
Lee et al., "Plasma-Assisted Dry Etching of Ferroelectric Capacitor Modules and Application to a 32M Ferroelectric Random Access Memory Devices with Submicron Feature Size," Japanese Journal of Applied Physics, vol. 41, No. 11S, 2002. pp. 6749-6753. (5 pages).
Non-Final Office Action dated Apr. 25, 2023 for U.S. Appl. No. 17/478,850.
Non-Final Office Action dated Dec. 8, 2022 for U.S. Appl. No. 17/396,609.
Non-Final Office Action dated Mar. 31, 2023 for U.S. Appl. No. 17/465,792.
Non-Final Office Action dated Mar. 31, 2023 for U.S. Appl. No. 17/478,849.
Restriction Requirement dated Apr. 26, 2023 for U.S. Appl. No. 17/550,899.
Restriction Requirement dated Apr. 26, 2023 for U.S. Appl. No. 17/552,266.
Restriction Requirement dated Apr. 26, 2023 for U.S. Appl. No. 17/552,321.
Restriction Requirement dated Aug. 22, 2022 for U.S. Appl. No. 17/396,609.
Restriction Requirement dated Dec. 30, 2022 for U.S. Appl. No. 17/465,92.
Restriction Requirement dated Jan. 11, 2023 for U.S. Appl. No. 17/478,849.
Restriction Requirement dated May 1, 2023 for U.S. Appl. No. 17/552,345.
Schneider et al., "Dry-etching of barium-strontium-titanate thin films," Proceedings of the 11th IEEE International Symposium on Applications of Ferroelectrics (Cat. No. 98CH36245) (pp. 51-54). IEEE. Aug. 1998. DOI: 10.1109/ISAF.1998.786634. (4 pages).
Shi et al., "Reactive Ion etching of sol-gel-derived BST thin film," Ceramics International vol. 30, Iss. 7, 2004, pp. 1513-1516. (4 pages).
Ueda et al., "Plasma etching of PZT capacitor using ISM plasma source for ferroelectric memory application," Integrated Ferroelectrics, 39:1-4, 23-30, DOI: 10.1080/10584580108011924. (8 pages).
Wang et al., "Ferroelectric Devices and Circuits for Neuro-Inspired Computing," MRS Communications (2020), 10, 538-548, doi: 10.1557/mrc.2020.71, (11 pages).
Final Office Action dated Jul. 19, 2023 for U.S. Appl. No. 17/478,849.
Final Office Action dated Sep. 14, 2023 for U.S. Appl. No. 17/465,792.
Non-Final Office Action dated Aug. 3, 2023 for U.S. Appl. No. 17/552,293.
Non-Final Office Action dated Aug. 3, 2023 for U.S. Appl. No. 17/552,323.
Non-Final Office Action dated Aug. 3, 2023 for U.S. Appl. No. 17/552,345.

(56) References Cited

OTHER PUBLICATIONS

Non-Final Office Action dated Aug. 15, 2023 for U.S. Appl. No. 17/552,269.
Non-Final Office Action dated Jul. 20, 2023 for U.S. Appl. No. 17/50,899.
Non-Final Office Action dated Jul. 20, 2023 for U.S. Appl. No. 17/552,266.
Notice of Allowance dated Aug. 7, 2023 for U.S. Appl. No. 17/,858,50.
Notice of Allowance dated Aug. 7, 2023 for U.S. Appl. No. 17/553,486.
Notice of Allowance dated Aug. 7, 2023 for U.S. Appl. No. 17/553,496.
Notice of Allowance dated Aug. 10, 2023 for U.S. Appl. No. 17/553,475.
Notice of Allowance dated Aug. 11, 2023 for U.S. Appl. No. 17/478,849.
Notice of Allowance dated Jul. 3, 2023 for U.S. Appl. No. 17/550,904.
Notice of Allowance dated Jul. 17, 2023 for U.S. Appl. No. 17/553,480.
Notice of Allowance dated Jul. 19, 2023 for U.S. Appl. No. 17/553,508.
Notice of Allowance dated Jul. 20, 2023 for U.S. Appl. No. 17/553,469.
Notice of Allowance dated Jul. 24, 2023 for U.S. Appl. No. 17/553,472.
Notice of Allowance dated Jul. 26, 2023 for U.S. Appl. No. 17/553,511.
Notice of Allowance dated Jun. 15, 2023 for U.S. Appl. No. 17/396,609.
Office Action dated May 16, 2023 for Taiwan Patent Application No. 111132920.
Restriction Requirement dated Jul. 13, 2023 for U.S. Appl. No. 17/552,269.
Restriction Requirement dated Sep. 14, 2023 for U.S. Appl. No. 17/465,796.
Non-Final Office Action notified Dec. 21, 2023 for U.S. Appl. No. 17/465,792.
Non-Final Office Action notified Jan. 18, 2024 for U.S. Appl. No. 17/502,942.
Non-Final Office Action notified Jan. 19, 2024 for U.S. Appl. No. 17/503,009.
Notice of Allowance notified Dec. 7, 2023 for U.S. Appl. No. 17/552,330.
Notice of Allowance notified Dec. 13, 2023 for U.S. Appl. No. 17/552,321.
Notice of Allowance notified Dec. 28, 2023 for U.S. Appl. No. 17/552,269.
Notice of Allowance notified Dec. 28, 2023 for U.S. Appl. No. 17/552,293.
Notice of Allowance notified Jan. 18, 2024 for U.S. Appl. No. 17/552,323.
Notice of Allowance notified Jan. 24, 2024 for U.S. Appl. No. 17/552,345.
Notice of Allowance notified Nov. 13, 2023 for U.S. Appl. No. 17/465,796.
Notice of Allowance notified Nov. 29, 2023 for U.S. Appl. No. 17/552,266.
First Office Action mailed Nov. 3, 2023 for TW Patent Application No. 111132919 Office Action recalled for typographical errors.
First Office Action mailed Nov. 14, 2023 for TW Patent Application No. 111132919 Office Action issued on Nov. 3, 2023 recalled for typographical errors.
Office Action—Written Primary Examination Decision—notified Jan. 10, 2024 for Taiwan Patent Application No. 111132920.

\* cited by examiner

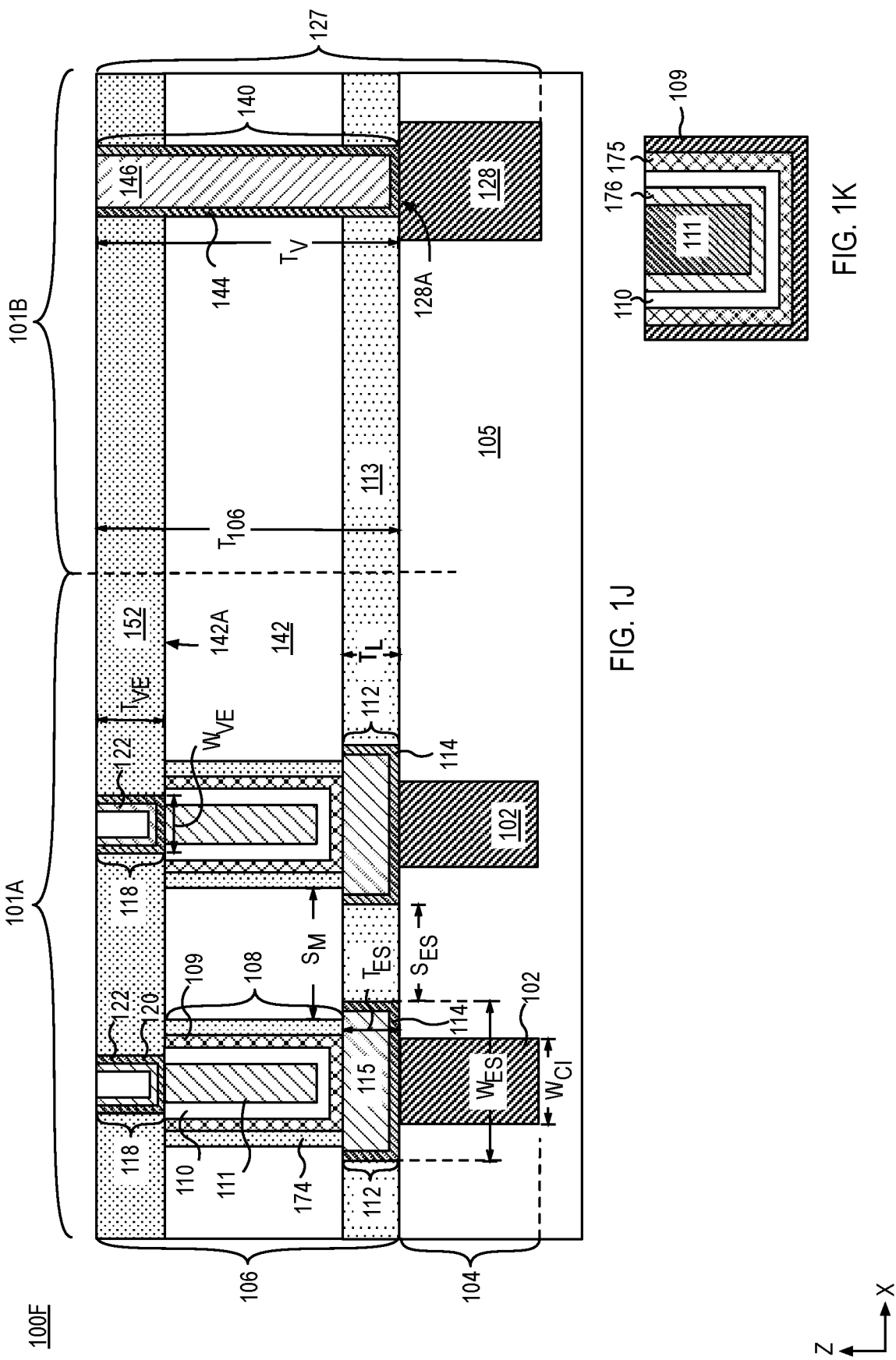

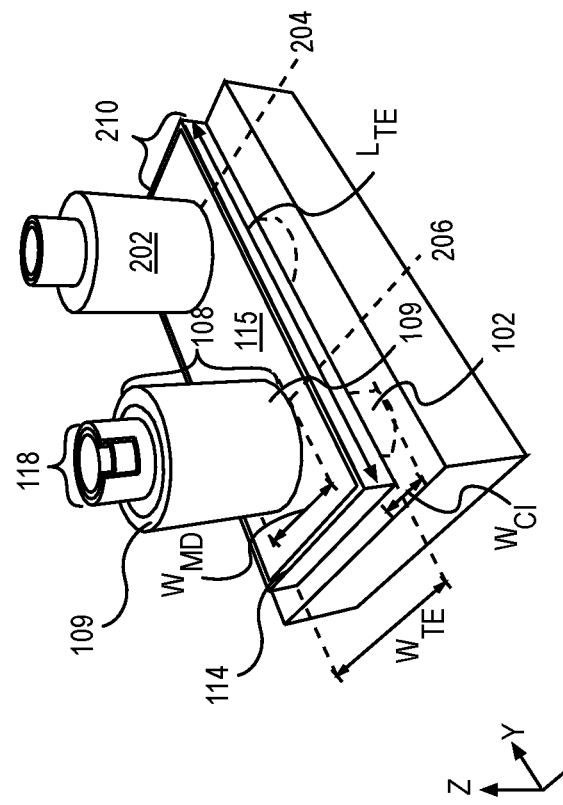
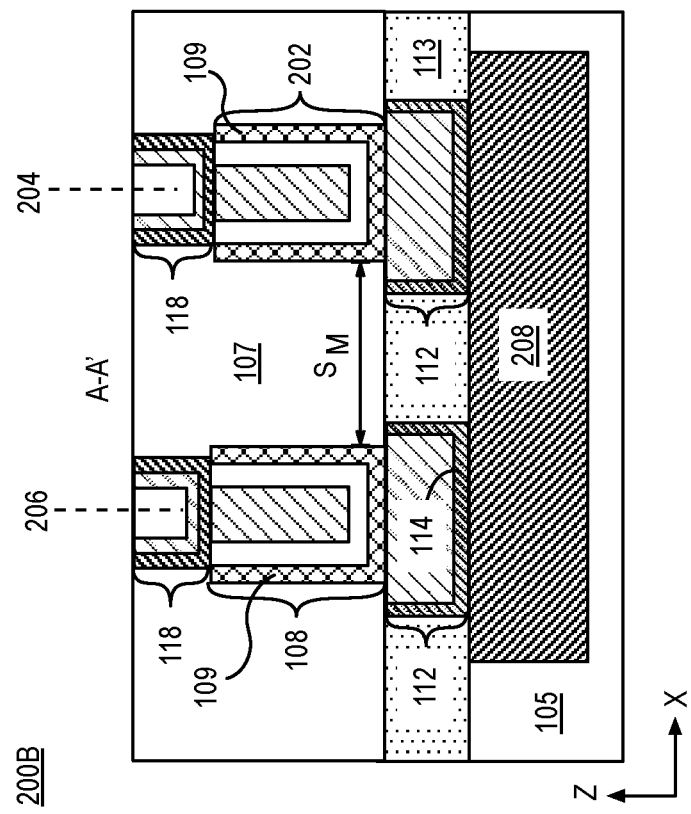
FIG. 2C
FIG. 2B

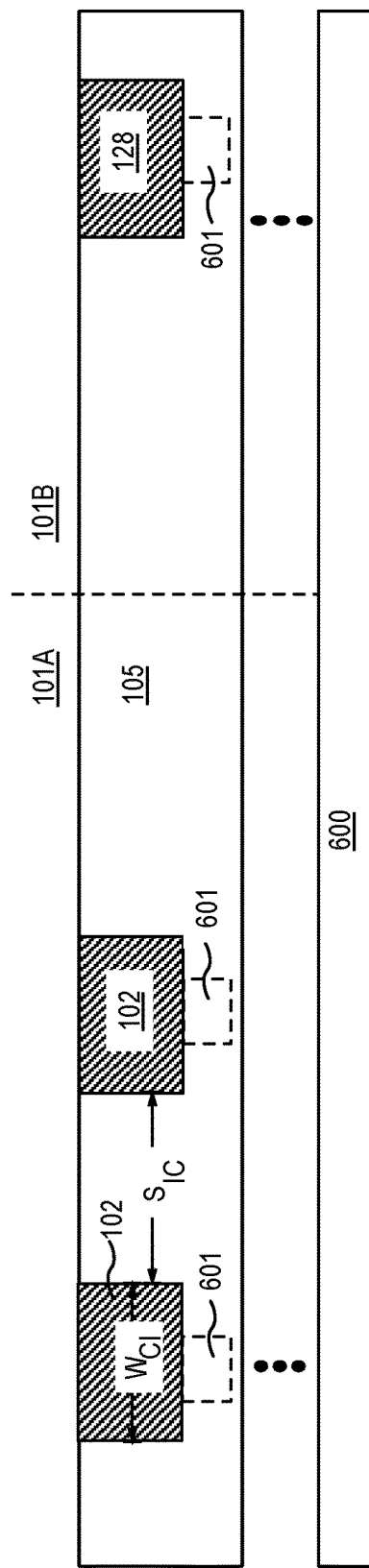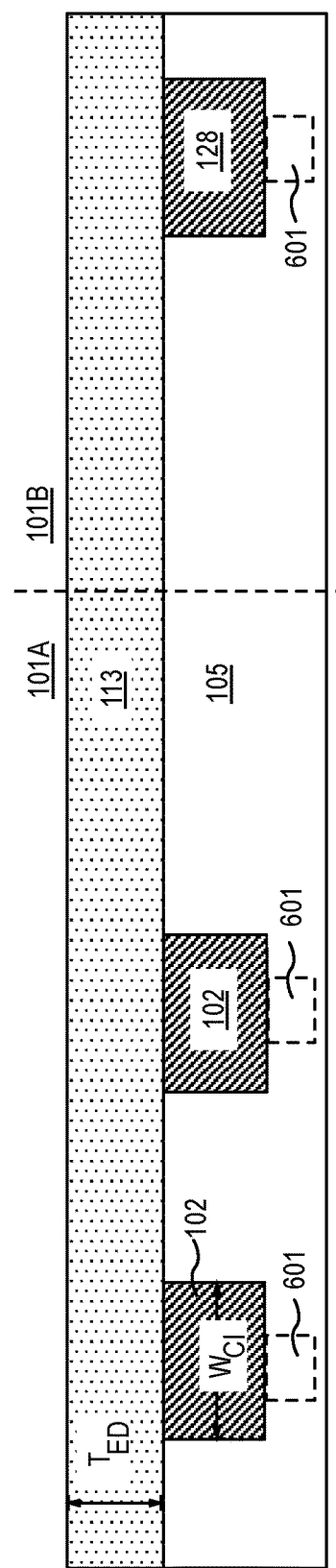
FIG. 6A
FIG. 6B

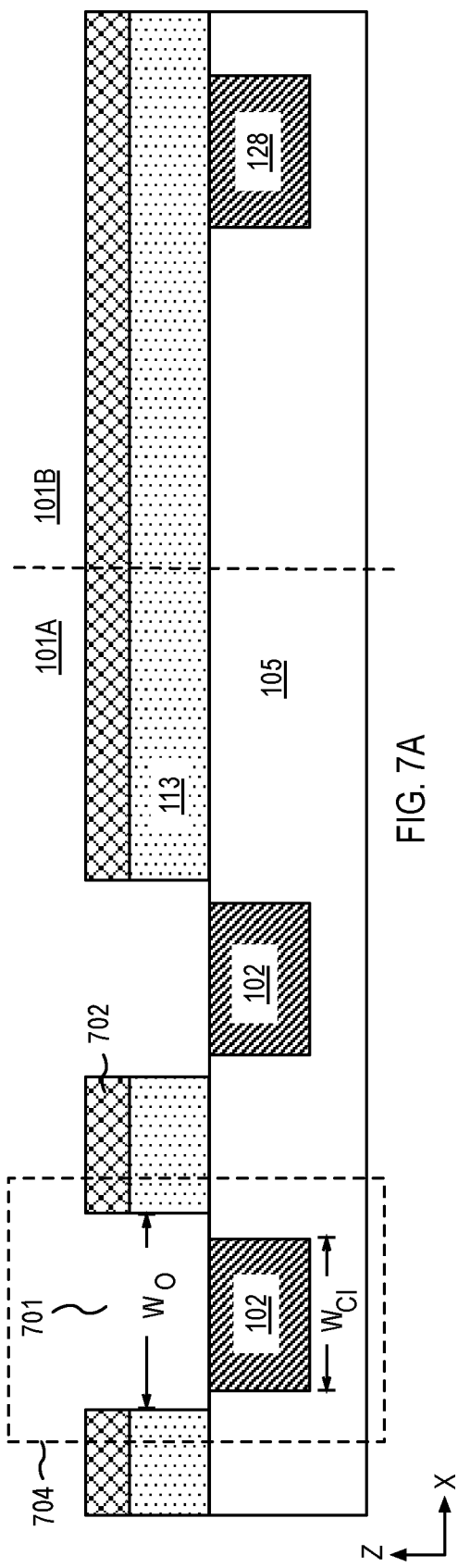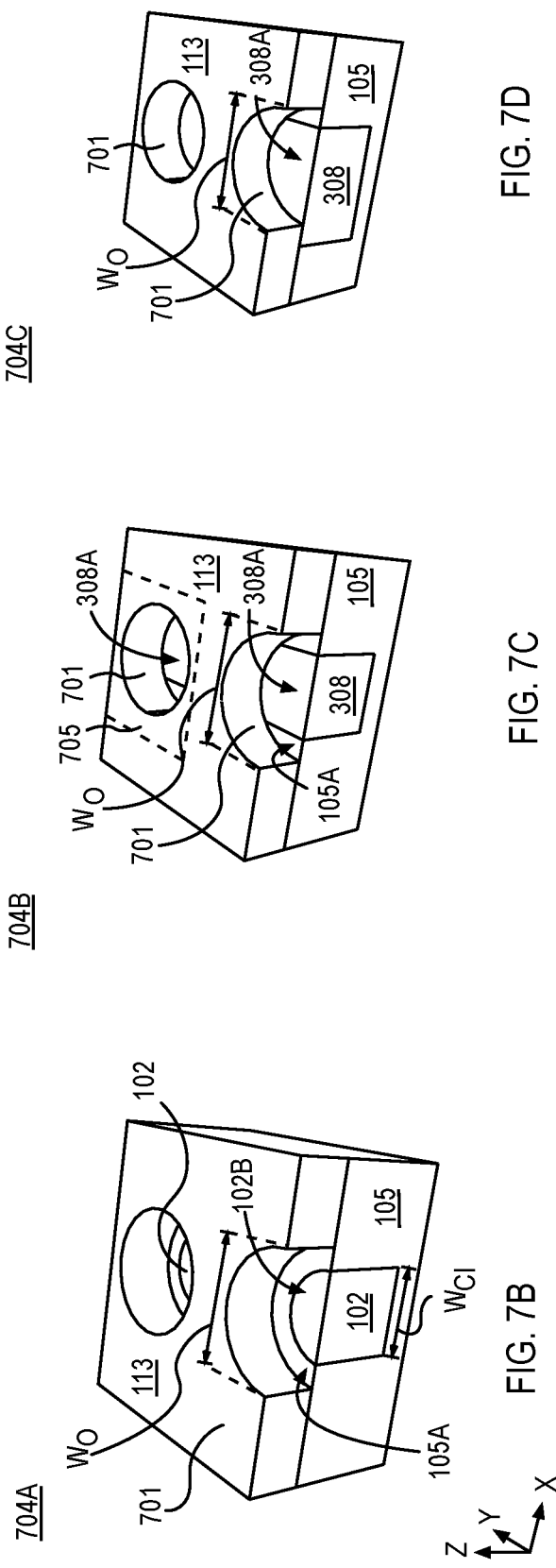

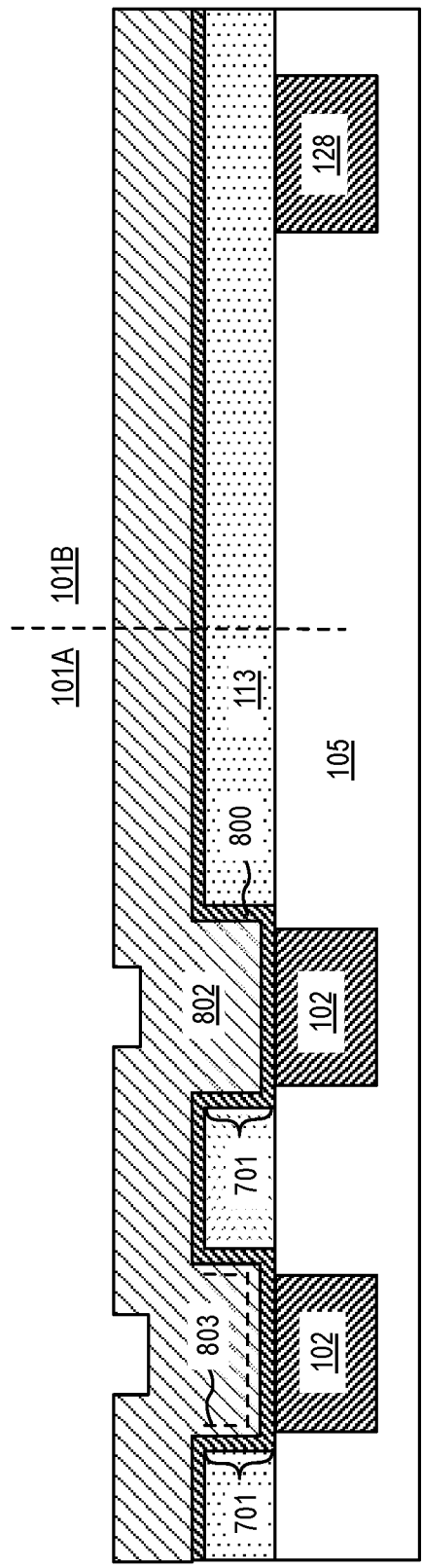
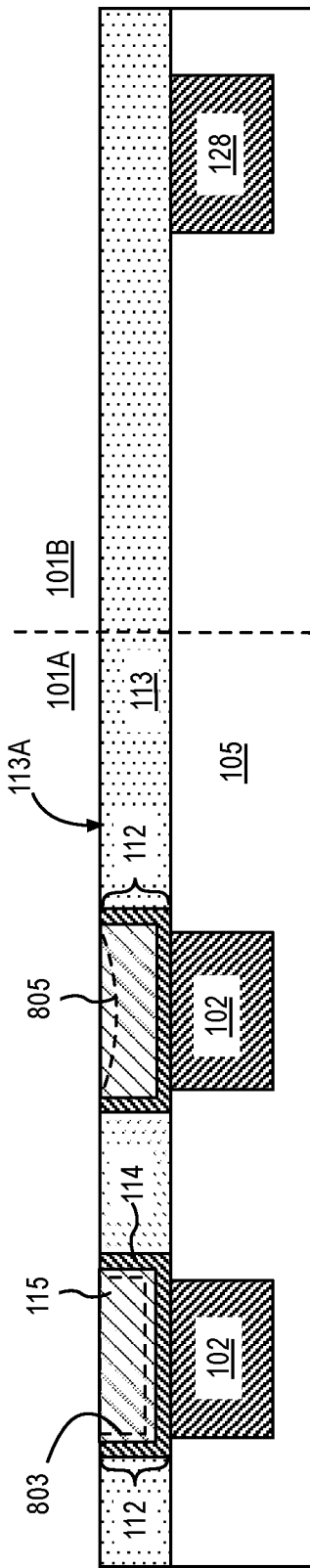
FIG. 8A
FIG. 8B

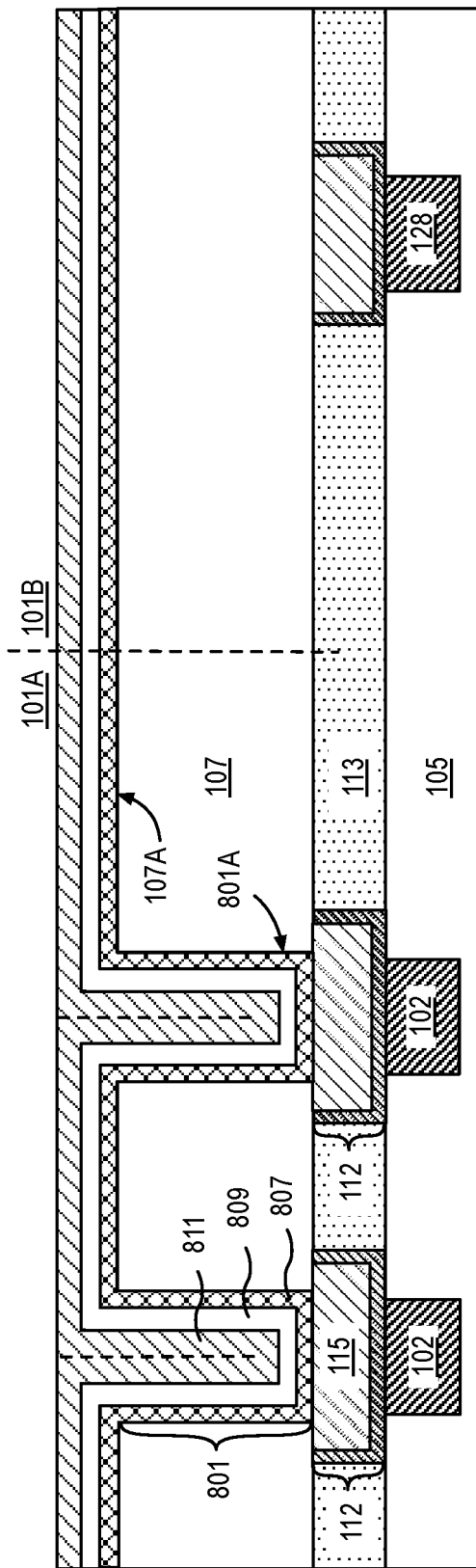
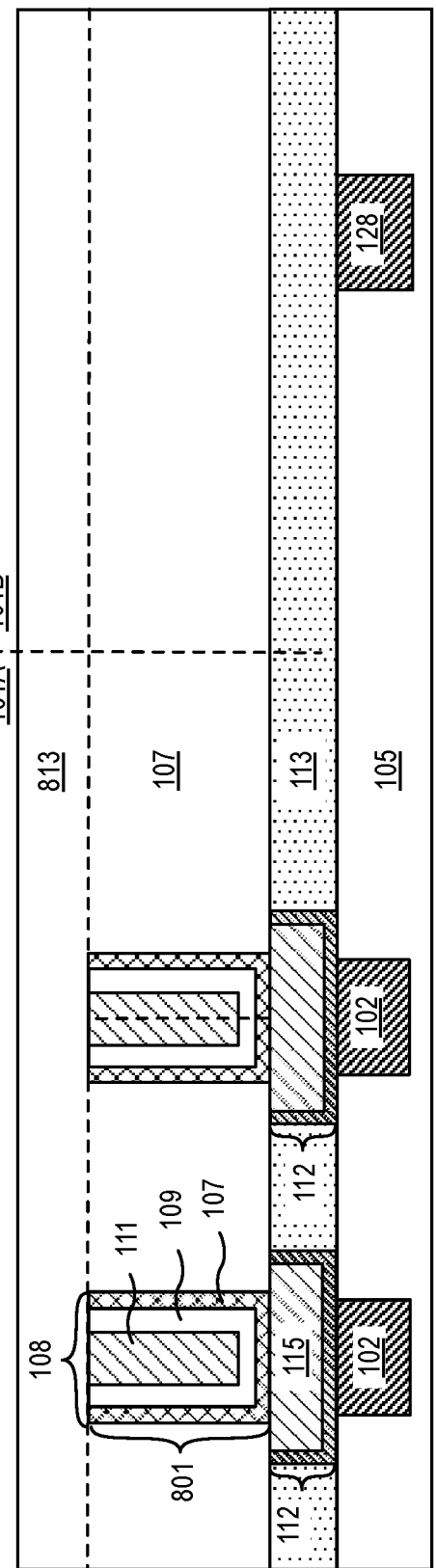
FIG. 8E
FIG. 8F

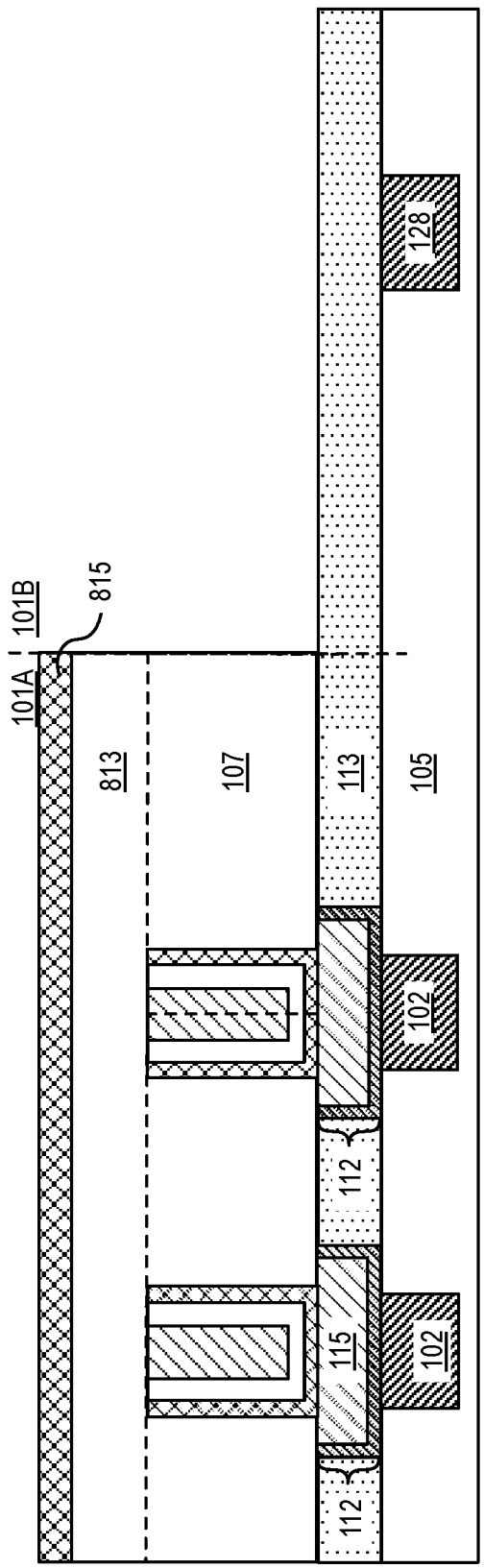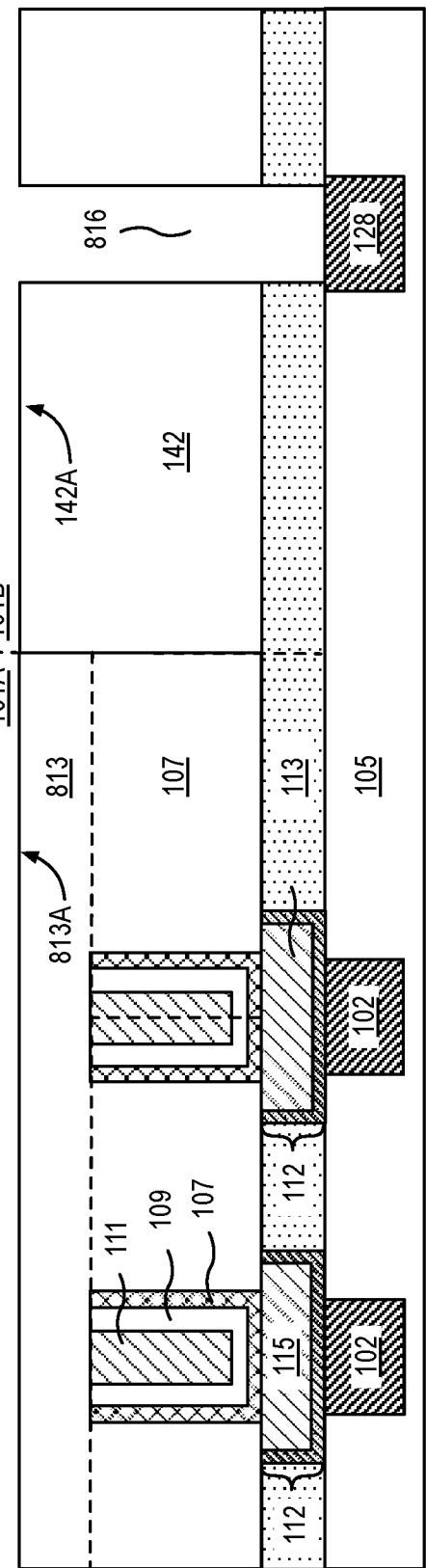

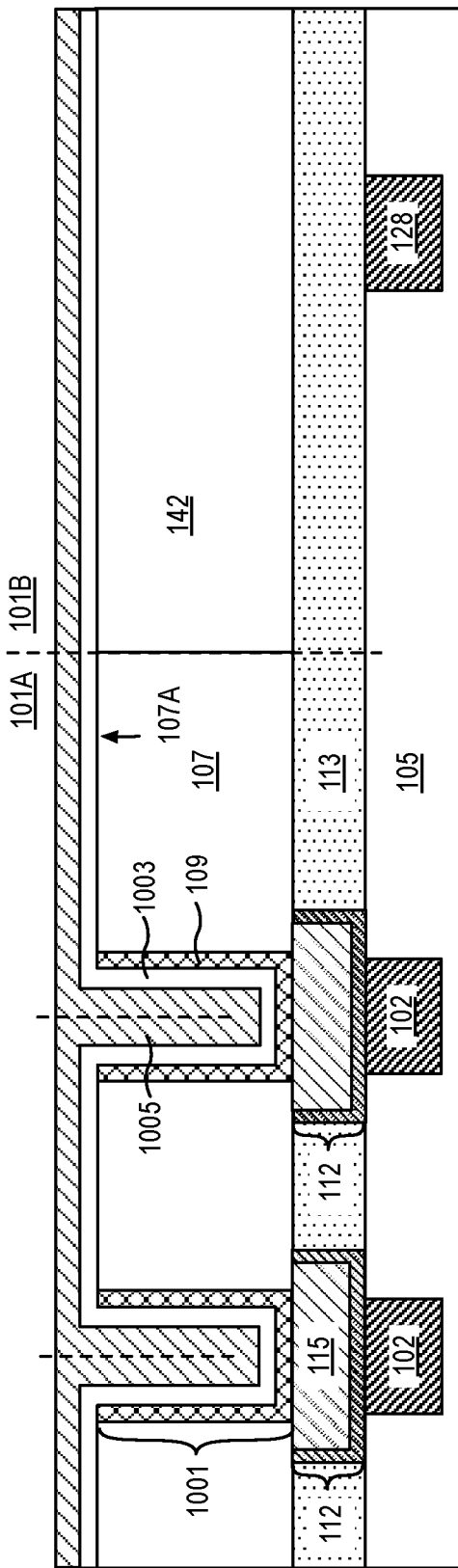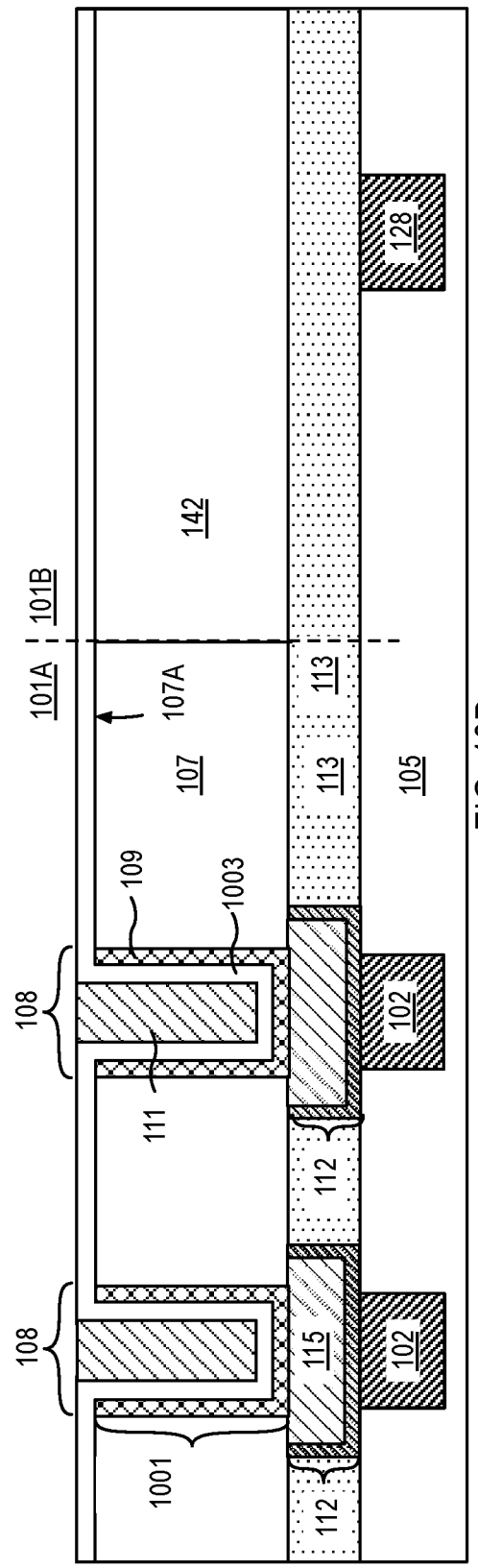

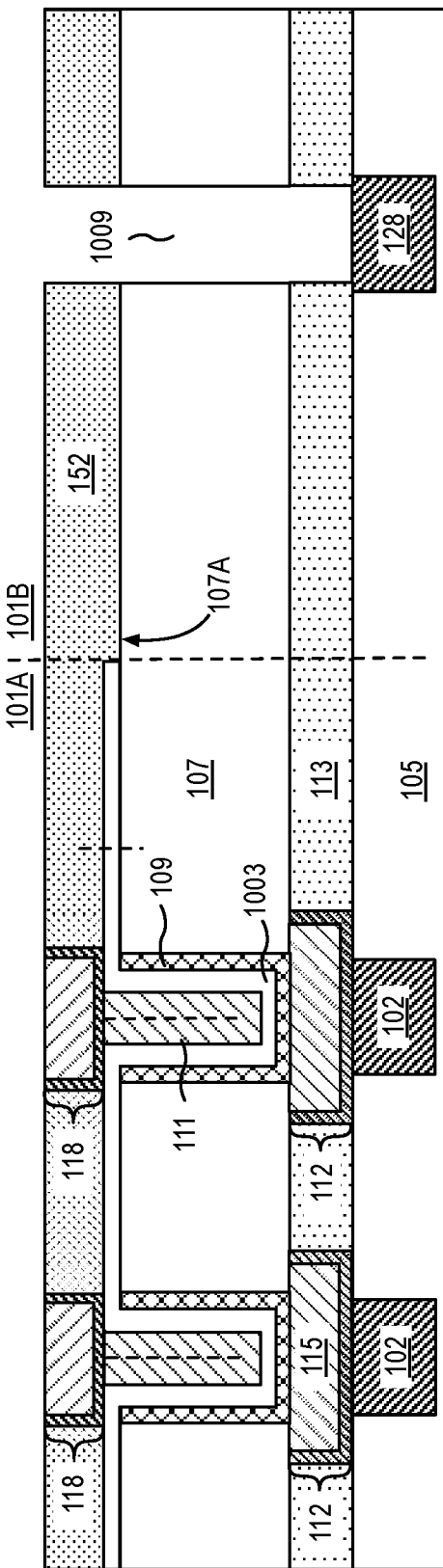
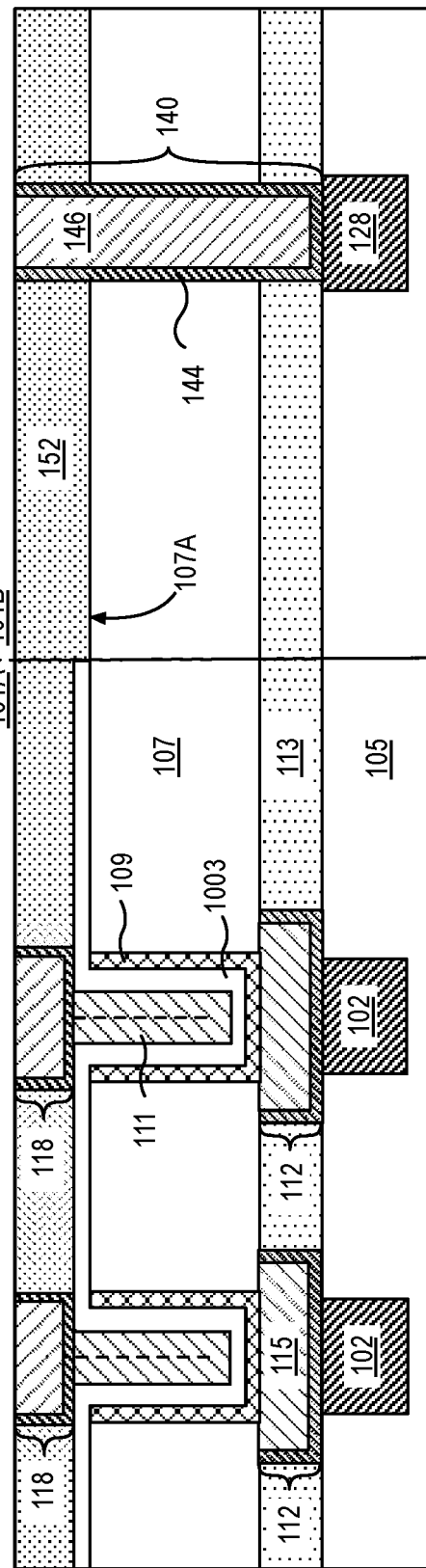
FIG. 10G
FIG. 10H

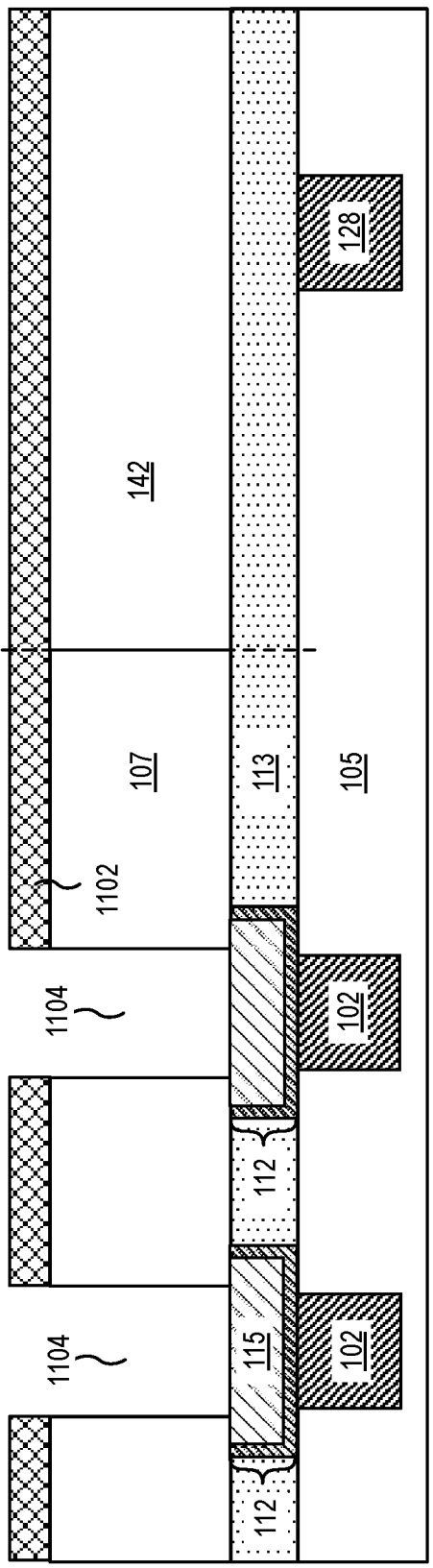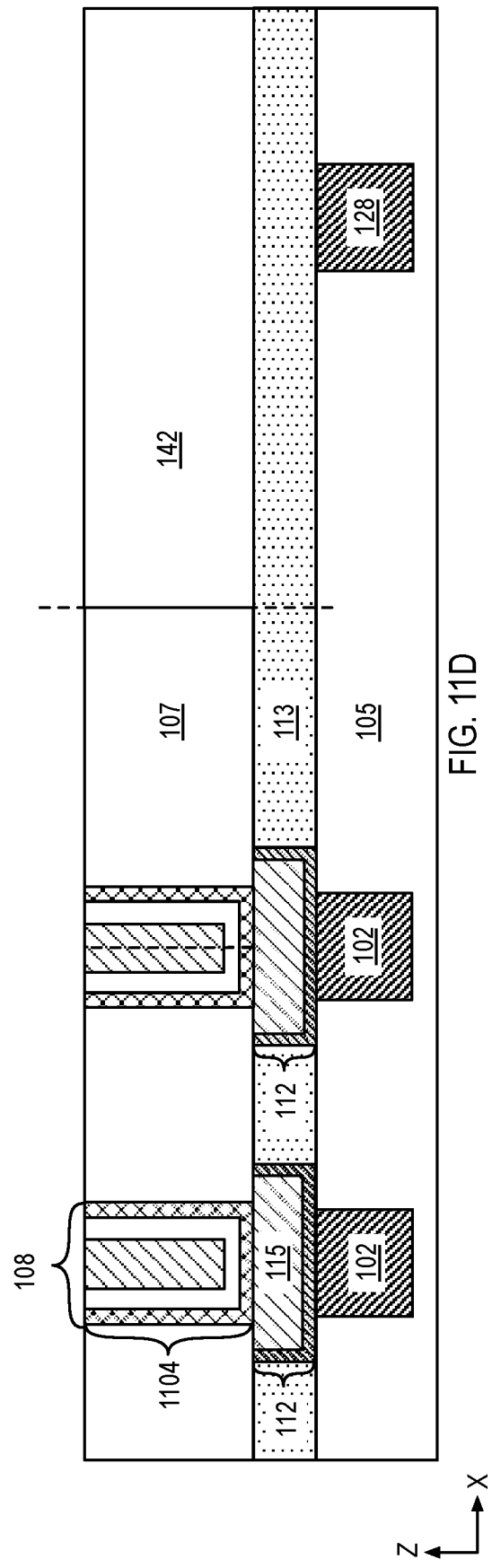
FIG. 11C
FIG. 11D

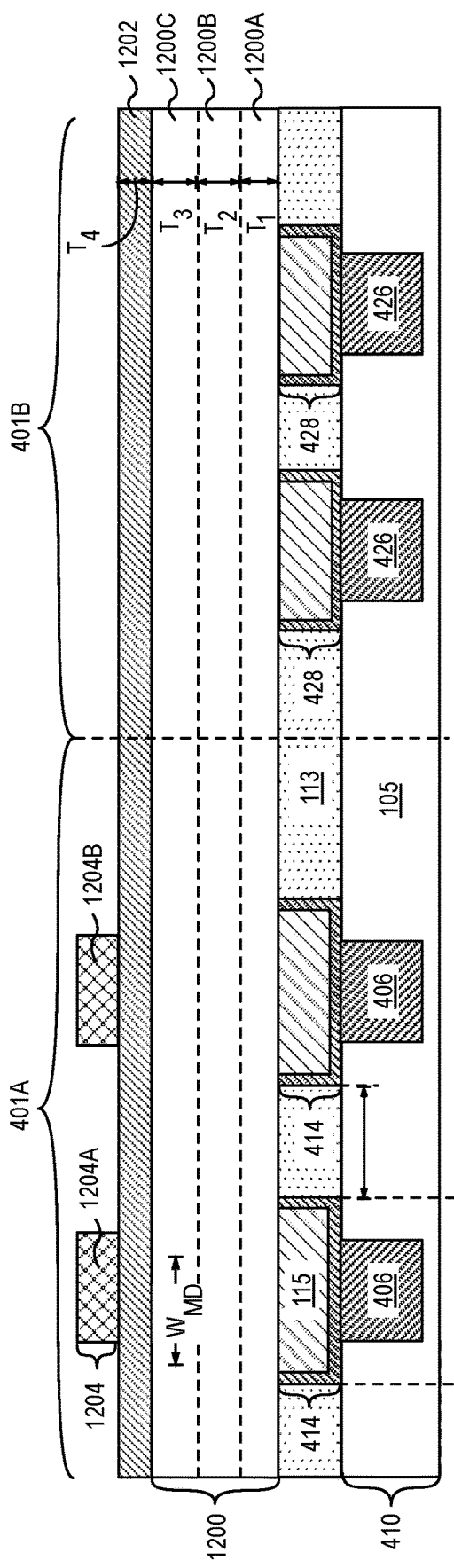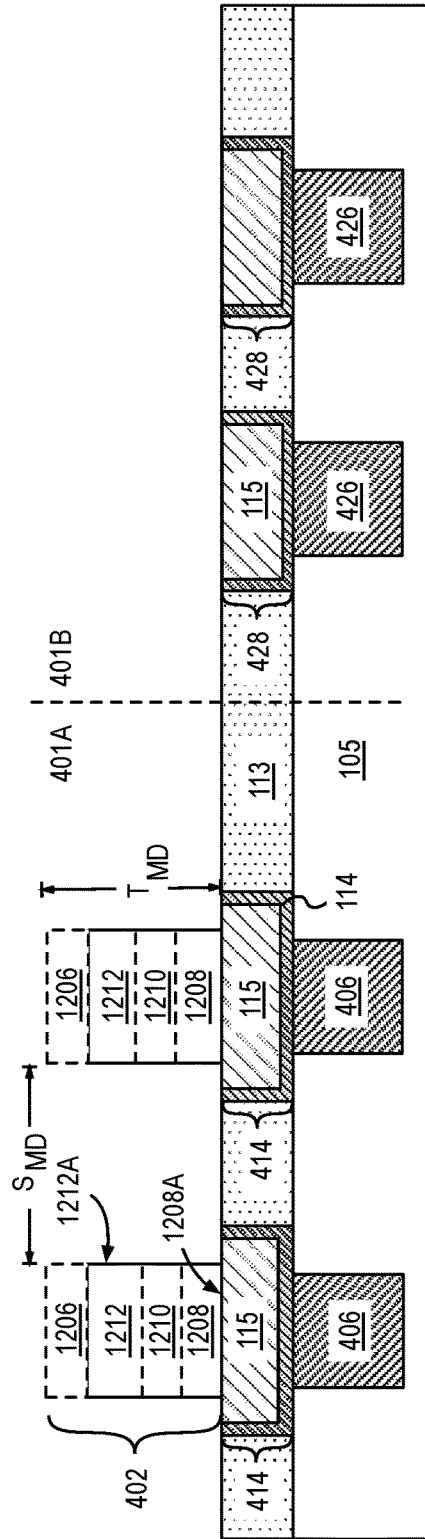

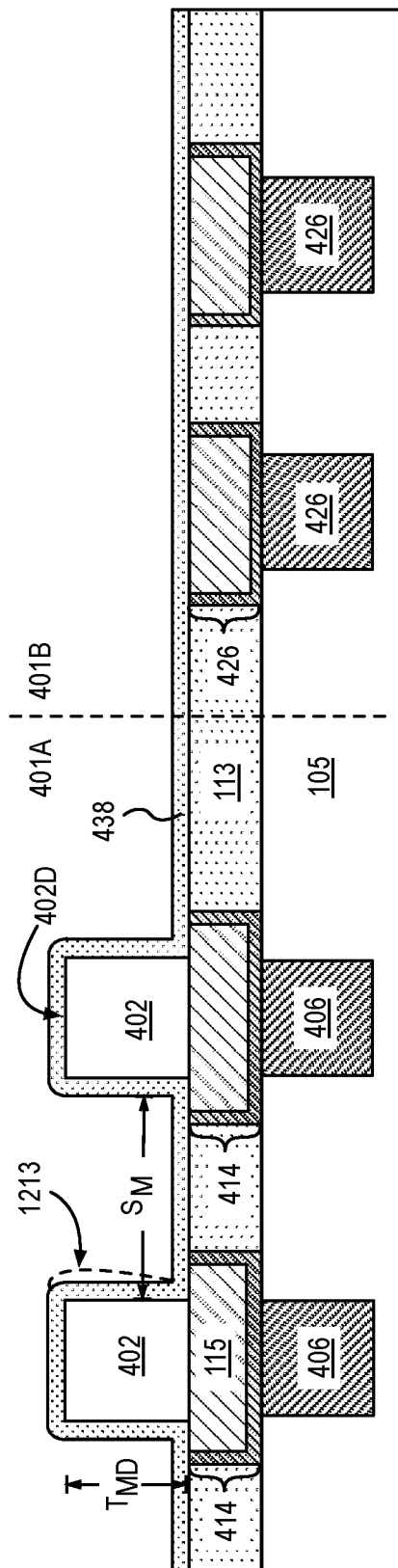
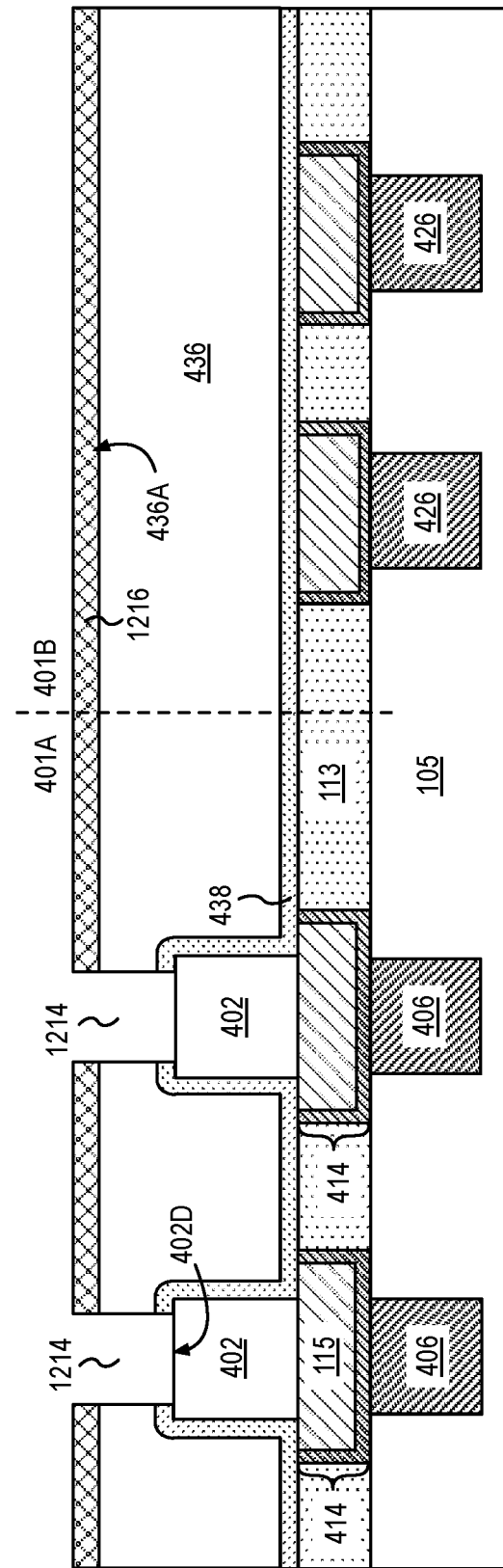

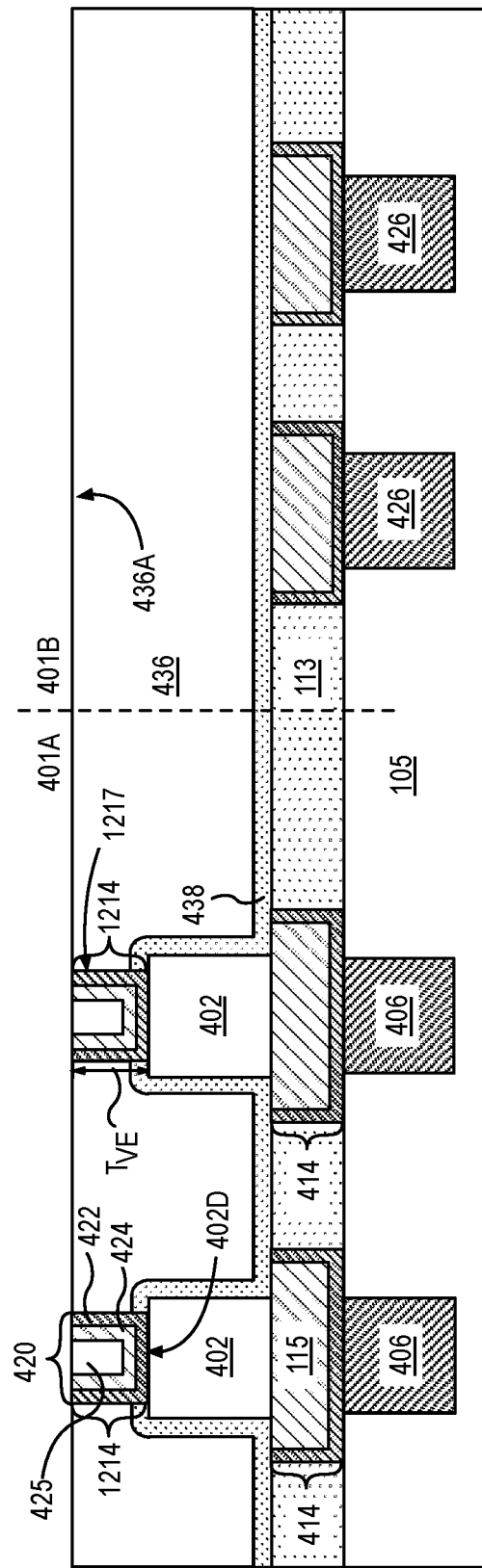
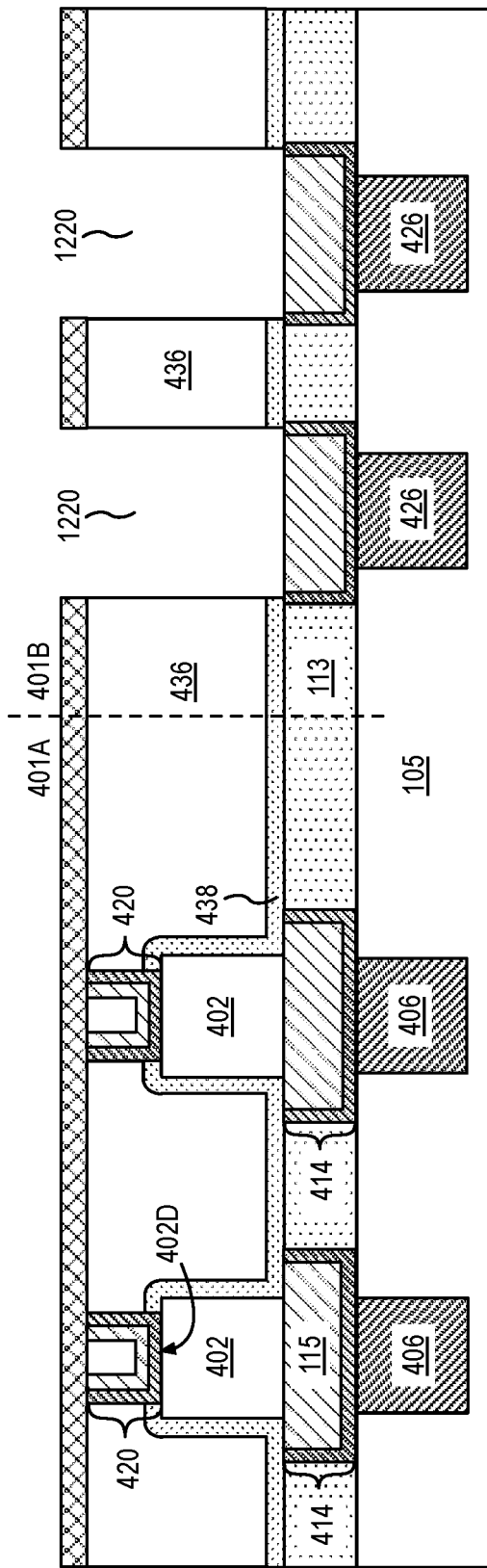
FIG. 12E
FIG. 12F

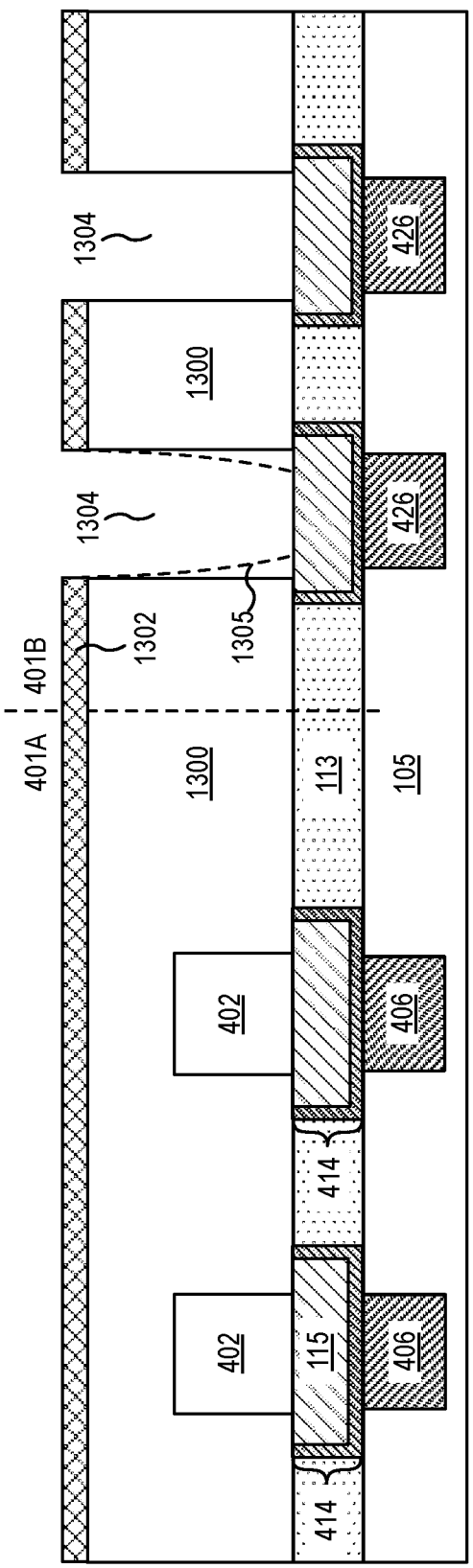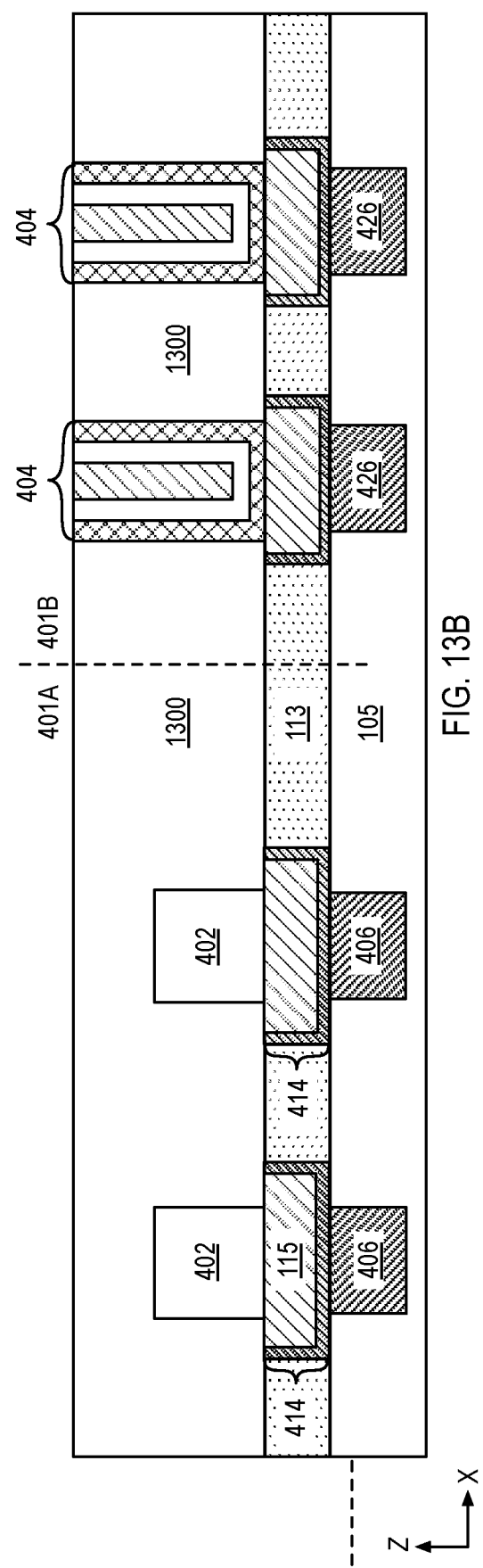
FIG. 13A
FIG. 13B

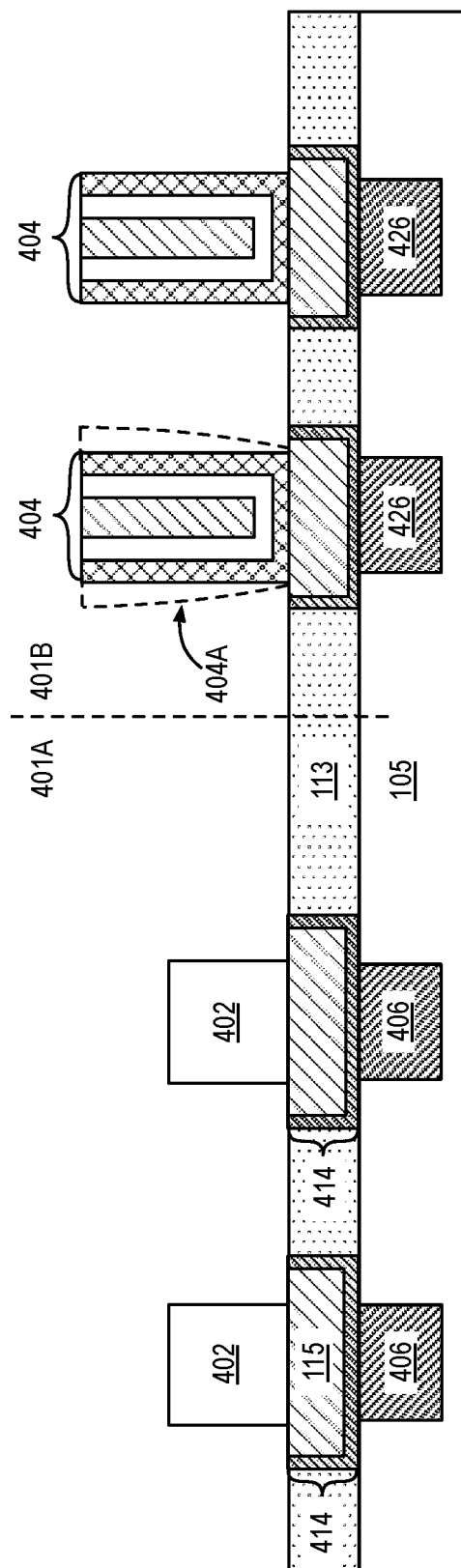
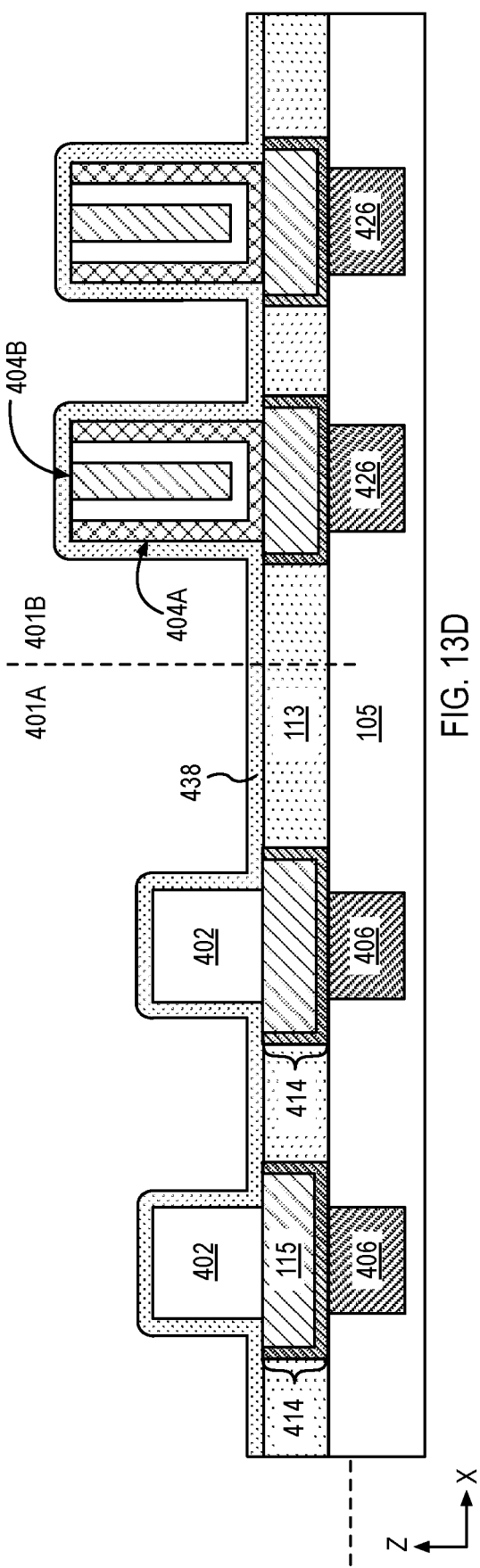
FIG. 13C
FIG. 13D

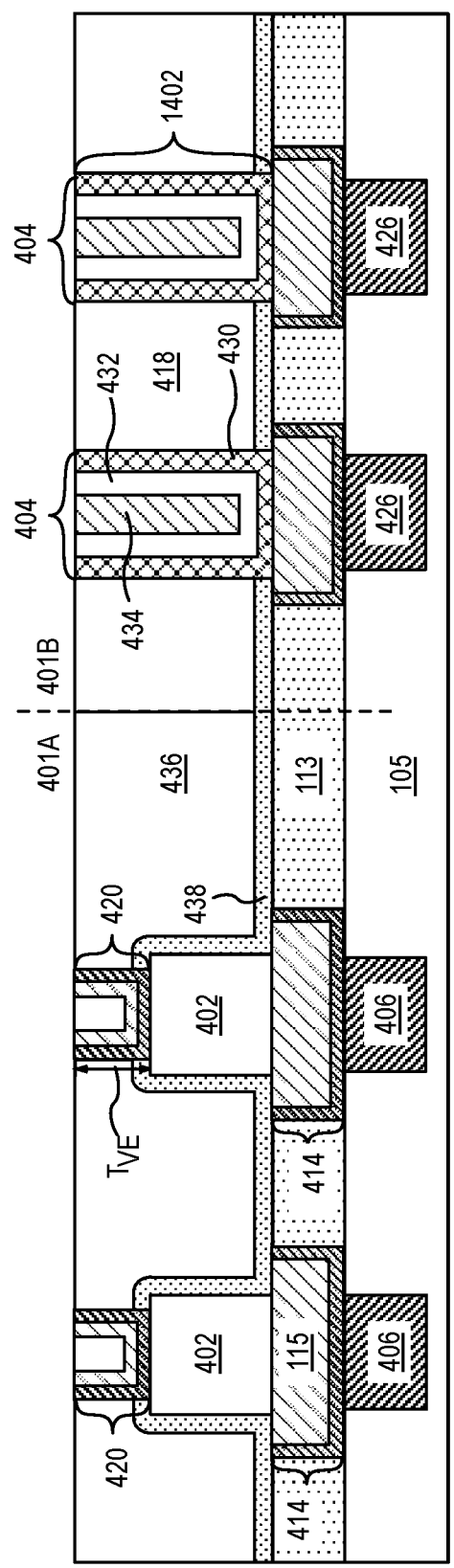
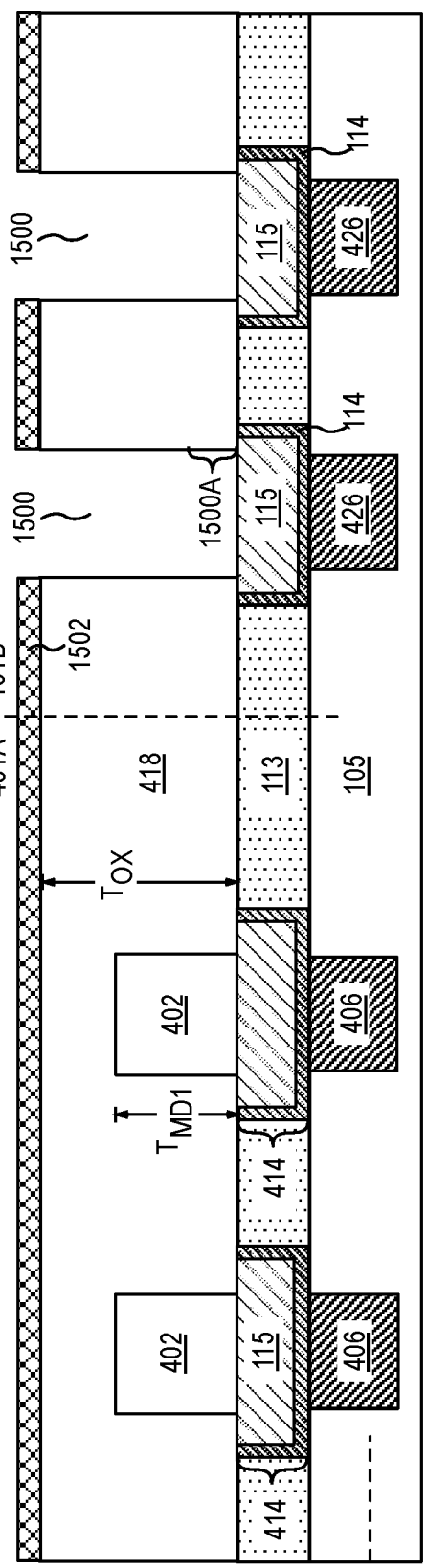
FIG. 14D
FIG. 15A

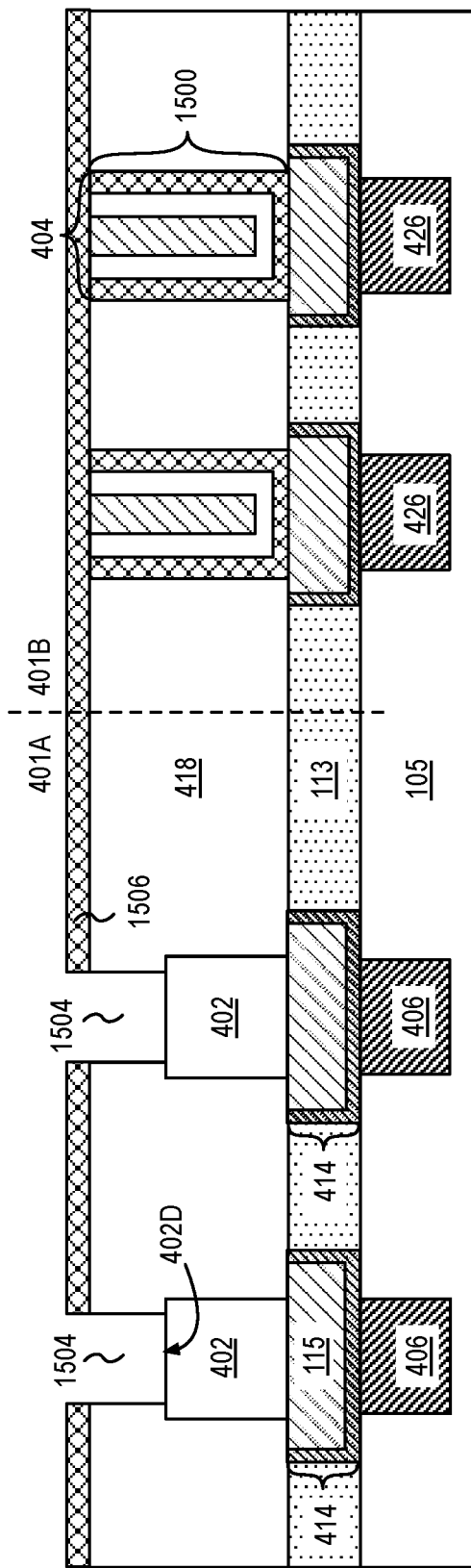
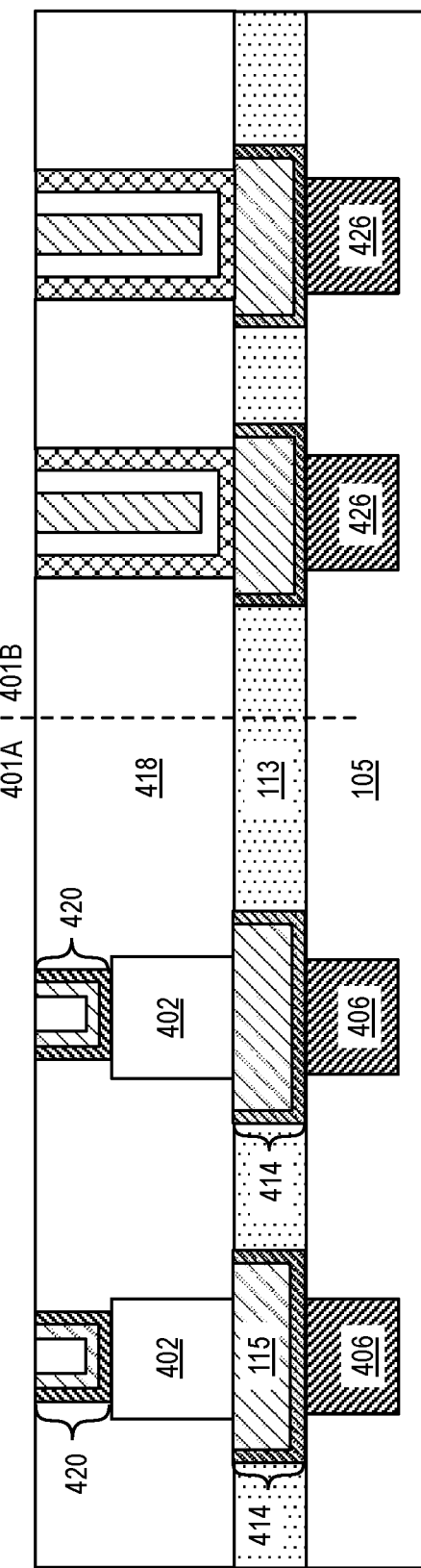
FIG. 15B
FIG. 15C

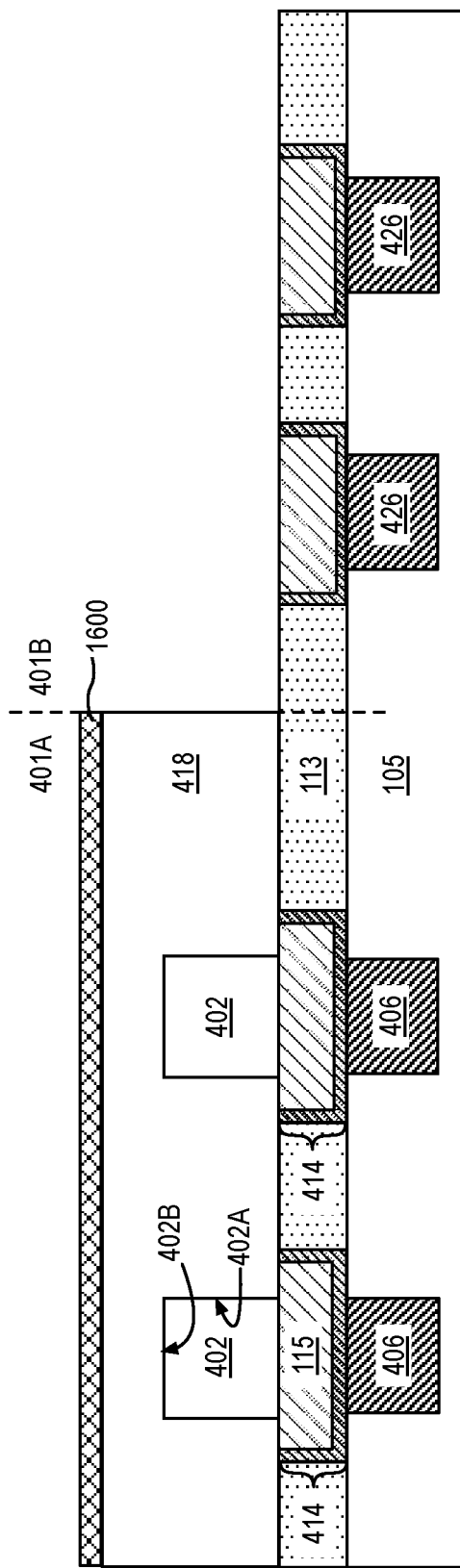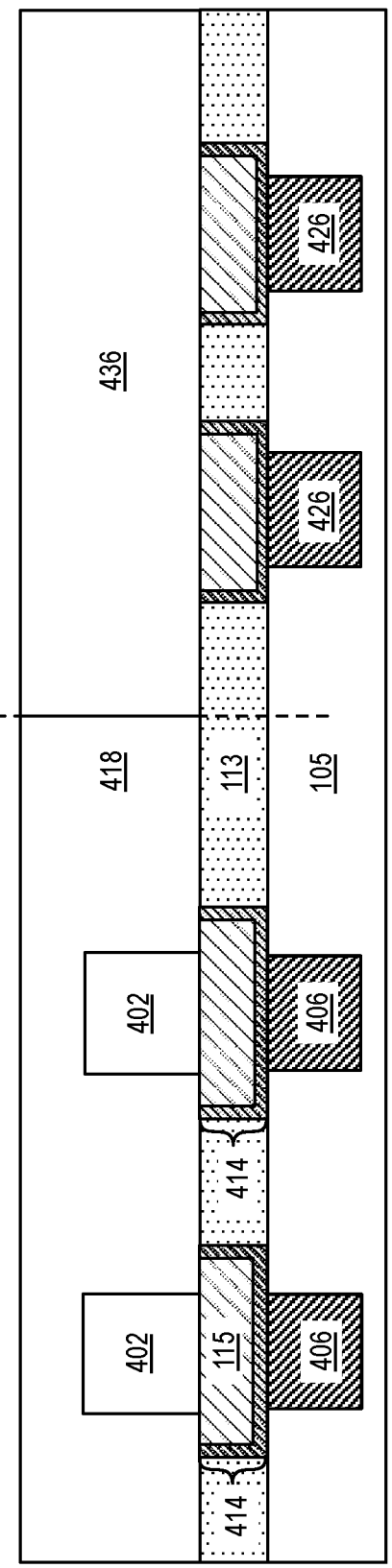

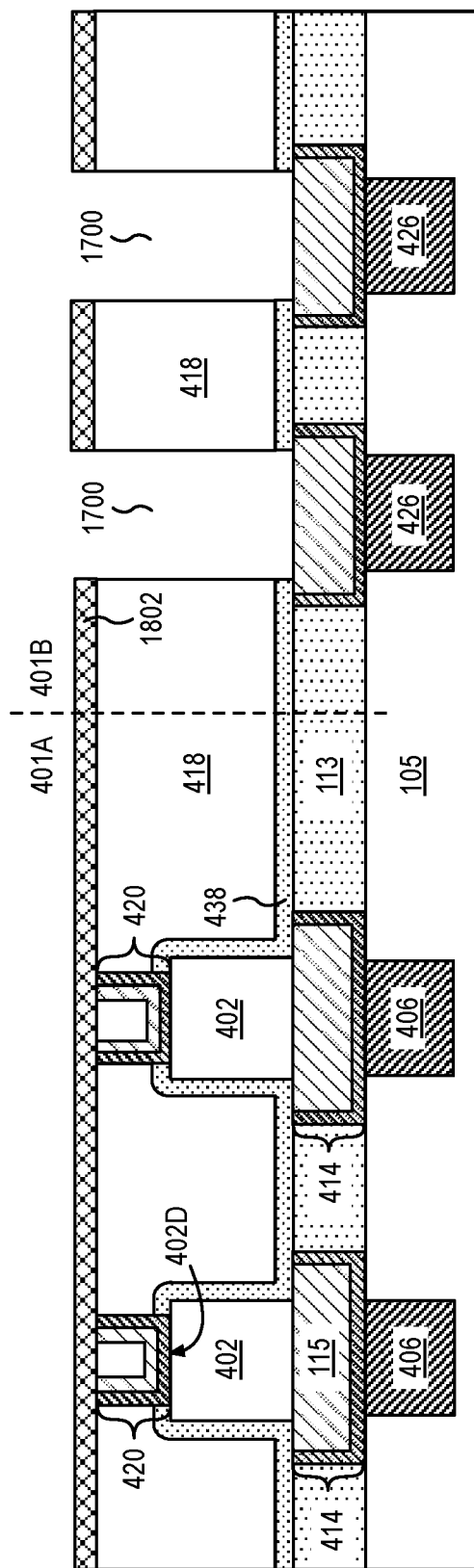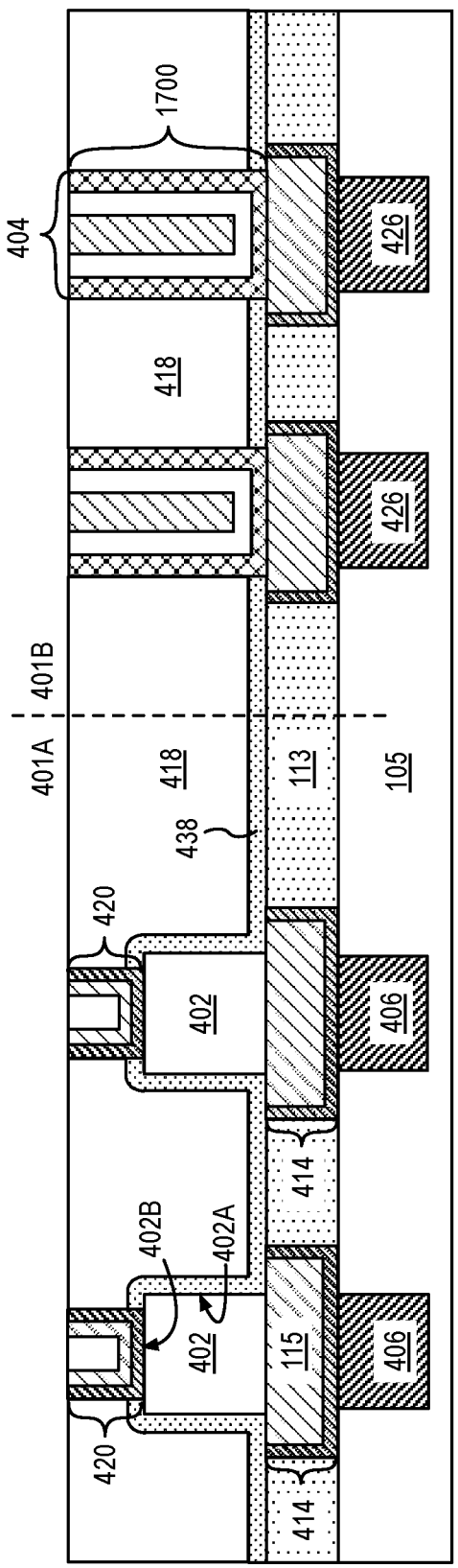

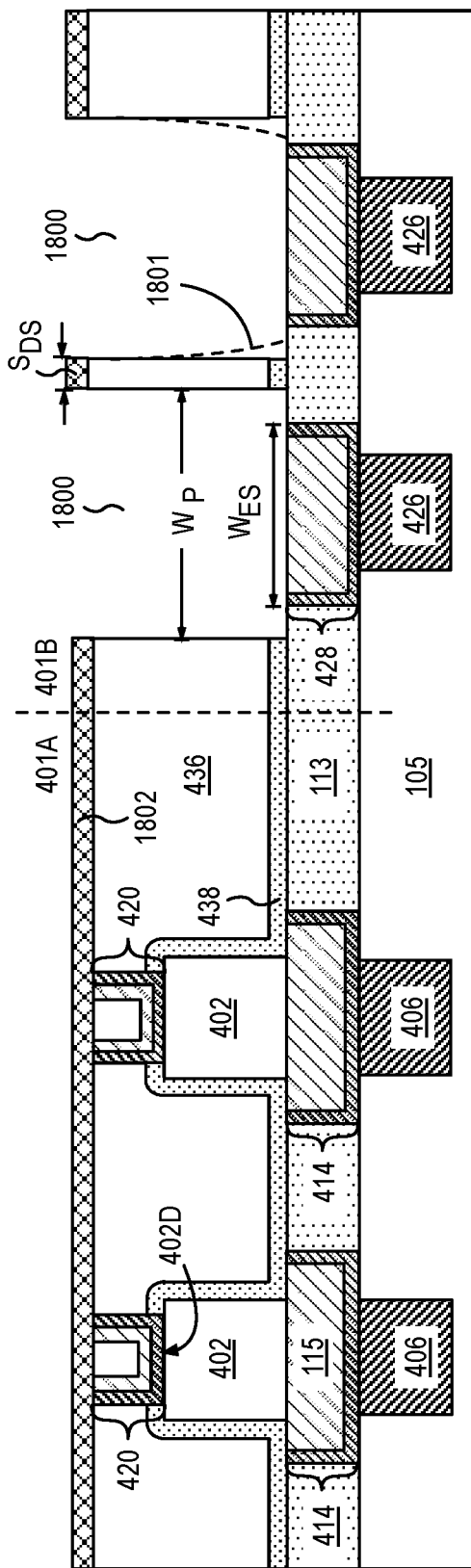
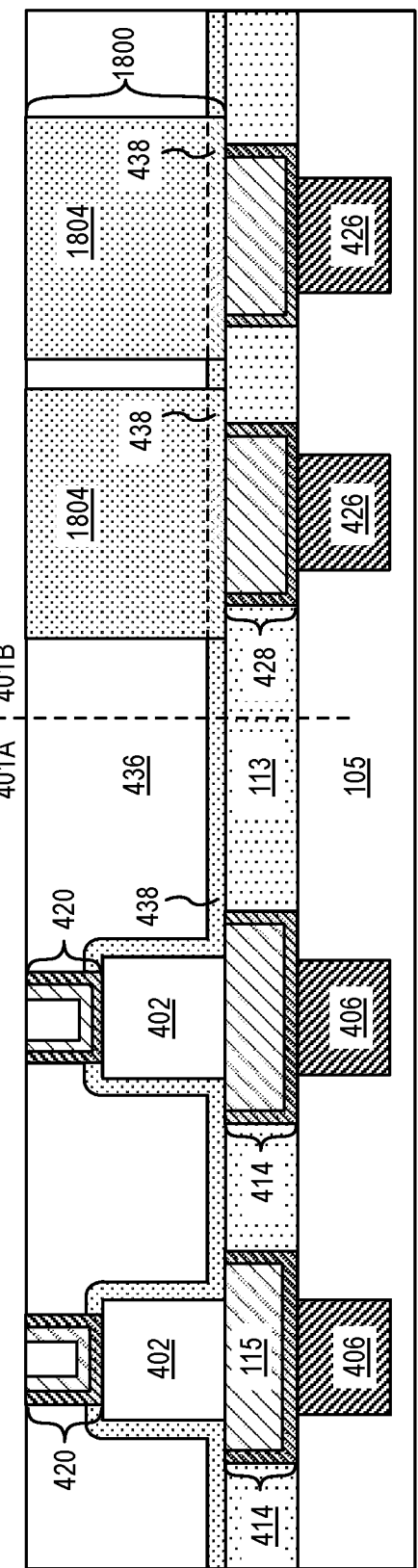
FIG. 18A
FIG. 18B

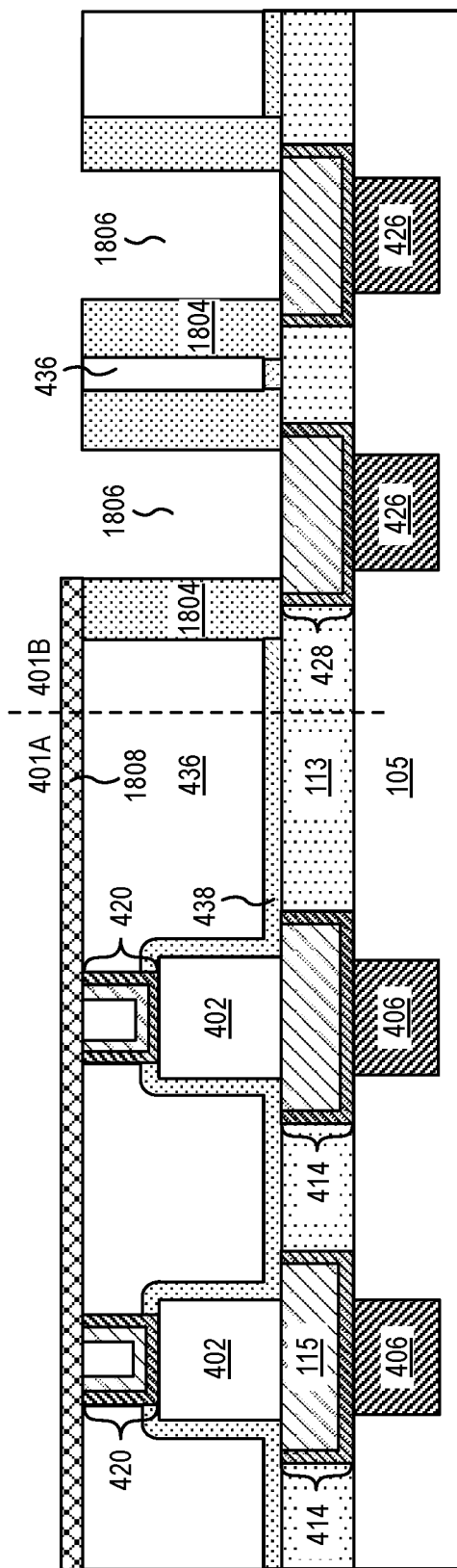
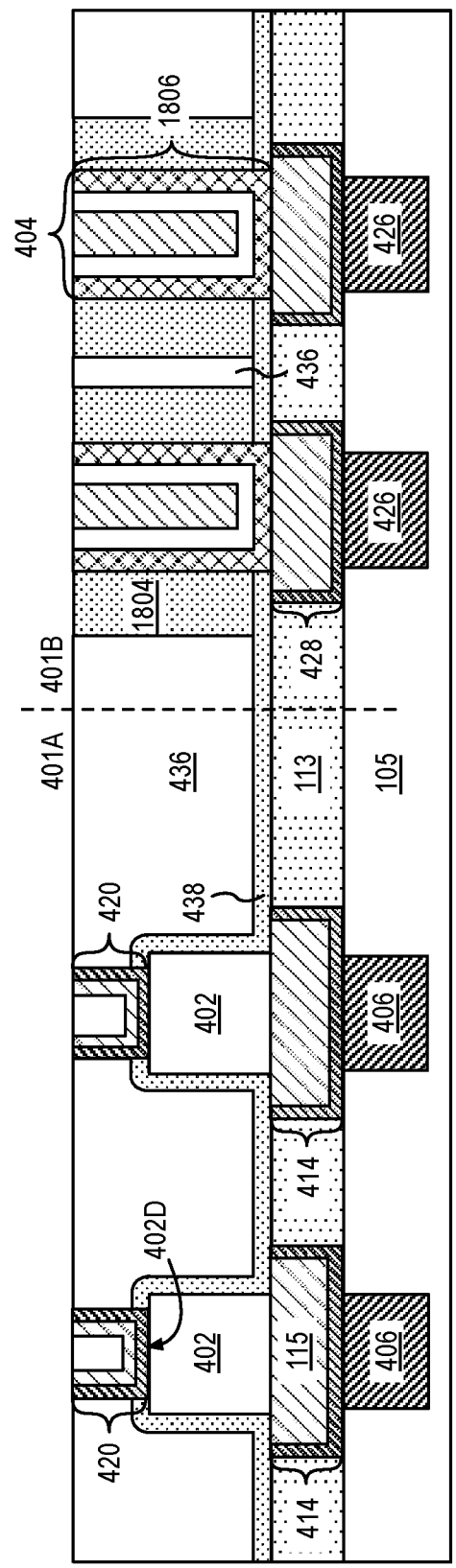
FIG. 18C
FIG. 18D

PLANAR AND TRENCH CAPACITORS WITH HYDROGEN BARRIER DIELECTRIC FOR LOGIC AND MEMORY APPLICATIONS AND METHODS OF FABRICATION

CLAIM OF PRIORITY

This Application is a Continuation Application of, and claims the benefit of priority to, U.S. patent application Ser. No. 17/550,899, filed on Dec. 14, 2021 and titled "Dual Hydrogen Barrier Layer for Trench Capacitors Integrated with Low Density Film for Logic Structures," which is incorporated by reference in its entirety for all purposes.

BACKGROUND

Integration of capacitor devices including (ferroelectric or paraelectric materials) on a same plane as interconnects of logic devices can be challenging. The capacitor devices include materials that have a variety of thicknesses and are prone to hydrogen damage. When spacing between devices are scaled formation of barrier layers can be challenging. As such alternate methods to form barriers around capacitor devices and alternative enabling integration methods essential for realizing a high-density capacitor array including ferroelectric and paraelectric materials are desirable.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Also, various physical features may be represented in their simplified "ideal" forms and geometries for clarity of discussion, but it is nevertheless to be understood that practical implementations may only approximate the illustrated ideals. For example, smooth surfaces and square intersections may be drawn in disregard of finite roughness, corner-rounding, and imperfect angular intersections characteristic of structures formed by nanofabrication techniques. Further, where considered appropriate, reference labels have been repeated among the figures to indicate corresponding or analogous elements.

FIG. 1J is a cross-sectional illustration of a device structure including a plurality of trench capacitors in a first region adjacent to interconnect structures in a logic region, where the trench capacitors and the interconnect structures are laterally surrounded by a low K dielectric but where a spacer is present between the trench capacitor and the low K dielectric, in accordance with an embodiment of the present disclosure.

FIG. 1K is a cross-sectional illustration of a trench capacitor that includes a conductive oxide as well as electrodes adjacent to the conductive oxide, in accordance with an embodiment of the present disclosure.

FIG. 2B is cross-sectional illustration of the device structure in FIG. 1A, where the conductive interconnect is a trench interconnect coupling a plurality of trench capacitors through a respective electrode structure, in accordance with an embodiment of the present disclosure.

FIG. 2C is an isometric illustration of the device structure in FIG. 1A, in an embodiment where the conductive interconnects are discrete island structures, but the electrode structure is a trench electrode that couples multiple memory devices.

FIG. 6A is a cross-sectional illustration of a plurality of conductive interconnects formed within a first dielectric above a substrate, in accordance with an embodiment of the present disclosure.

FIG. 6B is a cross-sectional illustration of the structure in FIG. 6A following the process to deposit an etch stop layer on conductive interconnects and on the first dielectric.

FIG. 7A is a cross-sectional illustration of the structure in FIG. 7A following the process to etch openings in etch stop layer to form electrode structures.

FIG. 7B is an isometric illustration of a portion of the structure in FIG. 7A, in accordance with an embodiment of the present disclosure.

FIG. 7C is an isometric illustration of a portion of the structure in FIG. 7A, in accordance with an embodiment of the present disclosure.

FIG. 7D is an isometric illustration of a portion of the structure in FIG. 7A, in accordance with an embodiment of the present disclosure.

FIG. 8A is a cross-sectional illustration of the structure in FIG. 7A following the process to deposit one or more electrode materials on the conductive interconnects and on etch stop layer.

FIG. 8B is a cross-sectional illustration of the structure in FIG. 8A following the process to planarize a fill material and a conductive hydrogen barrier material to form an electrode structure above a conductive interconnect in the memory region.

FIG. 8E is a cross-sectional illustration of the structure in FIG. 8D following the process to deposit various trench capacitor layers in the trenches to form trench capacitors.

FIG. 8F is a cross-sectional illustration of the structure in FIG. 8E following the process to planarize and remove excess trench capacitor layers deposited on and above the first dielectric and following the process to deposit a second dielectric on the first dielectric.

FIG. 8G is a cross-sectional illustration of the structure in FIG. 8F following the process to remove the first dielectric and the second dielectric from the second region.

FIG. 8H is a cross-sectional illustration of the structure in FIG. 8G following the process to form a third dielectric in the second region and following the process to form a trench in the third dielectric.

FIG. 10C is a cross-sectional illustration of the structure in FIG. 10B following the process to form a dielectric layer on the bottom electrode and following a process to deposit bottom electrode layer on the dielectric layer.

FIG. 10D is a cross-sectional illustration of the structure in FIG. 10C following the process to form trench capacitor 108 by a combination of planarization and selective etch back process.

FIG. 10G is a cross-sectional illustration of the structure in FIG. 10F following the process to form a via electrode on a respective trench capacitor, and form a via opening to expose conductive interconnect in the second region.

FIG. 10H is a cross-sectional illustration of the structure in FIG. 10G following the process to form a via structure on a conductive interconnect in the second region.

FIG. 11C is a cross-sectional illustration of the structure in FIG. 11B following the process to form trenches in the first dielectric.

FIG. 11D is a cross-sectional illustration of the structure in FIG. 11C following the process to form trench capacitors in the trenches.

FIG. 12A is a cross-sectional illustration of a material layer stack formed on a plurality of first electrode structures in a first region and on a plurality of second electrode structures in a second region.

FIG. 12B is a cross-sectional illustration of the structure in FIG. 12A following the process to pattern the material layer stack to form a plurality of memory devices.

FIG. 12C is a cross-sectional illustration of the structure in FIG. 12B following the process to form an encapsulation layer on individual ones of the plurality of memory devices.

FIG. 12D is a cross-sectional illustration of the structure in FIG. 12C following the process to deposit a second dielectric and planarize the second dielectric on the memory devices and following a process to form an opening in the second dielectric above a respective memory device.

FIG. 12E is a cross-sectional illustration of the structure in FIG. 12D following the process to form via electrode in a respective opening.

FIG. 12F is a cross-sectional illustration of the structure in FIG. 12E following the process to form trenches above the plurality of second electrode structures in a second region.

FIG. 13A is a cross-sectional illustration of the structure in FIG. 12B following the process to deposit a sacrificial dielectric on a planar capacitor and on an etch stop layer and form trenches in the sacrificial dielectric.

FIG. 13B is a cross-sectional illustration of the structure in FIG. 13A following the process to form a trench capacitor in a respective trench.

FIG. 13C is a cross-sectional illustration of the structure in FIG. 13B following the process to remove the sacrificial dielectric.

FIG. 13D is a cross-sectional illustration of the structure in FIG. 13C following the process form an encapsulation layer on the planar capacitor and on the trench capacitor.

FIG. 14D is a cross-sectional illustration of the structure in FIG. 14C following the process to form trench capacitors.

FIG. 15A is a cross-sectional illustration of the structure in FIG. 12B following the process to blanket deposit the second dielectric on the planar capacitors and form trench opening in the second dielectric above a respective second electrode structure.

FIG. 15B is a cross-sectional illustration of the structure in FIG. 15B following the process to form a trench capacitor in the trench opening and form a via opening above a respective planar capacitor.

FIG. 15C is a cross-sectional illustration of the structure in FIG. 15B following the process to form via electrode in a respective via opening.

FIG. 16A is a cross-sectional illustration of the structure in FIG. 12B following the process to form the second dielectric on the planar capacitors.

FIG. 16B is a cross-sectional illustration of the structure in FIG. 16A following the process to form the first dielectric in the second region.

FIG. 17A is a cross-sectional illustration of the structure in FIG. 12C following the process to deposit the second dielectric, form a respective via electrode above a respective planar capacitor and form trenches in the second dielectric above a respective second electrode structure.

FIG. 17B is a cross-sectional illustration of the structure in FIG. 17A following the process to form trench capacitors in the trenches.

FIG. 18A is a cross-sectional illustration of the structure in FIG. 12D following the process to form via electrodes and following the process to form a plurality of pockets in the first dielectric, where individual pockets expose at least a portion of a respective second electrode structure in the second region.

FIG. 18B is a cross-sectional illustration of the structure in FIG. 18A following the process to deposit the second dielectric in the plurality of pockets.

FIG. 18C is a cross-sectional illustration of the structure in FIG. 18B following the formation of trenches in the second dielectric deposited in individual ones of the plurality of pockets.

FIG. 18D is a cross-sectional illustration of the structure in FIG. 18C following the process to form trench capacitors in a respective trench.

DETAILED DESCRIPTION

Figure 1A:
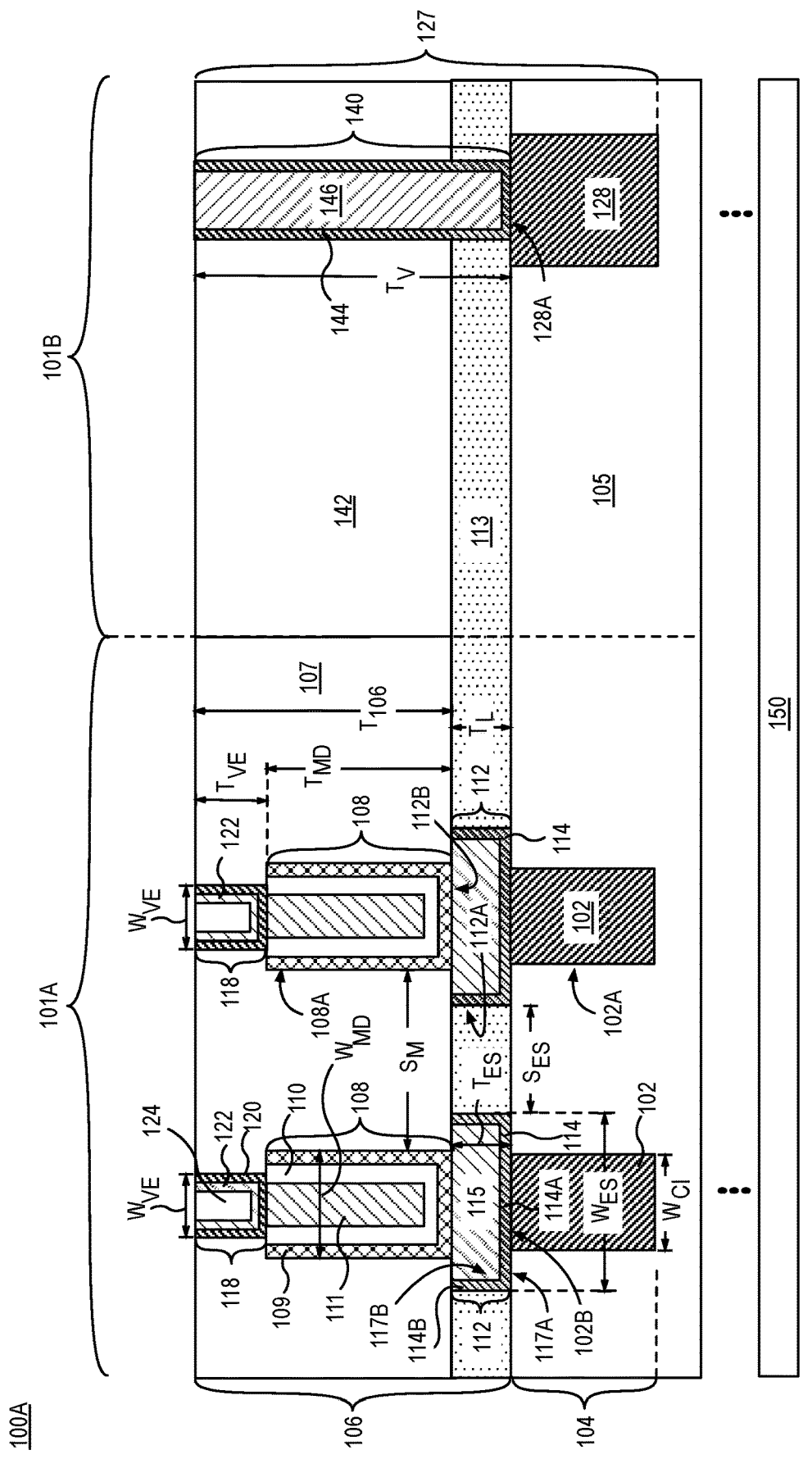
FIG. 1A is a cross-sectional illustration of a device structure including a plurality of trench capacitors in a first region adjacent to interconnect structures in a second region, where the respective trench capacitor is protected by a combination of conductive and insulative hydrogen barriers, in accordance with an embodiment of the present disclosure.

A dual hydrogen barrier for trench capacitors integrated with logic devices and methods of fabrication are described. While various embodiments are described with reference to FeRAM, capacitive structures formed herein can be used for any application where a capacitor is desired. For example, the capacitive structure can be used for fabricating ferroelectric based or paraelectric based majority gate, minority gate, and/or threshold gate. In the following description, numerous specific details are set forth, such as structural schemes and detailed fabrication methods to provide a thorough understanding of embodiments of the present disclosure. It will be apparent to one skilled in the art that embodiments of the present disclosure may be practiced without these specific details. In other instances, well-known features, such as process equipment and device operations, are described in lesser detail to not unnecessarily obscure embodiments of the present disclosure. Furthermore, it is to be understood that the various embodiments shown in the Figures are illustrative representations and are not necessarily drawn to scale.

In some instances, in the following description, well-known methods and devices are shown in block diagram form, rather than in detail, to avoid obscuring the present disclosure. Reference throughout this specification to "an embodiment" or "one embodiment" or "some embodiments" means that a particular feature, structure, function, or characteristic described in connection with the embodiment is included in at least one embodiment of the disclosure. Thus, the appearances of the phrase "in an embodiment" or "in one embodiment" or "some embodiments" in various places throughout this specification are not necessarily referring to the same embodiment of the disclosure. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses all possible combinations of one or more of the associated listed items.

The terms "coupled" and "connected," along with their derivatives, may be used herein to describe functional or structural relationships between components. These terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical, electrical or in magnetic contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example, in the context of materials, one material or material disposed over or under another may be directly in contact or may have one or more intervening materials. Moreover, one material disposed between two materials may be directly in contact with the two layers or may have one or more intervening layers. In contrast, a first material "on" a second material is in direct contact with that second material/material. Similar distinctions are to be made in the context of component assemblies. As used throughout this description, and in the claims, a list of items joined by the term "at least one of" or "one or more of" can mean any combination of the listed terms.

The term "adjacent" here generally refers to a position of a thing being next to (e.g., immediately next to or close to with one or more things between them) or adjoining another thing (e.g., abutting it).

The term "signal" may refer to current signal, voltage signal, magnetic signal, or data/clock signal.

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

Unless otherwise specified in the explicit context of their use, the terms "substantially equal," "about equal" and "approximately equal" mean that there is no more than incidental variation between two things so described. In the art, such variation is typically no more than +/−10% of a predetermined target value.

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures, or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. Similar distinctions are to be made in the context of component assemblies.

The term "between" may be employed in the context of the z-axis, x-axis or y-axis of a device. A material that is between two other materials may be in contact with one or both of those materials. In another example, a material that is between two or other material may be separated from both of the other two materials by one or more intervening materials. A material "between" two other materials may therefore be in contact with either of the other two materials. In another example, a material "between" two other materials may be coupled to the other two materials through an intervening material. A device that is between two other devices may be directly connected to one or both of those devices. In another example, a device that is between two other devices may be separated from both of the other two devices by one or more intervening devices.

Capacitors with a wide variety of materials have been implemented for memory (random access memory or RAM) applications. Perovskite materials have been implemented in capacitors such for high density FeRAM applications owing to their low power consumption and high on/off ratio. Perovskite FeRAM devices are also desirable over other forms of memory such as magnetic tunnel junction (MTJ)-based devices due to the relatively low number of layers within a device compared to the MTJ. A typical FeRAM may be fully operational with three layers, where a ferroelectric dielectric is contained between two electrode layers. The electrode layers may also include Perovskite materials to enable lattice matching, templating, oxygen source and reduction in electrical resistance. Introduction of lead-free Perovskite materials offer additional environmental benefits without sacrificing device performance.

However, FeRAM devices including lead-free Perovskite materials are prone to damage or degrade from reaction with hydrogen during processing. Specifically, the damage may be result of hydrogen migrating along grain boundaries between or along electrodes coupled with two terminals of a FeRAM device. Hydrogen can cause reduction when it reacts with the one or more materials of the FeRAM device, such the electrodes or the ferroelectric material itself. Sources of hydrogen during fabrication arise from anneal operations carried to tie up or passivate dangling bonds., FeRAM devices can lose their polarization switching characteristics because of hydrogen reduction.

In some embodiments, the capacitor devices have a planar structure where the individual layers are sequentially layered, one on top of another, where the layers are patterning into cylinder or rectangular shapes. Thus, it is highly desirable to protect capacitor sidewalls, top and bottom surfaces from reacting with hydrogen. In some embodiments, solutions against hydrogen diffusion include forming an insulating barrier layer, such as for example, silicon nitride, to protect sidewalls and top surfaces. A contact electrode at a top of the FeRAM device may be formed by piercing through the insulating barrier layer and exposing one or more top electrode materials. The barrier layer themselves may be further surrounded by additional insulating material such as an interlayer dielectric (ILD). However, the contact electrode formed may be wider than a width of a FeRAM device and can result in erosion of spacer. Spacer erosion can lead to exposure to the adjacent ILD material. ILD material such as silicon oxide or silicon oxide doped with carbon in general do not act as a hydrogen diffusion barrier.

In other examples, hydrogen may diffuse through one or more materials of the contact electrode towards the FeRAM device stack through a top electrode. To protect against hydrogen diffusion through a top surface of the top electrode noble metals have been implemented as part of the contact electrode structure. However, Noble metals normally have crystalline structures due to strong metallic bonding and their amorphous phase is thermodynamically unstable favoring transformation into a crystalline phase.

Furthermore, it is to be appreciated that hydrogen can also diffuse from layers below a bottom electrode of the FeRAM device. Typically, the bottom electrode is physically isolated from a conductive interconnect by at least one transition electrode. The conductive interconnect may be laterally surrounded by an ILD. The transition electrode may be laterally surrounded by an insulator layer that can act as a barrier against hydrogen diffusion as well as provide etch stop capability while patterning the FeRAM stack. The insulator layer is typically formed above the ILD and the conductive interconnect. The interface between the transition electrode and the conductive interconnect, can be a pathway for hydrogen diffusion. Depending on a width of the transition electrode relative to the conductive interconnect. The transition electrode may be in contact with the ILD adjacent to the conductive interconnect.

The inventors have devised a scheme to implement a dual hydrogen barrier that includes an insulative hydrogen barrier material directly adjacent to the memory device and a conductive hydrogen barrier that is integrated as part of the contact electrode. In some embodiments, the contact electrode may have a shape of a via that include a conductive hydrogen barrier having a first portion directly in contact with the memory device and a second portion that laterally surrounds a conductive (contact) material. The conductive contact material may further include one or more layers. The contact electrode may extend over a portion of the memory device.

To provide a barrier against hydrogen diffusion towards a bottom electrode, the transition electrode may also include a conductive hydrogen barrier material. The structure of the transition electrode may depend on the size of the memory device relative to the transition electrode. In embodiments, the transition electrode may include a conductive hydrogen barrier laterally surrounding a conductive material. In other embodiments, the transition electrode may include conductive hydrogen barrier directly across a top portion and in direct contact with the memory device.

To provide a barrier against hydrogen diffusion directly into sidewalls of the memory device, a dielectric that is amorphous, having a high film density (a film density above 90% of theoretical material density or film density) and is electrically insulating, may be directly in contact with the sidewalls of the memory device. Furthermore, when memory devices are integrated in a high density array, the space between the devices may not be large enough to deposit a barrier liner (spacer) as well as an ILD. In some such instances the high film density-dielectric is present over the entire memory region. FeRAM devices in the memory region may be directly adjacent to a logic region within a memory level, for system functionality. In particular, the ferroelectric devices may be directly adjacent to routing interconnects in the logic region. To minimize line capacitance, the routing interconnects are embedded within a low dielectric constant interlayer dielectric (ILD), where the ILD has a low film density (less than 90% film density) or a high porosity material.

In other embodiments, provide a barrier against hydrogen diffusion directly into sidewalls of the memory device, a spacer including a material that is amorphous, having a high film density (a film density above 90% of theoretical material density or film density) may be directly in contact with the sidewalls of the memory device. The spacer may be covered by an interlayer dielectric (ILD). The ILD has a low film density (a film density below 90% of theoretical material density or film density).

While the dual hydrogen barrier can be implemented in FeRAM devices (memory devices) having planar capacitor structures, to enable greater charge storage per unit area it is advantageous for capacitors to be non-planar. An example of a non-planar capacitor is a trench capacitor. A trench capacitor offers an advantage that sidewalls of the trench can offer an additional surface area for charge storage. Depending on a plan view design of the trench capacitor, for example, rectangular, circular or elliptical, the total charge storage can be effectively doubled per unit area of the footprint of the capacitor. However, to accomplish greater charge storage, the trench capacitor has a vertical thickness that can be at least twice the height of a planar capacitor. The dual hydrogen barrier concept can be further extended to trench capacitors.

Trench capacitors in general have a first conductive electrode (bottom electrode) that wraps around a base and sidewalls of a trench. A layer of dielectric charge storage material is conformal to an inner sidewall of the bottom electrode, and a second conductive electrode(top electrode) is lined against the layer of dielectric charge storage material. The dielectric charge storage material separates the first and the second conductive electrodes. The bottom electrode is exposed to the transition electrode and or the etch stop layer below, and to the dielectric surrounding the trench capacitor. In some embodiments the top surface of the trench capacitor include exposed portions of the bottom electrode, the dielectric charge storage material and the top electrode. To protect against hydrogen diffusion, the entire top surface of the trench capacitor needs to be protected by an insulative hydrogen barrier material.

The contact electrode including a conductive hydrogen barrier material can be utilized to contact the top electrode of the trench through the insulative hydrogen barrier material on the top surface of the trench capacitor. However, to prevent shorting between the top and bottom electrodes, the surface area of the contact electrode needs to be at least smaller than a footprint of the trench capacitor, when the trench capacitors are cylindrical or rectangular.

In order to provide some flexibility to the size of the contact electrode, the trench capacitor can have a greater top surface area than a bottom surface area. In some such embodiments, the trench capacitor can be a conical shaped trench capacitor with a tapered sidewalls and a flat base.

In other embodiments, the layer of dielectric charge storage material can extend outside the area of the trench capacitor and protect the bottom electrode from being exposed. This increases an effective area available for formation of the contact electrode.

To protect against hydrogen diffusion from lateral directions, sidewalls of the trench can be lined with a spacer including a hydrogen barrier material, or the trench can be formed in a hydrogen barrier material.

Advantages from a greater source of charge storage in trench capacitors are availed when the layers within the trench capacitor can have thicknesses that are substantially uniform on the base of the trench as well as on the sidewalls. While different deposition techniques are available, atomic layer deposition (ALD) process is inherently advantageous as it provides uniform and conformal film coverage on substantially all exposed surfaces, an atomic layer at a time. Other ALD processes such as plasma assisted ALD (PAALD) or plasma enhanced ALD (PEALD) offer further benefits such as, enhancing reactivity of co-reactants thus enabling higher deposition rates, and reduce carbon based impurities.

In addition to thickness uniformity, uniformity in material composition is also equally important. ALD processes can provide stoichiometric control at an atomic level. This is particularly advantageous when there are 3 or more elements in the film. Extremely tight control of film composition is essential to avail and tune optimal ferroelectric or paraelectric properties. Such uniformity in material composition on a planar and non-planar surfaces can be very challenging to obtain with other deposition techniques. Other inherent advantages of ALD process including depositing films with a discernable dopant profile.

While ALD deposition process has been utilized to deposit ferroelectric or paraelectric materials, the inventors have devised a deposition process that operates at substantially reduced range of temperatures, such as temperature between 160-400 degrees Celsius, compared to conventional ALD processes.

The trench capacitors may be integrated with transistors in a memory region of a substrate. For example, ferroelectric capacitors may be on a memory level above a transistor level. There may be one or more layers of conductive interconnects between the ferroelectric capacitors (herein ferroelectric devices) and transistors in the transistor level.

A vertical thickness or height of a single level of routing interconnects (herein interconnect level) is determined by a combined thickness of one or more stacked vias and metal lines within the routing interconnects and is substantially fixed. To minimize fabrication cost, it is highly desirable to match a height of the memory level with a height of a single level of routing interconnects. The single level may include one or more stacked conductive interconnects such as a metal line on a via, or a via on a via.

For manufacturability ferroelectric devices may be generally formed directly above conductive interconnects that are coupled with transistors on a lower level. When a conductive interconnect includes copper, it is high desirable to not etch a ferroelectric device and expose the copper conductive interconnect. In such instances, an etch stop layer may be inserted between the conductive interconnect and the ferroelectric device. The etch stop layer also acts as a hydrogen barrier layer to prevent diffusion of hydrogen from a dielectric adjacent to the conductive interconnect to one or more memory devices in a layer above. However, to provide electrical conductivity between the ferroelectric device and the conductive interconnect, a transition electrode may be inserted between a ferroelectric device and a conductive interconnect. The transition electrode may be embedded within the etch stop layer. Because the transition electrode is embedded within the etch stop layer, alignment and sizing requirements of the etch stop layer relative to the conductive interconnect (or the ferroelectric device) may be relaxed. Additionally, the shape of the transition electrode may be independent of a shape of the conductive interconnect.

To enable high density FeRAM devices the inventors have resorted to non-lead-based perovskite materials owing its environmental friendliness for mass production. A stack for ferroelectric capacitors can include one or more hardmask materials. The one or more hardmask materials can include dielectric materials, metallic materials or a combination thereof. Implementation of an etch with high selectivity (such as a reactive ion etching, or plasma etch process) between the hardmask and device layers can advantageously enable patterning.

In some embodiments, the conductive interconnects coupled with a respective ferroelectric device are discrete island structures. In other embodiments, the conductive interconnect may be a continuous trench line, where a plurality of ferroelectric devices may be coupled with the trench line. In some such embodiments, the transition electrode may be continuous between a respective ferroelectric device and extend along a length of the trench line. In other embodiments, the conductive interconnect may be discrete, but the transition electrode (herein electrode structure) may be continuous between two or more adjacent capacitors. In further embodiments, the conductive interconnects are discrete, but a top electrode of individual ferroelectric capacitors are coupled together by a single conductive plate.

FIG. 1A is a cross-sectional illustration of a device structure 100A, including a region 101A, adjacent to a region 101B above a substrate 150. The region 101A and 101B may be, for example, a memory region and a logic region, respectively or vice versa. In the illustrative embodiment, region 101A is a memory region 101A and region 101B is a logic region 101B.

The memory region 101A includes a plurality of conductive interconnects within level 104. Each conductive interconnect 102 is substantially identical within level 104. The conductive interconnect 102 is laterally surrounded by a dielectric 105. The dielectric 105 includes a material having a low film density, such as for example density less than 90% of theoretical material density. In some embodiments, dielectric 105 includes a material having a dielectric constant that is below 2.75. Dielectric 105 may include $SiO_2$, SiOC, SiC, or $SiO_2$ doped with F. The device structure 100A further includes a level 106 above level 104. Level 106 includes a second dielectric 107. In an embodiment, the dielectric 107 includes an amorphous, greater than 90% film density hydrogen barrier material.

The memory region 101A further includes a trench capacitor 108 in the dielectric 107. The trench capacitors include one or more ferroelectric materials or one or more paraelectric materials. In the illustrative embodiment, each trench capacitor 108 within device structure 100A are substantially identical. While two trench capacitors such as trench capacitor 108 are illustrated, an array can have more than 1000 substantially identical trench capacitors 108. As shown, each trench capacitor 108 is above and electrically coupled with a respective conductive interconnect 102.

The trench capacitor 108 includes a first electrode 109 (herein bottom electrode) comprising a ferroelectric material or a paraelectric material. The bottom electrode 109 includes base portion and substantially vertically sidewall portions. Trench capacitor 108 further includes a ferroelectric or a paraelectric dielectric layer 110 (herein dielectric layer 110) within the bottom electrode 109. As shown, the dielectric layer 110 is substantially conformal to the bottom electrode 109. Trench capacitor 108 further includes a second electrode 111 (herein top electrode) directly in contact with the dielectric layer 110. Top electrode 111 fills a space between the conformal dielectric layer 110.

In the illustrative embodiment, the base portion of the bottom electrode 109 is in contact with an electrode structure 112. As shown, the electrode structure 112 is coupled between a respective trench capacitor 108 and a respective conductive interconnect 102. The electrode structure 112 is laterally surrounded by an etch stop layer 113. In exemplary embodiments, etch stop layer 113 includes a dielectric material. In exemplary embodiments, the dielectric material of the etch stop layer 113 does not include a metal atom. The electrode structure 112 may cover an entire top surface or at least a portion of the top surface of conductive interconnect 102, depending on a lateral thickness (or width), $W_{ES}$, of electrode structure 112 compared to a lateral thickness, $W_{CI}$, of conductive interconnect 102. In the illustrative embodiment, $W_{ES}$ is greater than $W_{CI}$. In embodiments where $W_{ES}$ is greater than $W_{CI}$, electrode structure 112 is also on a portion of the dielectric 105. In some such embodiments, hydrogen may diffuse from the dielectric 105 to the trench capacitor 108. For example, interface 117A between electrode structure 112 and dielectric 105, and interface 117B between electrode structure 112 and etch stop layer 113 may provide pathways for hydrogen diffusion. To prevent hydrogen diffusion through interfaces 117A and 117B, electrode structure 112 can include a hydrogen barrier layer along interfaces 117A and 117B.

The hydrogen barrier layer may have various structural embodiments. In the illustrative embodiment, electrode structure 112 includes a conductive hydrogen barrier 114 and a conductive fill material 115 adjacent to conductive hydrogen barrier 114. As shown, conductive hydrogen barrier 114 extends along interfaces 117A and 117B and is in contact with uppermost surface 102B of conductive interconnect 102. In the illustrative embodiment, conductive hydrogen barrier 114 includes a portion 114A which is below conductive fill material 115 and a portion 114B that laterally surrounds conductive fill material 115. Portion 114B is directly between conductive fill material 115 and etch stop layer 113. Portion 114A is directly between conductive fill material 115 and conductive interconnect 102. In the illustrative embodiment, where $W_{ES}$ is greater than $W_{CI}$, portion 114A is also directly in contact with the dielectric 105. Conductive hydrogen barrier 114 and etch stop layer 113 form a dual hydrogen barrier from below the trench capacitor 108.

Conductive hydrogen barrier 114 includes a material that is amorphous. Amorphous materials lack defined grain boundaries that can facilitate hydrogen diffusion and are thus desirable. Embodiments of the conductive hydrogen barrier 114 include materials such as, but not limited to, TiAlN with >30 atomic percent AlN, TaN with >30 atomic percent N, TiSiN with >20 atomic percent SiN, Ta carbide (TaC), Ti carbide (TiC), tungsten carbide (WC), tungsten nitride (WN), carbonitrides of Ta, Ti, W, i.e., TaCN, TiCN, WCN, titanium monoxide (TiO), titanium oxide $Ti_2O$, tungsten oxide ($WO_3$), tin oxide ($SnO_2$), indium tin oxide (ITO), iridium oxide, indium gallium zinc oxide (IGZO), zinc oxide or METGLAS series of alloys, e.g., $Fe_{40}Ni_{40}P_{14}B_6$ (METGLAS is a Honeywell™). In some embodiments, the conductive hydrogen barrier 114 has a thickness that is less than 5 nm.

The device structure 100A further includes a second dielectric, such as dielectric 107 spanning the entire memory region 101A. In exemplary embodiments, the dielectric 107 includes a hydrogen barrier material where the hydrogen barrier material is amorphous, has a high film density (a film density above 90% of theoretical material density) and is electrically insulating. Amorphous materials prevent diffusion along grain boundary. High film density prevents diffusion through interconnected pores, closing all diffusion pathways. In an embodiment, dielectric 107 includes a metal and oxygen, such as for example $Al_xO_y$, $HfO_y$, $ZrO_x$, $TaO_x$, $TiO_x$, $AlSiO_x$, $HfSiO_x$, or $TaSiO_x$, where x is substantially equal to 2, and where y is an integer. In other embodiments, dielectric 107 includes a nitride of Al, Zr, or Hf, for example AlN, ZrN, or HfN. The dielectric 107 may include a high density $SiO_x$, SiN, SiCN, SiC or SiON. A high-density material has film density greater that 90% of theoretical material density. The dielectric 107 does not include low density SiOx, SiN, SiCN, SiC, or SiON.

As shown dielectric 107 laterally surrounds each trench capacitor 108 and is in direct contact with sidewalls 108A. In the illustrative embodiment, dielectric 107 spans an entire space between any two adjacent trench capacitors 108. In some embodiments, the dielectric 107 is also on portions of an uppermost surface of the trench capacitor 108, such as is shown.

In embodiments, the dielectric 107 includes a material that is compatible with the selection of the conductive ferroelectric oxide materials within the trench capacitor 108. Depending on embodiments, trench capacitor 108 can have three or more layers, while only three layers have been illustrated. In some embodiments an adhesion layer may be inserted between bottom electrode 109 and dielectric 107.

In an embodiment, bottom electrode 109 and top electrode 111 include a conductive ferroelectric oxide (when trench capacitor 108 is a ferroelectric trench capacitor 108). The conductive ferroelectric oxide includes a non-Pb perovskite metal oxide, such as but not limited to, La—Sr—CoO$_3$, SrRuO$_3$, La—Sr—MnO$_3$, YBa$_2$Cu$_3$O$_7$, BizSr$_2$CaCu$_2$O$_8$, or LaNiO$_3$. In various embodiments, the bottom electrode 109 and top electrode 111 include a nanocrystalline to polycrystalline material resulting from a deposition process utilized.

In other embodiments, bottom electrode 109 and top electrode 111 include a metal or a metal alloy. Examples of metal include Ti, Ta, W and Ru and examples of alloy include nitrides of Ti, Ta, W and Ru. In embodiments, the bottom electrode 109 and top electrode 111 have thicknesses of at least 1 nm. In some embodiments, the top electrode 111 has a thickness that fills a space between vertical portions of the dielectric layer 110. In other embodiments, a fill metal may be implemented when the thickness of the top electrode 111 does not fill the space between vertical portions of the dielectric layer 110.

In other embodiments, such as is illustrated in FIG. 1K, the trench capacitor 108 can include metals or metal alloys as well as conductive oxides. In the illustrative embodiment, trench capacitor 108 includes a bottom conductive oxide 175 between the bottom electrode 109 and dielectric layer 110, and a top conductive oxide 176 between dielectric 110 and top electrode 111. In some such embodiments, bottom conductive oxide 175 and top conductive oxide 176 includes a non-Pb perovskite metal oxide, such as but not limited to, La—Sr—CoO$_3$, SrRuO$_3$, La—Sr—MnO$_3$, YBa$_2$Cu$_3$O$_7$, BizSr$_2$CaCu$_2$O$_8$, or LaNiO$_3$.

Referring again to FIG. 1A, in an embodiment, dielectric layer 110 is a ferroelectric dielectric layer 110 that includes non-Pb perovskite material in the form ABO$_3$, where A and B are two cations of different sizes and O is Oxygen. A is generally larger than B in size. In some embodiments, non-Pb Perovskites can also be doped, e.g., by Lanthanides. The non-Pb Perovskite material can include one or more of La, Sr, Co, Cr, K, Nb, Na, Sr, Ru, Y, Fe, Ba, Hf, Zr, Cu, Ta, Bi, Ca, Ti and Ni.

In other embodiments, ferroelectric dielectric layer 110 includes low voltage ferroelectric material sandwiched between top electrode 111 and bottom electrode 109. These low voltage FE materials can be of the form AA'BB'O$_3$, where A' is a dopant for atomic site A and can be an element from the Lanthanides series, where B' is a dopant for atomic site B and can be an element from the transition metal elements such as Sc, Ti, V, Cr, Mn, Fe, Co, Ni, Cu, Zn. A' may have the same valency of site A, with a different ferroelectric polarizability. A voltage below 2-Volts is sufficiently low to be characterized as low voltage.

The ferroelectric dielectric layer 110 is chosen to have a similar young's modulus as the dielectric 107. Furthermore, dielectric 107 is chosen to have a low probability of presence of defects at the interface between dielectric 107 and the ferroelectric dielectric layer 110. Additionally, dielectric 107 has a lower dielectric constant than the dielectric constant of the ferroelectric dielectric layer 110 to enable field lines to be concentrated between the top electrode 111 and the bottom electrode 109. In some embodiments, the ferroelectric dielectric layer 110 can dictate a choice of the dielectric 107.

For example, in some embodiments, where ferroelectric dielectric layer 110 include a Pb$_x$Zr$_{1-x}$Ti$_y$O$_3$ group of families, dielectric 107 can include Al$_x$O$_y$, HfO$_x$, ZrO$_x$, TaO$_x$ or TiO$_x$. In some embodiments, where ferroelectric dielectric layer 110 include a La$_x$Bi$_{1-x}$Fe$_y$O$_3$ group of families, dielectric 107 can include Al$_x$O$_y$, HfO$_x$, ZrO$_x$, TaO$_x$ or TiO$_x$. In some embodiments, where ferroelectric dielectric layer 110 include a BaTiO$_3$ group of families, dielectric 107 can include Al$_x$O$_y$, HfO$_x$, ZrO$_x$, TaO$_x$ or TiO$_x$. In some embodiments, where ferroelectric dielectric layer 110 include a BiFeO$_3$ group of families, dielectric 107 can include Al$_x$O$_y$, HfO$_x$, ZrO$_x$, TaO$_x$ or TiO$_x$.

In the illustrative embodiment, level 106 further includes a via electrode 118 coupled with each trench capacitor 108. The via electrode 118 may include different structures. In each embodiment, the via electrode 118 includes at least one conductive hydrogen barrier, such as conductive hydrogen barrier 120 on the trench capacitor 108, a liner layer 122 on the conductive hydrogen barrier 120 and a conductive fill material 124 on the liner layer 122. In the illustrative embodiment, the conductive hydrogen barrier 120 laterally surrounds the liner layer 122, and the liner layer 122 laterally surrounds the conductive fill material 124. The conductive fill material 124 may include a material such as tantalum, titanium, ruthenium, tungsten, molybdenum, or copper.

The conductive hydrogen barrier 120 is on a portion of the trench capacitor 108 to prevent shorting between the bottom electrode 109 and top electrode 111. In the illustrative embodiment, conductive hydrogen barrier 120 includes a lateral portion in contact with the top electrode 111 and further extends on to a portion of the dielectric layer 110. The conductive hydrogen barrier 120 includes substantially vertical portions, connected to the lateral portion, and directly adjacent to the dielectric 107. As shown. the via electrode is laterally surrounded by dielectric 107. In one such embodiment, the conductive hydrogen barrier 120 and the dielectric 107 combine to provide a seal against hydrogen diffusion to dielectric layer 110 and to bottom electrode 109.

Embodiments of the conductive hydrogen barrier 120 include a material that is amorphous. Amorphous materials lack defined grain boundaries that can facilitate hydrogen diffusion and are thus desirable. Embodiments of the conductive hydrogen barrier 120 include materials such as, but not limited to, TiAlN with >30 atomic percent AlN, TaN with >30 atomic percent N, TiSiN with >20 atomic percent SiN, Ta carbide (TaC) Ti carbide (TiC), tungsten carbide (WC), tungsten nitride (WN), carbonitrides of Ta, Ti, W, i.e., TaCN, TiCN, WCN, titanium monoxide (TiO), titanium oxide (Ti$_2$O), tungsten oxide (WO$_3$), tin oxide (SnO$_2$), indium tin oxide (ITO), iridium oxide, indium gallium zinc oxide (IGZO), zinc xoide or METGLAS series of alloys, e.g., Fe$_{40}$Ni$_{40}$P$_{14}$B$_6$ (METGLAS is a Honeywell™). In some embodiments, the conductive hydrogen barrier 120 has a thickness that is dependent on $W_V$. In some embodiments, conductive hydrogen barrier 120 has a thickness that is less than 5 nm. It is to be appreciated that conductive hydrogen barrier 120 may include a material that is the same or different from the material of conductive hydrogen barrier 114.

The conductive interconnect 102, electrode structure 112 and the trench capacitor 108 can have widths that are substantially independent of each other. A spacing, $S_M$, between adjacent trench capacitors 108 depends on which of the conductive interconnect 102, electrode structure 112 and the trench capacitor 108 has the largest width. In embodiments, when $W_{ES}$ is greater than $W_{MD}$, and $W_{CI}$, as is shown, $S_M$ is determined by a spacing, $S_{ES}$, between the adjacent electrode structures 112. In some such embodiments, $S_M$ is larger than $S_{ES}$ and $S_M$ may range between 20 nm and 50 nm.

Reduction in $S_{ES}$ also leads to reduction in $S_M$. However, dielectric 107 provides further advantages when $S_{ES}$ is reduced. Dielectric 107 permits adequate insulation and prevents hydrogen from diffusing against sidewalls 108A such that no spacer is needed between trench capacitor 108 and dielectric 107.

Figure 1C:
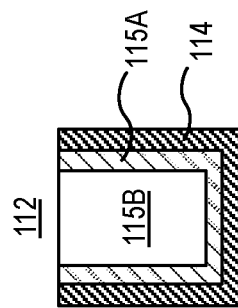
FIG. 1C is a cross-sectional illustration of an embodiment of an electrode structure that includes a liner layer between a conductive hydrogen barrier and a conductive fill material.
Figure 1B:
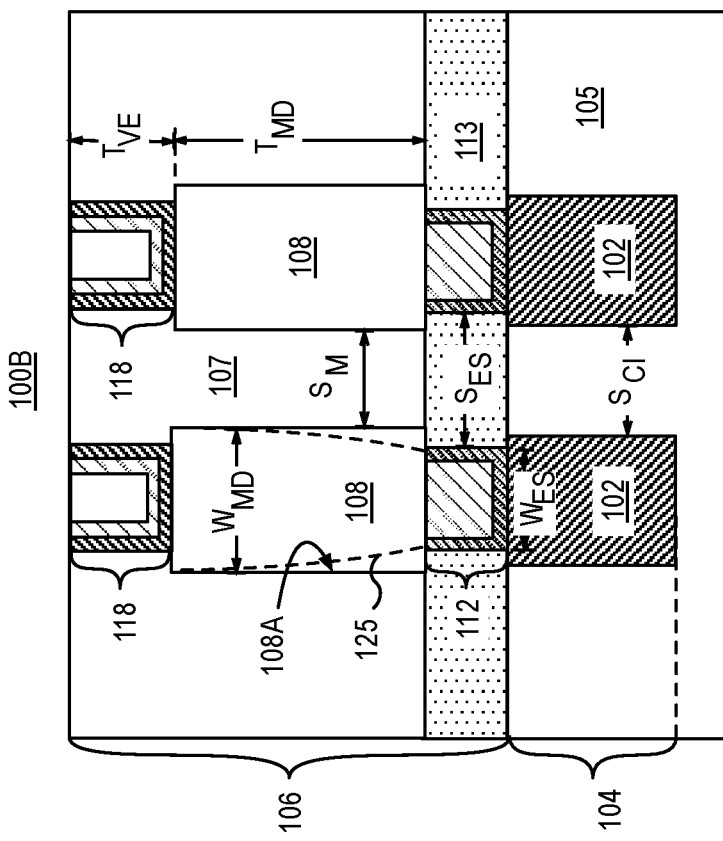
FIG. 1B is a cross-sectional illustration of the device structure in FIG. 1A, in an embodiment where the spacing between two adjacent memory devices is less than a spacing between electrode structures directly below two adjacent memory devices.

Dielectric 107 may provide further advantages when $S_M$ is less than $S_{ES}$. FIG. 1B is a cross-sectional illustration of the device structure 100B, in accordance with an embodiment of the present disclosure. Logic region 101B is not shown for clarity. Device structure 100B is an embodiment of the device structure 100A. In the illustrative embodiment, $W_{ES}$ is less than $W_{MD}$, and $W_{CI}$. When $W_{ES}$ is less than $W_{MD}$, and when $W_{MD}$ is greater than $W_{CI}$, $S_M$ can be less than $S_{ES}$, as shown. In some such embodiments, $S_M$, can be between 20 nm and 50 nm. Reducing $S_M$ can advantageously increase the density of trench capacitors per unit plan view area of device structure 100B. While two trench capacitors 108 are shown, the memory region can include 1000 trench capacitors 108 arranged in an array.

In some embodiments, the spacing, $S_M$, between adjacent trench capacitors 108 may be comparable to or less than height, $T_{MD}$, of the trench capacitor 108. In some such embodiments, a single dielectric 107 including a material that can act as a barrier against hydrogen diffusion can be implemented without inclusion of spacers adjacent to trench capacitors 108. In some embodiments, avoiding implementation of spacer layer adjacent to trench capacitors 108 can also help to tune the height, $T_{MD}$, of trench capacitor 108.

In some embodiments, $S_M$ may depend on a total thickness of layers in the stack of the trench capacitor 108. In some embodiments, sidewalls 108A are tapered as indicated by dashed lines 125. The taper in sidewall 108A can increase and maximum $S_M$. Taper in sidewall 108A may increase with a taller stack (or an increase in $T_{MD}$) further increasing $S_M$. However, trench capacitor 108 may need to have a minimum height for device functionality. In some such embodiments, a single dielectric such as dielectric 107 provides substantial advantages as density of trench capacitors 108 is increased because a single insulator material can be present in the space between two adjacent trench capacitors 108. Increase in $S_M$ reduces space to implement a spacer within sidewalls of a trench that defines a width, $W_{MD}$, of trench capacitor 108.

In general, the lateral thicknesses $W_{CI}$ and $W_{ES}$ can be independent of each other. A $W_{ES}$ that is greater than $W_{CI}$ or $W_{CI}$ and $W_{MD}$, may determine choice of material of electrode structure 112 and conductive fill material 115. The conductive fill material 115 may include a material such as tantalum, titanium, ruthenium, tungsten, molybdenum, or copper. For example, when $W_{ES}$ is greater than $W_{MD}$, electrode structure 112 may not include a material such as copper to prevent sputtering of the electrode structure 112 during fabrication of the trench capacitor 108. When $W_{ES}$ is less than $W_{MD}$ (as illustrated in FIG. 1B) conductive fill material 115 may include copper. In some embodiments, depending on the material, the conductive fill material 115 can further include an adhesion liner 115A and a fill metal 115B on the adhesion liner 115A as illustrated in FIG. 1C.

Referring again to FIG. 1A, in different embodiments, $W_{CI}$ can depend on a plan view shape of the conductive interconnect 102. Conductive interconnect 102 and the electrode structure 112 can have a variety of plan view shapes as will be discussed below. The relative shapes (discussed below) of the electrode structure 112 and conductive interconnect 102 can determine relative alignment between sidewalls 112A and 102A. In some embodiments, the trench capacitor 108 can be directly in contact with the conductive hydrogen barrier 114, if $W_{MD}$ and $W_{ES}$ are substantially similar and if there is positional misalignment.

In some embodiments, etch stop layer 113 includes a material such as silicon, nitrogen and/or carbon. In exemplary embodiments, etch stop layer 113 includes a material that is different from the material of the dielectric 107. The etch stop layer 113 and the electrode structure 112 have a thickness that is determined by a vertical thickness of the trench capacitor 108 and thickness, $T_{106}$, of the level 106. As shown the etch stop layer 113 has a vertical thickness, $T_L$, and the electrode structure 112 has a vertical thickness $T_{ES}$. In the illustrative embodiment, $T_L$, is substantially equal to $T_{ES}$. As such an uppermost surface 113A is co-planar or substantially co-planar with uppermost surface 112B. In some embodiments, portions of the uppermost surface 112B is concaved due to a processing methodology utilized. Thicknesses of conductive hydrogen barrier 114 and conductive fill material are determined by a desired $T_{ES}$. In most embodiments thickness of conductive fill material 115 is equal to or greater than that the thickness of the conductive hydrogen barrier 114.

Relative size of $W_{CI}$, $W_{ES}$ and $W_{MD}$, can also provide flexibility in a thickness of the etch stop layer 113 or electrode structure 112. In some examples when $W_{ES}$ is greater than $W_{MD}$, $T_{ES}$ and $T_{EL}$ can be relatively thinner compared to when $W_{ES}$ is less than $W_{MD}$ because of process margins to be discussed below.

As shown, and via electrode 118 has a vertical thickness, $T_{VE}$. Level 106 has a vertical thickness, $T_{106}$ that is substantially equal to a combined sum of $T_{ES}$, $T_{MD}$, and $T_{VE}$. It is to be appreciated that individual thicknesses $T_{ES}$, $T_{MD}$, and $T_{VE}$ may be co-dependently chosen to optimize performance of trench capacitor 108. For example, $T_{MD}$ may vary between 30 nm and 90 nm and $T_{ES}$ and $T_{VE}$ may be adjusted co-dependently to balance $T_{106}$.

In the illustrative embodiment, logic region 101B includes an interconnect structure 127 spanning levels 104 and 106. Interconnect structure 127 includes one or more conductive interconnects in level 104 and one or more vias and metal lines coupled with conductive interconnect 128 in level 106. In the illustrative embodiment, interconnect structure 127 includes conductive interconnect 128 in level 104 and a via structure 140.

In the illustrative embodiment, level 106 within the logic region further includes a dielectric 142 on the etch stop layer 113, where dielectric 142 is directly adjacent to the dielectric 107. Dielectric 142 includes a material that is designed to minimize electrical impact to logic circuitry, for example signal delays such as RC delays. Such electrical impact can arise due to scaling in feature sizes of metallic interconnects, such as vias and metal lines, as well as due to reduction in space between them. Increase in capacitive coupling and electrical resistance can increase signal delays. However, reducing a dielectric constant of the dielectric 107 can ameliorate electrical impact. Lowering the dielectric constant may be generally associated with increasing porosity in the film. Film porosity may be greater than 90 atomic percent by volume in dielectric 107. In some embodiments dielectric 142 has a dielectric constant of approximately 3.5 or less. In embodiments dielectric 142 includes silicon and oxygen (such as low K $SiO_2$). In the illustrative embodiment, dielectric 142 laterally surrounds at least a portion of the via structure 140. In some embodiments, dielectric 142 has a dielectric constant that is less than the dielectric constant of dielectric 107. Depending on $T_L$ an $T_{106}$, dielectric 142 includes a material with a low film density (a film density much below 90% of theoretical material density) for example low density $SiO_2$, carbon doped oxide (CDO), SiOC, SiCN, SiC, SiOxNy, F-doped oxides, or H-doped oxides.

In the illustrative embodiment, etch stop layer 113 extends continuously from memory region 101A to logic region 101B. At least a portion of the via structure 140 is adjacent to the etch stop layer 113, as shown. The etch stop layer 113 may be in contact with the conductive interconnect 128 depending on a lateral thickness of the via structure 140. In some embodiments, such as is shown, at least a portion of the etch stop layer 113 is on the conductive interconnect 128.

Via structure 140 has a vertical thickness, $T_V$, as measured from a lower most point of level 104 or from surface 128A of conductive interconnect 128. In exemplary embodiments, $T_V$ is equal to a combined sum of individual thicknesses $T_{ES}$, $T_{MD}$, and $T_{VE}$. In some embodiments, $T_V$ is between 50 nm and 100 nm. In other embodiments, $T_V$ is between 100 nm and 200 nm.

In an embodiment, $T_{MD}$ has a thickness between 5 nm and 100 nm and $T_{ES}$ has a thickness between 2 nm and 20 nm. In an embodiment, sum of $T_{MD}$ and $T_{ES}$ is approximately less than 90% of $T_V$.

Conductive interconnect 128 has one or more properties of conductive interconnect 102. Conductive interconnects 102 and 128 include a metal such as copper, cobalt, molybdenum, tungsten or ruthenium. In some embodiments, conductive interconnects 102 and 128 include a liner layer and a fill metal on the liner layer. For example, the liner layer may include a material, such as but not limited to, ruthenium, cobalt or tantalum and the fill metal may include copper, molybdenum or tungsten. Conductive interconnects 102 and 128 have a thickness that spans a portion of dielectric 105 within level 104. There may be other vias and interconnect routing connections within level 104 that are not shown in the Figure. The conductive interconnects 102 and 128 may be discrete vias or continuous trenches, as will be discussed further below.

In the illustrative embodiment, via structure 140 includes a liner layer 144 and a conductive fill material 146 on the liner layer 144. For example, liner layer 144 may include a material, such as but not limited to, ruthenium, cobalt, tantalum, or nitrides of tantalum and titanium, and conductive fill material 146 may include copper, molybdenum, or tungsten. In some embodiments, via structure 140 include a same or substantially the same material as the material of the conductive interconnect 102.

Substrate 150 may include a suitable substrate such as is utilized in semiconductor device fabrication and may comprise a material such as silicon, germanium, silicon germanium, group III-V materials, group III-N materials or quartz.

Figure 1D:
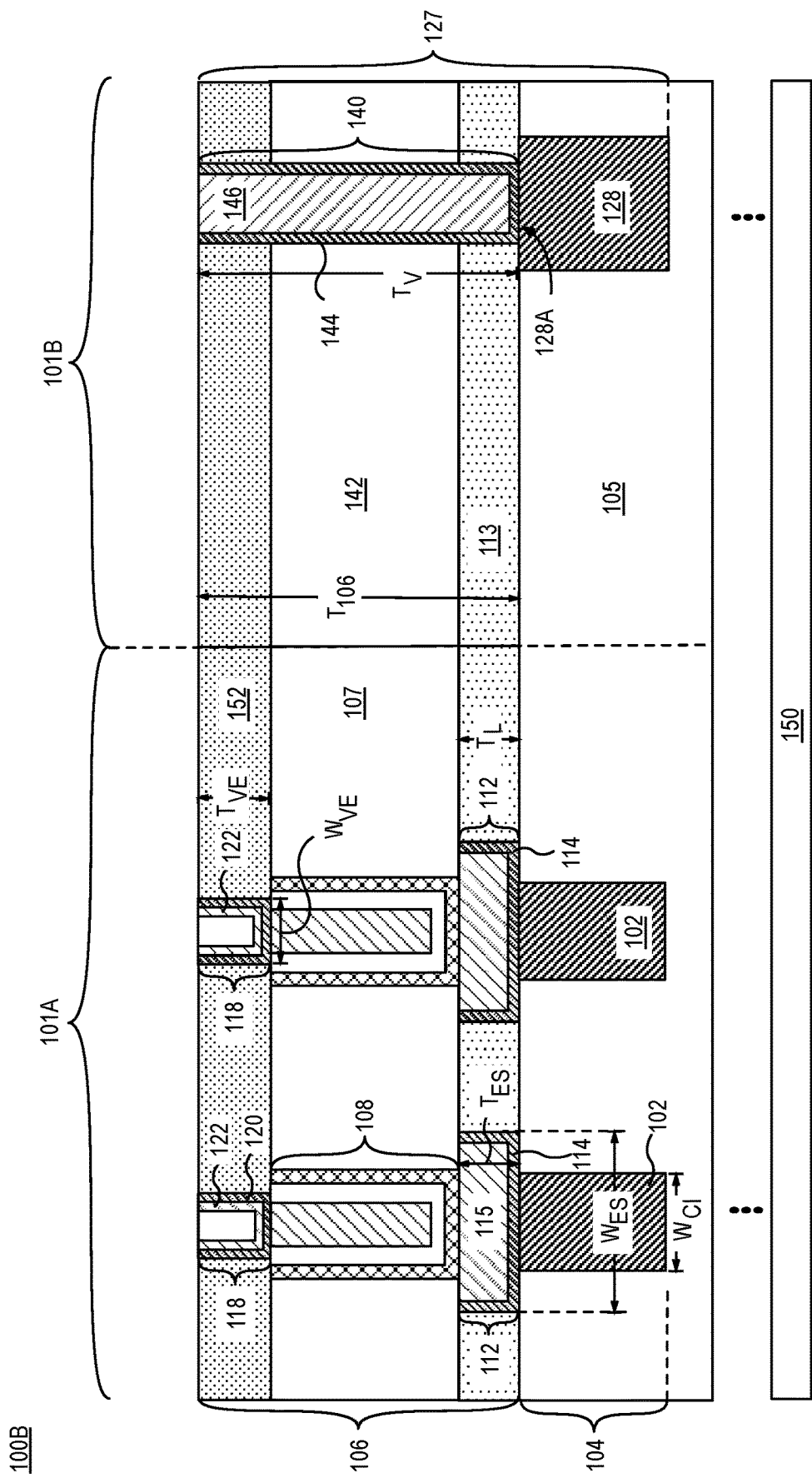
FIG. 1D is an example of a device structure in FIG. 1A, where a portion of the first dielectric above the trench capacitor is replaced by a second dielectric, and where the second dielectric includes via electrodes.

FIG. 1D is an example of a device structure 100B, where a portion of the dielectric 107 above the trench capacitor 108 is replaced by a dielectric 152. Device structure 100B includes many of the features of device structure 100A, such as for example trench capacitor 108, electrode structure 112, via structure 140 and conductive interconnects 102 and 128. In the illustrative embodiment, via electrode is laterally surrounded by a dielectric 152. Via electrode 118 is the same or substantially the same as via electrode 118 described in association with FIG. 1A. In exemplary embodiments dielectric 152 includes silicon nitride, or carbon doped silicon nitride material having a film density above 90% of theoretical material density or film density. As shown, an upper portion of the via structure 140 is laterally in contact with a dielectric 152. The dielectric 152 also covers bottom electrode 109 and in some embodiments dielectric 152 also covers some or all of the dielectric layer 110. Dielectric 152 provides a hydrogen barrier for trench capacitor 108.

Figure 1E:
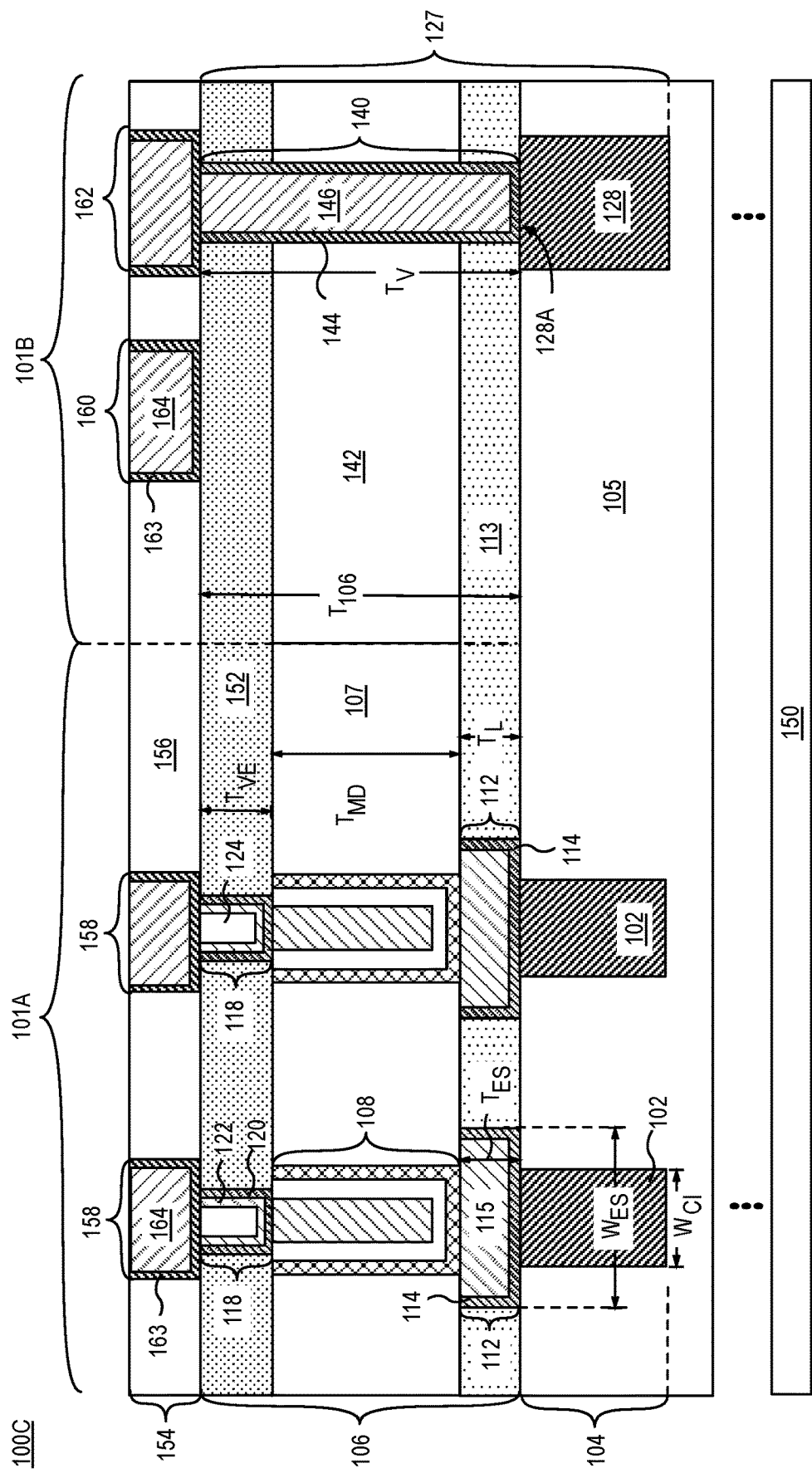
FIG. 1E is a cross-sectional illustration of a device structure that includes a plurality of metal lines on a level above the via electrodes.

FIG. 1E is a cross-sectional illustration of a device structure 100C that includes a level 154 above level 106, where level 154 includes a dielectric 156. In embodiments, dielectric 156 includes a low K ILD material such as low K $SiO_2$, SiON or SiC. The device structure 100C includes all of the features of device structure 100B (FIG. 1D).

Device structure 100C further includes a metal line 158 on the via electrode 118. In an embodiment, metal lines 158 couple a plurality of trench capacitors 108 along direction into the page of the figure (along y-direction). In other embodiments, metal lines 158 couple a plurality of adjacent trench capacitors 108 along the x-direction.

In the illustrative embodiment, device structure 100C further includes a plurality of metal lines 160 and 162, where metal line 162 is coupled with conductive interconnect 128 through via structure 140.

In an embodiment, metal lines 158, 160, and 162 include a same or substantially the same material. In the illustrative embodiment, metal lines 158, 160, and 162 include a liner layer 163 and a conductive fill material 164 on the liner layer 163. In an embodiment, liner layer 163 includes a material that is the same or substantially the same as the material of the liner layer 144, conductive fill material 164 includes a material that is the same or substantially the same as the material of the conductive fill material 146.

Figure 1F:
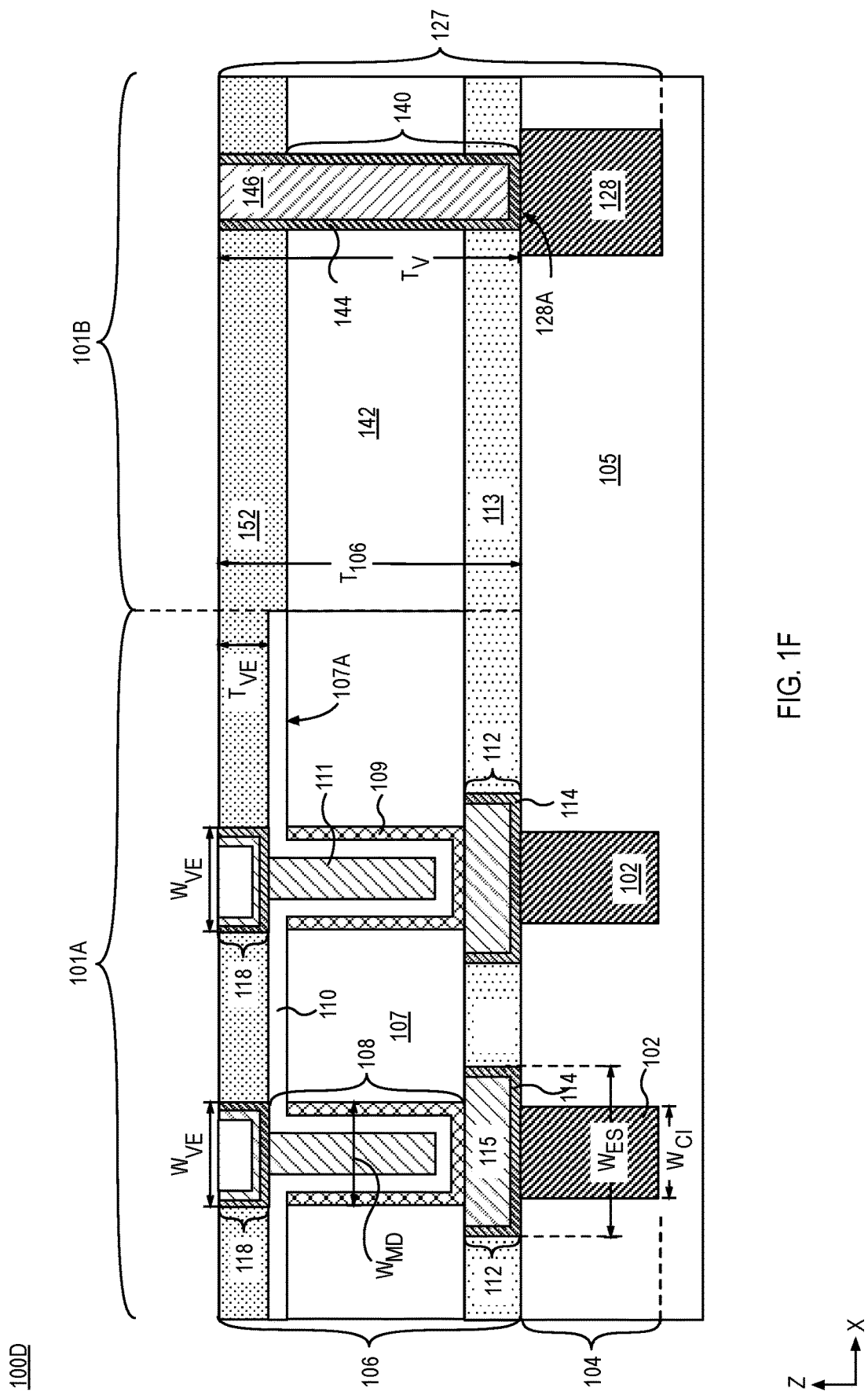
FIG. 1F is a cross-sectional illustration of a device structure, where a dielectric layer is continuous between adjacent trench capacitors.

FIG. 1F is a cross-sectional illustration of a device structure 100D, where the dielectric layer 110 is continuous between adjacent trench capacitors 108. In the illustrative embodiment, the dielectric layer 110 is continuous between adjacent trench capacitors 108 along the x-direction. In other embodiments, dielectric layer 110 is continuous between adjacent trench capacitors 108 along the y direction. In some other embodiments, dielectric layer 110 is continuous between adjacent trench capacitors 108 in both x and y directions. In the illustrative embodiment, dielectric 110 extends over the bottom electrode 109 and on the dielectric 107. The top electrode 111 is substantially confined within dielectric 107. A portion of top electrode 111 extends above an uppermost surface 107A.

A continuous extension of dielectric layer 110 over dielectric 107 prevents shorting between bottom electrode 109 and top electrode 111. The via electrode 118 may be also misaligned relative to the top electrode 111. A continuous extension of dielectric layer 110 enables the via electrode 118 to have an increased width, $W_{VE}$. In an embodiment, $W_{VE}$ is comparable to $W_{MD}$.

As shown, dielectric 110 extends to an edge of the region 101A to prevent a high dielectric film from affective signal performance in the conductive interconnect structure in region 101B.

Dielectric 152 includes a high-density film that acts as an insulative hydrogen barrier. In exemplary embodiments where dielectric 152 also extends to region 101B and adjacent to via structure 140, dielectric 152 includes a material such as silicon nitride or carbon doped silicon nitride. It is to be appreciated that vertical thickness, $T_{152}$ of dielectric 152 varies between region 101A and 101B.

Figure 1H:
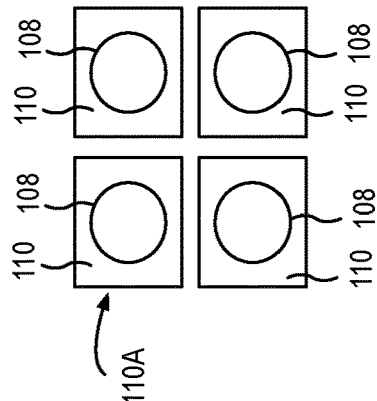
FIG. 1H is a plan view illustration of the structure in FIG. 1G where the dielectric layer extends outside a perimeter of respective trench capacitors but is not continuous between adjacent trench capacitors.
Figure 1I:
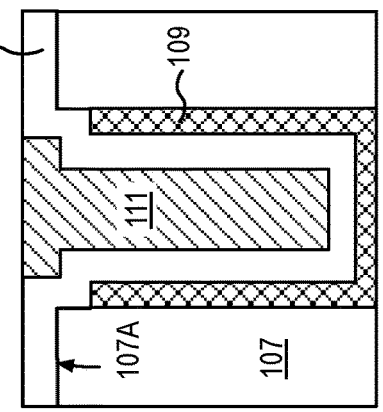
FIG. 1I is a cross-sectional illustration where a bottom electrode in a trench capacitor is recessed below a level of the dielectric layer in the trench capacitor.
Figure 1G:
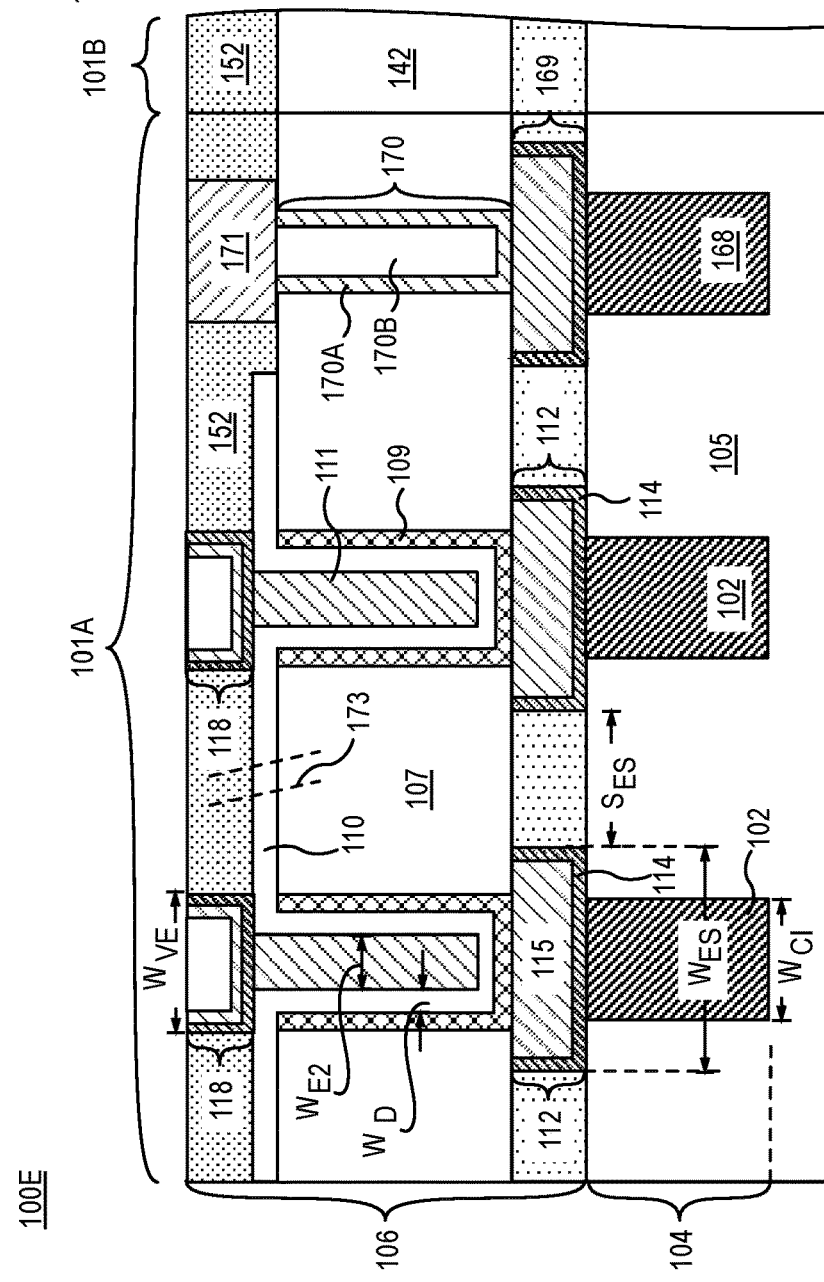
FIG. 1G is a cross-sectional illustration of a device structure in FIG. 1F, where the dielectric layer does not extend to a boundary between the first region and the second region, and where the device structure further includes a through via interconnect, in accordance with an embodiment of the present disclosure.

In other embodiments, dielectric layer 110 does not extend to a boundary between regions 101A and 101B, as illustrated in device structure 100E in FIG. 1G. As shown, device structure 100E further includes a conductive interconnect 168, an electrode structure 169 on conductive interconnect 168 in region 101A. A through via 170 is a routing via that extends from above electrode structure 169 to a via electrode 171 within dielectric 152. In some embodiments, dielectric layer 110 does not extend to the routing via 170 or via electrode 171.

In other embodiments, the dielectric layer 110 is in contact with through via 170 and has no appreciable impact on device functionality.

Conductive interconnect 168 and electrode structure 169 may be structurally identical to conductive interconnect 102 and electrode structure 112. In an embodiment, via electrode 170 includes a liner layer 170A and a fill material 170B. Liner layer 170A may include a material, such as but not limited to, ruthenium, cobalt, tantalum, or nitrides of tantalum and titanium, and the fill material 170B may include molybdenum or tungsten.

In some embodiments, the dielectric layer 110 is not continuous between adjacent trench capacitors 108 (as indicated break in lines denoted be dashed lines 173).

FIG. 1H is a plan view illustration of the structure in FIG. 1G where the dielectric layer 110 extends outside a perimeter of trench capacitor 108 but is not continuous between adjacent trench capacitors 108. As shown perimeter 110A of dielectric layer 110 extends outside of the trench capacitor 108. The plan view shape of trench capacitors 108 is circular in the embodiment. Other embodiments may include rectangular or elliptical plan view shapes. Discontinuity may reduce cross talk between adjacent trench capacitors.

In some embodiments, bottom electrode 109 is recessed below an uppermost surface 107A of dielectric 107, as illustrated in the cross-sectional illustration of FIG. 1I. In some such embodiments, a recessed bottom electrode 109 can provide further margin for preventing a short between bottom electrode 109 and top electrode 111. As shown, dielectric 110 extends on an upper portion of the bottom electrode 109 and separates the bottom electrode 109 from the top electrode 111.

In some embodiments, dielectric 107 may be replaced by dielectric 142 as illustrated in FIG. 1J. In some such embodiments, trench capacitor 108 in device structure 100F, is surrounded by a combination of hydrogen barrier materials. In an embodiment, device structure 100F includes many features of device structure 100A, such as conductive interconnect 102, electrode structure 112, trench capacitor 108, etch stop layer 113, via structure 140 and conductive interconnect 128.

In the illustrative embodiment, a spacer 174 is directly adjacent to bottom electrode 109. Spacer 174 includes an insulative hydrogen barrier material. In an embodiment, spacer 174 includes a material that is the same or substantially the same as the material of the of dielectric 107 (FIG. 1A). Spacer 174 extends between dielectric 142 and bottom electrode 109. The uppermost portion of spacer 174 is coplanar or substantially co-planar with an uppermost portion of bottom electrode 109, dielectric layer 110 and top electrode 111, and uppermost surface 142A.

When dielectric 142 is a material having a low film density that is not a hydrogen barrier, dielectric 142 does not extend over the bottom electrode 109 or dielectric layer 110. In the illustrative embodiment, dielectric 152 extends over portions of trench capacitor 108 and on spacer 174. Dielectric 152 includes a high film density material such as silicon nitride, or carbon doped silicon nitride. The combination of spacer 174 and dielectric 152 provide a barrier against hydrogen diffusion into trench capacitor 108.

As shown, via structure 140 includes an upper portion that is laterally surrounded by dielectric 152.

Figure 2A:
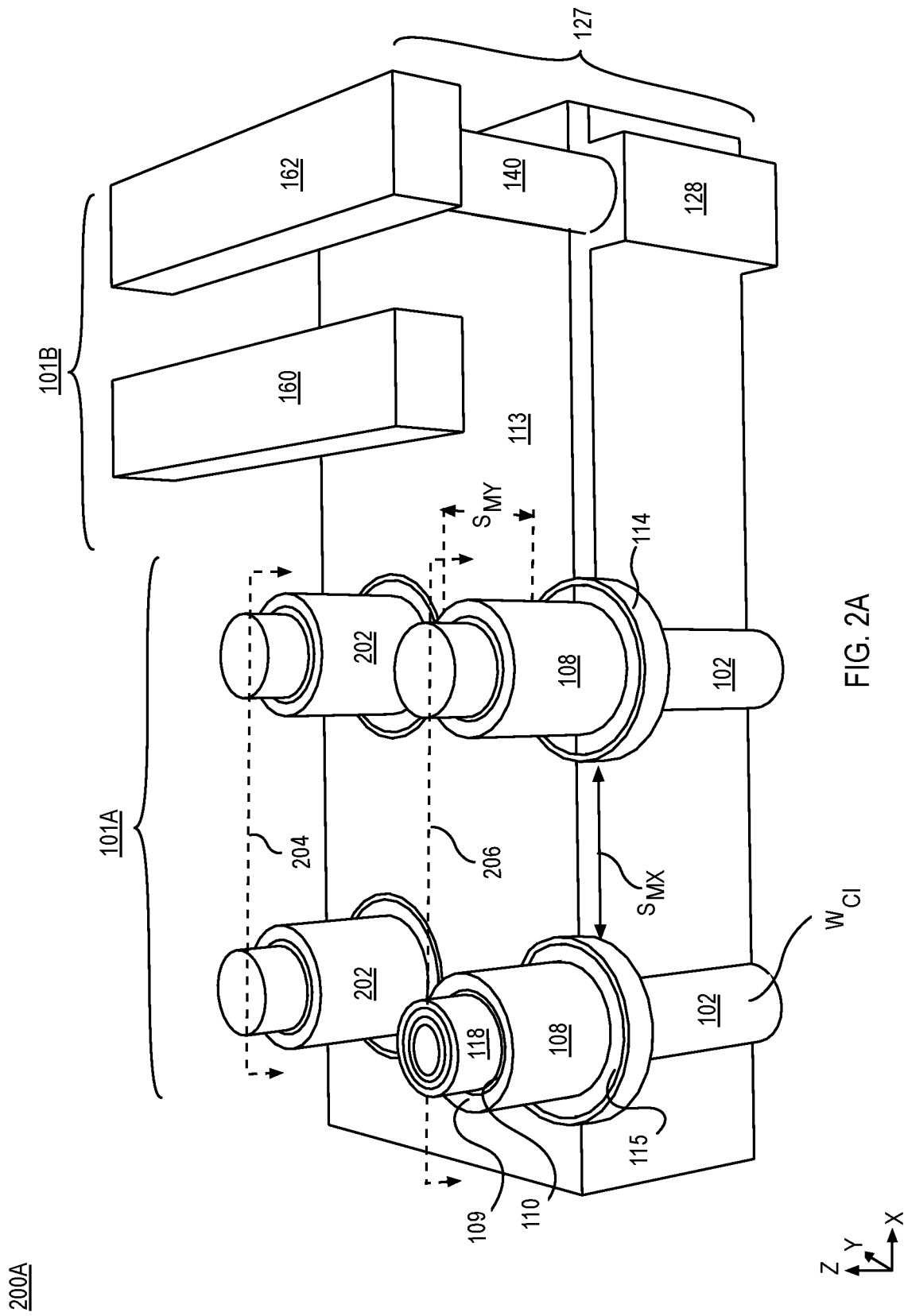
FIG. 2A is an isometric illustration of the device structure in FIG. 1A, where conductive interconnect that is coupled with a respective trench capacitor has a discrete island structure, in accordance with an embodiment of the present disclosure.

FIG. 2A is an isometric illustration of the device structure 200A, in accordance with an embodiment of the present disclosure. Device structure 200A includes many of the features of device structure 100C described in association with FIG. 1A. As shown, conductive interconnects 102 are discrete islands. Device structure 200A further includes features not illustrated in FIG. 1A as well as some variations in features of certain structures. The dielectric 107, 142 and 152, and metal lines 158 are not illustrated for clarity.

Device structure 200A includes a plurality of memory devices such as trench capacitor 202 on plane 204, behind a plane 206 of trench capacitor 108. Trench capacitor 202 is substantially identical to and has all the properties of trench capacitor 108. In the illustrative embodiment, each of the trench capacitors 108 and 202 are coupled with a respective conductive interconnect 102.

As shown each conductive interconnect 102 has a discrete island structure (i.e., a conductive interconnect surrounded by dielectric 105). The conductive interconnect 102 may include a variety of shapes. As illustrated conductive interconnect 102 is discrete, cylindrical, and spaced apart from an adjacent conductive interconnect 102. In some such embodiments, lateral thickness or width, $W_{CI}$ is also a diameter.

In the illustrative embodiment, the respective trench capacitor 108 and trench capacitor 202 have a cylindrical shape. In some such embodiments lateral thickness or width, $W_{MD}$, is a diameter of the respective trench capacitor 108 or trench capacitor 202. In other embodiments, trench capacitors can have a tapered cylindrical shape (for example a cross section of a tapered cylindrical trench is shown in FIG. 4B).

In the illustrative embodiment, electrode structure 112 also has a cylindrical shape. In some such embodiments $W_{ES}$, is a diameter of the electrode structure 112. However, it is to be appreciated that the shape of the electrode structure 112 can be independent of the shape of the trench capacitor 108 or 202, or a shape of conductive interconnect 102. As shown a portion of the conductive hydrogen barrier 114 is an annular shaped ring around the conductive fill material 115.

In the illustrative embodiment, each electrode structures 112 is spaced apart from an adjacent electrode structures 112 by a distance, $S_M$ along the x-direction and along the y-direction. In embodiments, $S_M$ along the x-direction and along the y-direction may be the same or different.

In the illustrative embodiment, conductive interconnect 128 is a conductive trench interconnect 128 that extends along the y-direction. As shown, metal lines 160 and 162 also extend along the y-direction. In some embodiments, via structure 140 is conductive via between metal line 162 and conductive trench interconnect 128. In other embodiments, interconnect structure 127 can include a plurality of vias such as via structure 140 between metal line 160 and conductive interconnect 128 to prevent an increase in electrical line resistance. In other embodiments, via structure 140 may be replaced by a metal line (not illustrated).

In some embodiments, conductive interconnect 102 is a trench interconnect 208, as illustrated in device structure 200B of FIG. 2B. Only the memory region 101A is illustrated for clarity. The trench interconnect 208 may continuously extend continuously from under trench capacitor 108 on plane 206 to under trench capacitor 202 on plane 204, as shown. In the illustrative embodiment, the trench interconnect 208 couples bottom electrode 109 of trench capacitor 108 and 202 along a length of the trench (along the y-direction). In embodiments, trench interconnect 208 includes a material that is the same or substantially the same as the material of the conductive interconnect 102. Trench interconnect 208 is not exposed to trench capacitor 108 or 202 during memory device fabrication. As shown, the conductive hydrogen barrier 114 and the etch stop layer 113 act as a collective hydrogen barrier.

As shown, where etch stop layer 113 extends over the trench interconnect 208, the electrode structure 112 can have a shape and/size that is independent of the shape of trench interconnect 208. It is also to be appreciated that electrode structure 112 can be offset along the x or the y direction relative to the trench interconnect 208, without loss of device functionality, as long as there is at least 50% overlap.

As discussed above, the shape of the electrode structure 112 may be independent of the trench interconnect 208 or the trench capacitor 108. The electrode structure 112 (depicted in FIG. 2A) has a cylindrical shape. However, the electrode structure 112 can be rectangular in other embodiments, such as is illustrated in FIG. 2C (the etch stop layer 113 or dielectric 107 is not shown for clarity). As shown, the conductive interconnect 102, in the memory region 101A are discrete islands, however, electrode structure 112 is a trench electrode structure 210 that couples two or more trench capacitors 108. Trench electrode structure 210 may extend laterally from above a conductive interconnect 102 on plane 206 to above conductive interconnect 102 on plane 204, behind plane 206. As such, trench electrode structure 210 couples a lower most electrode of the respective trench capacitors 108 and 202. Trench electrode structure 210 provides enhanced flexibility to couple a selected number of memory devices along a row without having to provide a continuous trench. The flexibility to choose the number of devices and groups of devices can provide additional electrical advantages such as for programming. Trench electrode structure 210 has one or more properties of electrode structure 112, such as conductive hydrogen barrier 114 and conductive fill material 115. As shown, conductive hydrogen barrier 114 extends along the length and width $L_{TE}$ and a width $W_{TE}$. In some embodiments, $W_{TE}$ is smaller or greater than $W_{MD}$, or $W_{CI}$. As shown, $W_{TE}$ is greater than $W_{MD}$, and $W_{CI}$. $L_{TE}$ is substantially greater than $W_{CI}$. Although as illustrated, $W_{TE}$ is greater than $W_{CI}$, in other embodiments, $W_{TE}$ can be less than $W_{CI}$ without loss of functionality. Furthermore, as explained above, $W_{MD}$ can be independent of $W_{TE}$. In embodiments, where $W_{MD} > W_{TE}$, a portion of the conductive hydrogen barrier 114 and a portion of the conductive fill material 115 are in contact with a lower most surface of the bottom electrode 109.

Figure 3B:
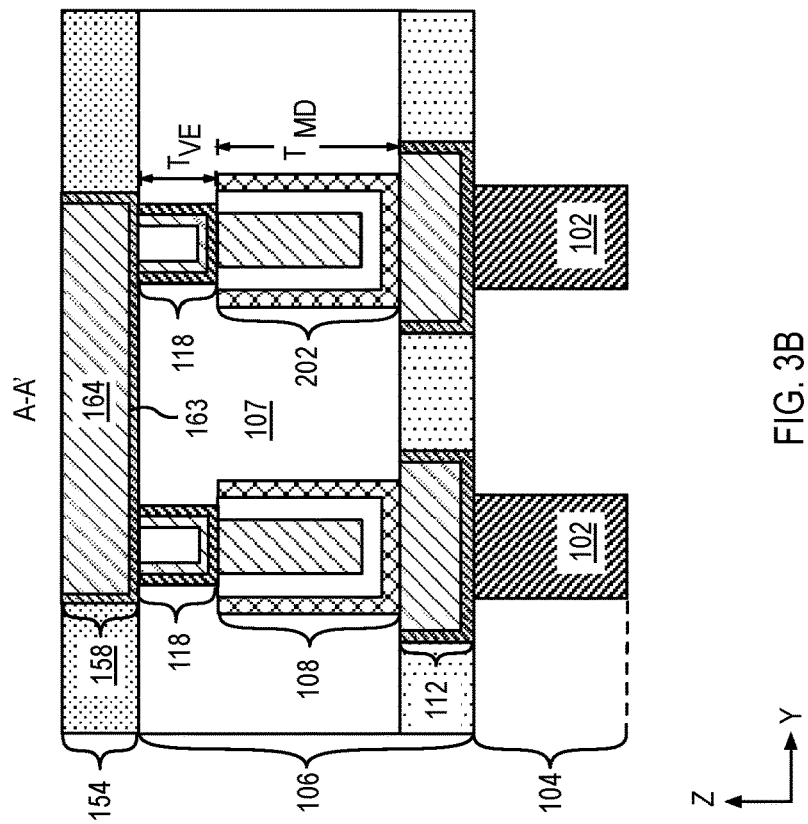
FIG. 3B is a cross sectional illustration, though a line A-A' of the device structure in FIG. 3A, in accordance with an embodiment of the present disclosure.
Figure 3A:
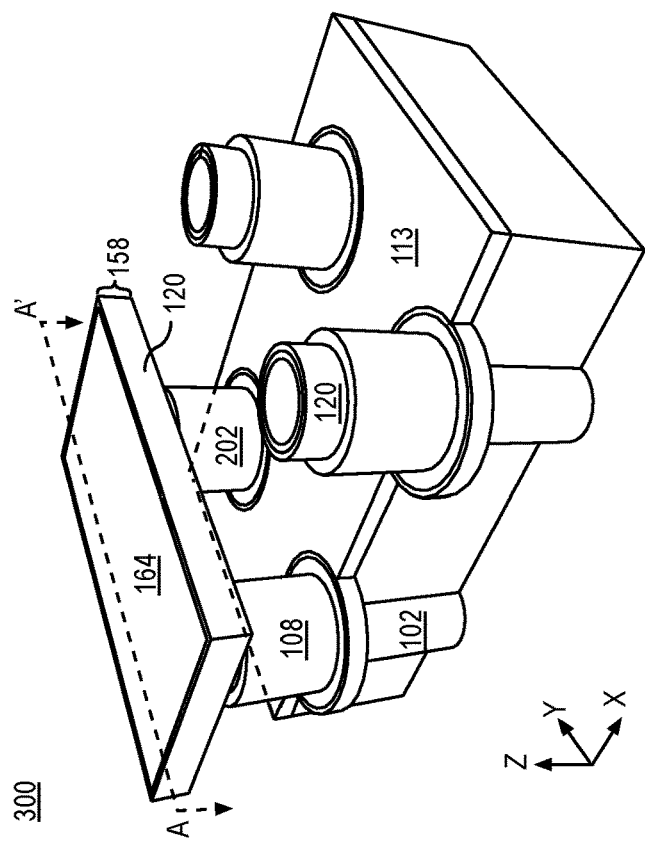
FIG. 3A is an isometric illustration of the device structure in FIG. 2A, in accordance with an embodiment of the present disclosure.

FIG. 3A is an isometric illustration of device structure 300, in accordance with an embodiment of the present disclosure. Device structure includes one or more features of the device structure 100C illustrated in FIG. 1E. In the illustrative embodiment, metal line 158 extends from above trench capacitor 108 to above trench capacitor 202 (along y-direction). In other embodiments, trench capacitor connects two or more adjacent trench capacitors 108 (along x-direction).

FIG. 3B is a cross-sectional illustration through a line A-A' of the structure in FIG. 3A. As shown, metal line 158 extends continuously from above trench capacitor 108 to above trench capacitor 202 along the y-direction. While only two trench capacitors are shown, metal line 158 may couple over 1000 trench capacitors.

In some embodiments, the region 101A may include trench capacitors as well as planar capacitor structures for memory and logic applications, respectively. In some such embodiments, the planar and trench capacitors may include electrode materials and dielectric layers that are the same or different. Thicknesses of the layers can also be same or different between planar and trench capacitors. Additionally, the dielectric surrounding planar and trench capacitors can be the same or be different.

Integration of planar and trench capacitors enables multi device structures with different functionalities.

Figure 4A:
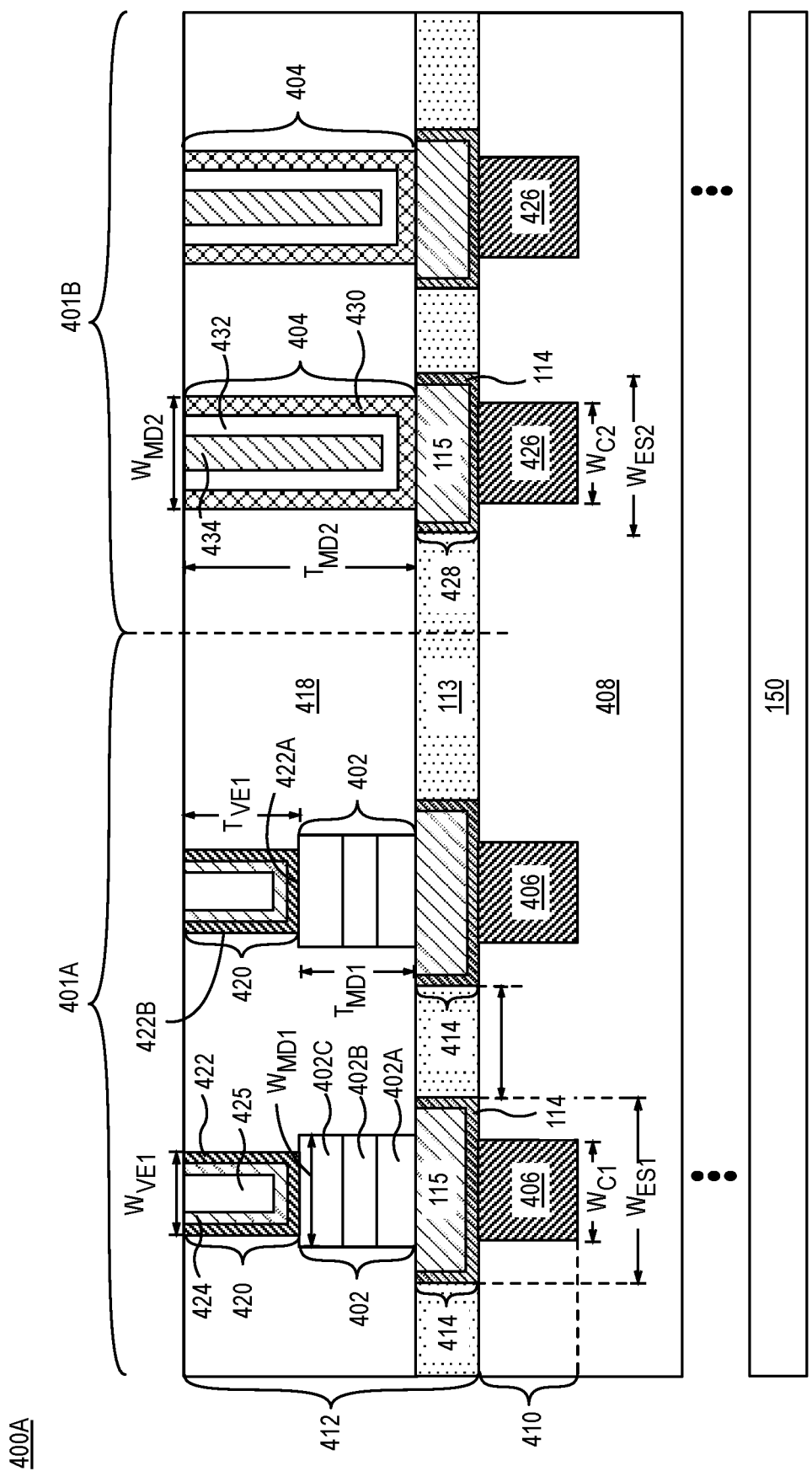
FIG. 4A is a cross-sectional illustration of a device structure that includes a planar capacitor in a first region and a trench capacitor in a second region adjacent to the first region, where the planar capacitor and the trench capacitor are embedded in a high film density material.
Figure 4B:
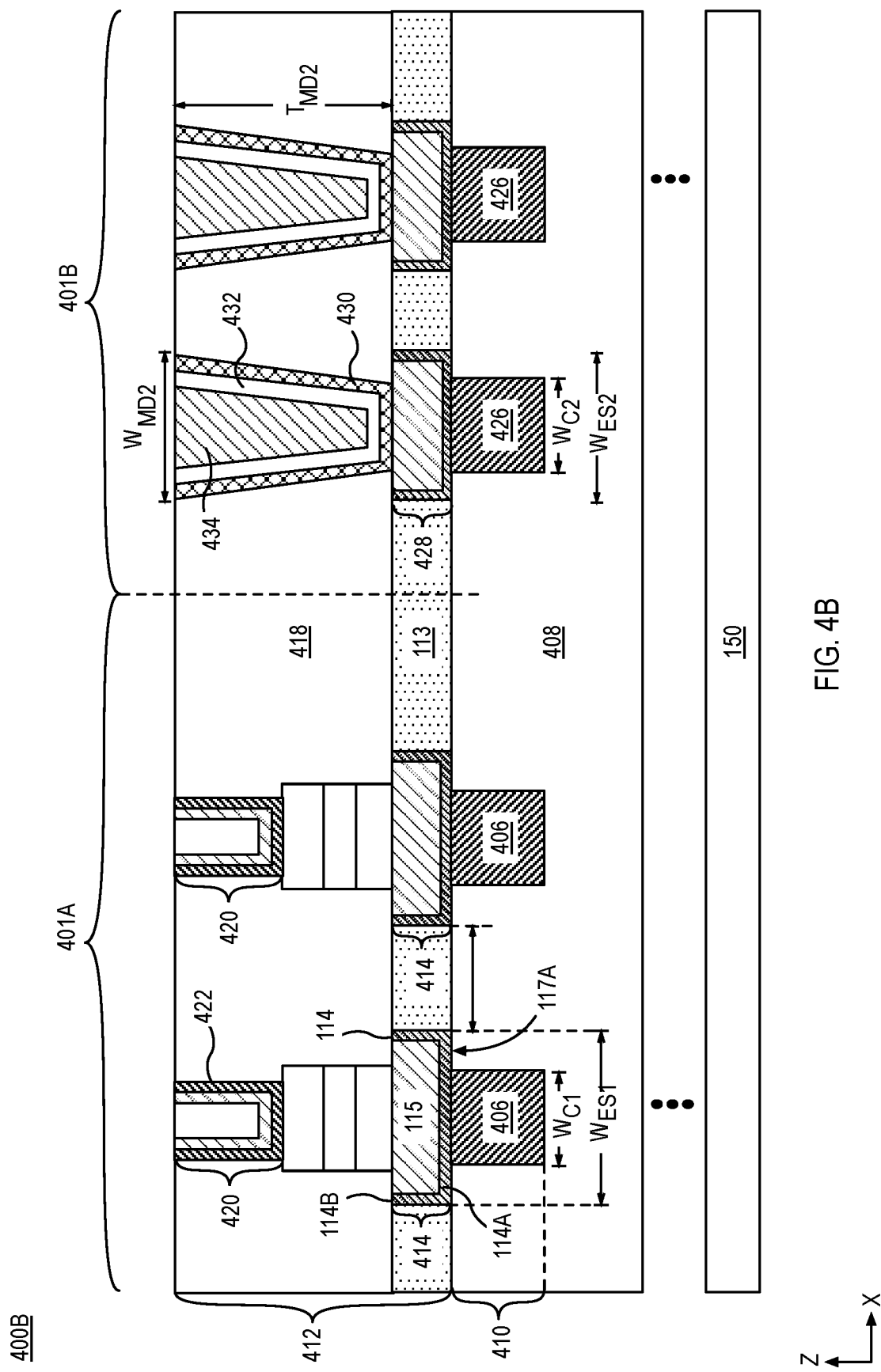
FIG. 4B is a cross-sectional illustration of a device structure where the trench capacitor in the second region is uniformly tapered.

FIG. 4A is a cross-sectional illustration of a device structure 400A that includes a planar capacitor 402 in a region 401A and a trench capacitor 404 in a region 401B adjacent to region 401A.

In the illustrative embodiment, region 401A includes a plurality of conductive interconnects such as conductive interconnect 406 within a dielectric 408 within a first level 410. In an exemplary embodiment, conductive interconnect 406 includes a material that is the same or substantially the same as the material of the conductive interconnect 102 (described in FIG. 1A). In an embodiment, dielectric 408 includes a material that is the same or substantially the same as the material of the dielectric 105.

Device structure 400A further includes a second level 412 above the first level 410. Level 412 includes a plurality of electrode structures such as electrode structure 414 on the conductive interconnect 406. The electrode structure 414 includes a material that is the same or substantially the same as the material of the electrode structure 112 (described in FIG. 1A), for example, electrode structure 414 includes conductive hydrogen barrier 114 and a conductive fill material 115 on the conductive hydrogen barrier 114. The electrode structure 414 is laterally adjacent to etch stop layer 113. In an embodiment, electrode structure 414 include one or more properties, such as materials, thicknesses etc, of electrode structure 112 (described in association with FIG. 1A). Level 412 further includes planar capacitor 402 above the electrode structure 414, where the planar capacitor includes a stack of layers including at least one ferroelectric material or paraelectric material. As shown, planar capacitor 402 includes a bottom electrode 402A, dielectric 402B on bottom electrode 402A and a top electrode 402C on dielectric layer 402B. In other embodiments, planar capacitor 402 includes more layers above top electrode 402C and/or below bottom electrode 402A. The planar capacitor 402 is on least a portion of the electrode structure 414. As shown, planar capacitor 402 has a lateral width $T_{MD1}$ that is less than a lateral width, $T_{S1}$ of electrode structure 414.

The planar capacitor 402 is laterally surrounded by a dielectric 418 above the etch stop layer 113. In an embodiment, the dielectric 418 includes an amorphous, greater than 90% film density hydrogen barrier material, wherein the planar capacitor 402 is embedded within dielectric 418. In an embodiment, dielectric 418 includes a material that is the same or substantially the same as the material of dielectric 107. As shown, portion of an uppermost surface of top electrode 402C is covered by dielectric 418 to provide a hydrogen barrier.

Top electrode 402C of planar capacitor 402 is further coupled by a via electrode 420. In the illustrative embodiment, via electrode 420 is on a portion of the uppermost surface of top electrode 402C. In other embodiments, via electrode 420 has a lateral thickness (width), $W_{VE1}$ that is less than $W_{MD}$. In other embodiments, $W_{VE1}$ is greater than $W_{MD}$. In some such embodiments, portions of the via electrode 420 may be present adjacent to sidewalls of top electrode 402C.

In an embodiment, via electrode 420 includes a structure that is substantially the same as via electrode 118 (described in association with FIG. 1A). In an embodiment, via electrode 420 includes a conductive hydrogen barrier 422 including a lateral portion 422A in contact with the top electrode 402C and substantially vertical portions 422B adjacent to the dielectric 418. In other embodiments, vertical portions 422B can be tapered by up to 10 degrees with respect to a normal to the top surface of top electrode 402C.

Via electrode 420 further includes a liner layer 424 on the conductive hydrogen barrier 422 and a conductive fill material 425 on the liner layer 424. In the illustrative embodiment, the conductive hydrogen barrier 120 laterally surrounds the liner layer 424, and the liner layer 424 laterally surrounds the conductive fill material 425. The conductive fill material 425 may include a material such as tantalum, titanium, ruthenium, tungsten, molybdenum or copper.

The region 401B includes a plurality of conductive interconnects such as conductive interconnect 426, an electrode structure 428 on the conductive interconnect 426 and the trench capacitor 404 on the electrode structure 428.

The conductive interconnect 426 includes a material that is the same or substantially the same as the material of the conductive interconnect 102. Conductive interconnect 426 may be wider or narrower than conductive interconnect 406. In an embodiment, electrode structure 428 includes a material that is the same or substantially the same as the material of the electrode structure 414. Electrode structure 428 has a lateral thickness, $W_{ES2}$, that is greater, equal to or less than, a lateral thickness, $W_{ES1}$, of electrode structure 414.

Trench capacitor 404 has one or more features of the trench capacitor 108 (described in association with FIG. 1A.) In an embodiment, trench capacitor 404 includes a bottom electrode 430 comprising a conductive ferroelectric material or a paraelectric material. The bottom electrode 430 includes base portion and substantially vertically sidewall portions. Trench capacitor 404 further includes a dielectric layer 432, that includes a ferroelectric or a paraelectric material, on the bottom electrode 430. As shown, the dielectric layer 110 is substantially conformal to the bottom electrode 109. Trench capacitor 404 further includes a second electrode 434 (herein top electrode) directly in contact with the dielectric layer 432. Top electrode 434 fills a space between the conformal dielectric layer 432.

In an embodiment, the top electrode 434 includes a material that is the same or substantially the same as the material of the bottom electrode 109 (FIG. 1A), dielectric layer 432 includes a material that is the same or substantially the same as the material of the dielectric layer 110 (FIG. 1A) and top electrode 434 includes a material that is the same or substantially the same as the material of the top electrode 111 (FIG. 1A).

As shown, and via electrode 420 has a vertical thickness, $T_{VE1}$, and planar capacitor 402 has a vertical thickness, $T_{MD1}$. The trench capacitor 404 has vertical thickness, $T_{MD2}$ that is substantially equal to a combined sum of $T_{ES1}$ and $T_{MD1}$. In embodiments, $T_{MD2}$ is at least two times greater than $T_{MD1}$. $T_{MD1}$ may range between 30 nm and 90 nm and $T_{VE1}$ may be adjusted co-dependently so that a combined sum may be equal to $T_{MD2}$. In the illustrative embodiment, one via electrode 420 is illustrated within level 412. However, when $T_{MD2}$ is greater than 2 times TMD, level 412 may include one or more electrodes stacked on electrode 420. In some such embodiments, additional electrodes may or may not require a conductive hydrogen barrier layer.

In the illustrative embodiment, the planar capacitor 402 has a width, $W_{MD1}$ that is equal to or greater than width $W_{MD2}$ of trench capacitor 404. Due to geometrical constraints, $W_{MD1}$ may be substantially larger than $W_{MD2}$, for planar capacitor 402 to hold a similar charge as trench capacitor 404.

In one embodiment, dielectric layer 402B includes a ferroelectric material and dielectric layer 432 includes a ferroelectric material. The ferroelectric materials may be the same or be different. In some such embodiments, thicknesses of dielectric layer 402B and 432 may be independent of each other.

In another embodiment, dielectric layer 402B includes a ferroelectric material and dielectric layer 432 includes a paraelectric material. In some such embodiments, thicknesses of dielectric layer 402B and 432 may be independent of each other.

In another embodiment, dielectric layer 402B includes a paraelectric material and dielectric layer 432 includes a paraelectric material. The paraelectric materials may be the same or be different. In some such embodiments, thicknesses of dielectric layer 402B and 432 may be independent of each other.

In another embodiment, dielectric layer 402B includes a paraelectric material and dielectric layer 432 includes a ferroelectric material. In some such embodiments, thicknesses of dielectric layer 402B and 432 may be independent of each other.

It is to be appreciated that width $W_{CI}$, of conductive interconnect 406 and width, $W_{ES1}$, of electrode structure 414 may be tuned with respect to each other depending on a device density required in region 401A. Similarly, width $W_{CI}$, of conductive interconnect 426 and width, $W_{ES2}$, of electrode structure 428 may be tuned with respect to each other depending on a device density required in region 401B. Furthermore, widths $W_{C1}$ and $W_{ES1}$ may be tuned independently of each of $W_{C2}$ and $W_{ES2}$.

In some embodiments, the trench capacitor 404 may be tapered uniformly as illustrated in the device structure 400B in FIG. 4B. In some such embodiments, the trench capacitor 404 has width, $W_{MD2}$, that varies with height, $T_{MD2}$, as shown. An advantage of a tapered trench capacitor 404 is that the top electrode has a larger surface area for making with a contact electrode (such as via electrode 118 in FIG. 1A). A top electrode 434 having a larger surface area can increase process margins and provide greater tolerance for misalignment with a via electrode compared to top electrode 434 in device structure 400A (FIG. 4A). A taper in trench capacitor 404 also increases a width of top electrode 434 with height, $T_{MD2}$.

Other than the taper in trench capacitor 404, device structure 400B is the same as device structure 400A.

Figure 4C:
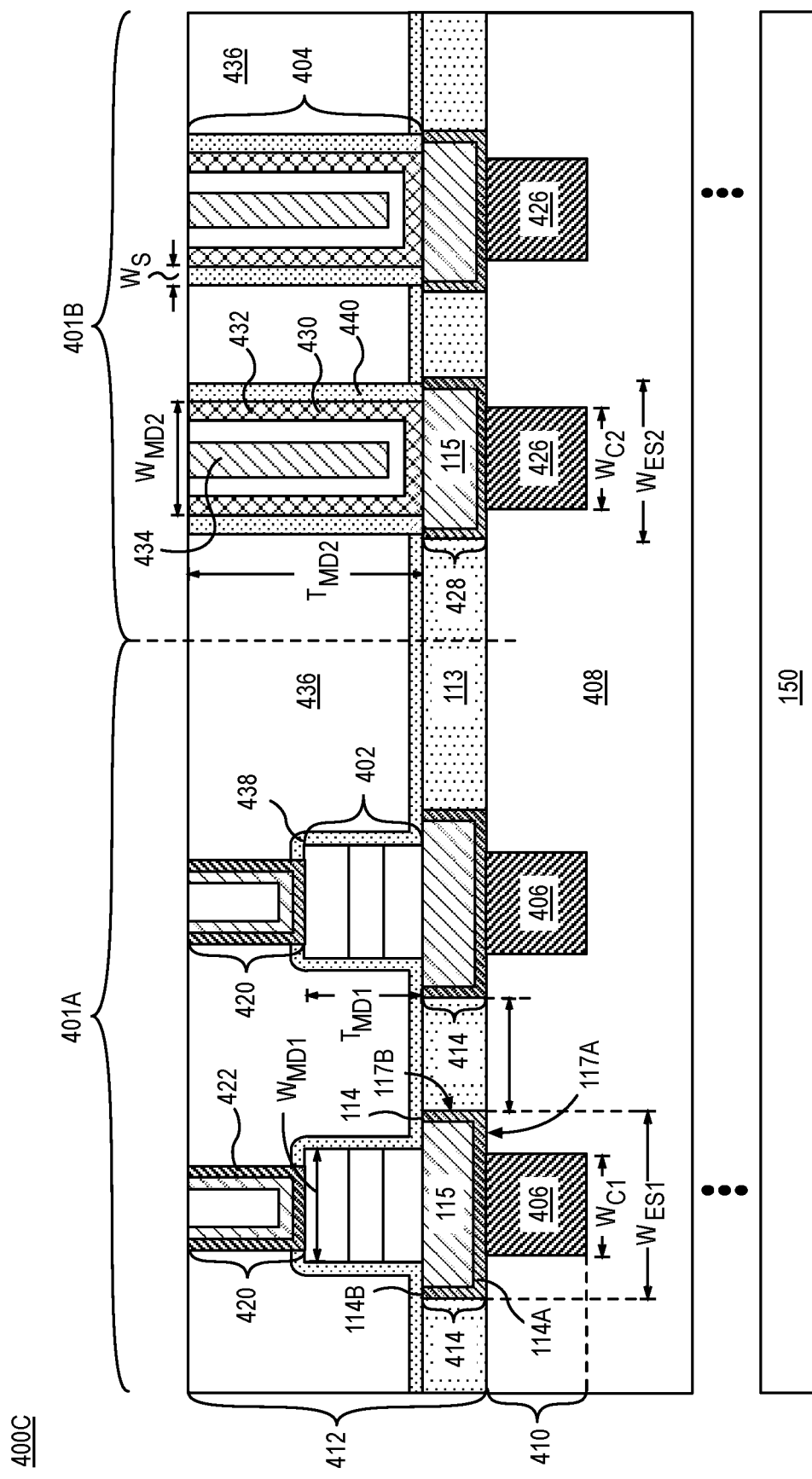
FIG. 4C is a cross-sectional illustration of a device structure that includes a planar capacitor in a first region and a trench capacitor in a second region adjacent to the first region, where the planar capacitor is surrounded laterally by an encapsulation layer and the trench capacitor is laterally surrounded by a spacer.

In other embodiments, the dielectric 418 in device structure 400A may be replaced by a dielectric 436 including a low K ILD, as illustrated in device structure 400C in FIG. 4C. In some such embodiments, device structure further includes an encapsulation layer 438 around planar capacitor 402 and a spacer 440 between dielectric 436 and bottom electrode 430 to prevent hydrogen diffusion into planar capacitor 402 and trench capacitor 404.

In an exemplary embodiment, encapsulation layer 438 includes an insulative hydrogen barrier material. The encapsulation layer 438 and via electrode 420 provide adequate seal around planar capacitor 402 against hydrogen diffusion. In the illustrative embodiment, the encapsulation layer 438 extends on a surface of the etch stop layer 113 and may further extend into region 401B.

In an embodiment, the encapsulation layer 438 includes a metal and oxygen, such as for example $Al_xO_y$, $HfO_x$, $ZrO_x$, $TaO_x$, $TiO_x$, $AlSiO_x$, $HfSiO_x$ or $TaSiO_x$, where x is substantially equal to 2, and where y is an integer. In other embodiments, encapsulation layer 438 includes a nitride of Al, Zr or Hf, for example AlN, ZrN, or HfN.

Trench capacitor 404 is also laterally surrounded by a spacer 440. In an exemplary embodiment, spacer 440 includes a material that is the same or substantially the same as the material of spacer 174 (FIG. 1I). In an embodiment, spacer 440 is conformal with bottom electrode 430. As shown, encapsulation layer 438 is also directly adjacent to a spacer 440. In an embodiment, encapsulation layer 438 includes a material that is the same or substantially the same as the material of spacer 440. In other embodiments, encapsulation layer 438 includes a metal atom whereas spacer 440 does not include a metallic species. Spacer 440 may include a material that offers substantial ease in patterning relative to conductive fill material 115.

In embodiments where $W_{ES1}$ is greater than $W_{MD1}$, encapsulation layer 438 is also on a top surface of electrode structure 414. In embodiments where $W_{ES2}$ is greater than $W_{MD2}$, encapsulation layer 438 can also be on a top surface of electrode structure 428, depending on a width, Ws, of spacer 440.

In other embodiments, the encapsulation layer 438 stops at an interface between region 401A and 401B and does not extend on the etch stop layer 113 in region 401B.

Figure 4D:
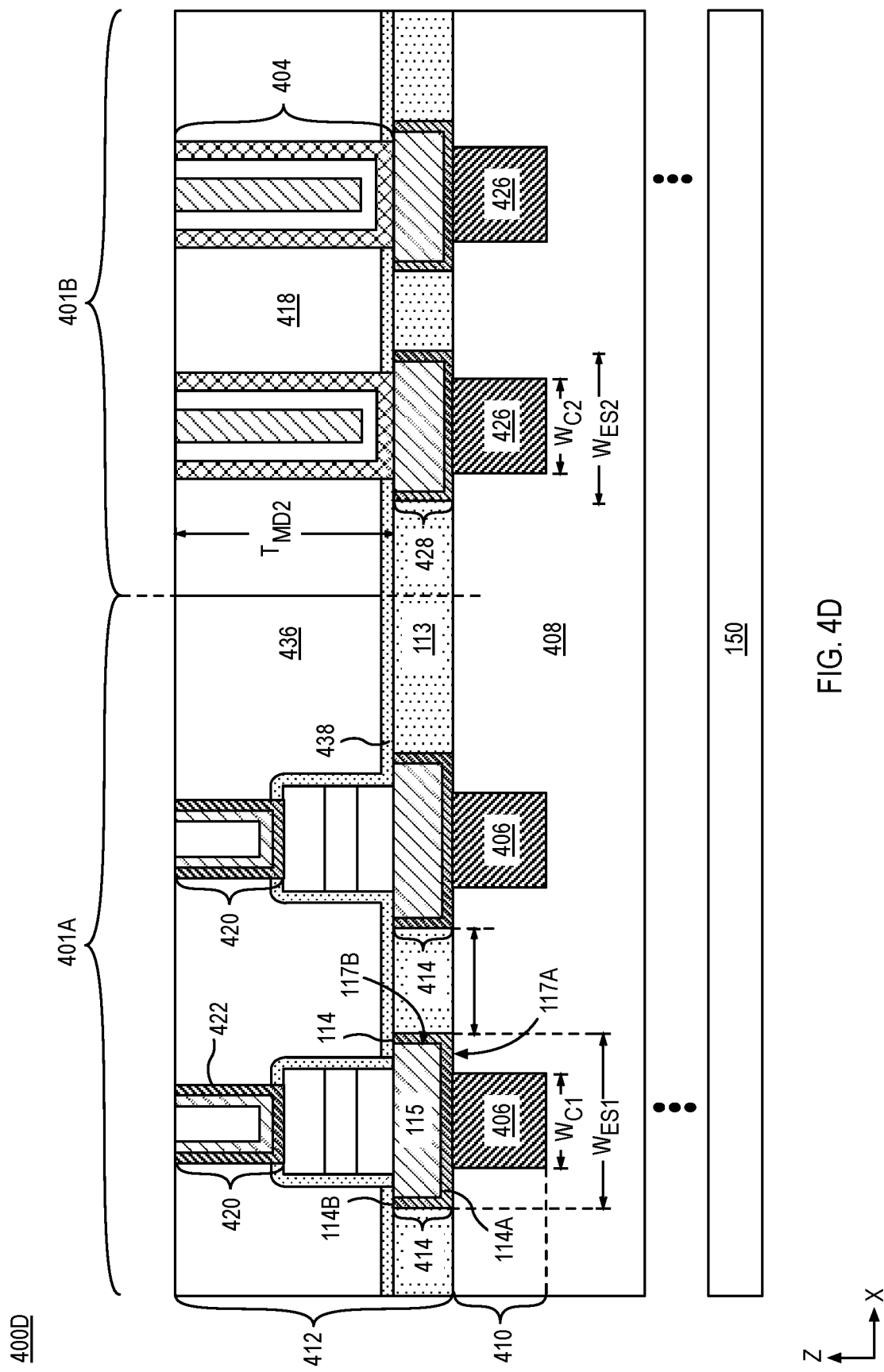
FIG. 4D is a cross-sectional illustration of a device structure that includes a planar capacitor in a first region and a trench capacitor in a second region adjacent to the first region, where trench capacitor is embedded in a high film density material, whereas the planar capacitor is laterally surrounded by an encapsulation layer, in accordance with an embodiment of the present disclosure.

In some embodiments, dielectric 418 in region 401A of device structure 400C in FIG. 4C, may be replaced by a dielectric 436, as illustrated in FIG. 4D. in some such embodiments, the encapsulation layer 438 offers a hermetic seal against hydrogen diffusion. The encapsulation layer 438 extends into region 401B, as shown. In some such embodiments, encapsulation layer 438 can include a material that is substantially similar but not identical to a material of the dielectric 418. Encapsulation layer 438 that includes a material that is different from dielectric 418 can be advantageous during fabrication process of trench capacitor 404 as will be described below.

Figure 4E:
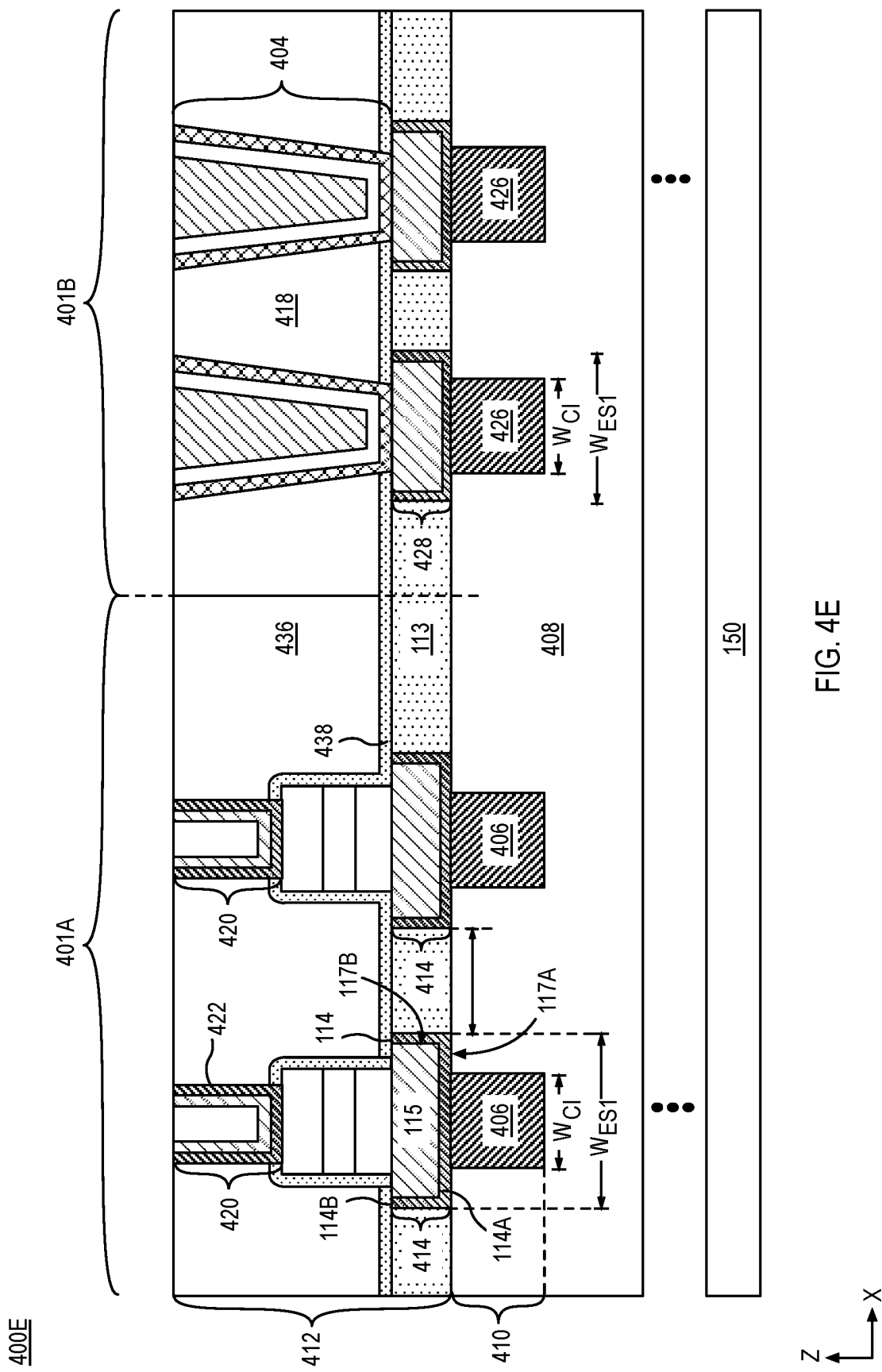
FIG. 4E is a cross-sectional illustration of a device structure that includes a planar capacitor in a first region and a tapered trench capacitor in a second region adjacent to the first region, where trench capacitor is embedded in a high film density material, whereas the planar capacitor is laterally surrounded by an encapsulation layer, in accordance with an embodiment of the present disclosure.

While trench capacitor 404 in device structure 400D has a substantially vertical trench profile, sidewalls of trench capacitor 404 can be tapered as illustrated in device structure 400E in FIG. 4E. A tapered trench capacitor 404 has one or more features described in association with FIG. 4B.

In some embodiments, the device structure 400A in FIG. 4A further includes encapsulation layer 438 between the dielectric 418 and planar capacitor 402 and between dielectric 418 and etch stop layer 113.

Figure 4F:
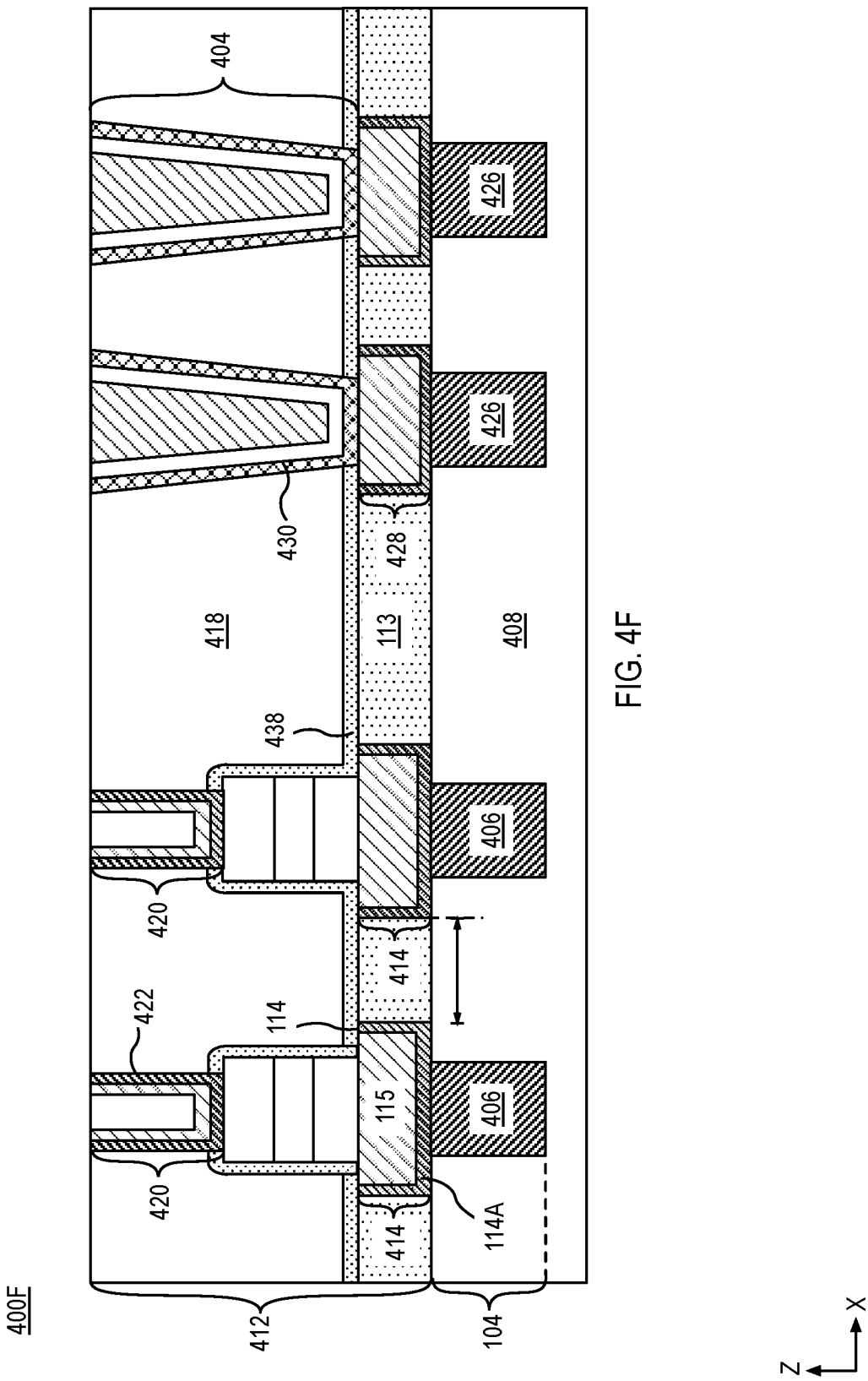
FIG. 4F is a cross-sectional illustration of a device structure 400F that includes a planar capacitor in a first region and a trench capacitor in a second region adjacent to the first region, where the planar capacitor and the trench capacitor are embedded in a high film density material, but where an encapsulation layer is between the high film density material and the planar capacitor.

FIG. 4F is a cross-sectional illustration of a device structure 400F that includes encapsulation layer 438 between the dielectric 418 and planar capacitor 402 and between etch stop layer 113 and dielectric 418. As will be discussed below, an encapsulation layer 438 is advantageous during fabrication of trench capacitor 404.

The encapsulation layer 438 may include a material that is different from the dielectric 418. Encapsulation layer 438 is chosen for its ability to provide adequate protection against hydrogen diffusion. As shown, encapsulation layer 438 is also directly adjacent to a lower most portion of the bottom electrode 430.

Figure 5:
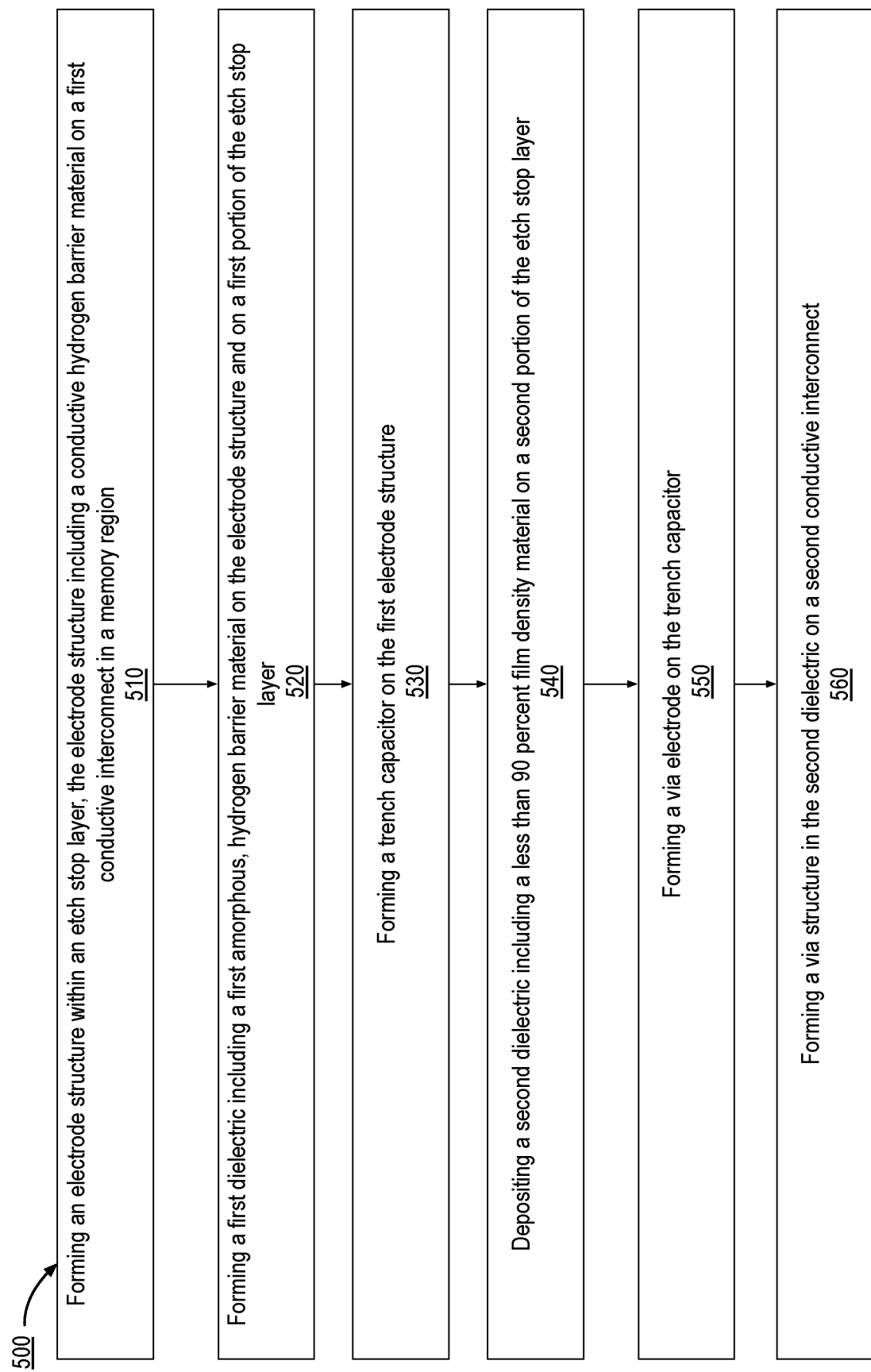
FIG. 5 is a flow diagram to form memory devices with dual hydrogen barrier layers in a first region and conductive interconnects in a logic region, in accordance with some embodiments of the present disclosure.

FIG. 5 is a flow diagram to form memory devices such as trench capacitors in a memory region and conductive interconnects in a logic region, in accordance with some embodiments of the present disclosure. Some operations can be performed simultaneously or out of order. The method begins at operation 510, with the formation of an electrode structure within an etch stop layer, where the electrode structure includes a conductive hydrogen barrier material on a first conductive interconnect in a memory region. The method 500 continues at operation 520 with the formation of a first dielectric including a first amorphous, hydrogen barrier material on the electrode structure and on a first portion of the etch stop layer. The method continues at operation 530 with the formation of trench capacitors on the first electrode structures. The method continues at operation 540 with the deposition of a second dielectric including a less than 90 percent film density material on a second portion of the etch stop layer. The method continues at operation 550 with the formation of a via electrode on the trench capacitor. The method concludes at operation 560 with the formation of a via structure in the second dielectric on a second conductive interconnect.

FIG. 6A is a cross-sectional illustration of a plurality of conductive interconnects 102 and 128 formed within dielectric 105 above a substrate 600. In the illustrative embodiment, conductive interconnects 102, are formed in a memory region and conductive interconnect 128 is formed in a logic region. In exemplary embodiments, there may be one or more levels of transistors and interconnects between conductive interconnects 102 and 128 and substrate 600. In high density memory applications, the number of conductive interconnects 102 and 128 can range between 1K and 5K within a given array in memory region 101A. Conductive interconnects 102 and 128 have a lateral thickness, $W_{CI}$, that may be determined by a minimum acceptable electrical resistance. In some embodiments, conductive interconnects 102 are discrete structures that are substantially, rectangular, circular or elliptical in plan-view shape and conductive interconnect 128 is a trench line (extending into the plane of the Figure). In some embodiments, conductive interconnects 102 have a lateral thickness between 20 nm and 40 nm. For example, conductive interconnects 102 may have a lateral thickness between 20 nm and 40 nm, along the x-direction, as shown. In other embodiments, conductive interconnects 102 and 128 are trenches that extend into the plane of the Figure. The conductive interconnects 102 and 128 may have shapes that are independent of each other. As shown, conductive interconnects 102 have substantially the same lateral thickness to minimize variability in device performance.

In some embodiments, the conductive interconnects 102 and 128 are electrically and mechanically coupled with vias and/or lines such as via 601 and/or line 601 indicated in dashed boxes in the Figure. The via 601 and/or line 601 may include a same or substantially the same material as a material of the conductive interconnect 102.

In some embodiments, conductive interconnects 102 and 128 include a liner layer and a fill metal on the liner layer. For example, the liner layer may include a material, such as but not limited to, ruthenium, cobalt or tantalum and the fill metal may include copper or tungsten. In one or more embodiments, conductive interconnects 102 and 128 include copper fill metal on a ruthenium or a tantalum liner. In an embodiment, each of the conductive interconnects 102 are separated by spacing Sic. Sic is substantially determined by a designed density of memory devices to be fabricated within a given area, as well as by underlying structures embedded within layers below conductive interconnects 102.

In various embodiments, substrate 600 includes a material that is the same or substantially the same as the material of the substrate 150 described in association with FIG. 1A.

FIG. 6B is a cross-sectional illustration of the structure in FIG. 6A following the process to deposit an etch stop layer 113 on conductive interconnects 102 and 128 as well as on the dielectric 105. Etch stop layer 113 is deposited to a thickness, $T_{ED}$ that is chosen to accommodate a height of an electrode structure to be formed. For example, the as deposited thickness, $T_{ED}$, may include process margins for multiple planarization processes to be utilized. $T_{ED}$ is also chosen to provide sufficient material against etch erosion during process to form memory devices in the memory region 101A.

The etch stop layer 113 also functions as a diffusion barrier layer. A diffusion barrier is essential for preventing diffusion of copper from conductive interconnect 128, and hydrogen during downstream process to the memory devices to be formed or other devices within the logic region. As such, etch stop layer 113 includes a material such as, but not limited to, silicon nitrogen and one or more of, oxygen or carbon.

FIG. 7A is a cross-sectional illustration of the structure in FIG. 7A following the process to etch openings 701 in etch stop layer 113 to form electrode structures. In an embodiment, photoresist mask 702 is formed by a lithographic process on etch stop layer 113. Exposed portions of etch stop layer 113 may be etched by a plasma etch process through opening in the photoresist mask 702. In the illustrative embodiment, the openings 701 have a lateral thickness, $W_O$. $W_O$ may be substantially the same across various openings 701 that are designed to form electrode structures. $W_O$ may be narrower, equal to or wider than $W_{CI}$ of conductive interconnects 102. In the illustrative embodiment, $W_O$ is less than $W_{CI}$. The substrate 600 is not illustrated in FIGS. 6B-19, for clarity.

Shape of openings 701 may be circular or rectangular and the conductive interconnects may be discrete islands or trenches depending on embodiments. FIGS. 7A-7C illustrate different embodiments (for example portions 704A, 704B and 704C) of a portion 704 of the conductive interconnect and opening in FIG. 7A. The photoresist mask 702 is removed for clarity.

FIG. 7B is an isometric illustration of a portion 704A of the structure in FIG. 7A, in accordance with an embodiment of the present disclosure. A cross section through opening 701 is illustrated. In the illustrative embodiment, the conductive interconnect 102 is cylindrical, where $W_{CI}$ is less than $W_O$, (for example diameter) of opening 701. As shown opening 701 is circular and $W_O$ may be, for example, a diameter of the opening 701. In other embodiments, opening 701 can be rectangular and/or extend over two or more conductive interconnects, such as for example, conductive interconnects 102. The dielectric 105 is exposed during formation of the openings 701 when $W_{CI}$ is less than $W_O$, as shown. In the illustrative embodiment, uppermost surface 102B of conductive interconnect 102 is co-planar or substantially co-planar with uppermost surface 105A of dielectric 105.

In some embodiments, the conductive interconnect within portion 704C is a trench interconnect 308 as illustrated in FIG. 7C. In some such embodiments, the openings 701 expose different portions of uppermost surface 308A of trench interconnect 308. In the illustrative embodiment, $W_{TI}$ is less than $W_O$ and openings 701 expose uppermost surface 105A of the dielectric 105. In the illustrative embodiment, uppermost surface 308A of trench interconnect 308 is co-planar or substantially co-planar with uppermost surface 105A. In the illustrative embodiment, opening 701 is circular. However, in other embodiments, the opening 701 can be rectangular as indicated by dashed lines 705.

While it is desirable for the opening 701 to be substantially aligned with sidewalls of trench interconnect 308, in some embodiments, the opening 701 may be offset relative to trench interconnect 308, as is illustrated in portion 704C in FIG. 7D. Such an offset may be a result of misalignment between photoresist mask 702 and the trench interconnect 308 (or a conductive interconnect in other embodiments). The method adopted to fabricate an electrode structure within opening 701 is not impacted by misalignment as long as at least 50% of the opening 701 exposes the uppermost surface 308A of trench interconnect 308. Misalignment does not enable hydrogen to diffuse through to the trench capacitor 108 (not shown).

FIG. 8A is a cross-sectional illustration of the structure in FIG. 7A following the process to deposit one or more electrode materials on the conductive interconnects 102 and on etch stop layer 113. In an embodiment, a conductive hydrogen barrier material 800 is deposited in the opening 701, on sidewalls of etch stop layer 113 and on the conductive interconnect 102. In the illustrative embodiment, conductive hydrogen barrier material 800 is also deposited on exposed portions of the dielectric 105. A fill material 802 is filled in remaining portions of opening 701 on the conductive hydrogen barrier material 800. Depending on the type of material chosen for fill material 802, a liner layer (indicated by dashed lines 803) may be first deposited on the conductive hydrogen barrier material 800 and then the fill material 802 is deposited on the liner layer. In embodiments the conductive fill material 115 includes tantalum, titanium, ruthenium, tungsten or copper.

FIG. 8B is a cross-sectional illustration of the structure in FIG. 8A following the process to planarize the fill material 802 and the conductive hydrogen barrier material 800 to form electrode structure 112. In an embodiment, the planarization process includes a chemical mechanical planarization (CMP) process. The CMP process removes the fill material 802 and the conductive hydrogen barrier material 800 from an uppermost surface 113A of the etch stop layer 113. The planarization process isolates the conductive hydrogen barrier material 800 to form a conductive hydrogen barrier 114 and the fill material 802 to form a conductive fill material 115.

The CMP process may also reduce the as deposited thickness of the etch stop layer 113 to a thickness $T_{EC}$. $T_{EC}$ may be substantially uniform across the memory and logic regions 101A and 101B, respectively. There may be variations in thicknesses of up 5% from the CMP processing due to the presence of the electrode structures. Additionally, in some embodiments, the conductive fill material 115 may be dished (or recessed in a concave manner) as indicated by dashed lines 805. A concaved profile may change a surface profile of each layer within a memory device to be formed. The extent of dishing may be dependent on $W_{CI}$ and on a pattern density of and spacing between the electrode structures 112.

Figure 8C:
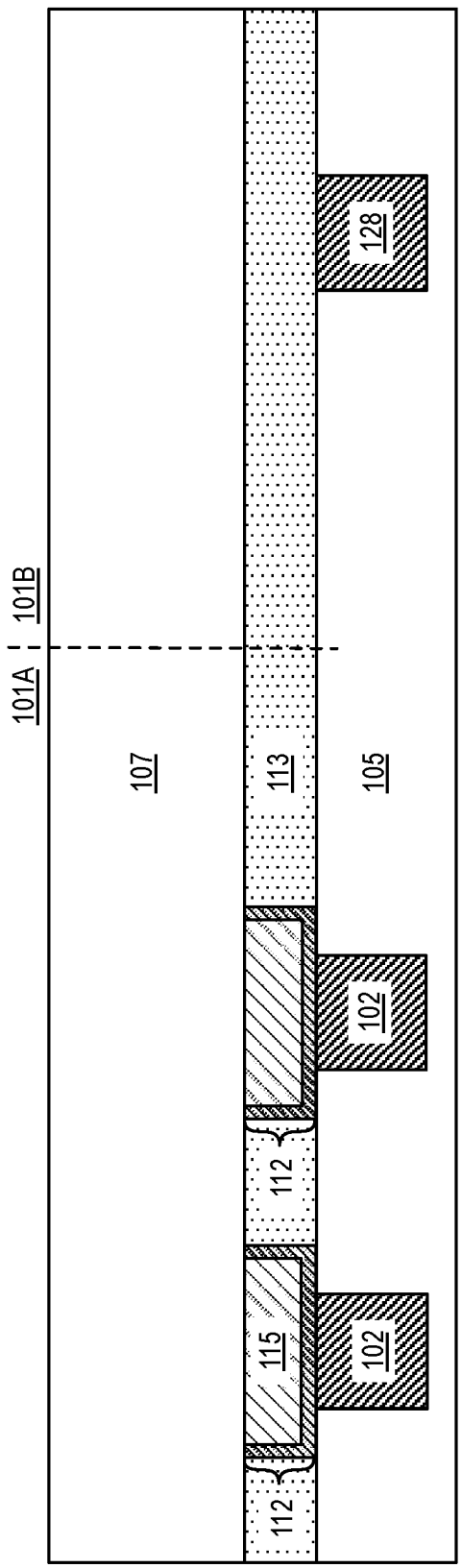
FIG. 8C is a cross-sectional illustration of the structure in FIG. 8B following the deposition of a first dielectric including a high film density material.

FIG. 8C is a cross-sectional illustration of the structure in FIG. 8B following the deposition of dielectric 107. In an embodiment, dielectric is blanket deposited on electrode structure 112 and on the etch stop layer 113 by an atomic layer deposition (ALD), PEALD, PAALD, a plasma enhanced chemical vapor deposition (PECVD), chemical vapor deposition (CVD), a physical vapor deposition (PVD) process or a combination thereof.

In an embodiment, the dielectric 107 includes a metal and oxygen, such as for example $Al_xO_y$, $HfO_x$, $ZrO_x$, $TaO_x$, $TiO_x$, $AlSiO_x$, $HfSiO_x$ or $TaSiO_x$. In other embodiments, dielectric 107 includes a nitride of Al, Zr or Hf, for example AlN, ZrN, or HfN. Some of the dielectric materials may be deposited by a process that utilizes hydrogen or ammonia containing precursor chemicals, while other materials may be deposited by a process that does not utilize hydrogen or be performed in an environment where hydrogen may be present. In some embodiments, deposition of dielectric 107 is performed by a combination of processing operations. A first operation may utilize a physical vapor deposition process to deposit a material including a metal and oxygen, such as but not limited to $Al_xO_y$, $HfO_x$, $ZrO_x$, $TaO_x$, $TiO_x$, $AlSiO_x$, $HfSiO_x$, $TaSiO_x$, or a metal nitrogen such as but not limited to AlN, ZrN, or HfN. A second operation may be subsequently performed where one or more of $Al_xO_y$, $HfO_x$, $ZrO_x$, $TaO_x$, $TiO_x$, $AlSiO_x$, $HfSiO_x$, $TaSiO_x$, AlN, ZrN, or HfN may be deposited by a process that may or may not utilize a hydrogen precursor, where x is substantially equal to 2, and where y is an integer.

Figure 8D:
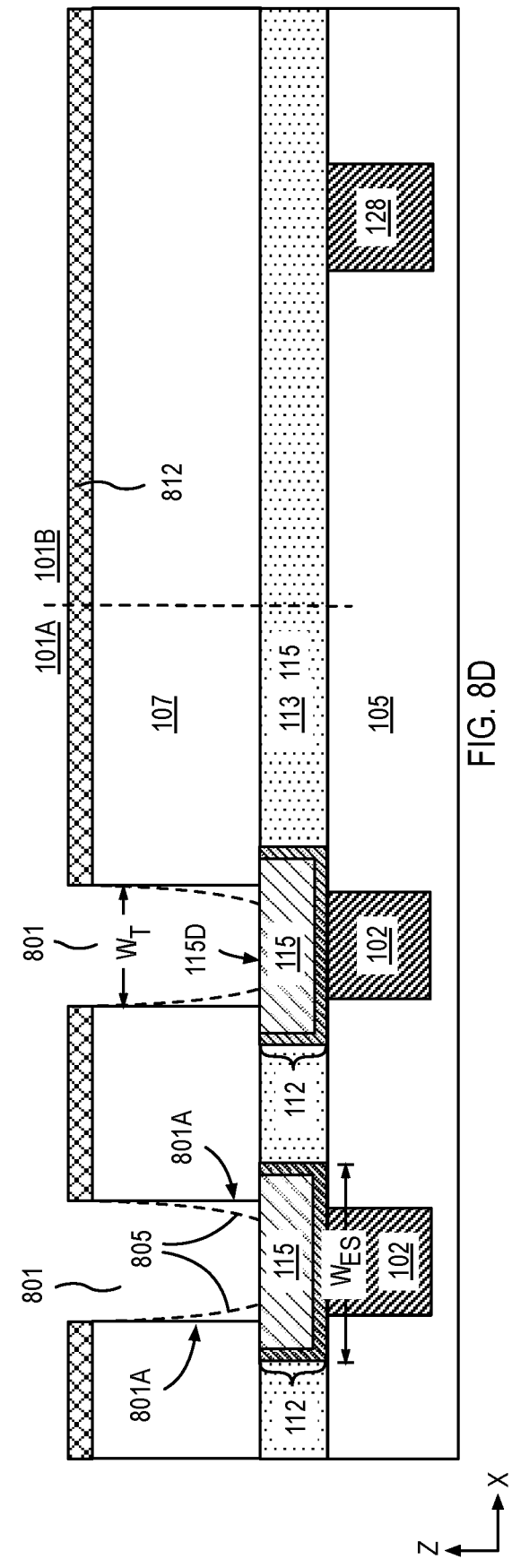
FIG. 8D is a cross-sectional illustration of the structure in FIG. 8C following the process to pattern the first dielectric to form trenches.

FIG. 8D is a cross-sectional illustration of the structure in FIG. 8C following the process to pattern dielectric 107 to form trenches 801. In the illustrative embodiment, a mask 812 is formed on the dielectric 107. The mask 812 defines locations where trenches are to be formed relative to the underlying electrode structure 112. In an embodiment, dielectric 107 is etched by a plasma etch process. The plasma etch process may include a discharge produced by a magnetic enhanced reactive ion etching mechanism, an electron cyclotron resonance discharge or an inductively coupled plasma discharge. It is highly desirable to pattern dielectric 107 to form trenches 801 with substantially vertical side walls.

In some embodiments, $CH_xF_y$ (fluorocarbon) $O_2$ and Ar based gas combination may be utilized to etch dielectric 107 in one of the three different plasma discharges described above. In an exemplary embodiment, trenches 801 have substantially vertical profiles relative to an uppermost surface 115D of the conductive fill material 115. In some embodiments, photoresist mask 812 is removed after forming trenches 801. In some embodiments a dual step process to form trenches 801 may be adopted. The dual state process may result in curved sidewalls 801A of trench 801, as indicated by dashed lines 805. In an embodiment, the trench 801 has a width, $W_T$, that is designed to accommodate thickness requirements of the various films utilized to fabricate a trench capacitor.

In the illustrative embodiment, $W_T$ is less than $W_{ES}$. In other embodiments, WT is equal to or greater than $W_{ES}$.

FIG. 8E is a cross-sectional illustration of the structure in FIG. 8D following the process to deposit various layers to form a trench capacitor. In some embodiments, a bottom electrode layer 807 and top electrode layer 811 can be deposited into trenches 801 by a PVD or a CVD process, while dielectric layer 809 is deposited by an ALD process due to thickness uniformity requirements. In other embodiments, an ALD process is utilized to sequentially deposit all layers within the trench 801.

In an embodiment, the ALD deposition process is performed at a temperature between 150 degrees Celsius-250 degrees Celsius. In an embodiment, the bottom electrode layer 807 includes a material that is the same or substantially the same as the material of the bottom electrode 109 (described in association with FIG. 1A). In an embodiment, dielectric layer 809 includes a material that is the same or substantially the same as the material of the dielectric layer 110 (described in association with FIG. 1A). In an embodiment, top electrode layer 811 includes a material that is the same or substantially the same as the material of the top electrode 111 (described in association with FIG. 1A).

The deposition process forms a bottom electrode layer 807 on sidewalls 801A of the trench, on a base of the trench, on the electrode structure 112, and on uppermost surface 107A of dielectric 107. In an embodiment, bottom electrode layer 807 is deposited to a thickness of at least 1 nm by an ALD, PAALD, or PEALD process. The deposition process forms the dielectric layer 809 on the surface of the bottom electrode layer 807 and forms a material of the top electrode layer 811 on the dielectric layer 809. An ALD deposition process may be utilized to sequentially deposit a single monolayer at a time. In an embodiment, the deposition process is carried out until a desired dielectric layer 809 including a ferroelectric or paraelectric nanocrystalline film having a requisite thickness between 1 nm and 30 nm is obtained.

Depending on $W_T$, and on a thickness of top electrode layer 811 to be deposited, the top electrode layer 811 may or may not fill the trench 801. In an embodiment, top electrode layer 811 is deposited to a thickness of at least 1 nm by an ALD, PAALD, or PELD process. In the illustrative embodiment, top electrode layer 811 fills trench 801. In other embodiments, an additional fill material may be required to fill the space between the dielectric layer 809 that is conformally deposited on the bottom electrode layer 807.

In some embodiments, prior to deposition of the bottom electrode layer 807 a spacer layer is formed in the trench 801, wherein the spacer includes silicon nitride, silicon carbide or carbon doped silicon nitride on sidewalls of the trench. In some such embodiments, the spacer layer is etched to form a spacer adjacent to the dielectric 107. The electrode structure 112 is exposed prior to deposition of bottom electrode layer 807.

FIG. 8F is a cross-sectional illustration of the structure in FIG. 8E following the process to planarize and remove excess trench capacitor layers deposited on and above the dielectric 107. In an embodiment, a chemical mechanical polish (CMP) process is utilized. The CMP process removes the top electrode layer, the dielectric layer and bottom electrode layer from above the dielectric 107. The planarization process isolates the top electrode 111, the dielectric layer 110 and bottom electrode 109 within trench 801 to form trench capacitor 108.

A dielectric 813 is deposited on the dielectric 107 and on the trench capacitor 108. In an embodiment, dielectric 813 includes a material that is the same or substantially the same as the material of dielectric 107. In an embodiment, dielectric includes an insulative material with a hydrogen barrier property. A hydrogen barrier is essential to prevent hydrogen from reaching an uppermost portion of the dielectric layer 809. In other embodiments, dielectric 813 includes silicon and nitrogen, or silicon, nitrogen and carbon. In other embodiments, dielectric 813 is a bilayer stack where the first layer is a hydrogen barrier layer and the second layer is a low K ILD material, further where the first layer is directly in contact with the dielectric 107 and trench capacitor 108.

FIG. 8G is a cross-sectional illustration of the structure in FIG. 8F following the process to remove the dielectric 813 and dielectric 107 from region 101B. In an embodiment, a mask 815 is formed on the dielectric 813 by a lithographic process. The mask is utilized to etch the dielectric 813 and 107 from region 101B, as shown. In an embodiment, a plasma etch is utilized to etch and remove dielectric 107 selectively from above the etch stop layer 113 in region 101B.

FIG. 8H is a cross-sectional illustration of the structure in FIG. 8G following the process to form dielectric 142 in region 101B. In an embodiment, a PECVD or a CVD process is utilized to deposit dielectric 142 on the etch stop layer 113, adjacent to dielectric 107 in region 101B, and on an uppermost surface of dielectric 813. In an embodiment, a planarization process is performed to remove excess dielectric 142 deposited uppermost surface of dielectric 813. A CMP process may be utilized to remove excess dielectric 142 from above dielectric 813. The CMP process forms uppermost surface 813A of dielectric 813 and uppermost surface 142A of dielectric 142 that are co-planar or substantially co-planar.

In an embodiment, a mask is formed on dielectric 142 and on dielectric 813. The mask may be formed by a lithographic process. Following the formation of the mask, a plasma etch may be performed to etch dielectric 142, etch stop layer 113 to form a via opening 816.

Figure 8I:
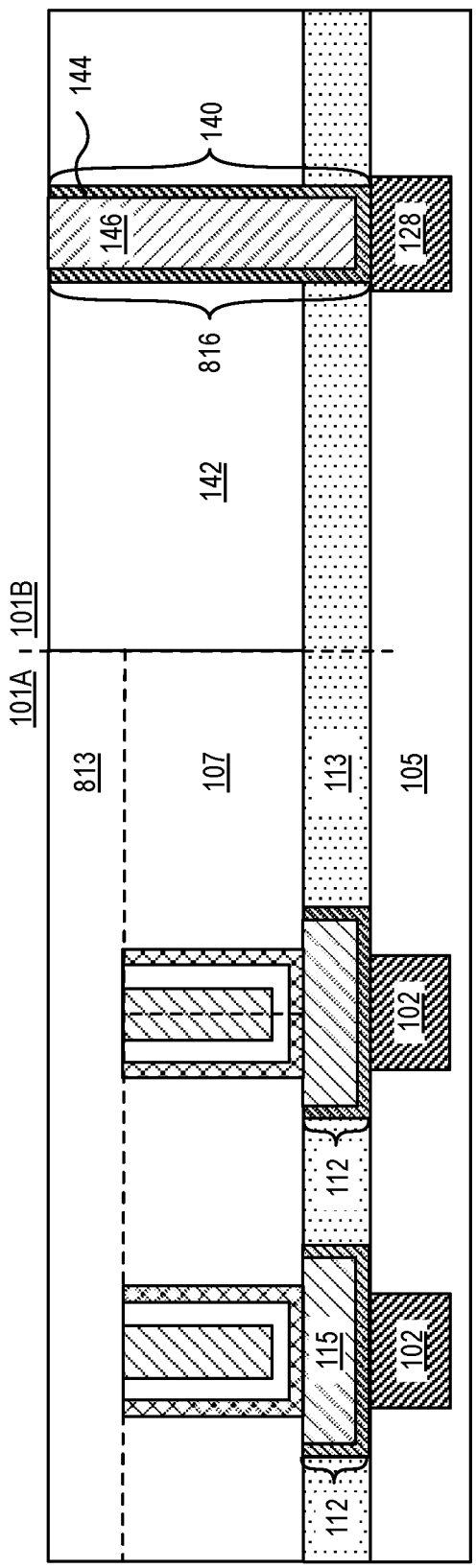
FIG. 8I is a cross-sectional illustration of the structure in FIG. 8H following the process to form a via structure in third dielectric.

FIG. 8I is a cross-sectional illustration of the structure in FIG. 8H following the process to form a via structure in dielectric 142. Following the process to form the via opening 816, the mask is removed, and one or more layers of conductive material is deposited into the via opening 816, on the conductive interconnect 128, on the dielectrics 813 and 142. In an embodiment, a liner layer 144 is deposited into the via opening 816, followed by a deposition of conductive fill material 146 on the liner layer 144.

Following the deposition process a planarization process is performed to isolate the liner layer 144 and conductive fill material 146 within the via opening 816 to form via structure 140.

Figure 8J:
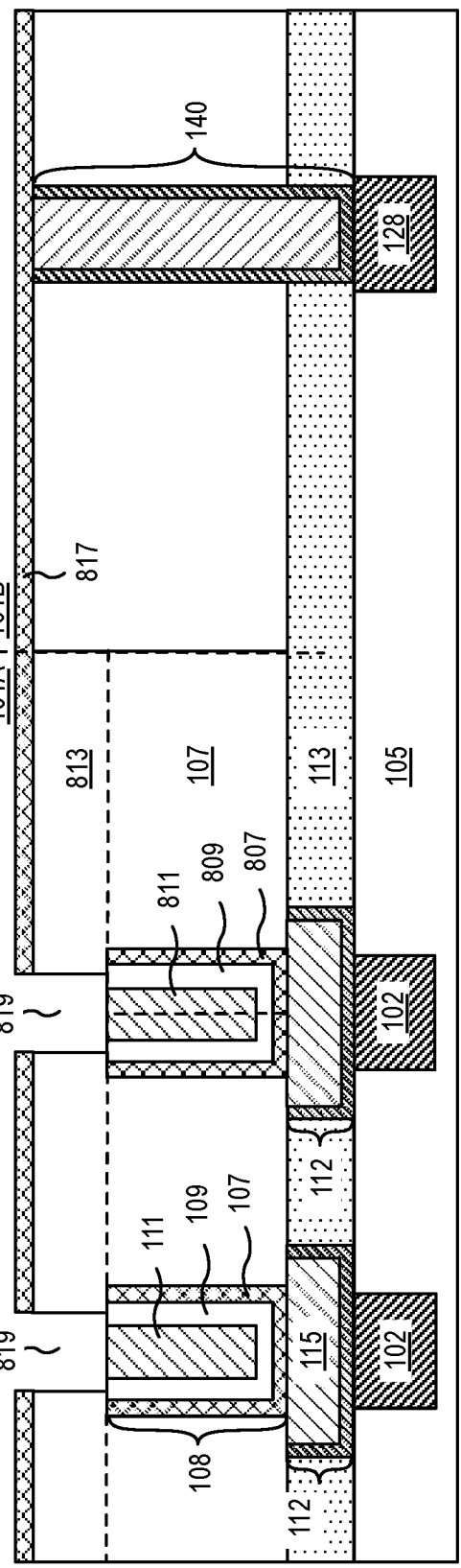
FIG. 8J is a cross-sectional illustration of the structure in FIG. 8I following the process to form openings in the second dielectric to expose a respective trench capacitor.

FIG. 8J is a cross-sectional illustration of the structure in FIG. 8I following the process to form openings 819 in the dielectric 813 through a mask 817. The openings 819 may have sidewalls that are substantially vertical or flared. In the illustrative embodiment, the sidewalls of opening 819 are substantially vertical. Mask 817 may be formed on the dielectric 813, dielectric 142 and on via structure 140 by a lithographic process. The openings 819 may be formed by a plasma etch process that etches dielectric 813 but is selective to top electrode 111, and dielectric layer 809 of trench capacitor 108. In exemplary embodiments, the opening 819 exposes a portion of the dielectric layer 809 and all of the top electrode 111.

Figure 8K:
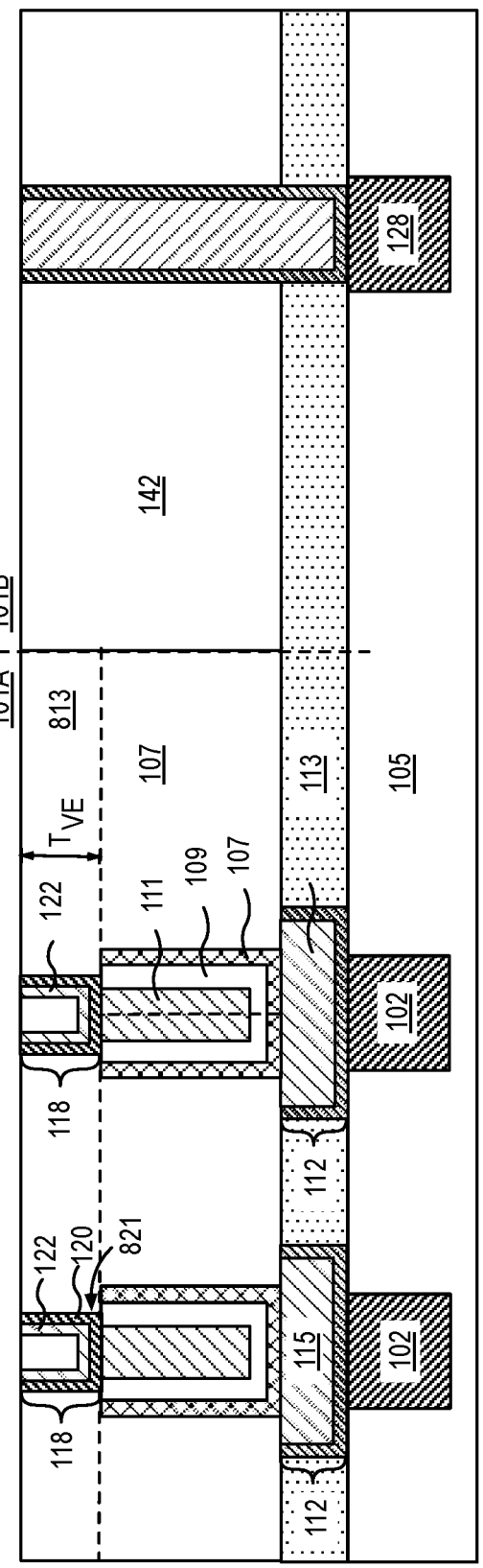
FIG. 8K is a cross-sectional illustration of the structure in FIG. 8J following the process to deposit materials to form a via electrode on a respective trench capacitor.

FIG. 8K is a cross-sectional illustration of the structure in FIG. 8J following the process to deposit materials to form via electrodes. In the illustrative embodiment, conductive hydrogen barrier material is blanket deposited into the openings 819, on the trench capacitor 108, on uppermost surface 813A and on sidewall of dielectric 813. The conductive hydrogen barrier material includes a material that is compatible with the dielectric 813 so that an interface 821 between the conductive hydrogen barrier material and the dielectric 813 is not a source of dislocations.

In an embodiment, a liner layer material is blanket deposited in the openings 819, and on the conductive hydrogen barrier material. A layer of fill metal is deposited into the remaining portions of openings 819 on the liner layer material.

In embodiments, the conductive hydrogen barrier material, the liner layer material and layer of fill metal are deposited by an ALD, CVD, PVD or sputter deposition process.

Following the deposition process, a planarization process is performed to remove excess materials from above dielectric 813 and 142 to form via electrode 118 on each trench capacitor 108.

In an embodiment, the planarization process includes a chemical mechanical planarization (CMP) process. The CMP process removes layer of fill metal, liner layer material and the conductive hydrogen barrier material from an uppermost surface 813A. The planarization process isolates the materials inside the openings 819 to form conductive hydrogen barrier 120, liner layer 122 and conductive fill material 124 within the openings 819. The CMP process may also reduce the as deposited thickness of the dielectric 813. Thus, process outlined above may be utilized to fabricate the structure in FIG. 1A.

Figure 9A:
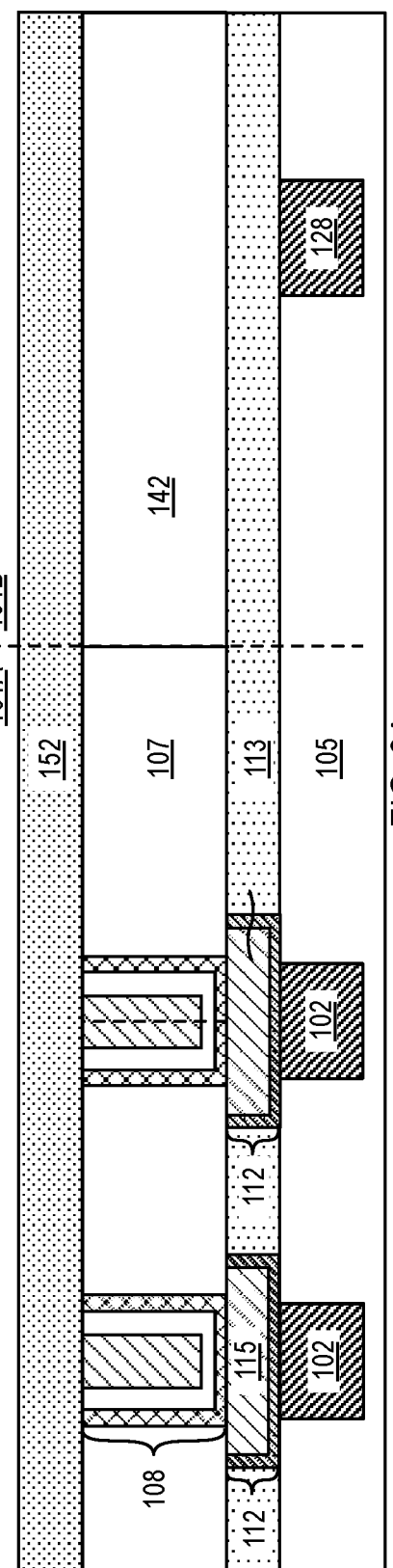
FIG. 9A is a cross-sectional illustration of the structure in FIG. 8E following the process to planarize and form trench capacitors, following the process to deposit a fourth dielectric having hydrogen barrier properties on the trench capacitors and on the first dielectric and second dielectric.

FIG. 9A is a cross-sectional illustration of the structure in FIG. 8E following the process to planarize and form trench capacitors 108, following the process to deposit a dielectric 152 having hydrogen barrier properties on the trench capacitors 108. In an embodiment, the method to form trench capacitor 108 is substantially the same as the method described in association with FIG. 8F. Referring again to FIG. 9A, in an embodiment, dielectric 152 is deposited on the trench capacitor 108, on dielectric 107 and on dielectric 142 in region 101B. Dielectric 142 may be formed prior to forming dielectric 107 as will be described below in FIGS. 11A-11D. In exemplary embodiments dielectric 152 includes silicon nitride, or carbon doped silicon nitride material having a film density above 90% of theoretical material density or film density.

Figure 9B:
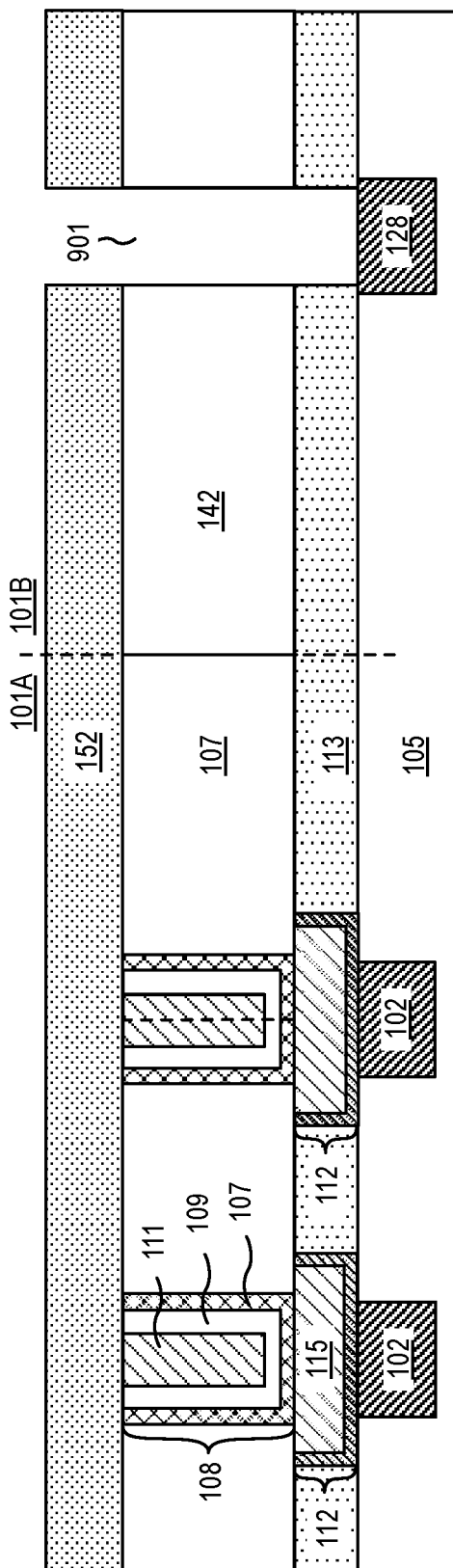
FIG. 9B is a cross-sectional illustration of the structure in FIG. 9A following the process to form a via opening in the second region.

FIG. 9B is a cross-sectional illustration of the structure in FIG. 9A following the process to form a via opening 901. In an embodiment, the process to form via opening 901 is substantially similar to process utilized to form via opening 816 in FIG. 8H. Referring again to FIG. 9B, however, formation of via opening 901 requires etching an additional dielectric 152 prior to etching dielectric 107.

Figure 9C:
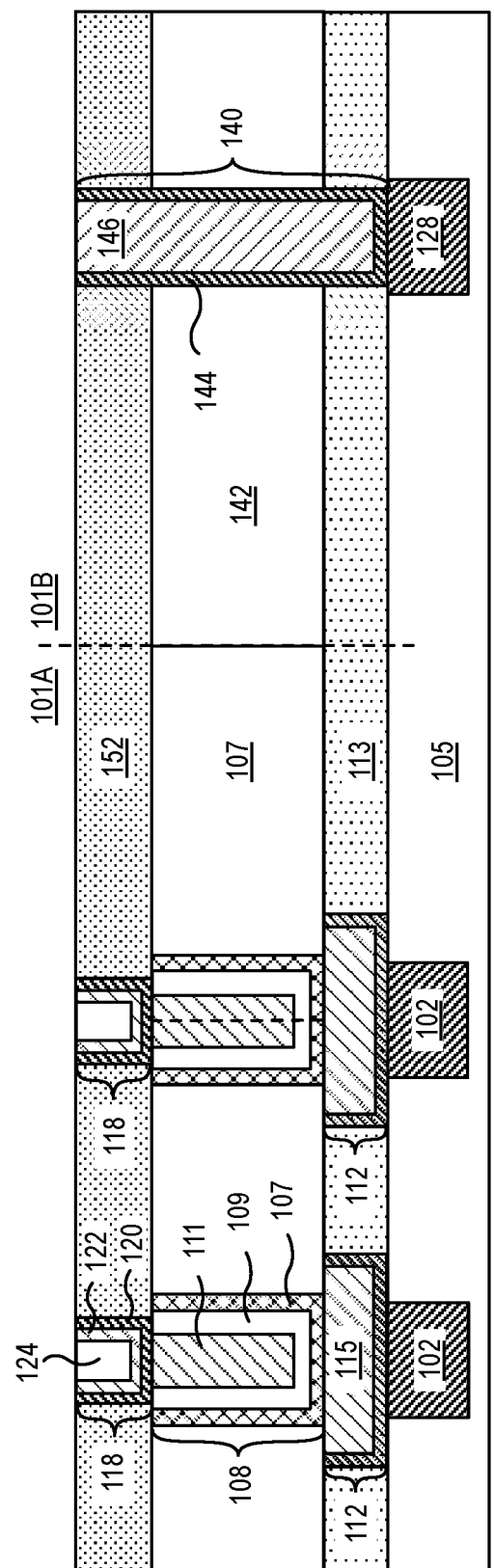
FIG. 9C is a cross-sectional illustration of the structure in FIG. 9B following the process to form a via electrode on a respective trench capacitor and following the formation of a via structure in the via opening, in accordance with an embodiment of the present disclosure.

FIG. 9C is a cross-sectional illustration of the structure in FIG. 9B following the process to form a via electrode 118 on the trench capacitor 108 and following the formation of via structure 140 in the via opening 901. Formation of via structure is substantially similar to formation of via structure 140 (described in association with FIG. 8I.)

In an embodiment, a mask is formed on dielectric 152. The mask may be formed by a lithographic process. Following the formation of the mask, a plasma etch may be performed to etch dielectric 152, dielectric 142 etch stop layer 113 to form a via openings above trench capacitor 108.

Following the process to form the via opening 901, the mask is removed, and one or more layers of conductive material is deposited into the via opening 901, on the conductive interconnect 128, on the dielectrics 813 and 142. In an embodiment, a liner layer 144 is deposited into the via opening 816, followed by a deposition of conductive fill material 146 on the liner layer 144.

Following the deposition process a planarization process is performed to isolate the liner layer 144 and conductive fill material 146 within the via opening 816 to form via structure 140.

In an embodiment, formation of via electrodes 118 is substantially similar to formation of via electrodes 118 (described in association with FIGS. 8J and 8K). Via openings utilized to form electrodes 118 are formed in dielectric 152 in contrast to dielectric 813 (in FIGS. 8J and 8K). Materials of the via electrode including conductive hydrogen barrier 120 are deposited on the top electrode 111 of trench capacitor 108. In some embodiments, portions of the conductive hydrogen barrier 120 may be deposited on the dielectric layer 809, but not on bottom electrode 109. A planarization process is performed to remove excess materials of the via electrode 118 from above dielectric 152. The method described in association with FIGS. 9B and 9C can be reversed so that the via electrodes 118 are formed prior to formation of via structure 140.

Figure 9D:
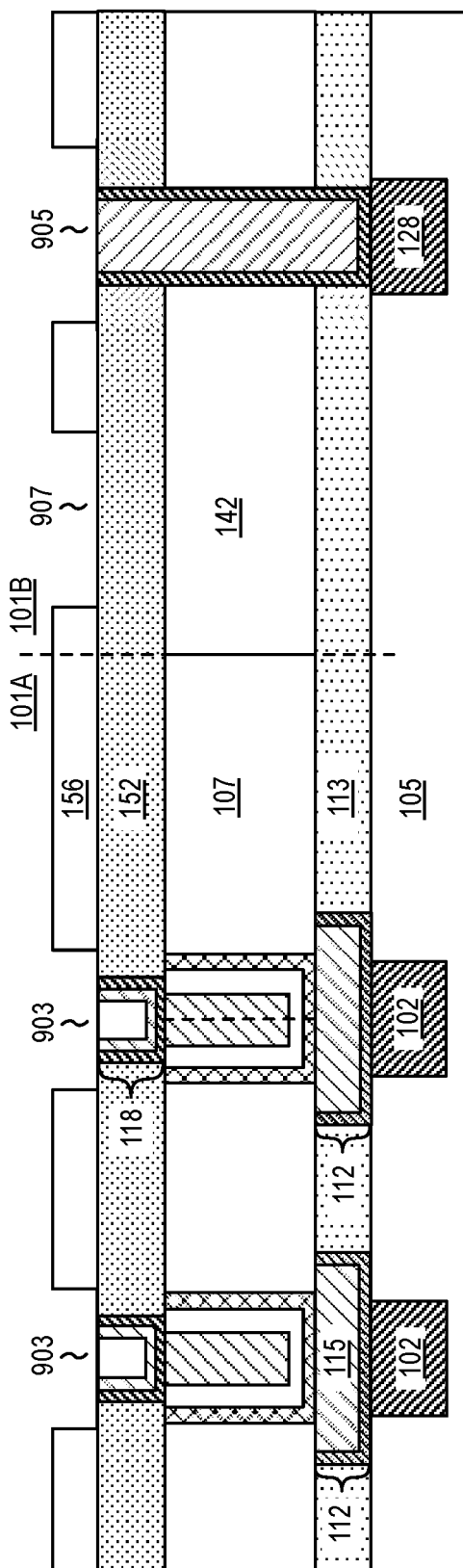
FIG. 9D is a cross-sectional illustration of the structure in FIG. 9C following the process to deposit a fifth dielectric and following a process to form openings above via electrode and opening above the via structure, in accordance with an embodiment of the present disclosure.

FIG. 9D is a cross-sectional illustration of the structure in FIG. 9C following the process to form opening 903 above via electrode 118 and openings 905 above via structure. In an embodiment, dielectric 156 is deposited on dielectric 152. In an embodiment, dielectric is blanket deposited on dielectric 152 by a PECVD or CVD process.

In an embodiment, a mask is formed on dielectric 156 and openings are formed. In the illustrative embodiment, openings 903, 905 and 907 are formed simultaneously by etching dielectric 156 through the mask.

Figure 9E:
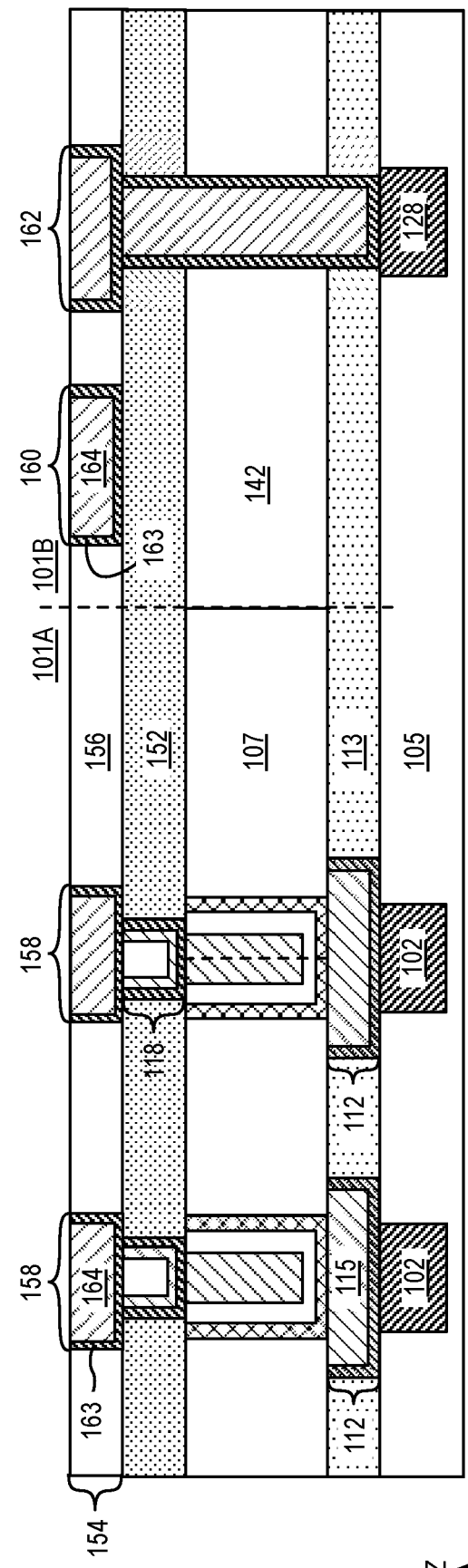
FIG. 9E is a cross-sectional illustration of the structure in FIG. 9D following the process to form a metal line above a respective via electrode and metal line above via structure, in accordance with an embodiment of the present disclosure.

FIG. 9E is a cross-sectional illustration of the structure in FIG. 9D following the process to form metal lines 158 above via electrode 118 and metal line 162 above via structure 140 and metal line 160 within dielectric 156, in accordance with an embodiment of the present disclosure. In an embodiment, a liner layer 163 is blanket deposited into the openings on the via electrodes 118, on the dielectric 152, on via structure 140 and on sidewalls on uppermost surface of dielectric 156. A conductive fill material 164 is then blanket deposited on the liner layer 163. In an embodiment, excess material is removed from above the dielectric 156 to form metal line 158 on a respective via electrode 118, metal line 160 on dielectric 156, and metal line 162 on via structure 140. Method described in association with FIGS. 9A-9E may be utilized to form device structure 100C described in association with FIG. 1E.

Figure 10A:
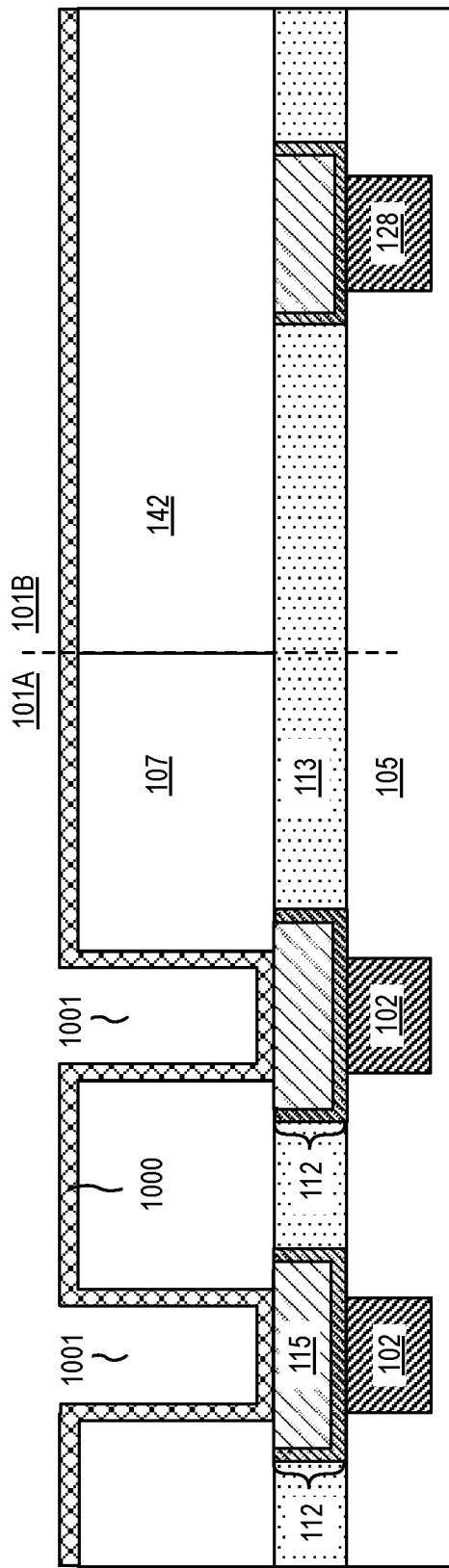
FIG. 10A is a cross-sectional illustration of the structure in FIG. 11D following the process to deposit a bottom electrode layer in trench openings, in accordance with an embodiment of the present disclosure.

FIG. 10A is a cross-sectional illustration of the structure in FIG. 11D following the process to deposit a bottom electrode layer 1000 in trench openings 1001, in accordance with an embodiment of the present disclosure. In an embodiment, an ALD process is utilized to deposit bottom electrode layer 1000. In an embodiment, bottom electrode layer includes a material that is the same or substantially the same as the material of the bottom electrode layer 807 (described in association with FIG. 8E).

Figure 10B:
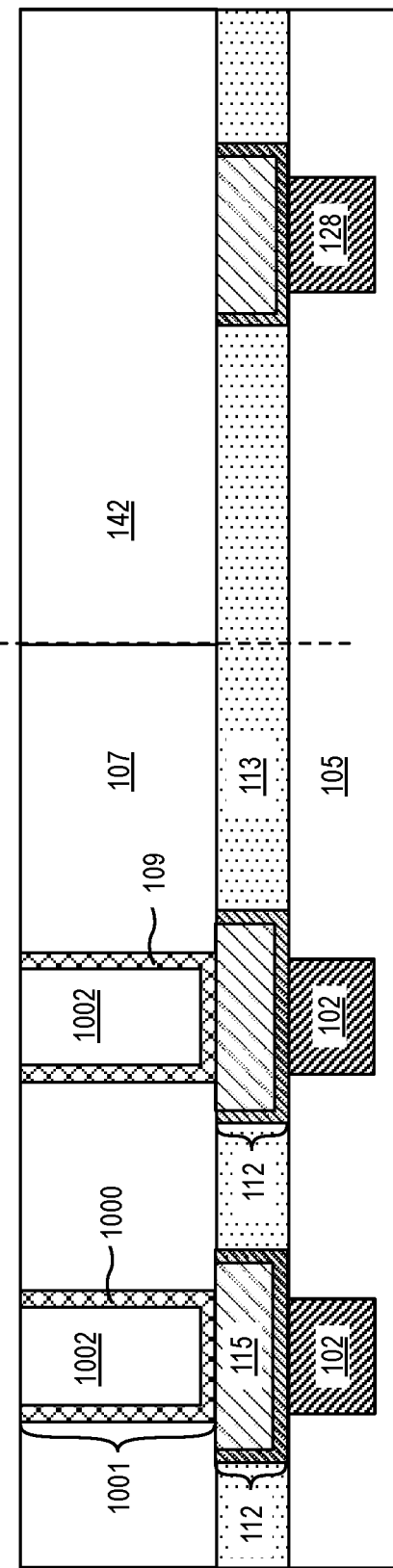
FIG. 10B is a cross-sectional illustration of the structure in FIG. 10A following the process to form a sacrificial layer within the trench openings, on the bottom electrode layer, followed by a process to planarize and remove portions of the bottom electrode outside of the trench openings to form bottom electrodes within a respective trench.

FIG. 10B is a cross-sectional illustration of the structure in FIG. 10A following the process to form a sacrificial layer 1002 within the trench openings 1001, on the bottom electrode layer 1000.

In an embodiment, a sacrificial layer 1002 is deposited into the openings 1001 on the bottom electrode layer 1000. The sacrificial material may include a dielectric material or a metallic material that can be removed selectively to the bottom electrode layer 1000 and dielectrics 107 and 142.

After deposition of the sacrificial layer 1002, a planarization process is performed to remove the bottom electrode layer 1000 from an uppermost surface of dielectric 107 and 142. In an embodiment, the planarization process includes a chemical mechanical planarization (CMP) process. The CMP process may be utilized to form a bottom electrode 109 within a respective trench opening 1001.

FIG. 10C is a cross-sectional illustration of the structure in FIG. 10B following the process to form a dielectric layer 1003 on the bottom electrode 109 and following a process to deposit top electrode layer 1005 on the dielectric layer 1003.

Following the formation of the bottom electrode 109, the sacrificial material is removed from opening 1001 selectively to dielectrics 107 and 142 and bottom electrode 109.

The dielectric layer 1003 is deposited on the bottom electrode 109, on dielectric 107 and on dielectric 142. The dielectric layer 1003 extends continuously from a trench opening 1001 to an adjacent opening 1001. Top electrode layer 1005 is then blanket deposited on dielectric layer 1003. In an embodiment, the process to deposit dielectric layer 1003 and top electrode layer 1005 includes a process that is the same or substantially the same as the process described in association with FIG. 8E. In an embodiment, the materials of the dielectric layer 1003 includes a material that is the same or substantially the same as the material of the dielectric layer 809, and the materials of the top electrode layer 1005 includes a material that is the same or substantially the same as the material of the top electrode layer 811.

FIG. 10D is a cross-sectional illustration of the structure in FIG. 10C following the process to form trench capacitor 108. In the illustrative embodiment, the top electrode layer is planarized and recessed into trench opening 1001 by a combination of planarization and selective etch back process, where dielectric layer 1003 is not recessed. The process of etching back top electrode layer 1005 (in FIG. 10C) to form top electrode 111 forms trench capacitor 108 in trench opening 1001. While dielectric 1003 is continuous each adjacent trench capacitor 108 can be independently operated because there is no appreciable cross talk between adjacent trench capacitor 108.

However dielectric layer 1003 can be patterned further prior to formation of via electrodes.

Figure 10E:
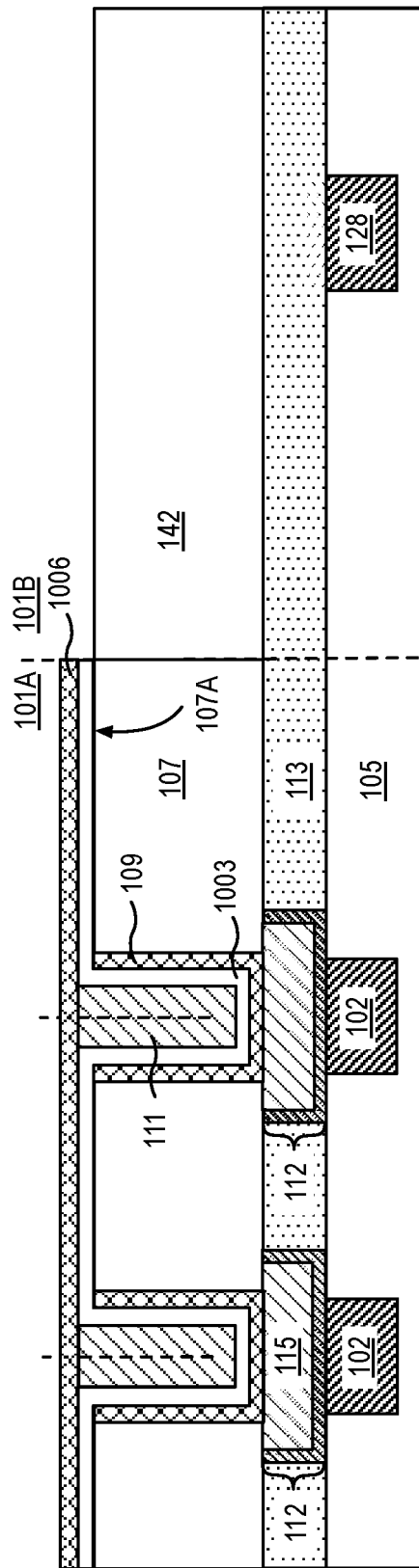
FIG. 10E is a cross-sectional illustration of the structure in FIG. 10D following the process to mask, etch and remove a portion of the dielectric layer from the second region.

FIG. 10E is a cross-sectional illustration of the structure in FIG. 10D following the process to mask and etch portion of the dielectric layer 1003. In an embodiment, a mask 1006 is formed on dielectric layer 1003, on top electrode 111. A plasma etch process may be utilized to etch dielectric layer 1003. In the illustrative embodiment, the dielectric layer 1003 is removed from the region 101B.

Figure 10F:
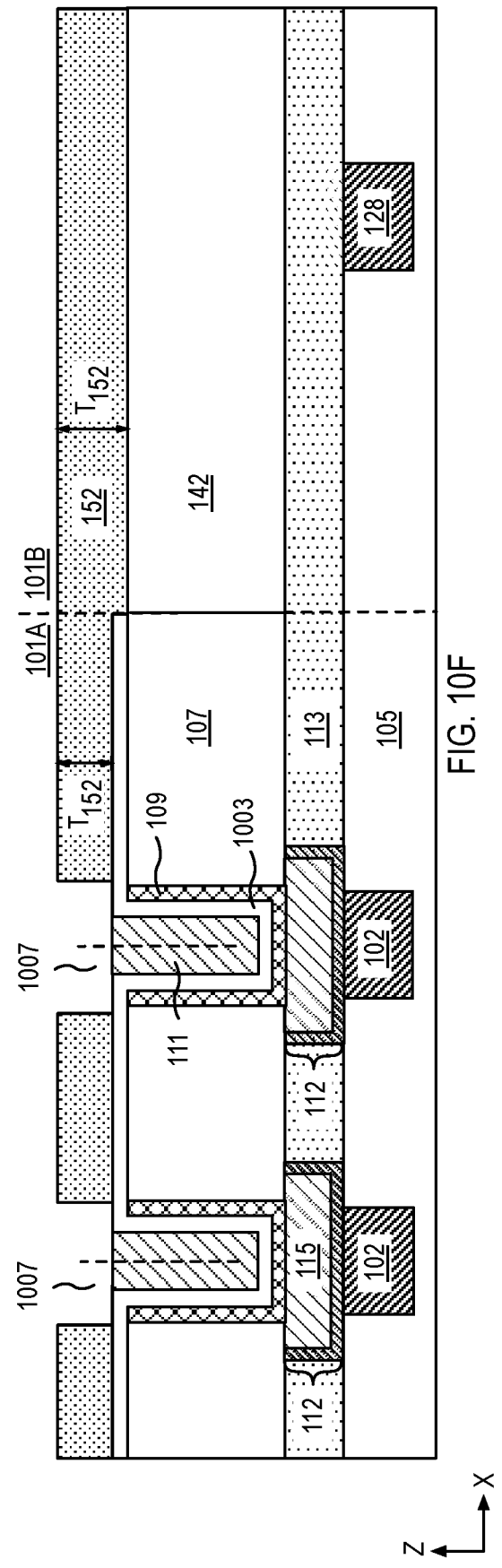
FIG. 10F is a cross-sectional illustration of the structure in FIG. 10E following the process to form openings in a fourth dielectric formed on portions of trench capacitor, and on the dielectric layer.

FIG. 10F is a cross-sectional illustration of the structure in FIG. 10E following the process to form openings 1007 in a dielectric 152 formed on portions of trench capacitor 108, on the dielectric layer 1003 and on uppermost surface 107A.

In an embodiment, dielectric 152 is blanket deposited onto the surface of dielectric layer 1003, dielectric 142 and on top electrode 111. Depending on thickness of the dielectric layer 1003, the dielectric 152 may be planarized. While the height of dielectric 152 may be different between regions 101A and 10B, the difference can be exacerbated when dielectric layer has a thickness that is greater than 5 nm.

Openings 1007 are formed by a plasma etch process after forming a mask on the dielectric 152.

FIG. 10G is a cross-sectional illustration of the structure in FIG. 10F following the process to form via electrode 118 on trench capacitor 108, and form opening 1009 to expose conductive interconnect 128 in region 401B.

In an embodiment, the process to form via electrodes is the same or substantially the same as the process utilized to form via electrodes described in association with FIG. 8K. referring again to FIG. 10G, opening 1009 is formed by masking the dielectric 152 and via electrodes 118 and etching dielectric 152, 142 and etch stop layer 113.

FIG. 10H is a cross-sectional illustration of the structure in FIG. 10FG following the process to form via structure 140 conductive interconnect 128 in region 401B. The materials and methods utilized to form via structure 140 are described in association with FIG. 9C.

Figure 11A:
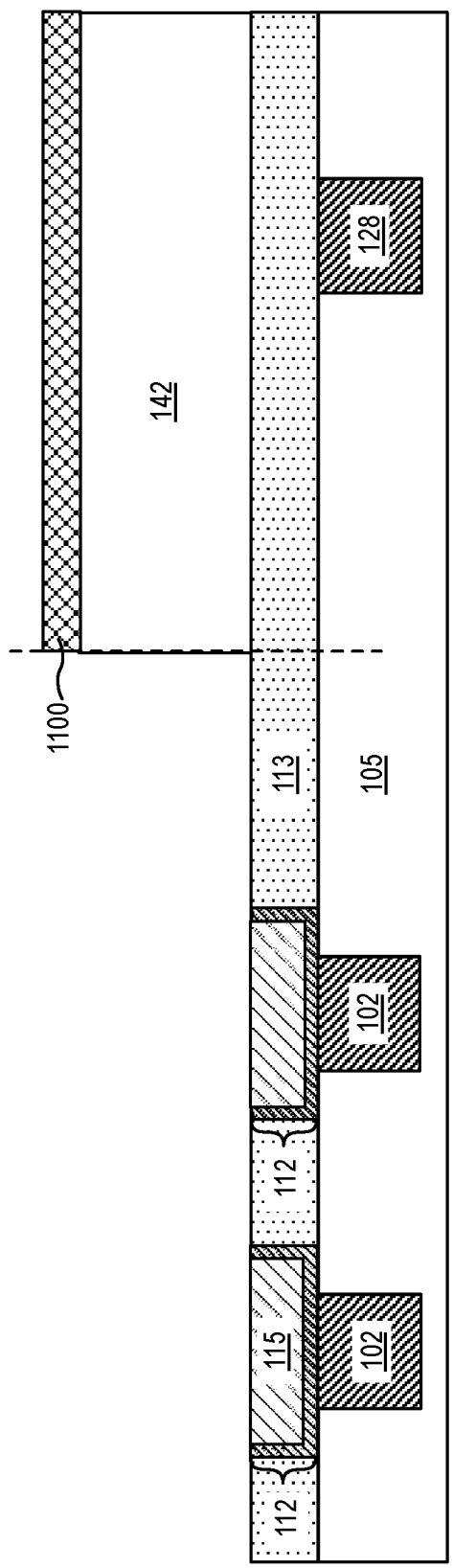
FIG. 11A is a cross-sectional illustration of the structure in FIG. 8B following the process to deposit a first dielectric and etch the dielectric from a first region.

FIG. 11A is a cross-sectional illustration of the structure in FIG. 8B following the process to deposit dielectric 142 and etch dielectric 142 from region 101A, in accordance with an embodiment of the present disclosure. In an embodiment, a mask 1100 is formed on dielectric 142 and a plasma etch process is utilized to remove dielectric 142 from region 101A. The etch process to remove dielectric 142 is selective to electrode structure 112, and to etch stop layer 113. Dielectric 142 includes a material with a low film density (a film density much below 90% of theoretical material density) for example low density $SiO_2$, carbon doped oxide (CDO), SiOC, SiCN, SiC, $SiO_xN_y$, F-doped oxides, or H-doped oxides.

Figure 11B:
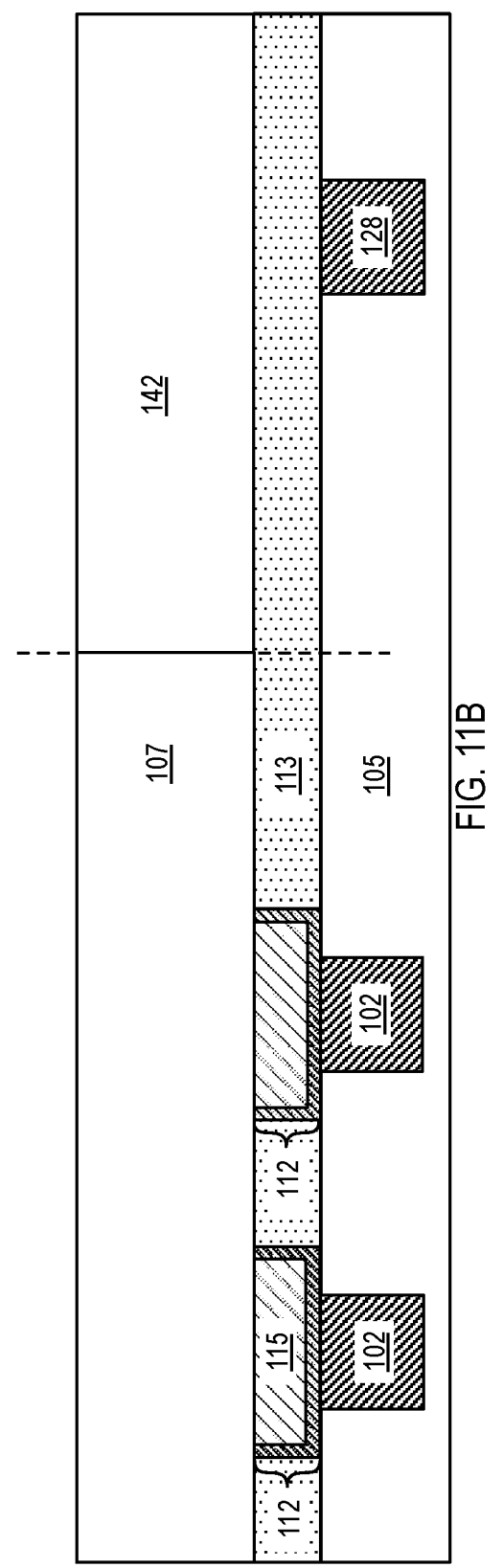
FIG. 11B is a cross-sectional illustration of the structure in FIG. 11B following the process to deposit and planarize a second dielectric.

FIG. 11B is a cross-sectional illustration of the structure in FIG. 11A following the process to form a block of dielectric 107 adjacent to and in contact with dielectric 142. In an embodiment, dielectric 107 is blanket deposited on the etch stop layer 113, electrode structure 112 and on dielectric 142 by a PVD, PECVD, PVD, ALD deposition process or a combination thereof. After deposition, dielectric 107 is planarized and removed from above dielectric 142.

FIG. 11C is a cross-sectional illustration of the structure in FIG. 11B following the process to form trench openings 1104 in the dielectric 107. In an embodiment, a mask 1102 is formed on the dielectric 107 and dielectric 142. In an embodiment, trench openings 1104 are formed in the dielectric 107 by a plasma etch process selective to electrode structure 112. When trench openings 1104 are wider than electrode structures 112, the etch process is also required to be selective to etch stop layer 113.

FIG. 11D is a cross-sectional illustration of the structure in FIG. 11C following the process to form trench capacitor 108 in dielectric 107 within trench openings 1104. The method to form trench capacitor 108 has been described in association with FIG. 8F.

FIG. 12A is a cross-sectional illustration of a material layer stack 1200 formed on electrode structures 414 in a first region 401A and on electrode structures 428 in a second region 401B. In the illustrative embodiment, electrode structures 414 are on a same plane as electrode structures 428. As shown, electrode structure 414 is formed above a respective conductive interconnect 406, and electrode structure 428 is formed above a respective conductive interconnect 426.

The process to form material layer stack 1200 includes blanket deposition of at least three material layers, where the number further depends on a type of memory device to be fabricated. In some embodiments, the material layer stack 1200 includes deposition of layers for a ferroelectric memory device. In other embodiments, the material layer stack 1200 includes deposition of layers for a paraelectric memory device.

In an embodiment, individual layers of material layer stack 1200 (for a ferroelectric memory device) are deposited in situ, i.e., without breaking vacuum. Material layer stack 1200 maybe deposited by an atomic layer deposition (ALD) process, a plasma enhanced chemical vapor deposition (PECVD), chemical vapor deposition (CVD), a physical vapor deposition (PVD) process or a combination thereof. In some embodiments, conductive layer 1200A is blanket deposited on electrode structure 112 and on etch stop layer 113. In an embodiment, conductive layer 1200A includes a conductive ferroelectric oxide. The conductive ferroelectric oxide includes a non-Pb perovskite metal oxide, such as but not limited to, La—Sr—CoO₃, SrRuO₃, La—Sr—MnO₃, YBa₂Cu₃O₇, Bi2Sr₂CaCu₂O₈, or LaNiO₃.

Conductive layer 1200A is deposited to a thickness, $T_1$, that is suitable for minimizing electrical resistance and to minimize tapering of sidewalls during a patterning process that will be utilized to fabricate memory devices. In some embodiments, conductive layer 1200A has a thickness that is between 1 nm and 30 nm. A thickness of less than 30 nm is highly desirable to prevent significant tapering in sidewalls during the patterning process.

In an embodiment, the deposition process is continued by deposition of a dielectric layer 1200B (for example, a ferroelectric dielectric layer 1200B for a ferroelectric memory device). The dielectric layer 1200B may be blanket deposited on the conductive layer 1200A. Dielectric layer 1200B has a thickness, $T_2$, that is between 1 nm and 30 nm. In some embodiments, dielectric layer 1200B includes non-Pb Perovskite material in the form $ABO_3$, where A and B are two cations of different sizes and O is oxygen. A is generally larger than B in size. In some embodiments, non-Pb Perovskites can also be doped, e.g., by Lanthanides. The non-Pb Perovskite material can include one or more of La, Sr, Co, Cr, K, Nb, Na, Sr, Ru, Y, Fe, Ba, Hf, Zr, Cu, Ta, Bi, Ca, Ti and Ni.

In other embodiments, dielectric layer 1200B includes a low voltage ferroelectric material sandwiched between the conductive oxide layers (1200A and 1200C). Low voltage materials can be of the form AA'BB'O₃, where A' is a dopant for atomic site A and can be an element from the Lanthanides series and B' is a dopant for atomic site B and can be an element from the transition metal elements such as Sc, Ti, V, Cr, Mn, Fe, Co, Ni, Cu, Zn. A' may have the same valency of site A, with a different ferroelectric polarizability. A voltage below 3 Volts is sufficiently low to be characterized as low voltage.

The deposition process is continued with a deposition of conductive layer 1200C on dielectric layer 1200B. In some embodiments, the conductive layer 1200C includes a material that is the same or substantially the same as the material of conductive layer 1200A. When conductive layers 1200A and 1200C include the same material, the material layer stack is symmetric. In different embodiments, conductive layer 1200C can have a different thickness than conductive layer 1200A. In embodiments, conductive layer 1200C is deposited to a thickness, $T_3$, between 1 nm and 30 nm. Conductive layer 1200C between 1 nm and 30 nm can facilitate the patterning process.

In some embodiments, where an ALD deposition process is utilized, the conductive layers 1200A and 1200C includes alloys of nitrogen and one or more of Ti, Ta, W, or Ru. The ALD deposition process may performed at low temperatures such as temperatures between 160-400 degrees Celsius. Depending on the material the resultant conductive layers may be nanocrystalline. The crystallinity of the layers 1200A, 1200B and 1200C may be tuned depending on deposition temperature, pressure, and plasma exposure and power.

In an embodiment, the deposition process concludes with the formation of hardmask layer 1202 on conductive layer 1200C. In some embodiment, hardmask layer 1202 is blanket deposited by a PECVD, CVD or PVD process. In an embodiment, hardmask layer 1202 includes a material that has a favorable etch selectivity compared to the ferroelectric materials in material layer stack 1200. In some embodiments, hardmask layer 1202 includes materials that can be patterned with high fidelity with respect to a masking layer formed on hardmask layer 1202, for example $SiO_2$, $Si_3N_4$, DLC (Diamond Like Carbon) or $Al_2O_3$. In other embodiments, hardmask layer 1202 includes a conductive material that is different from the conductive material of the ferroelectric material. In some embodiments it is desirable to deposit hardmask layer 1202 to a thickness, $T_4$, that enables patterning of at least the conductive layer 1200C. In other embodiments, hardmask layer 1202 may deposited to a thickness, $T_4$, that depends on a total thickness of material layer stack 1200. $T_4$ may be at least 20 nm. In a different embodiment, hardmask layer 1202 includes a bilayer where the bilayer includes a metallic layer and a dielectric on the metallic layer.

In an embodiment, photoresist mask 1204 is formed on hardmask layer 1202 and is formed by a lithographic process. The photoresist mask 1204 includes blocks 1204A and 1204B. Each block 1204A-1204B is a mask for patterning a discrete memory device, such as for example a ferroelectric memory device.

In an embodiment, the dielectric layer 1200B includes paraelectric materials. Paraelectric materials may include: $SrTiO_3$, $Ba_{(x)}Sr_{(y)}TiO_3$ (where x is −0.05, and y is 0.95), $HfZrO_2$, Hf—Si—O, La-substituted $PbTiO_3$. In some embodiments, material layer stack including paraelectric materials can range from 5 nm to 100 nm in total thickness.

FIG. 12B is a cross-sectional illustration of the structure in FIG. 12A following the process to pattern the material layer stack to form a plurality of memory devices. In an embodiment, hardmask layer 1202 is etched by a plasma etch process. The plasma etch process may include a discharge produced by a magnetic enhanced reactive ion etching mechanism, an electron cyclotron resonance discharge or an inductively coupled plasma discharge. The plasma parameters maybe characterized by a range of plasma densities such as between 1e9-1e12 ions/cm$^3$, pressures in the range of 0.001-10 Torr, and electron temperatures in the range of 1-8 eV. Ions may be accelerated to the surface from a plasma sheath by means of electrostatic chuck with biasing capabilities that are independent of the power delivered to sustain various plasma configurations. It is highly desirable to pattern hardmask layer 1202 to have substantially vertical side walls to prevent increase in a width when patterning the remaining layers in material layer stack 1200.

A $CH_XF_Y$ (fluorocarbon) $O_2$ and Ar based gas combination may be utilized to etch hardmask layer 1202 to form hardmask 1206 in one of the three different plasma discharges described above. In an exemplary embodiment, hardmask 1206 has a substantially vertical profile relative to a lowermost surface 1208A. In some embodiments, photoresist mask 1204 is removed after forming hardmask 1206. The plasma etch process is continued to pattern conductive layer 1200C. Hardmask 1206 is utilized to etch conductive layer 1200C. In an embodiment, a plasma etch process is utilized to etch the conductive layer 1200C to form a top electrode 1212. In the illustrative embodiment, top electrode 1212 has substantially vertical sidewalls 1212A. In some embodiments, hardmask 1206 is removed during the plasma etch process as indicated by dashed lines, when the hardmask 1206 includes a dielectric material. The etch process is continued to etch dielectric layer 1200B to form etched dielectric layer 1210 (herein dielectric layer 1210).

The plasma etch process is continued to etch and form a bottom electrode 1208. In an embodiment, the process utilized to etch conductive layer 1200A (FIG. 12A) to form bottom electrode 1208 may be substantially the same as the etch process utilized to form top electrode 1212. In the illustrative embodiment, sidewalls of the planar capacitor 402 are substantially vertical respect to a normal to lowermost surface 1208A. The process of forming the top electrode 1212, dielectric layer 1210, bottom electrode 1208 also completes formation of planar capacitor 402.

In some embodiments, portions of the electrode structure 428 may be recessed during patterning to form bottom electrode 1208.

FIG. 12C is a cross-sectional illustration of the structure in FIG. 12B following the process to form an encapsulation layer 438 on individual ones of the plurality of trench capacitors 402. In an embodiment, encapsulation layer 438 is deposited on the planar capacitor 402, on etch stop layer 113 and on electrode structures 428. Encapsulation layer 438 includes a hydrogen barrier material and may be deposited by a PVD, PECVD, PVD, ALD deposition process or a combination thereof. Depending on the deposition process, encapsulation layer 438 may be substantially conformal to planar capacitor 402. In some embodiments the encapsulation layer 438 has a wider portion adjacent to a top surface 402D of planar capacitor 402 as indicated by dashed lines 1213. The encapsulation layer 438 may be deposited to a thickness of at least 3 nm.

FIG. 12D is a cross-sectional illustration of the structure in FIG. 12C following the process to deposit dielectric 436 on the memory devices, planarize dielectric 436 and following a process to form openings 1214 in the dielectric 436, in accordance with an embodiment of the present disclosure.

In an embodiment, the dielectric 436 includes a low film density material. In an embodiment, a PECVD or a CVD process is utilized to blanket deposit dielectric 436 on encapsulation layer 438, in regions 401A and 401B. In an embodiment, a planarization process is performed form a substantially flat uppermost surface 436A.

A mask 1216 maybe formed on the dielectric surface 436A by a lithographic process. Openings 1214 are formed in the dielectric 436 through a mask 1216. The openings 1214 may have sidewalls that are substantially vertical or flared. In the illustrative embodiment, the sidewalls of opening 1214 are substantially vertical. The openings 1214 may be formed by a plasma etch process that etches dielectric 436 but is selective to planar capacitor 402. In some embodiments, the opening 1214 exposes a portion of the uppermost surface 402D of the planar capacitor 402. In other embodiments, the openings 1214 are wider and expose an entire upper most surface 402D. In some embodiments, when openings 1214 exposes the entire uppermost surface 402D, etch process may recess portions of the encapsulation layer 438 below the uppermost surface 402D. However, a conductive hydrogen barrier layer to be deposited on the planar capacitor 402 in a subsequent operation as well as remaining encapsulation layer 438 will provide sufficient hermetic seal to provide a barrier against hydrogen diffusion.

FIG. 12E is a cross-sectional illustration of the structure in FIG. 12D following the process to form via electrodes 420 in the openings 1214. In the illustrative embodiment, a conductive hydrogen barrier material is blanket deposited into the openings 1214, on the planar capacitor 402, on uppermost surface 436A and on sidewall of dielectric 436 within openings 1214. The conductive hydrogen barrier material includes a material that is compatible with the dielectric 436 so that an interface 1217 between the conductive hydrogen barrier material and the dielectric 436 is not a source of dislocations.

In an embodiment, a liner layer material is blanket deposited in the openings 1214, and on the conductive hydrogen barrier material. A layer of fill metal is deposited into the remaining portions of openings 1214 on the liner layer material. In embodiments, the conductive hydrogen barrier material, the liner layer material and layer of fill metal are deposited by an ALD, PVD or sputter deposition process.

Following the deposition process, a planarization process is performed to remove excess materials from above dielectric 436.

In an embodiment, the planarization process includes a chemical mechanical planarization (CMP) process. The CMP process removes layer of fill metal, liner layer material and the conductive hydrogen barrier material from an uppermost surface 436A. The planarization process isolates the materials inside the openings 1214 to form via electrode 420 with a conductive hydrogen barrier 422, liner layer 424 and conductive fill material 425 within the openings 1214. The CMP process may also reduce the as deposited thickness of the dielectric 436. The via electrode has a vertical thickness, $T_{VE}$.

FIG. 12F is a cross-sectional illustration of the structure in FIG. 12E following the process to form trenches 1220 above the plurality of electrode structures 428 in region 401B. In an embodiment, the method to form trenches 1220 is the same or substantially the same as the method utilized to form trenches 801 described in association with FIG. 8D. In the illustrative embodiment, forming trenches 1220 requires etching through the encapsulation layer 438 and exposing an uppermost surface of electrode structure 428. As shown trenches 1220 have substantially vertical sidewall profiles. In other embodiments, the sidewalls may be tapered inwards such that the trench has a width that decreases towards electrode structure 428.

Figure 12G:
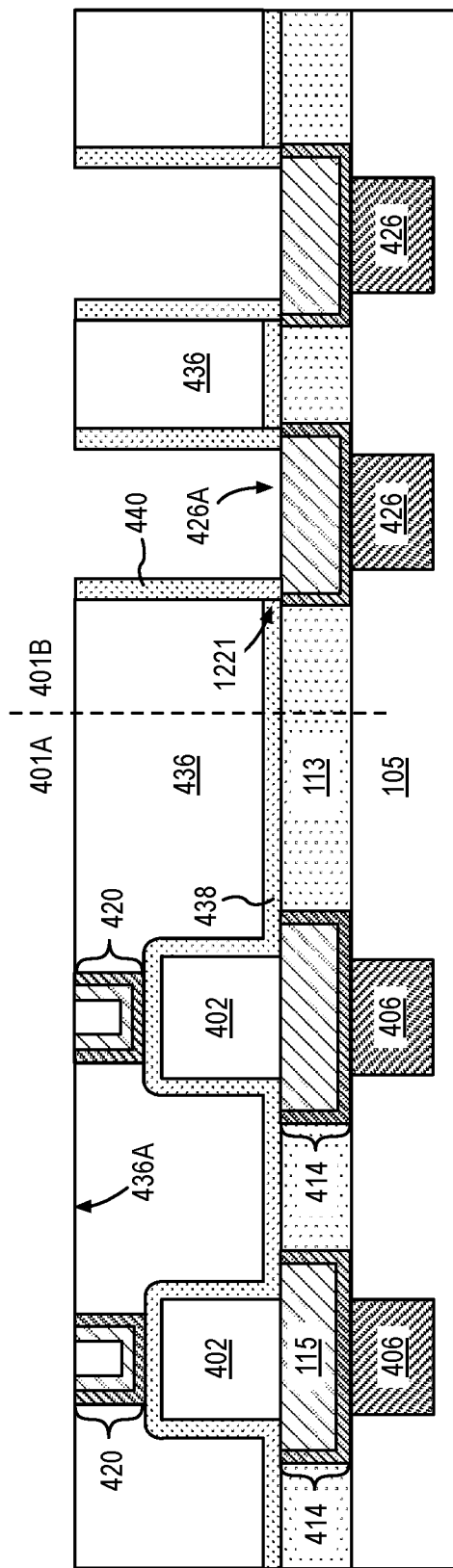
FIG. 12G is a cross-sectional illustration of the structure in FIG. 12F following the process to form spacer adjacent to a sidewall of respective trench.

FIG. 12G is a cross-sectional illustration of the structure in FIG. 12F following the process to form a spacer 440 adjacent to a sidewall of respective trench 1220. In an embodiment, a spacer layer is. Blanket deposited in the trench on the electrode structure 428, on dielectric 436 and on via electrode 420. The spacer may be deposited by a PVD, PECVD, PVD, ALD deposition process or a combination thereof. After deposition the spacer layer may be etched by a plasma etch process to remove portions that are on the top surface 426A and on uppermost surface 436A. It is to be appreciated that spacer 440 and encapsulation layer 438 may include a same material or a different material. Furthermore, spacer 440 may be deposited to a different thickness than the encapsulation layer 438. In some embodiments, the interface 1221 between encapsulation layer 438 and spacer 440 may have a seam. In some embodiments, an inner sidewall of spacer 440 may be tapered away from trench sidewall 1220A.

Figure 12H:
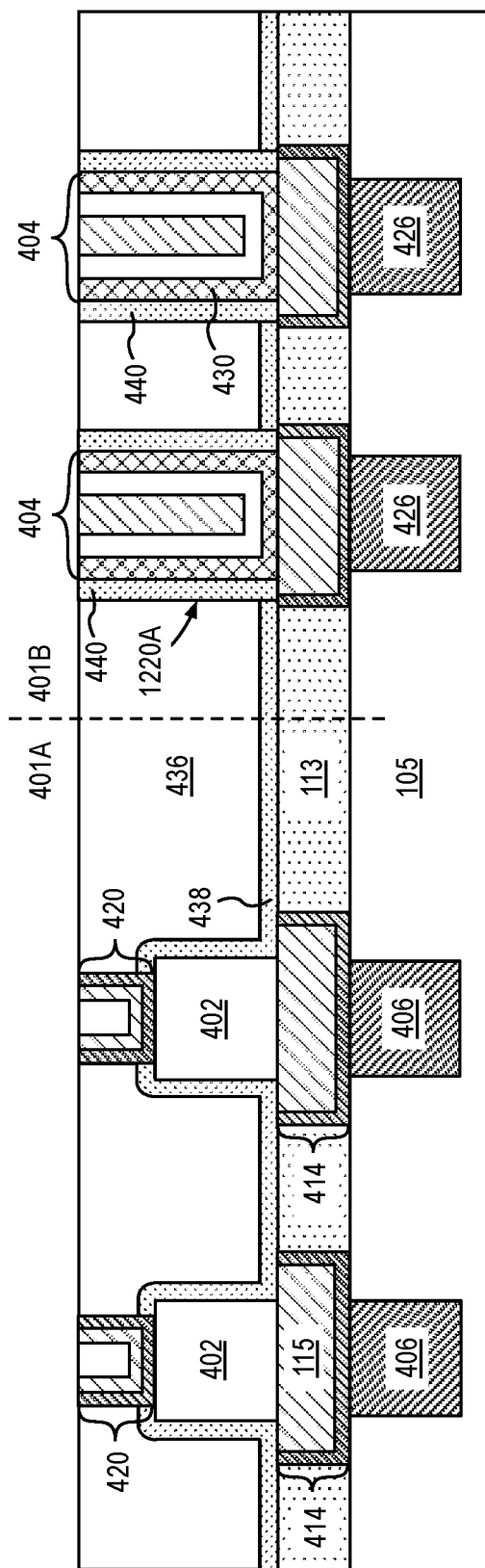
FIG. 12H is a cross-sectional illustration of the structure in FIG. 12G following the process to form trench capacitors.

FIG. 12H is a cross-sectional illustration of the structure in FIG. 12G following the process to form trench capacitors. In an embodiment, the method to form trench capacitor 404 is the same or substantially the same as the method utilized to form trench capacitor 108 described in association with FIG. 8D. In the illustrative embodiment, a material of the bottom electrode 430 is formed adjacent to spacer 440.

In some embodiments, another layer of dielectric can be deposited on the dielectric 436 on via electrode 420 and on trench capacitor 404 to fabricate a via electrode on trench capacitor 404 such as is illustrated in FIG. 9C.

FIG. 13A is a cross-sectional illustration of the structure in FIG. 12B following the process to deposit a sacrificial dielectric 1300 on the planar capacitor 402 and on the etch stop layer 113. In an embodiment, the sacrificial dielectric 1300 is formed by a PVD, PECVD, PVD, ALD deposition process or a combination thereof. In an embodiment, sacrificial dielectric 1300 includes a low K ILD such SIO$_2$ or SiOC. A planarization process is formed after deposition.

A mask 1302 may be formed on the sacrificial dielectric 1300. In an embodiment, a plasma etch process is utilized to etch trenches 1304 in the sacrificial dielectric 1300 as shown. The trench 1304 exposes at least portions of electrode structure 428.

In some embodiments the trench may be tapered as indicated by dashed lines 1305.

FIG. 13B is a cross-sectional illustration of the structure in FIG. 13A following the process to form trench capacitor 404. In an embodiment, the process utilized to form trench capacitor 404 is substantially the same as the process utilized to form trench capacitor 404 described in association with FIG. 12H.

FIG. 13C is a cross-sectional illustration of the structure in FIG. 13B following the process to remove the sacrificial dielectric. In an embodiment, a wet chemical process is utilized to remove the sacrificial dielectric selectively to the planar capacitor 402, trench capacitor 404, etch stop layer 113, and electrode structure 428.

FIG. 13D is a cross-sectional illustration of the structure in FIG. 13C following the process form an encapsulation layer 438 on the planar capacitor 402 and on the trench capacitor 404. In an embodiment, the process utilized to form encapsulation layer 438 is substantially the same as the process utilized to form encapsulation layer 438 described in association with FIG. 12C. In the illustrative embodiment, the encapsulation layer 438 is also deposited on trench sidewalls 404A of trench capacitor 404. As shown encapsulation layer 438 is also deposited on a top surface 404B of trench capacitor 404, including bottom electrode 430, dielectric layer 432, and top electrode 434.

In some embodiments, where the trench capacitor 404 is tapered (resulting from a tapered trench 1304 as shown in FIG. 13A), the method described herein, can enable formation of a hydrogen barrier layer around a tapered trench sidewall 404A.

Figure 13E:
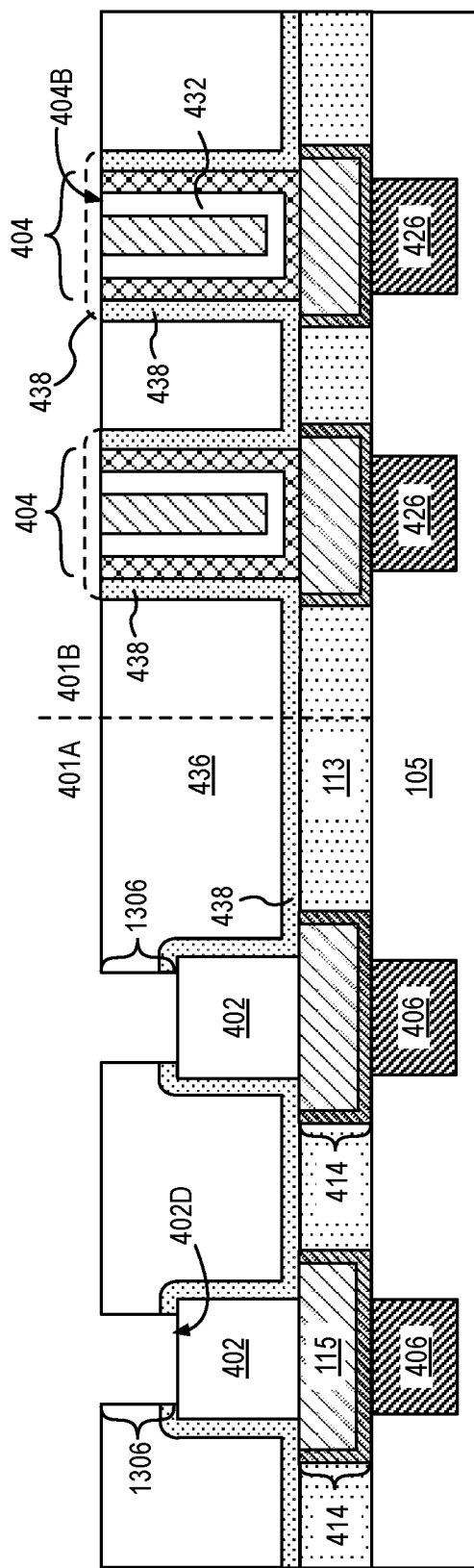
FIG. 13E is a cross-sectional illustration of the structure in FIG. 13F following the process to deposit a dielectric and form via openings in the dielectric above a respective planar capacitor.
Figure 13F:
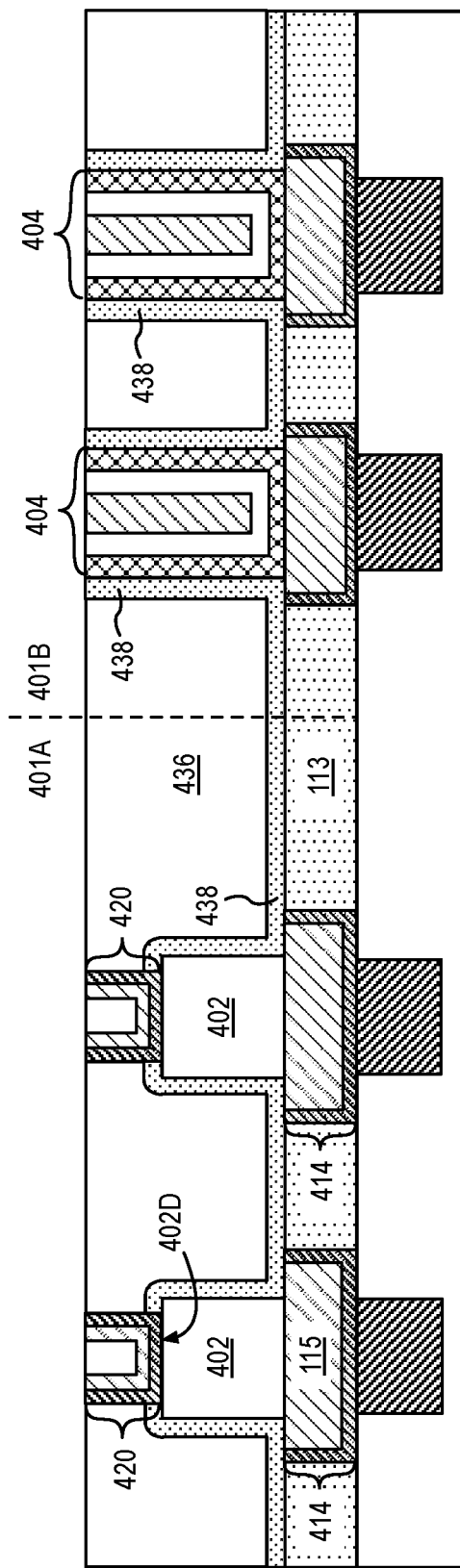
FIG. 13F is a cross-sectional illustration of the structure in FIG. 13E following the process form via electrode on a respective planar capacitor.

FIG. 13E is a cross-sectional illustration of the structure in FIG. 13F following the process form via openings 1306 in dielectric 436 above a respective planar capacitor 402.

In the illustrative embodiment, dielectric 436 is deposited on the encapsulation layer 438 and planarized. The encapsulation layer 438 may be removed from above the trench capacitor 404 during a planarization process, as shown. In other embodiments, encapsulation layer 438 may be present on top surface 404B of trench capacitor 404 as shown by the dashed lines. In some such embodiments, the encapsulation layer 438 may remain as a hydrogen barrier above the dielectric layer 430. In yet other embodiments, the planarization process leaves a substantially planar dielectric 436 above the encapsulation layer.

While in the illustrative embodiment, dielectric 436 including a low K ILD is deposited, in other embodiments, dielectric 418 is deposited on the encapsulation layer 438 and planarized. The method described can provide a process for forming difficult to pattern dielectric materials that can advantageously provide hydrogen barrier features to planar capacitor 402 and trench capacitor 404.

After planarization process a mask is formed on dielectric 436 and a plasma etch may be utilized to etch dielectric 436 to form via openings 1306. The via openings 1306 exposes an uppermost surface 402D of planar capacitor 402.

FIG. 13F is a cross-sectional illustration of the structure in FIG. 13E following the process form via electrode 420 on a respective planar capacitor 402. The method to form via electrode 420 is described in association with FIG. 12E.

Figure 14A:
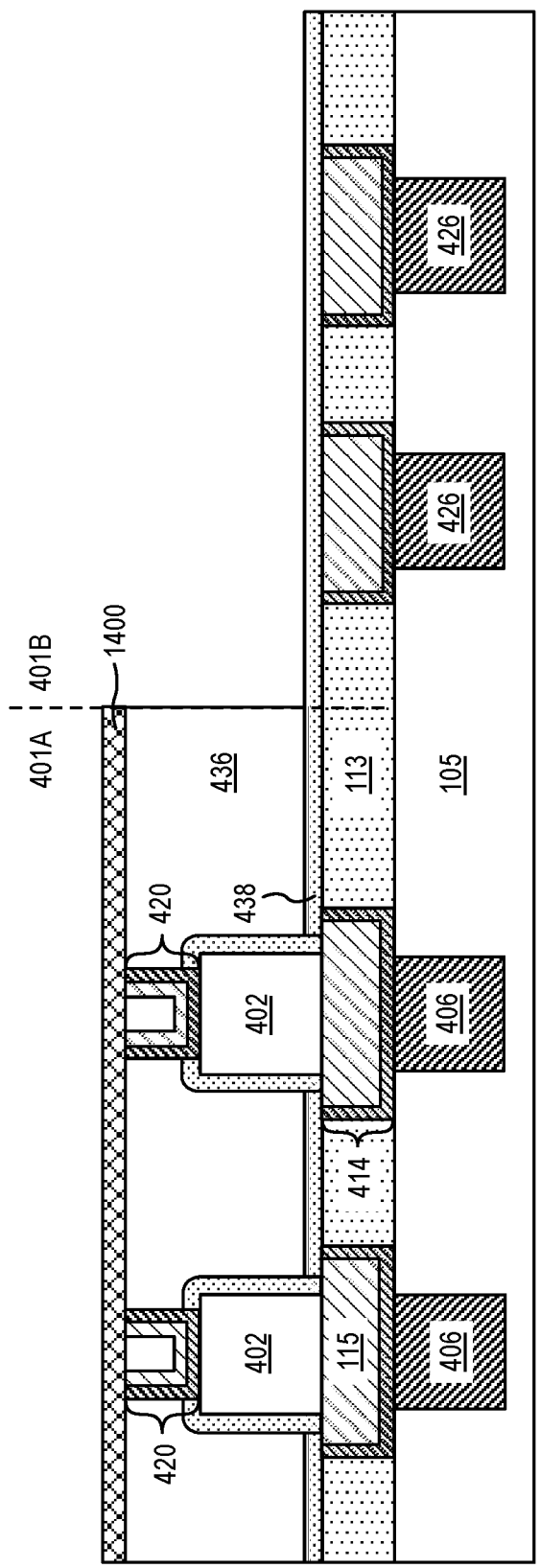
FIG. 14A is a cross-sectional illustration of the structure in FIG. 12E following the process to etch and remove the first dielectric from the second region.

FIG. 14A is a cross-sectional illustration of the structure in FIG. 12E following the process to etch and remove the dielectric 436 from the region 401B.

In an embodiment, a mask 1400 is formed on the dielectric 436 and on via electrode 420 by a lithographic process. The mask is utilized to etch the dielectric 436 from region 401B, as shown. In an embodiment, a plasma etch is utilized to etch and remove dielectric 436 selectively from above the encapsulation layer 438 in region 401B. The encapsulation layer provides protection to the electrode structure 428 in region 401B during removal of dielectric 436. The mask 1400 is removed after the etch process.

Figure 14B:
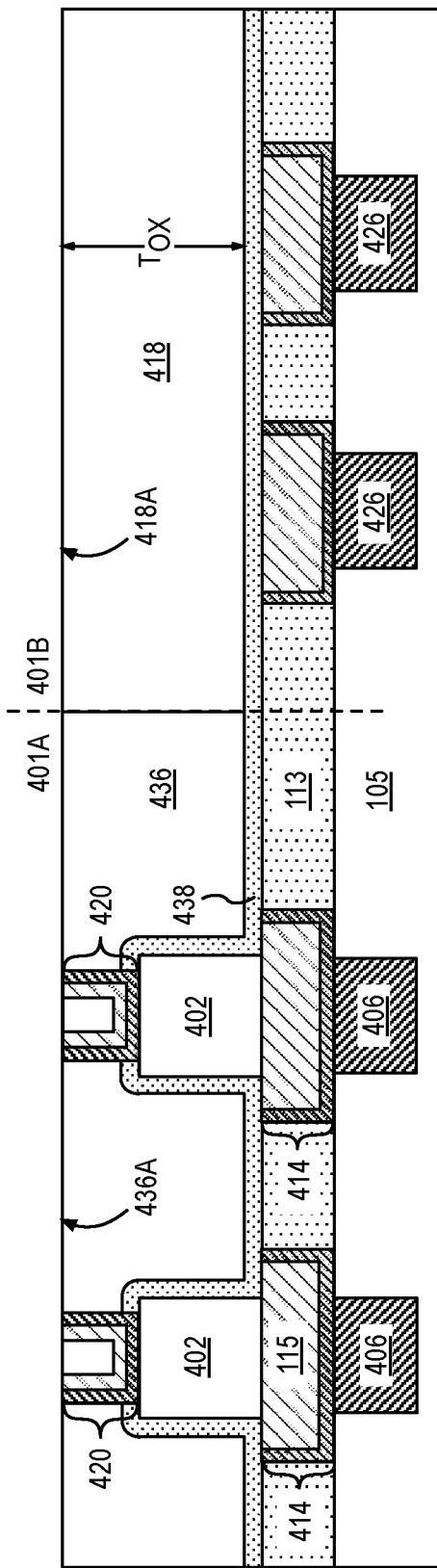
FIG. 14B is a cross-sectional illustration of the structure in FIG. 14A following the process to deposit a second dielectric in the second region and planarizing the second dielectric.

FIG. 14B is a cross-sectional illustration of the structure in FIG. 14A following the process to block of dielectric 418 in the region 401B adjacent to and in contact with dielectric 436 in region 401A. In an embodiment, dielectric 418 is blanket deposited on the etch encapsulation layer 438 and on dielectric 436 by a PVD, CVD and ALD deposition methods. The dielectric 436 is a high density film and provides a hydrogen barrier to a trench capacitor to be formed above electrode structure 428. After deposition, dielectric 418 is planarized and removed from above dielectric 436. Uppermost surfaces 436A and 418A are co-planar or substantially co-planar after the planarization process.

Figure 14C:
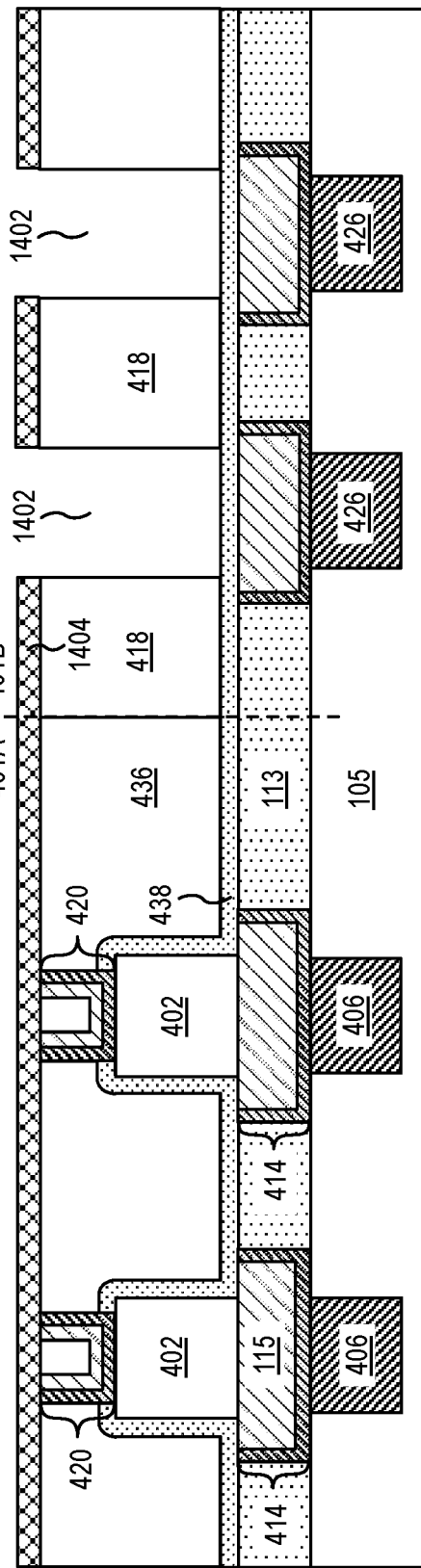
FIG. 14C is a cross-sectional illustration of the structure in FIG. 14B following the process to form trenches above the plurality of second electrode structures in the second region.

FIG. 14C is a cross-sectional illustration of the structure in FIG. 14B following the process to form trenches 1402 above the plurality of second electrode structures 428 in region 401B.

In an embodiment, a mask 1404 is formed on the dielectrics 436 and 418 and on via electrode 420 by a lithographic process. The mask is utilized to etch the dielectric 418 from region 401B, as shown. In an embodiment, a plasma etch is utilized to etch and remove dielectric 418 selectively from above the electrode structure 428 in trenches 1402. The encapsulation layer 438 provides protection to the electrode structure 428 in region 401B during removal of dielectric 418. Dielectric 418 may be more difficult to etch than dielectric 436. The presence of encapsulation layer 438 may ensure that electrode structure 428 is not affected during formation of trenches 1402. The mask 1404 is removed after the etch process.

FIG. 14D is a cross-sectional illustration of the structure in FIG. 14C following the process to form trench capacitors 404 in the trenches 1402. In an embodiment, the method to form trench capacitor 404 is the same or substantially the same as the method utilized to form trench capacitor 404 described in association with FIG. 12G. In the illustrative embodiment, the bottom electrode 430 is formed directly adjacent to dielectric 418.

It is to be appreciated that height TVE of the via electrode 420 maybe reduced as a result of the formation of trench capacitor 404 due to multiple planarization processes. In other embodiments, via electrode 420 may be formed after fabrication of trench capacitors 404.

Dielectric layer 432 may be the same or different from a dielectric layer within planar capacitor 402.

FIG. 15A is a cross-sectional illustration of the structure in FIG. 12B following the process to blanket deposit dielectric 418 on the planar capacitors 402 and form trenches 1500 in the dielectric 418 above a respective second electrode structure 428. Dielectric 418 includes a high density film and offers hydrogen barrier protection to the planar capacitor 402 as well as to the trench capacitors 404 to be formed. In an embodiment, the dielectric 418 is deposited to a thickness, $T_{OX}$, that is at least equal to 1.5 times vertical thickness, $T_{MD1}$ of the planar capacitor 402. In some such embodiments, deposition of an encapsulation layer may be skipped.

The method to form trenches 1500 includes forming a mask 1502 on the dielectric 418 and etching the dielectric through openings in the mask 1502. The etch process is different from the etch process utilized to form trenches 1402 in FIG. 14C. In the illustrative embodiment, the absence of an encapsulation layer protecting electrode structure 428 requires attention in the chemical species utilized to etch dielectric 418 while exposing electrode structure 428. In some such embodiments, a lower portion 1500A of trench 1500 may be tapered inward as parameters such as ion energy may be reduced to minimize damage to the conductive hydrogen barrier 114 or the conductive fill material 115 in electrode structure 428.

Mask 1502 may be removed after formation of trenches 1500.

FIG. 15B is a cross-sectional illustration of the structure in FIG. 15B following the process to form a trench capacitor 404 in a respective trench opening and form a via opening 1504 above a respective planar capacitor 402.

In an embodiment, the trench capacitor can be formed prior to the formation of via electrodes 420 as illustrated. The method to form trench capacitor is substantially the same as the method utilized to form trench capacitor 404 described in association with FIG. 14D. referring again to FIG. 15B, the choice of materials in trench capacitor 404 depends on a type of device desired, for example, ferroelectric device or a paraelectric device.

After fabrication of trench capacitor 404, a mask 1506 is formed on dielectric 418 and on trench capacitors 404. A plasma etch process may be utilized to form via openings 1504 to expose uppermost surfaces 402D of planar capacitors 402, as shown.

FIG. 15C is a cross-sectional illustration of the structure in FIG. 15B following the process to form via electrodes 420. The materials and processes utilized to form via electrode 420 are the same or substantially the same as the materials and processes utilized to form via electrodes 420 described in association with FIG. 14D.

FIG. 16A is a cross-sectional illustration of the structure in FIG. 12B following the process to form dielectric 418 on planar capacitors 402. In an embodiment, the dielectric 418 includes a hydrogen barrier material and can be deposited without deposition of an encapsulation layer on exposed surfaces of planar capacitor 402. Dielectric 418 may include materials and be deposited by a process described above In association with FIG. 15A. Referring again to FIG. 16A, a mask 1600 may be formed on the dielectric 418 by a lithographic process. The mask 1600 is utilized to pattern the dielectric 418 and remove it from region 401B. The process to etch dielectric 418 exposes the electrode structure 428 and etch stop layer 113 in region 401B, as shown.

FIG. 16B is a cross-sectional illustration of the structure in FIG. 16A following the process to form a block of dielectric 436 in the region 401B. In an embodiment, dielectric 436 may be deposited on the dielectric 418, on etch stop layer 113 and on electrode structure 428 by a PVD, PECVD, PVD, ALD deposition process or a combination thereof. Excess dielectric 436 deposited on dielectric 418 may be removed by planarizing. The planarization process forms substantially co-planar uppermost surfaces 418A and 436A as shown. In some embodiments, dielectric 436 may be deposited in region 401B to form trench capacitors that are substantially taller than planar capacitor 402.

Figure 16C:
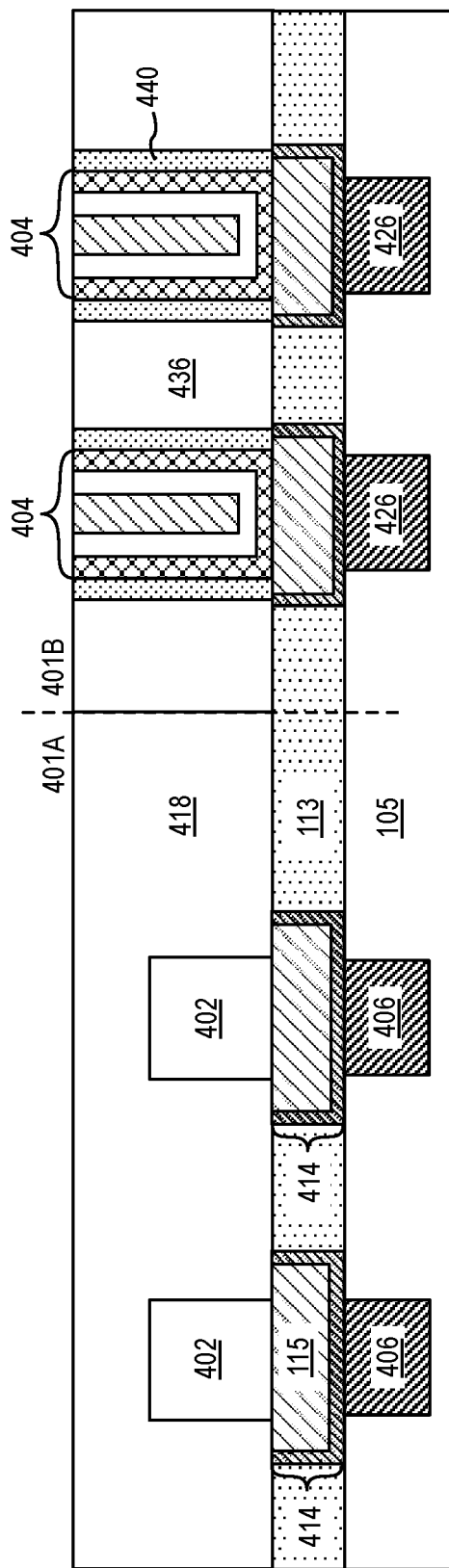
FIG. 16C is a cross-sectional illustration of the structure in FIG. 16B following the process to form a trench capacitor and a spacer between the trench capacitor and the first dielectric.

FIG. 16C is a cross-sectional illustration of the structure in FIG. 16B following the process to form trench capacitors 404 and a spacer 440 between the trench capacitor 404 and dielectric 436.

In an embodiment, the method to form spacer 440 and trench capacitor 404 is the same or substantially the same as the method utilized to form spacer 440 and trench capacitor 404 described in association with FIG. 12G-H.

Figure 16D:
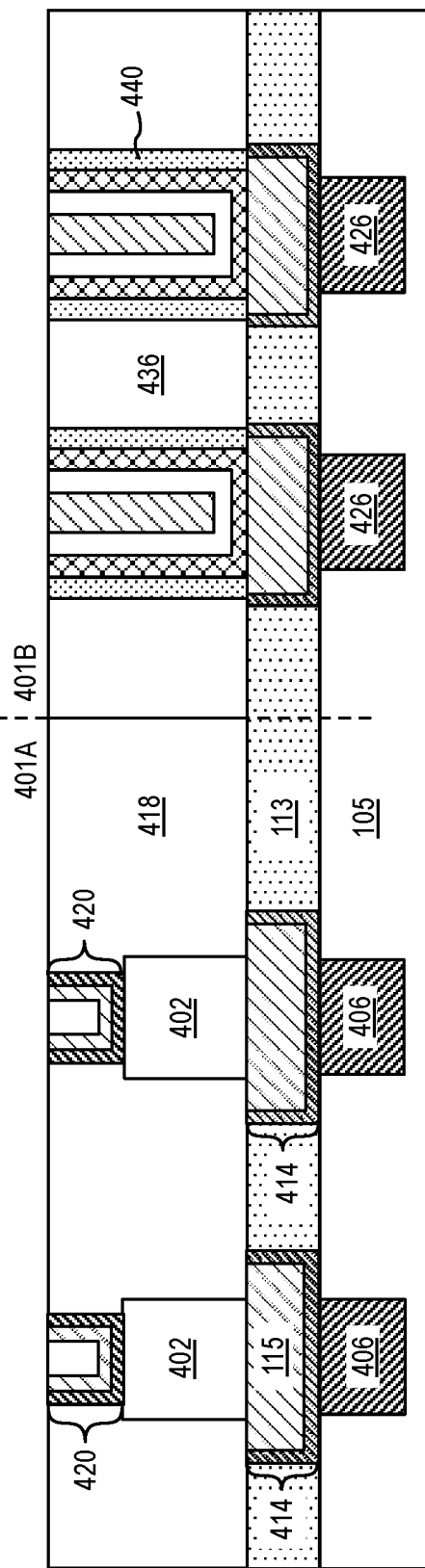
FIG. 16D is a cross-sectional illustration of the structure in FIG. 16C following the process to form via opening above a respective planar capacitor.
Figure 19:
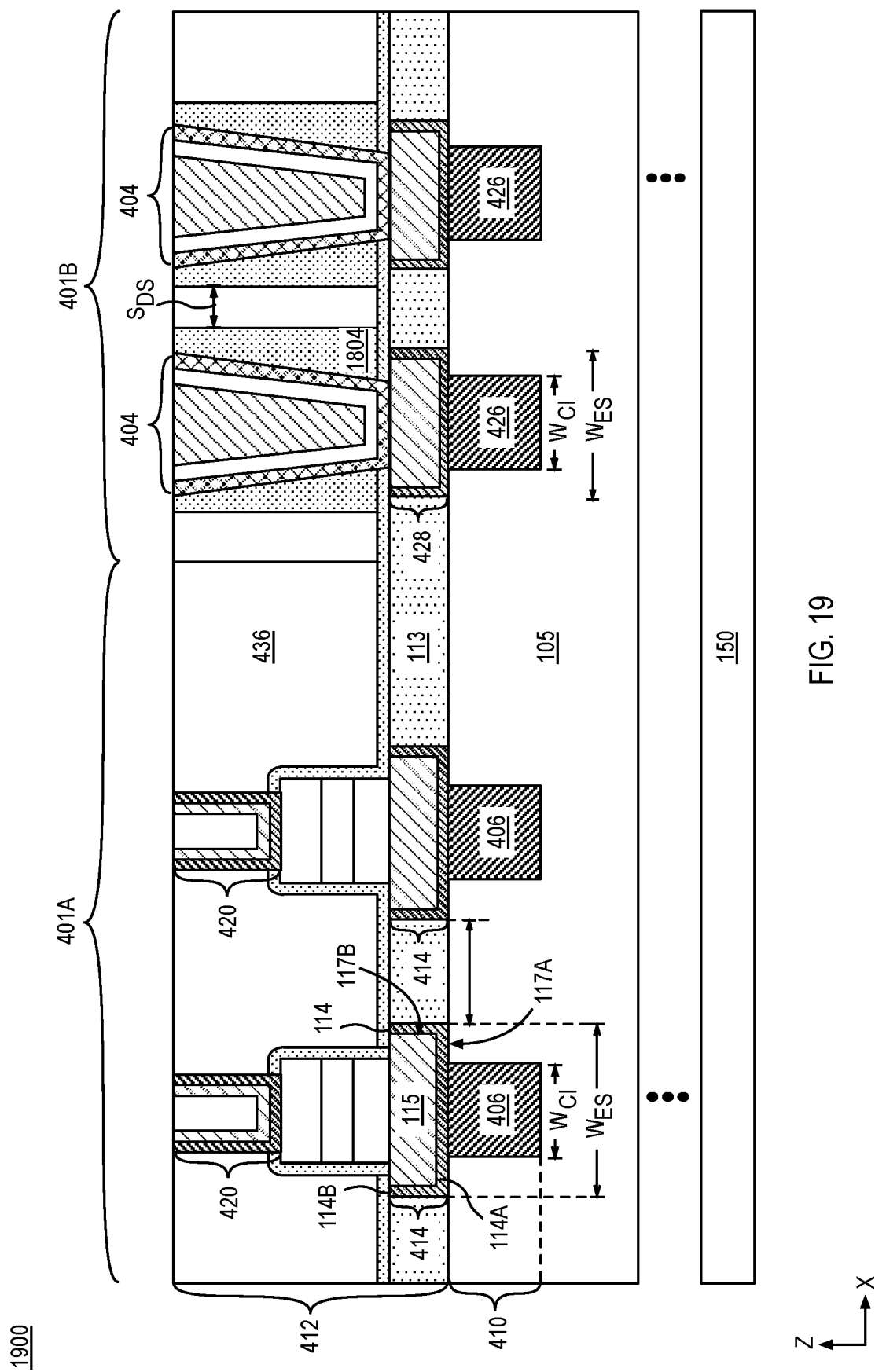
FIG. 19 is a cross-sectional illustration of a trench capacitor having tapered sidewalls where a top electrode has a greater surface area at the top compared to at the bottom of the trench capacitor.

FIG. 16D is a cross-sectional illustration of the structure in FIG. 16C following the process to form via electrode 420 above a respective planar capacitor 402. In an embodiment, the method utilized to form via electrode 420 is the same or substantially the same as the method utilized to form via electrode 420 described in association with FIGS. 15B and 15C.

FIG. 17A is a cross-sectional illustration of the structure in FIG. 12C following the process to deposit dielectric 418, form a respective via electrode 420 above a respective planar capacitor 402 and form trenches 1700 in the dielectric 418 above a respective electrode structure 428. In an embodiment, the operations to form via electrode 420 and trenches 1700 may be performed in any order. In the illustrative embodiment, via electrodes 420 are formed prior to formation of trenches 1700.

The method utilized to form via electrode 420 includes a method that is the same or substantially the same as the method utilized to form via electrode 420 described in association with FIGS. 12D and 12E. In the illustrative embodiment, dielectric 418 is etched to form respective opening above planar capacitors 402.

FIG. 17B is a cross-sectional illustration of the structure in FIG. 17A following the process to form trench capacitor 404 in the trench 1700. In an embodiment, the method to form trench capacitors 404 is the same or substantially the same as the method utilized to fabricate trench capacitor 404 described in association with FIG. 15B. The methods described above may be performed in the order described to produce structure depicted in FIG. 4E.

In some embodiments, instead of depositing a high density film such as dielectric 418 over an entire region such as region 401B, pockets of high density film can be formed prior to forming trench capacitors. This method has the advantage of utilizing a hydrogen barrier material around each trench capacitor but enabling other conductive interconnect structures to be formed in the same region, where the conductive interconnect structures are utilized for signal routing and may prefer low K ILD.

FIG. 18A is a cross-sectional illustration of the structure in FIG. 12E following the process to form via electrodes 420 and following the process to form a plurality of pockets 1800 in the dielectric 436. In an embodiment, a mask 1802 is formed on the dielectric 436 and on via electrode 420 by a lithographic process. In an embodiment, portions of the dielectric 436 and encapsulation layer 438 are etched selectively to electrode structure 428, to form pockets 1800. In an embodiment, a plasma etch is utilized to etch and remove dielectric 436 and encapsulation layer 438 in pockets 1800. After the etch process, the mask 1802 is removed. The pockets 1800 have a lateral thickness, $W_P$, that is greater than a width of a trench capacitor that will be formed. In the illustrative embodiment, $W_P$ is greater than $W_{ES}$. In other embodiments, $W_P$ may be comparable to $W_{ES}$ as long as a width of trench capacitor is also less than $W_{ES}$.in some embodiments, pockets 1800 may be tapered as indicated by dashed lines 1801.

In the illustrative embodiment, adjacent pockets 1800 are spaced apart by a minimum spacing, $S_{DS}$. In some embodiments $S_{DS}$ is at least 5 nm. In other embodiments, pocket 1800 is sufficiently wide to cover more than one device, such as an array in a single direction or in x and y direction in the Figure. The pockets 1800 can have a plan view profile that is rectangular or circular/elliptical.

FIG. 18B is a cross-sectional illustration of the structure in FIG. 18A following the process to deposit a dielectric 1804 in the plurality of pockets 1800 and on uppermost surface 436A and on via electrodes 420. In embodiments, dielectric 1804 includes a material that is the same or substantially the same as the material of the dielectric 436. A planarization process is utilized to planarize dielectric 1804.

In other embodiments the encapsulation layer 438 is not removed in a prior operation as indicated by the dashed lines. The encapsulation layer 438 provides protection to the electrode structure 428 in region 401B during removal of dielectric 1804 during a subsequent process operation where trench openings are formed. The presence of encapsulation layer 438 may ensure that electrode structure 428 is not eroded during formation of trenches 1402.

FIG. 18C is a cross-sectional illustration of the structure in FIG. 18B following the formation of trenches 1806 in the dielectric 1804. In an embodiment, a mask 1808 is formed on dielectric 436, dielectric 1804 and on via electrode 420. In an embodiment, a plasma etch process is utilized to form trenches 1806 by etching dielectric 1804. The etch process exposes at least a portion of electrode structure 428 in trenches 1806.

FIG. 18D is a cross-sectional illustration of the structure in FIG. 18C following the process to form trench capacitors 404 in a respective trench 1806. In an embodiment, the method to form trench capacitor 404 is the same or substantially the same as the method described to form trench capacitor 404 described in association with FIG. 16C.

The method described in FIGS. 18A-D forms a trench capacitor 404 within a pocket of high density film. Dielectric 1804 provides a hydrogen barrier to trench capacitor 404. The dielectric 1804 is analogous to a spacer formed around trench capacitor 404 (as described in association with FIG. 12H). However, dielectric 1804 provides an additional advantage that a tapered trench can also be laterally protected by a hydrogen barrier material without the need to immerse an entire region 401B in a high density film. Such a tapered trench capacitor 404 is illustrated in device structure 1900 in FIG. 19.

Figure 20:
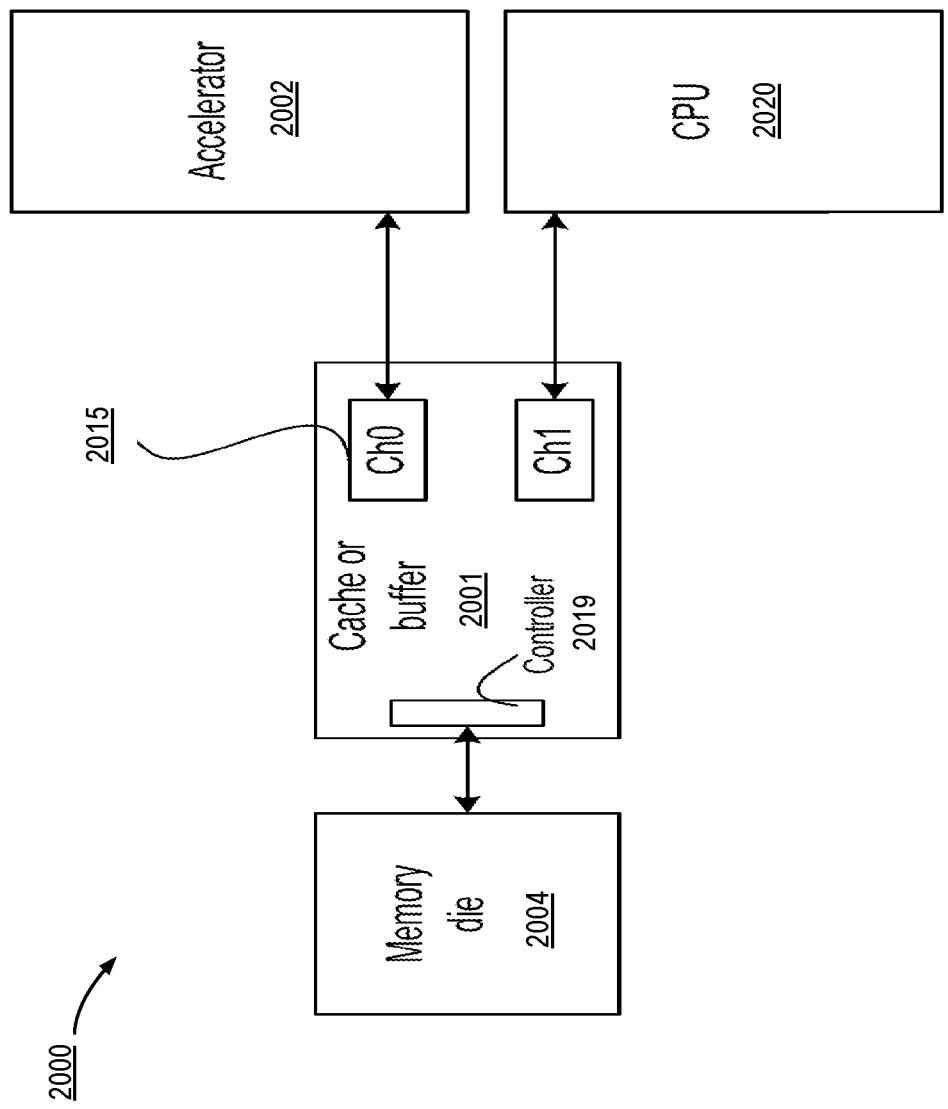
FIG. 20 illustrates a computing architecture with a coherent cache or memory-side buffer chiplet that includes a memory controller, wherein the coherent cache or memory-side buffer chiplet is coupled to an accelerator, a processor, and a memory, in accordance with some embodiments.

FIG. 20 illustrates computing architecture 2000 with a coherent cache or memory-side buffer chiplet that includes a memory controller, wherein the coherent cache or memory-side buffer chiplet is coupled to an accelerator, a processor, and a memory, in accordance with some embodiments. Computing architecture 2000 comprises coherent cache or memory-side buffer chiplet 2001, accelerator 2002 (e.g., inference chip), processor (e.g., central processing unit CPU 2020), and memory die 2004. In some embodiments, coherent cache or memory-side buffer chiplet 2001 comprises at least two channels 2015 which are configured to connect with accelerator 2002 and CPU 2020. In some embodiments, coherent cache or memory-side buffer chiplet 2001 comprises I/O and controller 2019 to manage data traffic with memory die 2404. By moving controller 2019 from CPU 2020 to coherent cache or memory-side buffer chiplet 2001, cost in terms of power and die area for CPU 2020 is reduced. In some embodiments, coherent cache or memory-side buffer chiplet 2001 is a cache memory that comprises ferroelectric memory cells. For example, coherent cache or memory-side buffer chiplet 2001 comprises one or more of: FE-SRAM, FE-DRAM, SRAM, MRAM, resistance RAM (Re-RAM), embedded DRAM (e.g., 1T-1C based memory), or a combination of them. Using FE-SRAM, MRAM, or Re-RAM allows for low power and high-speed memory operation.

Figure 21:
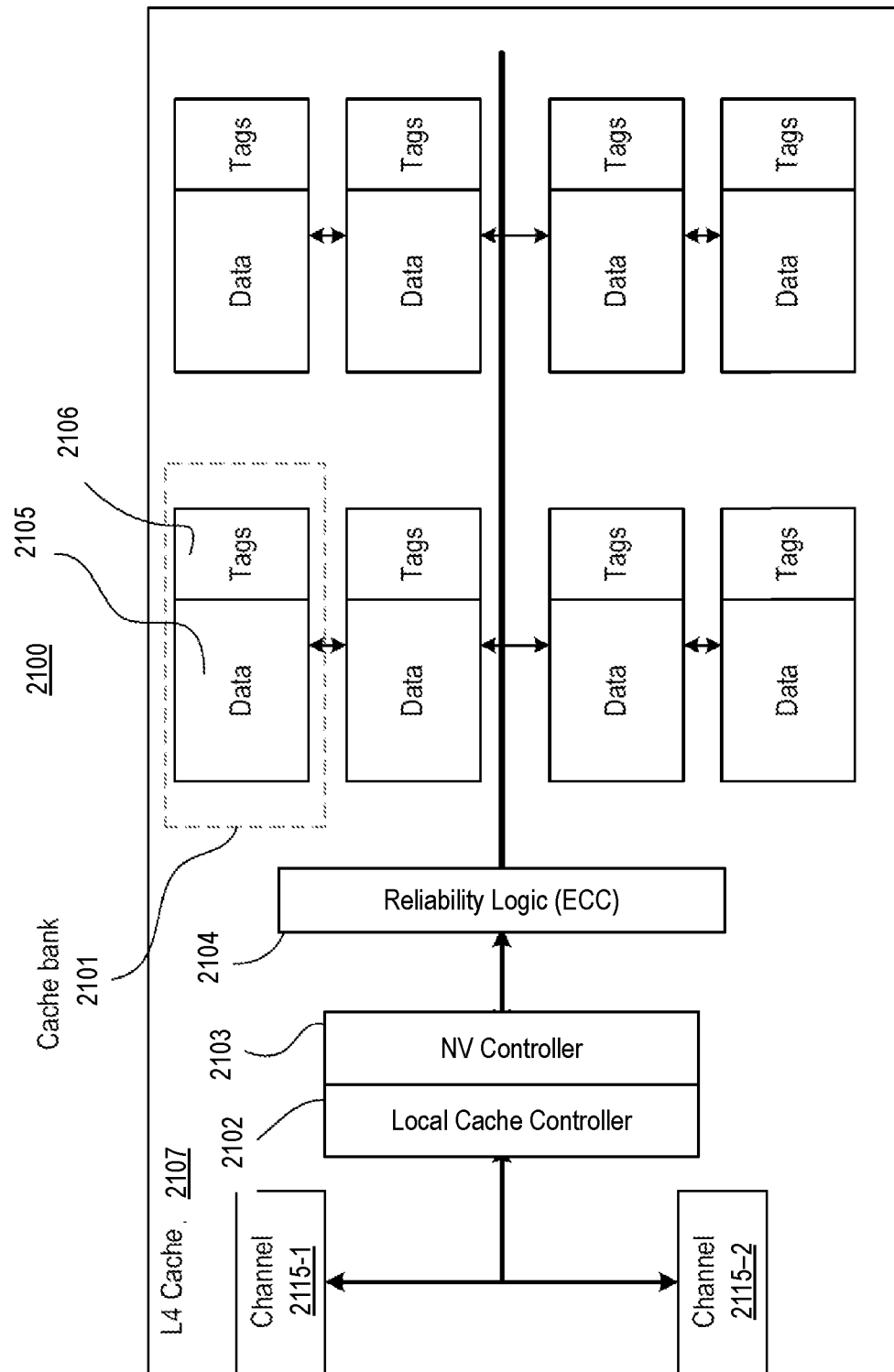
FIG. 21 illustrates an architecture of the coherent cache or memory-side buffer chiplet with multiple controllers and multiple cache banks, in accordance with some embodiments.

FIG. 21 illustrates architecture 2100 of the coherent cache or memory-side buffer chiplet (e.g., 2107) with multiple controllers and multiple cache banks, in accordance with some embodiments. In some embodiments, architecture 2100 comprises channels (e.g., ch0 2115-1 and ch1 2115-2), cache banks 2101, local cache controller 2102, non-volatile (NV) controller 2103, and reliability logic 2104. Coherent cache or memory-side buffer chiplet 2107 may function as a cache or memory buffer. In some embodiments, cache lookups can map a large physical memory into a small physical cache using indirection via tags. Here, indirection refers to the use of tags to specify which address maps to which physical location. If multiple addresses can map to a single physical location, a tag is used to figure out which address is currently mapped.

In some embodiments, each cache bank 2101 includes data bank 2105 (e.g., comprising memory cells) and associated tags 2106. In some embodiments, data bank 2105 comprises ferroelectric memory cells. In some embodiments, data bank 2105 comprises one or more of: FE-SRAM, FE-DRAM, SRAM, MRAM, resistance RAM (Re-RAM), embedded DRAM (e.g., 1T-1C based memory), or a combination of them. Using FE-SRAM, MRAM, or Re-RAM allows for low power and high-speed memory operation. In some embodiments, when data bank 2105 includes ferroelectric memory, it uses NV controller 2103 and a stronger reliability logic (e.g., error correction code) for security compared to non-ferroelectric memory for data bank 2105.

When data bank 2105 is used to implement a cache, tags may be used to identify which addresses map to which physical locations in the bank. The cache may be set associative in which a particular address can map to several physical locations. The specific physical location a newly allocated address is mapped to may be determined by a replacement algorithm such as LRU (least recently used) or pseudo-LRU, or even random. On the other hand, the cache might be direct mapped, with each address mapping to merely a single physical cache line. In both set associative and direct mapped caches, several addresses map to a single physical cache line. To identify the address currently occupying the physical cache line, a tag 2106 may be coupled with each physical line. Tag 2106 may comprise some address bits, sufficient to uniquely identify which address currently occupies the physical line coupled with the tag.

In some embodiments, cache controller 2102 could be used to control state transitions required for cache look ups such as comparing requested addresses with tags stored in the tags 2106 and identifying a candidate for replacement (replacement algorithm) when a cache miss occurs. In addition, the cache controller could be tasked with initializing the cache when the cache powers on. When FE memory of data bank 2105, which retains state across power cycles, is used, cache controller 2102 could write 0s to all memory locations to ensure that data associated with previously executed programs is erased, thus preventing any data leakage to subsequently executed programs. The non-volatile memory may also include an NV bit, which could indicate that cache data is meant to be non-volatile and remain across power cycles. Cache controller 2102 would skip locations marked thus when initializing memory.

In some embodiments, reliability logic 2104 performs error correction to the data. Any suitable error correction scheme (e.g., with error correction code (ECC)) may be used by reliability logic 2104. In some embodiments, NV controller 2103 is provided to explicitly clear the cache when using a non-volatile memory, such as FM memory for data bank 2105. NV controller 2103 may include an NV bit which indicates cache lines that should not be cleared but are expected to retain their contents across power cycles. The functions of NV controller 2103 can be combined in cache controller 2102, or vice versa.

Figure 22:
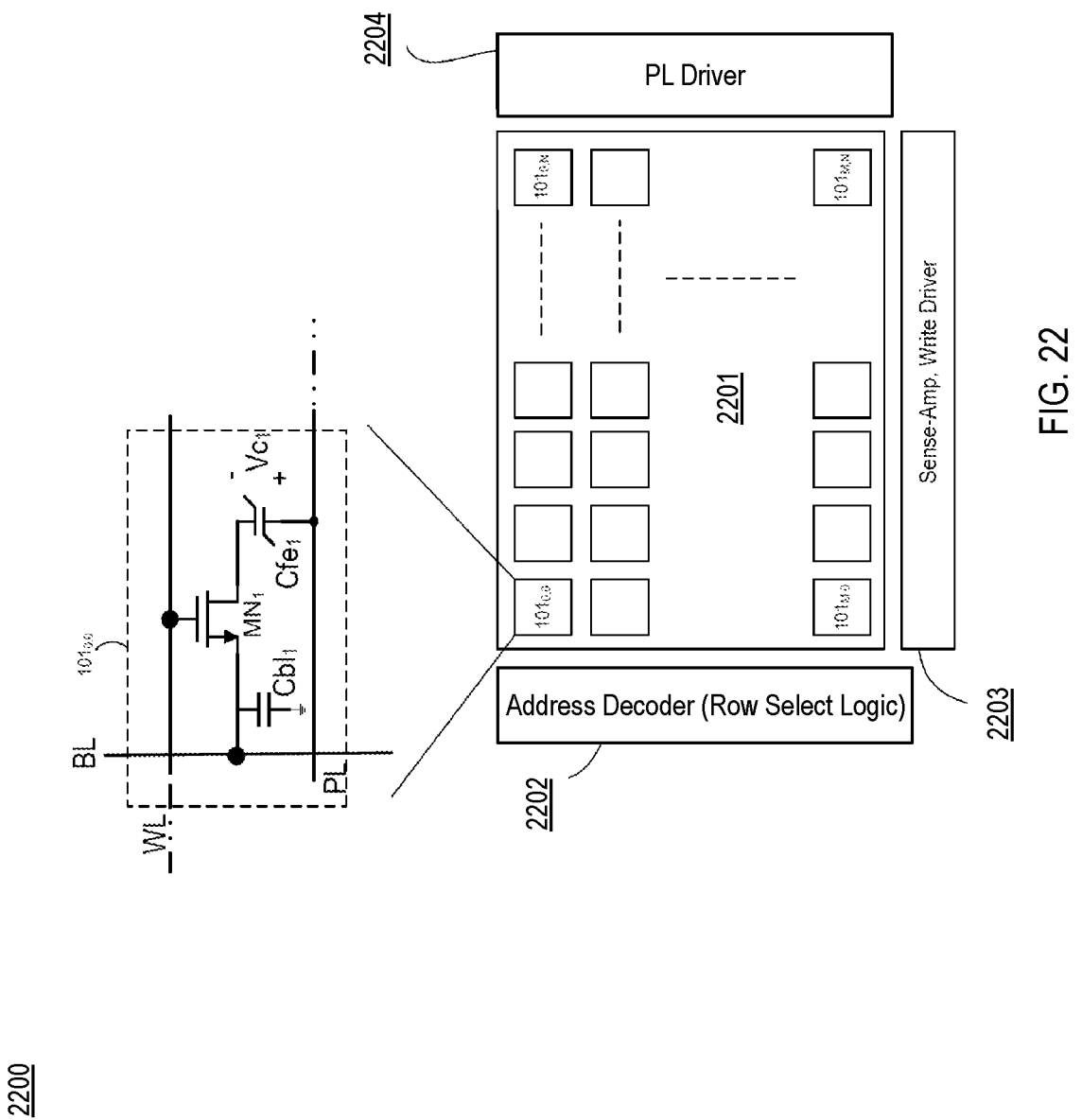
FIG. 22 illustrates an apparatus comprising memory and corresponding logic, wherein the memory comprises ferroelectric (FE) memory bit-cells, in accordance with some embodiments.

FIG. 22 illustrates apparatus 2200 comprising memory and corresponding logic, wherein the memory comprises ferroelectric (FE) memory bit-cells, in accordance with some embodiments. Apparatus 2200 comprises M×N memory array 2201 of bit-cells, logic circuitry 2202 for address decoding, sense amplifier and write drivers 2203, and plate-line (PL) driver 2204. Logic circuitry 2202 comprises address decoders for selecting a row of bit-cells and/or a particular bit-cell from M×N memory array 2201, where M and N are integers of same or different values. Logic circuitry 2202 comprises sense-amplifiers for reading the values from the selected bit-cell, while write drivers are used to write a particular value to a selected bit-cell. Here, a schematic of FE bit-cell $2201_{0,0}$ is illustrated. The same embodiments apply to other bit-cells of the M×N array. In this example, a one-transistor one-capacitor (1T1C) bit cell is shown, but the embodiments are applicable to 1TnC bit-cell and multi-element FE gain bit-cell as described herein.

In some embodiments, bit-cell $2201_{0,0}$ comprises a word-line (WL), a plate-line (PL), a bit-line (BL), a complementary bit-line (BLB), and two half bit-cells $2201_{0,0\_A}$ and $2201_{0,0\_B}$. In some embodiments, bit-cell $2201_{0,0}$ comprises an n-type transistor $MN_1$, and FE capacitive structure $Cfe_1$. The gates of transistor $MN_1$ are coupled to a common WL. In various embodiments, one terminal of the FE capacitive structure $Cfe_1$ is coupled to a PL. The second terminal of the FE capacitive structure is coupled to source or drain terminal of the transistor $MN_1$. In various embodiments, BL is coupled to the source or drain terminal of first transistor $MN_1$. In some embodiments, a BL capacitor $CBl_l$ is coupled to the source or drain terminal of first transistor $MN_1$ and to a reference node (e.g., ground such that the FE capacitor is not coupled to the same source or drain terminal. In some embodiments, the PL is parallel to the BL and orthogonal to the WL. In some embodiments, the PL is parallel to the WL and orthogonal to the BL.

In some embodiments, the FE capacitor is a planar capacitor. In some embodiments, the FE capacitor is a pillar or non-planar capacitor. In some embodiments, when the bit-cell is a 1TnC bit-cell, the FE capacitors are configured in a tower structure allowing the x-y foot-print to remain the same as for a 1T1C bit-cell but with taller bit-cell in the z-direction. In some embodiments, when the bit-cell is a multi-element FE gain bit-cell, the bit-cell allows for decoupling of the storage node from BL, allows for reducing the thickness scaling requirement for pillar capacitors, and allows for reducing polarization density requirements. Further, by stacking the 'n' capacitors in the z-direction (forming a tower), the area increases in the x-y direction due to the two transistors. The increase in area (due to the two transistors per bit-cell) allows for expanding the sizes (or radius) of the capacitors in the x-y direction.

Figure 23:
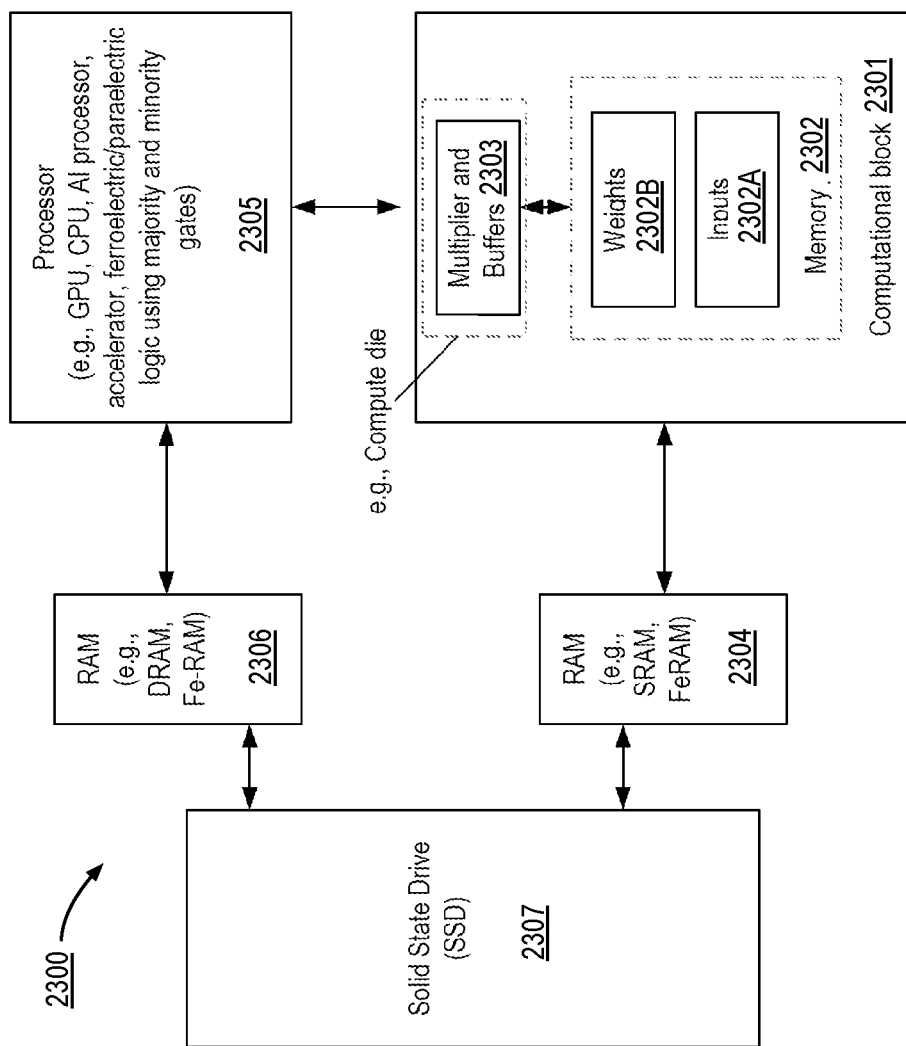
FIG. 23 illustrates a high-level architecture of an artificial intelligence (AI) machine comprising a compute die positioned on top of a memory die, in accordance with some embodiments.

FIG. 23 illustrates a high-level architecture of an artificial intelligence (AI) machine 2300 comprising a compute die positioned on top of a memory die, in accordance with some embodiments. AI machine 2300 comprises computational block 2301 or processor having memory 2302 such as random-access memory (RAM) 2302 and compute die 2303; first random-access memory 2304 (e.g., static RAM (SRAM), ferroelectric or paraelectric RAM (FeRAM), ferroelectric or paraelectric static random-access memory (FeSRAM)), main processor 2305, second random-access memory 2306 (dynamic RAM (DRAM), FeRAM), and solid-state memory or drive (SSD) 2307. In some embodiments, some or all components of AI machine 2300 are packaged in a single package forming a system-on-chip (SoC). The SoC can be configured as a logic-on-logic configuration, which can be in a 3D configuration or a 2.5D configuration.

In some embodiments, computational block 2301 is packaged in a single package and then coupled to main processor 2305 and memories 2304, 2306, and 2307 on a printed circuit board (PCB). In some embodiments, computational block 2301 is configured as a logic-on-logic configuration, which can be in a 3D configuration or a 2.5D configuration. In some embodiments, computational block 2301 comprises a special purpose compute die 2303 or microprocessor. For example, compute die 2303 is a compute chiplet that performs a function of an accelerator or inference. In some embodiments, RAM 2302 is DRAM which forms a special memory/cache for the special purpose compute die 2303. The DRAM can be embedded DRAM (eDRAM) such as 1T-1C (one transistor and one capacitor) based memories. In some embodiments, RAM 2302 is ferroelectric or paraelectric RAM (Fe-RAM).

In some embodiments, compute die 2303 is specialized for applications such as Artificial Intelligence, graph processing, and algorithms for data processing. In some embodiments, compute die 2303 further has logic computational blocks, for example, for multipliers and buffers, a special data memory block (e.g., buffers) comprising DRAM, FeRAM, or a combination of them. In some embodiments, RAM 2302 has weights and inputs stored in-order to improve the computational efficiency. The interconnects between main processor 2305 (also referred to as special purpose processor), First RAM 2304 and compute die 2303 are optimized for high bandwidth and low latency. The architecture of FIG. 23 allows efficient packaging to lower the energy, power, or cost and provides for ultra-high bandwidth between RAM 2302 and compute die 2303 of computational block 2301.

In some embodiments, RAM 2302 is partitioned to store input data (or data to be processed) 2302A and weights 2302B. In some embodiments, input data 2302A is stored in a separate memory (e.g., a separate memory die) and weights 2302B are stored in a separate memory (e.g., a separate memory die).

In some embodiments, computational logic or compute die 2303 comprises matrix multiplier, adder, concatenation logic, buffers, and combinational logic. In various embodiments, compute die 2303 performs multiplication operation on input data 2302A and weight 2302B. In some embodiments, weights 2302B are fixed weights. For example, main processor 2305 (e.g., a graphics processor unit (GPU), field programmable grid array (FPGA) processor, application specific integrated circuit (ASIC) processor, digital signal processor (DSP), an AI processor, a central processing unit (CPU), or any other high-performance processor) computes the weights for a training model. Once the weights are computed, they are stored in memory 2302. In various embodiments, the input data 2302A, that is to be analyzed using a trained model, is processed by computational block 2301 with computed weights 2302B to generate an output (e.g., a classification result).

In some embodiments, First RAM 2304 is ferroelectric or paraelectric based SRAM. For example, a six transistor (6T) SRAM bit-cells having ferroelectric or paraelectric transistors are used to implement a non-volatile FeSRAM. In some embodiments, SSD 2307 comprises NAND flash cells. In some embodiments, SSD 2307 comprises NOR flash cells. In some embodiments, SSD 2307 comprises multi-threshold NAND flash cells.

In various embodiments, the non-volatility of FeRAM is used to introduce new features such as security, functional safety, and faster reboot time of AI machine 2300. The non-volatile FeRAM is a low power RAM that provides fast access to data and weights. First RAM 2304 can also serve as a fast storage for inference die (or accelerator), which typically has low capacity and fast access requirements.

In various embodiments, the FeRAM (FeDRAM or FeSRAM) includes ferroelectric or paraelectric material. The ferroelectric or paraelectric (FE) material may be in a transistor gate stack or in a capacitor of the memory. The ferroelectric material can be any suitable low voltage FE material that allows the FE material to switch its state by a low voltage (e.g., 2300 mV). Threshold in the FE material has a highly non-linear transfer function in the polarization vs. voltage response. The threshold is related a) non-linearity of switching transfer function, and b) to the squareness of the FE switching. The non-linearity of switching transfer function is the width of the derivative of the polarization vs. voltage plot. The squareness is defined by the ratio of the remnant polarization to the saturation polarization; perfect squareness will show a value of 1.

The squareness of the FE switching can be suitably manipulated with chemical substitution. For example, in $PbTiO_3$ a P-E (polarization-electric field) square loop can be modified by La or Nb substitution to create an S-shaped loop. The shape can be systematically tuned to ultimately yield a non-linear dielectric. The squareness of the FE switching can also be changed by the granularity of a FE layer. A perfectly epitaxial, single crystalline FE layer will show higher squareness (e.g., ratio is closer to 1) compared to a poly crystalline FE. This perfect epitaxial can be accomplished using lattice matched bottom and top electrodes. In one example, BiFeO (BFO) can be epitaxially synthesized using a lattice matched $SrRuO_3$ bottom electrode yielding P-E loops that are square. Progressive doping with La will reduce the squareness.

In some embodiments, the FE material comprises a perovskite of the type $ABO_3$, where 'A' and 'B' are two cations of different sizes, and 'O' is oxygen which is an anion that bonds to both the cations. Generally, the size of atoms of A is larger than the size of B atoms. In some embodiments, the perovskite can be doped (e.g., by Lanthanides). In various embodiments, when the FE material is a perovskite, the conductive oxides are of the type $AA'BB'O_3$. A' is a dopant for atomic site A, it can be an element from the Lanthanides series. B' is a dopant for atomic site B, it can be an element from the transition metal elements especially Sc, Ti, V, Cr, Mn, Fe, Co, Ni, Cu, Zn. A' may have the same valency of site A, with a different ferroelectric polarizability.

In some embodiments, the FE material comprises hexagonal ferroelectrics of the type $h-RMnO_3$, where R is a rare earth element viz. cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), and yttrium (Y). The ferroelectric phase is characterized by a buckling of the layered $MnO_5$ polyhedra, accompanied by displacements of the Y ions, which lead to a net electric polarization. In some embodiments, hexagonal FE includes one of: $YMnO_3$ or $LuFeO_3$. In various embodiments, when the FE material comprises hexagonal ferroelectrics, the conductive oxides are of $A_2O_3$ (e.g., $In_2O_3$, $Fe_2O_3$) and $ABO_3$ type, where 'A' is a rare earth element and B is Mn.

In some embodiments, the FE material is perovskite, which includes one or more of: La, Sr, Co, Sr, Ru, Y, Ba, Cu, Bi, Ca, and Ni. For example, metallic perovskites such as: $(La,Sr)CoO_3$, $SrRuO_3$, $(La,Sr)MnO_3$, $YBa_2Cu_3O_7$, $Bi_2Sr_2CaCu_2O_8$, $LaNiO_3$, etc. may be used for FE material. Perovskites can be suitably doped to achieve a spontaneous distortion in a range of 0.3 to 2%. For chemically substituted $BiFeO_3$, $BrCrO_3$, $BuCoO_3$ class of materials, La or rare earth substitution into the Bi site can tune the spontaneous distortion. In some embodiments, the FE material is contacted with a conductive metal oxide that includes one of the conducting perovskite metallic oxides exemplified by: La—Sr—$CoO_3$, $SrRuO_3$, La—Sr—$MnO_3$, $YBa_2Cu_3O_7$, $Bi_2Sr_2CaCu_2O_8$, and $LaNiO_3$.

In some embodiments, the FE material comprises a stack of layers including low voltage FE material between (or sandwiched between) conductive oxides. In various embodiments, when the FE material is a perovskite, the conductive oxides are of the type $AA'BB'O_3$. A' is a dopant for atomic site A, it can be an element from the Lanthanides series. B' is a dopant for atomic site B, it can be an element from the transition metal elements especially Sc, Ti, V, Cr, Mn, Fe, Co, Ni, Cu, Zn. A' may have the same valency of site A, with a different ferroelectric polarizability. In various embodiments, when metallic perovskite is used for the FE material, the conductive oxides can include one or more of: $IrO_2$, $RuO_2$, $PdO_2$, $OSO_2$, or $ReO_3$. In some embodiments, the perovskite is doped with La or Lanthanides. In some embodiments, thin layer (e.g., approximately 10 nm) perovskite template conductors such as $SrRuO_3$ coated on top of $IrO_2$, $RuO_2$, $PdO_2$, $PtO_2$, which have a non-perovskite structure but higher conductivity to provide a seed or template for the growth of pure perovskite ferroelectric at low temperatures, are used as the conductive oxides.

In some embodiments, ferroelectric materials are doped with s-orbital material (e.g., materials for first period, second period, and ionic third and fourth periods). In some embodiments, f-orbital materials (e.g., lanthanides) are doped to the ferroelectric material to make paraelectric material. Examples of room temperature paraelectric materials include: $SrTiO_3$, $Ba_{(x)}Sr_{(y)}TiO_3$ (where x is −0.05, and y is 0.95), $HfZrO_2$, Hf—Si—O.

In some embodiments, the FE material comprises one or more of: Hafnium (Hf), Zirconium (Zr), Aluminum (Al), Silicon (Si), their oxides or their alloyed oxides. In some embodiments, the FE material includes one or more of: $Al_{(1-x)}Sc_{(x)}N$, $Ga_{(1-x)}Sc_{(x)}N$, $Al_{(1-x)}Y_{(x)}N$ or $Al_{(1-x-y)}Mg_{(x)}Nb_{(y)}N$, where x and y are third and fourth fractions, respectively, or $HfO_2$ doped with one of: Al, Ca, Ce, Dy, Er, Gd, Ge, La, Sc, Si, Sr, Sn, or Y. In some embodiments, the FE material includes one or more of: Bismuth ferrite (BFO) or BFO with doping material.

In some embodiments, the FE material includes Bismuth ferrite (BFO), BFO with a doping material wherein the doping material is one of Lanthanum, or any element from the lanthanide series of the periodic table. In some embodiments, the FE material includes a relaxor ferro-electric includes one of: Barium Titanium-Bismuth Zinc Niobium Tantalum (BT-BZNT) or Barium Titanium-Barium Strontium Titanium (BT-BST).

In some embodiments, the FE material includes hafnium oxide of the form $Hf_{(1-x)}E_xO_y$, where E includes one of: Al, Ca, Ce, Dy, Er, Gd, Ge, La, Sc, Si, Sr, Sn, or Y, where 'x' and 'y' are first and second fractions, respectively. In some embodiments, the FE material includes Niobate type compounds $LiNbO_3$, $LiTaO_3$, Lithium iron Tantalum Oxy Fluoride, Barium Strontium Niobate, Sodium Barium Niobate, or Potassium strontium niobate.

In some embodiments, the FE material comprises multiple layers. For example, alternating layers of $[Bi2O_2]2+$, and pseudo-perovskite blocks ($Bi_4Ti_3O_{12}$ and related Aurivillius phases), with perovskite layers that are n octahedral layers in thickness can be used. In some embodiments, the FE material comprises organic material. For example, Polyvinylidene fluoride or polyvinylidene difluoride (PVDF).

In some embodiments, the FE material comprises hexagonal ferroelectrics of the type $h-RMnO_3$, where R is a rare earth element viz. cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), and yttrium (Y). The ferroelectric phase is characterized by a buckling of the layered $MnO_5$ polyhedra, accompanied by displacements of the Y ions, which lead to a net electric polarization. In some embodiments, hexagonal FE includes one of: $YMnO_3$ or $LuFeO_3$. In various embodiments, when the FE material comprises hexagonal ferroelectrics, the conductive oxides are of $A_2O_3$ (e.g., $In_2O_3$, $Fe_2O_3$) and $ABO_3$ type, where 'A' is a rare earth element and B is Mn.

In some embodiments, the FE material comprises improper FE material. An improper ferroelectric is a ferroelectric where the primary order parameter is an order mechanism such as strain or buckling of the atomic order. Examples of improper FE material are $LuFeO_3$ class of materials or super lattice of ferroelectric and paraelectric materials $SnTiO_3$ (STO), respectively, and $LaAlO_3$ (LAO) and STO, respectively. For example, a super lattice of [PTO/STO]n or [LAO/STO]n, where 'n' is between 1 to 2300. While various embodiments here are described with reference to ferroelectric material for storing the charge state, the embodiments are also applicable for paraelectric material. In some embodiments, paraelectric material includes one of: $SrTiO_3$, $Ba_{(x)}Sr_{(y)}TiO_3$ (where x is −0.5, and y is 0.95), $HfZrO_2$, Hf—Si—O.

The method of forming the structures described herein are applicable to various logic embodiments. For example, the FeRAM devices or capacitive structures formed herein can be used to forming other ferroelectric/paraelectric circuits. These circuits can be implemented majority gate, minority gate and/or threshold gate.

Following examples are provided that illustrate the various embodiments. The examples can be combined with other examples. As such, various embodiments can be combined with other embodiments without changing the scope of the invention.

Figure 24:
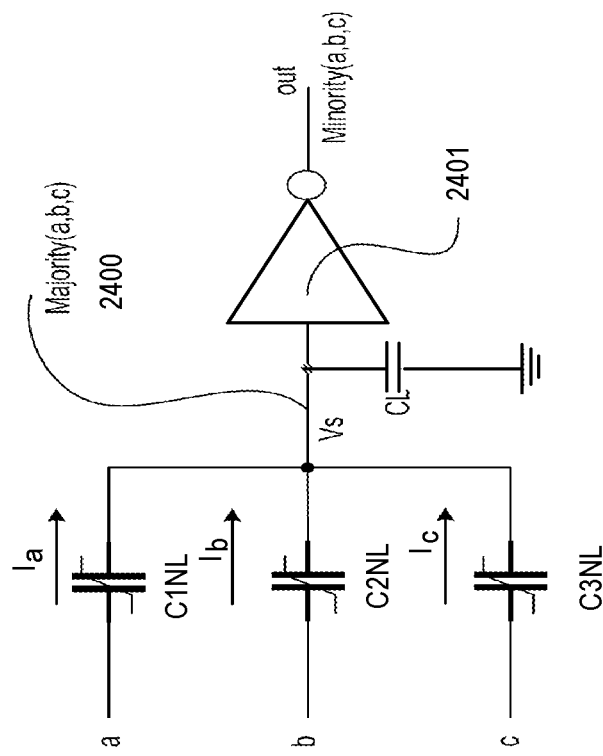
FIG. 24 illustrates a 3-input majority gate using non-linear input capacitors, in accordance with some embodiments.

FIG. 24 illustrates 3-input majority gate 2400 using non-linear input capacitors, in accordance with some embodiments. In some embodiments, 3-input majority gate 2400 comprises non-linear input capacitors C1n1, C2n1, and C3n1 that receives digital signals a, b, and c, respectively. Here, signal names and node names are interchangeably used. For example, 'a' refers to node 'a' or signal 'a' depending on the context of the sentence. One end or terminal of capacitor C1n1 is coupled to node a while the other end of capacitor C1n1 is coupled to summing node Vs. The same is true for other non-linear capacitors C2n1 and C3n1 as shown. In some embodiments, 3-input majority gate 2400 comprises a driver circuitry 2401. In this example, driver circuitry 2401 is an inverter. In other embodiments, other types of driver circuitries can be used such as NAND gate, NOR gate, multiplexer, buffer, and other logic gates.

The majority function is performed at summing node Vs as Majority(a,b,c). In this example, since driver circuitry 2401 is an inverter, minority function is performed at output "out" as Minority(a,b,c).

In some embodiments, in addition to the gate capacitance of driver circuitry 2401, an additional linear capacitor CL is coupled to summing node Vs and ground as shown. In some embodiments, this linear capacitor CL is a non-ferroelectric capacitor. In some embodiments, the non-ferroelectric capacitor includes one of: dielectric capacitor, para-electric capacitor, or non-linear dielectric capacitor. A dielectric capacitor comprises first and second metal plates with a dielectric between them. Examples of such dielectrics are: HfOX, $ABO_3$ perovskites, nitrides, oxy-fluorides, oxides, etc. A para-electric capacitor comprises first and second metal plates with a para-electric material between them. In some embodiments, f-orbital materials (e.g., lanthanides) are doped to the ferroelectric materials to make paraelectric material. Examples of room temperature paraelectric material include: $SrTiO_3$, $Ba_{(x)}Sr_{(y)}TiO_3$ (where x is −0.5, and y is 0.95)), $HfZrO_2$, Hf—Si—O, or La-substituted $PbTiO_3$. A dielectric capacitor comprises first and second metal plates with non-linear dielectric capacitor between them. The range for dielectric constant is 1.2 to 10000. The capacitor CL can be implemented as MIM (metal-insulator-metal) capacitor technology, transistor gate capacitor, hybrid of metal capacitors or transistor capacitor. The capacitor CL can be implemented as MIM (metal-insulator-metal) capacitor technology, transistor gate capacitor, or hybrid of metal capacitors or transistor capacitor.

In some embodiments, the non-linear input capacitors C1n1, C2n1, and C3n1 comprise non-linear polar material. In some embodiments, the non-linear polar material includes one of: ferroelectric (FE) material, para-electric material, relaxor ferroelectric, or non-linear dielectric. In various embodiments, para-electric material is the same as FE material but with chemical doping of the active ferroelectric ion by an ion with no polar distortion. In some cases, the non-polar ions are non-s orbital ions formed with p, d, f external orbitals. In some embodiments, non-linear dielectric materials are same as para-electric materials, relaxors, and dipolar glasses.

In some embodiments, f-orbital materials (e.g., lanthanides) are doped to the ferroelectric material to make para-electric material. Examples of room temperature paraelectric material include: $SrTiO_3$, $Ba_{(x)}Sr_{(y)}TiO_3$ (where x is −0.5, and y is 0.95), $HfZrO_2$, or Hf—Si—O.

In various embodiments, the FE material can be any suitable low voltage FE material that allows the FE material to switch its state by a low voltage (e.g., 100 mV). In some embodiments, the FE material comprises a perovskite of the type $ABO_3$, where 'A' and 'B' are two cations of different sizes, and 'O' is oxygen which is an anion that bonds to both the cations. Generally, the size of A atoms is larger than the size of B atoms. In some embodiments, the perovskite can be doped (e.g., by Lanthanides). Perovskites can be suitably doped to achieve a spontaneous distortion in a range of 0.3 to 2%. For example, for chemically substituted lead titanate such as Zr in Ti site; La or Nb in Ti site, the concentration of these substitutes is such that it achieves the spontaneous distortion in the range of 0.3 to 2%. For chemically substituted $BiFeO_3$, $BiCrO_3$, $BiCoO_3$ class of materials, La or rare earth substitution into the Bi site can tune the spontaneous distortion. In some embodiments, perovskite includes one of: $BaTiO_3$, $KNbO_3$, or $NaTaO_3$.

Threshold in the FE material has a highly non-linear transfer function in the polarization vs. voltage response. The threshold is related to: a) non-linearity of switching transfer function; and b) the squareness of the FE switching. The non-linearity of switching transfer function is the width of the derivative of the polarization vs. voltage plot. The squareness is defined by the ratio of the remnant polarization to the saturation polarization; perfect squareness will show a value of 1.

The squareness of the FE switching can be suitably manipulated with chemical substitution. For example, in $PbTiO_3$ a P-E (polarization-electric field) square loop can be modified by La or Nb substitution to create an S-shaped loop. The shape can be systematically tuned to ultimately yield a non-linear dielectric. The squareness of the FE switching can also be changed by the granularity of the FE layer. A perfect epitaxial, single crystalline FE layer will show higher squareness (e.g., ratio is closer to 1) compared to a poly crystalline FE. This perfect epitaxial can be accomplished using lattice matched bottom and top electrodes. In one example, BiFeO (BFO) can be epitaxially synthesized using a lattice matched $SrRuO_3$ bottom electrode yielding P-E loops that are square. Progressive doping with La will reduce the squareness.

In some embodiments, the FE material is contacted with a conductive metal oxide that includes one of the conducting perovskite metallic oxides exemplified by: La—Sr—$CoO_3$, $SrRuO_3$, La—Sr—$MnO_3$, $YBa_2Cu_3O_7$, $Bi_2Sr_2CaCu_2O_2$, $LaNiO_3$, and $ReO_3$.

In some embodiments, the FE material comprises a stack of layers including low voltage FE material between (or sandwiched between) conductive oxides. In various embodiments, when FE material is a perovskite, the conductive oxides are of the type AA'BB'$O_3$. A' is a dopant for atomic site A, it can be an element from the Lanthanides series. B' is a dopant for atomic site B, it can be an element from the transition metal elements especially Sc, Ti, V, Cr, Mn, Fe, Co, Ni, Cu, Zn. A' may have the same valency of site A, with a different ferroelectric polarizability.

In some embodiments, the FE material comprises hexagonal ferroelectrics of the type h-$RMnO_3$, where R is a rare earth element such as: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), and yttrium (Y). The ferroelectric phase is characterized by a buckling of the layered $MnO_5$ polyhedra, accompanied by displacements of the Y ions, which lead to a net electric polarization. In some embodiments, hexagonal FE includes one of: $YMnO_3$ or $LuFeO_3$. In various embodiments, when the FE material comprises hexagonal ferroelectrics, the conductive oxides adjacent to the FE material are of $A_2O_3$ (e.g., $In_2O_3$, $Fe_2O_3$) and $ABO_3$ type, where 'A' is a rare earth element and B is Mn.

In some embodiments, FE material comprises improper FE material. An improper ferroelectric is a ferroelectric where the primary order parameter is an order mechanism such as strain or buckling of the atomic order. Examples of improper FE material are $LuFeO_3$ class of materials or super lattice of ferroelectric and paraelectric materials. While various embodiments here are described with reference to ferroelectric material for storing the charge state, the embodiments are also applicable for paraelectric material. For example, the capacitor of various embodiments can be formed using paraelectric material instead of ferroelectric material.

In some embodiments, the FE material includes one of: Hafnium (Hf), Zirconium (Zr), Aluminum (Al), Silicon (Si), their oxides or their alloyed oxides. In some embodiments, FE material includes one of: $Al_{(1-x)}Sc_{(x)}N$, $Ga_{(1-x)}Sc_{(x)}N$, $Al_{(1-x)}Y_{(x)}N$ or $Al_{(1-x-y)}Mg_{(x)}Nb_{(y)}N$, where x and y are third and fourth fractions, respectively, or $HfO_2$ doped with one of: Al, Ca, Ce, Dy, Er, Gd, Ge, La, Sc, Si, Sr, Sn, or Y. In some embodiments, the FE material includes Bismuth ferrite (BFO) or BFO with doping material.

In some embodiments, the FE material includes Bismuth ferrite (BFO), BFO with a doping material wherein the doping material is one of: Lanthanum, or any element from the lanthanide series of the periodic table. In some embodiments, the FE material includes a relaxor ferroelectric including one of barium titanium-bismuth zinc niobium tantalum (BT-BZNT), or barium titanium-barium strontium titanium (BT-BST).

In some embodiments, the FE material includes hafnium oxide of the form $Hf_{(1-x)}E_xO_y$, where E includes one of: Al, Ca, Ce, Dy, Er, Gd, Ge, La, Sc, Si, Sr, Sn, or Y, where 'x' and 'y' are first and second fractions, respectively. In some embodiments, FE material includes Niobate type compounds $LiNbO_3$, $LiTaO_3$, lithium iron tantalum oxy fluoride, barium strontium niobate, sodium barium niobate, or potassium strontium niobate.

In some embodiments, the FE material comprises multiple layers. For example, alternating layers of [Bi2O2]2+, and pseudo-perovskite blocks ($Bi_4Ti_3O_{12}$ and related Aurivillius phases), with perovskite layers that are n octahedral layers in thickness can be used.

In some embodiments, the FE material comprises organic material. For example, Polyvinylidene fluoride or polyvinylidene difluoride (PVDF). The FE material is between two electrodes. These electrodes are conducting electrodes. In some embodiments, the electrodes are perovskite templated conductors. In such a templated structure, a thin layer (e.g., approximately 10 nm) of a perovskite conductor (such as $SrRuO_3$) is coated on top of $IrO_2$, $RuO_2$, $PdO_2$, or $PtO_2$ (which have a non-perovskite structure but higher conductivity) to provide a seed or template for the growth of pure perovskite ferroelectric at low temperatures. In some embodiments, when the ferroelectric comprises hexagonal ferroelectric material, the electrodes can have hexagonal metals, spinels, or cubic metals. Examples of hexagonal metals include: $PtCoO_2$, $PdCoO_2$, and other delafossite structured hexagonal metallic oxides such as Al-doped ZnO. Examples of spinels include $Fe_3O_4$ and $LiV_2O_4$. Examples of cubic metals include Indium Tin Oxide (ITO) such as Sn-doped $In_2O_3$.

The charge developed on node Vs produces a voltage and current that is the output of the majority gate 2400. Any suitable driver circuitry 2401 can drive this output. For example, a non-FE logic, FE logic, CMOS logic, BJT logic, etc. can be used to drive the output to a downstream logic. Examples of the drivers include inverters, buffers, NAND gates, NOR gates, XOR gates, amplifiers, comparators, digital-to-analog converters, analog-to-digital converters, multiplexers, etc. The majority function is performed at the summing node Vs, and the resulting voltage is projected on to capacitance of driver circuitry 2401. For example, the majority function of the currents ($I_a$, $I_b$, and $I_c$) on node Vs results in a resultant current that charges capacitor. Table 1 illustrates the majority function f(Majority a, b, c).

TABLE 1

| a | b | c | Vs (f(Majority a, b, c)) |
|---|---|---|---|
| 0 | 0 | 0 | 0 |
| 0 | 0 | 1 | 0 |
| 0 | 1 | 0 | 0 |
| 0 | 1 | 1 | 1 |
| 1 | 0 | 0 | 0 |
| 1 | 0 | 1 | 1 |
| 1 | 1 | 0 | 1 |
| 1 | 1 | 1 | 1 |

The charge developed on node Vs produces a voltage and current that is the output of the majority gate 2400. Any suitable driver circuitry 2401 can drive this output. For example, a non-FE logic, FE logic, CMOS logic, BJT logic, etc. can be used to drive the output to a downstream logic. Examples of the drivers include inverters, buffers, NAND gates, NOR gates, XOR gates, amplifiers, comparators, digital-to-analog converters, analog-to-digital converters, multiplexers, etc.

While FIG. 24 illustrates a 3-input majority gate, the same concept can be extended to more than 3 inputs to make an N-input majority gate, where N is greater than 2. In various embodiments, 'N' is an odd number. For example, a 5-input majority gate is like an input majority gate 2400 but for additional inputs 'd' and 'e'. These inputs can come from the same drivers or from different drivers.

In some embodiments, the 3-input majority gate can be configured as a fast inverter with a much faster propagation delay compared to a similar sized (in terms of area footprint) CMOS inverter. This is particularly useful when the inputs have a significantly slower slope compared to the propagation delay through the non-linear input capacitors. One way to configurate the 3-input majority gate as an inverter is to set one input to a logic high (e.g., b=1) and set another input to a logic low (e.g., b=0). The third input is the driving input which is to be inverted. The inversion will be at the Vs node. The same technique can also be applied to N-input majority gate, where 'N' is 1 or any other odd number. In an N-input majority gate, (N−1)/2 inputs are set to '1' and (N−1)/2 inputs are set to '0', and one input is used to decide the inversion function. It will be appreciated that the various embodiments are described as a majority gate, the same concepts are applicable to a minority gate. In a minority gate the driving circuitry is an inverting circuitry coupled to the summing node Vs. The minority function is seen at the output of the inverting circuitry.

In some embodiments, (2N−1) input majority gate can operate as an N-input AND gate where (N−1) inputs of the majority gate are set to zero. The AND function will be seen at the summing node Vs. Similarly, N-input NAND, OR, NOR gates can be realized. In various embodiments, the summing node Vs is driven by a driver circuitry (e.g., inverter, buffer, NAND gate, AND gate, OR gate, NOR gate, or any other logic circuitry). However, driver circuitry 2401 can be replaced with another majority or minority gate. In one such embodiment, the storage node Vs is directly coupled to a non-linear capacitor of another majority or minority gate.

Any logic function $f(x_1, x_2, \ldots x_n)$ can be represented by two levels of logic as given by the min-term expansion:

$$f(x_1, x_2, \ldots, x_n) =$$

$$V_{C_1, C_2, \ldots, C_n} f(x_1, x_2, \ldots, x_n) \wedge x_1^{C_1} \wedge x_2^{C_2} \wedge x_3^{C_3} \ldots \wedge x_n^{C_n}$$

where $C_i$ is either 0 or 1. When $$C_i \text{ is } 1, x_i^{C_i} = x_i$$

(the input is used in its original form). When $C_i$ is $$0, x_i^{C_i} = \overline{x_i}$$

(the input is used in its inverted form). The first level of logic is represented by at most $2^n$ AND gates ($\wedge$), one for each of the $2^n$ possible combinations of 0 and 1 for $C_1, C_2, \ldots C_n$. The second level of logic is represented by a single OR gate ($\vee$). Each operand of the OR gate is a representation of a row in the truth table for $f(x_1, x_2, \ldots x_n)$.

A (2N−1)-input majority gate can represent an N-input AND gate, by tying (N−1) of the majority gate's inputs to a ground level. Similarly, a (2N−1)-input majority gate can represent an N-input OR gate, by tying (N−1) of the majority gate's inputs to a supply level (Vdd). Since a majority gate can represent AND and OR gates, and the inputs to the AND and OR gates are either original or inverted forms of the input digital signals, any logic function can be represented by majority gates and inverters only, in accordance with some embodiments.

Figure 25:
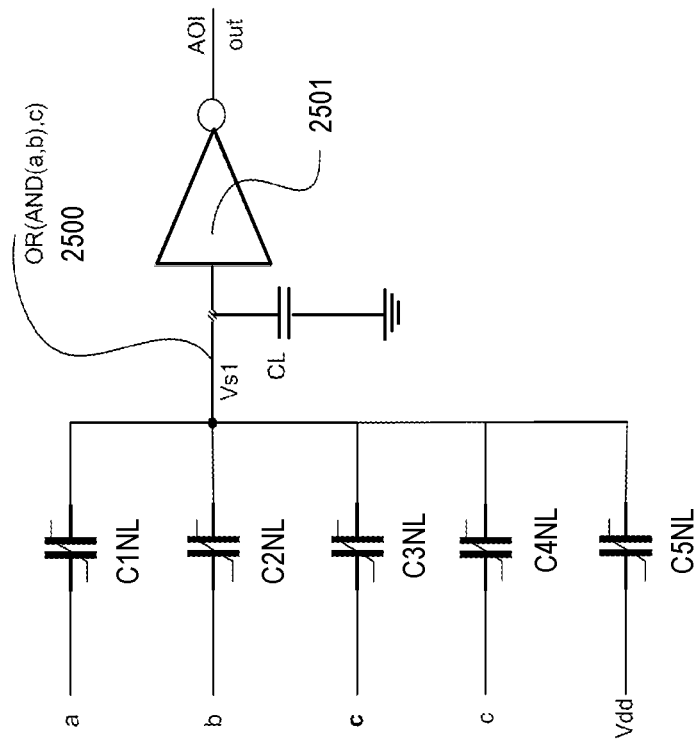
FIG. 25 illustrates a complex logic gate implemented using a 5-input majority gate, in accordance with some embodiments.

FIG. 25 illustrates complex logic gate 2500 implemented using a 5-input majority gate, in accordance with some embodiments. In some embodiments, an AOI (and-or-invert) logic comprises a 5-input majority gate. The 5-input majority gate includes non-linear capacitors C1n1, C2n1, C3n1, C4n1, and C5n1 and driving circuitry 2501 coupled as shown. In various embodiments, two of the non-linear capacitors receives the same input. Here, capacitors C3n1 and C4n1 receive input 'c'. In various embodiments, C5n1 is coupled to Vdd to produce an OR function at node Vs, where the OR function is OR(AND(a,b),c). In some embodiments, other logic gates can be realized by changing Vdd to ground for capacitor C5n1, and/or changing other inputs.

Following examples are provided that illustrate the various embodiments. The examples can be combined with other examples. As such, various embodiments can be combined with other embodiments without changing the scope of the invention.

Example 1: A device comprising: a first region comprising: a first conductive interconnect within a first dielectric in a first level; a second level above the first level, the second level comprising: an electrode structure on the first conductive interconnect, the electrode structure comprising: a first conductive hydrogen barrier layer; and a first conductive fill material on the first conductive hydrogen barrier layer, wherein the electrode structure comprises a first lateral thickness; an etch stop layer comprising an insulator, the etch stop layer laterally surrounding the electrode structure; a second dielectric on the etch stop layer, the second dielectric comprising an amorphous, greater than 90% film density hydrogen barrier material; a trench within the second dielectric, the trench on the electrode structure; a memory device within the trench, the memory device comprising: a first electrode along a base and a sidewall of the trench, wherein the first electrode is in contact with the electrode structure; a dielectric layer comprising a ferroelectric material or a paraelectric material substantially conformal to the first electrode; and a second electrode in contact with the dielectric layer; a via electrode on the second electrode, the via electrode comprising: a second conductive hydrogen barrier layer comprising a lateral portion in contact with the second electrode and substantially vertical portions connected to the lateral portion; and a second conductive fill material adjacent to the second conductive hydrogen barrier layer; and a second region adjacent to the first region, the second region comprising: a second conductive interconnect within the first level; a third dielectric on the etch stop layer, the third dielectric directly adjacent to the second dielectric, wherein the third dielectric comprises a less than 90% film density material; and a via structure on the second conductive interconnect, the via structure laterally in contact with the third dielectric.

Example 2: The device of example 1, wherein the second dielectric comprises $Al_xO_y$, $HfO_x$, $AlSiO_x$, $ZrO_x$, $TiO_x$, $AlSiO_x$, $HfSiO_x$, $TaSiO_x$, AlN, ZrN, or HfN, wherein x is substantially equal to 2, and wherein y is an integer.

Example 3: The device of example 1, wherein the third dielectric comprises $SiO_2$, SiOC, SiC, or $SiO_2$ doped with F.

Example 4: The device of example 1, wherein the etch stop layer comprises silicon and one or more of nitrogen and carbon and the second dielectric does not comprise silicon nitride.

Example 5: The device of example 1, wherein the first conductive hydrogen barrier layer and the second conductive hydrogen barrier layer comprise TiAlN with greater than 30 atomic percent AlN, TaN with greater than 30 atomic percent N, TiSiN with greater than 20 atomic percent SiN, TaC, TiC, WC, WN, carbonitrides of Ta, Ti or W, TiO, $Ti_2O$, $WO_3$, $SnO_2$, ITO, IGZO, zinc oxide, or METGLAS series of alloys.

Example 6: The device of example 1, wherein the ferroelectric material comprises one of: bismuth ferrite (BFO), BFO with a doping material wherein the doping material is one: lanthanum, or elements from lanthanide series of periodic table; lead zirconium titanate (PZT) or PZT with a doping material, wherein the doping material is one of: La or Nb; a relaxor ferroelectric material which includes one of lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), or Barium titanium-barium strontium titanium (BT-BST); a perovskite material which includes one of: $BaTiO_3$, $PbTiO_3$, $KNbO_3$, or $NaTaO_3$; hexagonal ferroelectric which includes one of: $YmnO_3$, or $LuFeO_3$; hexagonal ferroelectrics of a type h-$RmnO_3$, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium I, ytterbium (Yb), or yttrium (Y); Hafnium (Hf), Zirconium (Zr), Aluminum (Al), Silicon (Si), their oxides or their alloyed oxides; hafnium oxides of the form $Hf_{(1-x)}E_xO_y$, where E includes one of: Al, Ca, Ce, Dy, Er, Gd, Ge, La, Sc, Si, Sr, Sn, Zr, or Y, wherein 'x' and 'y' are first and second fractions, respectively; $Al_{(1-x)}Sc_{(x)}N$, $Ga_{(1-x)}Sc_{(x)}N$, $Al_{(1-x)}Y_{(x)}N$ or $Al_{(1-x-y)}Mg_{(x)}Nb_{(y)}N$, wherein 'x' and 'y' are third and fourth fractions, respectively: $HfO_2$ doped with one of: Al, Ca, Ce, Dy, Er, Gd, Ge, La, Sc, Si, Sr, Sn, or Y; or niobate type compounds $LiNbO_3$, $LiTaO_3$, lithium iron tantalum oxy fluoride, barium strontium niobate, sodium barium niobate, or potassium strontium niobate; or an improper ferroelectric material which includes one of: [PTO/STO]n or [LAO/STO]n, where 'n' is between 1 to 100, or wherein the paraelectric material comprises $SrTiO_3$, $Ba_{(x)}Sr_{(y)}TiO_3$ (where x is −0.05, and y is 0.95), $HfZrO_2$, Hf—Si—O, or La-substituted $PbTiO_3$.

Example 7: The device of example 1, wherein the first electrode and the second electrode comprise Ti, Ta, Ru, W, or nitrides of Ti, Ta, Ru, W.

Example 8: The device of example 1, wherein the first electrode and the second electrode comprises a conductive ferroelectric oxide such as but not limited to La—Sr—$CoO_3$, $SrRuO_3$, La—Sr—$MnO_3$, $YBa_2Cu_3O_7$, $Bi_2Sr_2CaCu_2O_8$, or $LaNiO_3$.

Example 9: The device of example 8, wherein the sidewall of the trench is substantially vertical and wherein the first electrode is substantially conformal with the sidewall of the trench.

Example 10: The device of example 1, wherein the sidewall of the trench is tapered and wherein the second electrode comprises a lateral thickness that increases with height relative to an uppermost surface of the electrode structure.

Example 11: The device of example 1, wherein the first conductive hydrogen barrier layer and the second conductive hydrogen barrier layer comprise different materials, and wherein the first conductive hydrogen barrier layer and the second conductive hydrogen barrier layer comprise a thickness of least 1 nm.

Example 12: The device of example 1, wherein the first conductive hydrogen barrier layer laterally surrounds the first conductive fill material, and wherein the first electrode is not in contact with the first conductive hydrogen barrier layer.

Example 13: The device of example 1, wherein the first conductive hydrogen barrier layer laterally surrounds the first conductive fill material, and wherein a portion of the first conductive hydrogen barrier layer and a portion of the first conductive fill material are in contact with a lower most surface of the first electrode.

Example 14: The device of example 1, wherein the electrode structure further comprises a first liner layer directly between the first conductive hydrogen barrier layer and the first conductive fill material and wherein the first liner layer comprises a material that is different from a material of the first conductive hydrogen barrier layer.

Example 15: The device of example 1, wherein the via electrode further comprises a second liner layer between the second conductive hydrogen barrier layer and the second conductive fill material, and wherein the second liner layer comprises a material that is different from a material of the second conductive hydrogen barrier layer.

Example 16: A device comprising: a first region comprising: a first conductive interconnect within a first dielectric in a first level; a second level above the first level, the second level comprising: an electrode structure on the first conductive interconnect, the electrode structure comprising: a first conductive hydrogen barrier layer; and a first conductive fill material on the first conductive hydrogen barrier layer, wherein the electrode structure comprises a first lateral thickness; an etch stop layer comprising an insulator, the etch stop layer laterally surrounding the electrode structure; a second dielectric on the etch stop layer, the second dielectric comprising a lower than 90% film density material; a trench within the second dielectric, the trench on the electrode structure; a spacer along a sidewall of the trench; a memory device within the trench, the memory device comprising: a bottom electrode comprising a ferroelectric material or a paraelectric material, wherein the bottom electrode is substantially conformal to a base of the trench and to the spacer, and wherein the bottom electrode is in contact with the electrode structure; a dielectric layer substantially conformal to the bottom electrode; and a top electrode in contact with the dielectric layer; a third dielectric on the memory device, the third dielectric comprising a second amorphous, greater than 90% film density hydrogen barrier material; a via electrode on the top electrode, the via electrode comprising: a second conductive hydrogen barrier layer comprising a lateral portion in contact with the top electrode and substantially vertical portions directly adjacent to the third dielectric; and a second conductive fill material adjacent to the second conductive hydrogen barrier layer; and a second region adjacent to the first region, the second region comprising: a second conductive interconnect within the first level; a via structure on the second conductive interconnect, the via structure laterally surrounded by the second dielectric, the third dielectric and the etch stop layer.

Example 17: The device of example 16, wherein the second dielectric comprises $SiO_2$, SiOC, SiC, or $SiO_2$ doped with F.

Example 18: The device of example 1, wherein the spacer comprises $Al_xO_y$, $HfO_x$, $AlSiO_x$, $ZrO_x$, $TiO_x$, $AlSiO_x$, $HfSiO_x$, $TaSiO_x$, AlN, ZrN, or HfN, wherein x is substantially equal to 2, and wherein y is an integer.

Example 19: The device of example 18, further comprising a first metal line above and coupled with the via electrode, wherein the first metal line is laterally surrounded by a fourth dielectric, and wherein the via structure is further between the second conductive interconnect and a second metal line, wherein in the second metal line is laterally surrounded by the fourth dielectric.

Example 20: A system comprising: a processor; a communication interface communicatively coupled to the processor; and a memory coupled to the processor, wherein the memory comprises: bit-cells, wherein one of the bit-cells includes: a first region comprising: a first conductive interconnect within a first dielectric in a first level; a second level above the first level, the second level comprising: an electrode structure on the first conductive interconnect, the electrode structure comprising: a first conductive hydrogen barrier layer; and a first conductive fill material on the first conductive hydrogen barrier layer, wherein the electrode structure comprises a first lateral thickness; an etch stop layer comprising an insulator, the etch stop layer laterally surrounding the electrode structure; a second dielectric on the etch stop layer, the second dielectric comprising an amorphous, greater than 90% film density hydrogen barrier material; a trench within the second dielectric, the trench on the electrode structure; a memory device within the trench, the memory device comprising: a first electrode along a base and a sidewall of the trench, wherein the first electrode is in contact with the electrode structure; a dielectric layer comprising a ferroelectric material or a paraelectric material substantially conformal to the first electrode; and a second electrode in contact with the dielectric layer; a via electrode on the second electrode, the via electrode comprising: a second conductive hydrogen barrier layer comprising a lateral portion in contact with the second electrode and substantially vertical portions connected to the lateral portion; and a second conductive fill material adjacent to the second conductive hydrogen barrier layer; and a second region adjacent to the first region, the second region comprising: a second conductive interconnect within the first level; a third dielectric on the etch stop layer, the third dielectric directly adjacent to the second dielectric, wherein the third dielectric comprises a less than 90% film density material; and a via structure on the second conductive interconnect, the via structure laterally in contact with the third dielectric.

Example 2a: A method of fabricating a device structure, the method comprising: forming an electrode structure in a memory region by a first process comprising: etching a first opening in an etch stop layer and exposing a first conductive interconnect below the etch stop layer; depositing a first conductive hydrogen barrier layer in the first opening; and depositing a first conductive material on the first conductive hydrogen barrier layer; depositing a first dielectric comprising an amorphous, greater than 90% film density hydrogen barrier material on the electrode structure; forming a trench capacitor by a second process comprising: forming a trench in the first dielectric, the trench exposing at least a portion of the electrode structure; depositing a first electrode layer on a base and on sidewalls of the trench; depositing a dielectric layer comprising a ferroelectric material or a paraelectric material on the first electrode layer; and depositing a second electrode layer on the dielectric layer; depositing a second dielectric comprising a less than 90% film density material on the etch stop layer in an adjacent logic region; forming a via electrode on the trench capacitor by a third process comprising: depositing a second conductive hydrogen barrier layer on the second electrode layer; and depositing a second conductive material on the second conductive hydrogen barrier layer; forming a second opening in the second dielectric and in the etch stop layer; and depositing a conductive material in the second opening to form a via structure on a second conductive interconnect.

Example 2b: The method of example 2a, wherein depositing the first conductive hydrogen barrier layer comprises utilizing a first atomic layer deposition process to blanket deposit the first conductive hydrogen barrier layer on the first conductive interconnect and on sidewalls of the etch stop layer to form a conductive hydrogen barrier layer having a lateral portion and substantially vertical portions connected to the lateral portion.

Example 2c: The method of example 2b, wherein depositing the first conductive hydrogen barrier layer comprises using the first atomic layer deposition process to deposit a material comprising TiAlN, with greater than 30 atomic percent AlN, TaN with greater than 30 atomic percent N, TiSiN with greater than 20 atomic percent SiN, TaC, TiC, WC, WN, carbonitrides of Ta, Ti or W, TiO, $Ti_2O$, $WO_3$, $SnO_2$, ITO, IGZo, zinc oxide or METGLAS series of alloys.

Example 2d: The method of example 2a, wherein etching the first opening comprises forming the first opening with a first lateral thickness that is greater than a second lateral thickness of the first conductive interconnect, and wherein forming the trench further comprises masking and etching a portion of the first dielectric where the trench has a third lateral thickness that is less than the first lateral thickness.

Example 2e: The method of example 2a, wherein forming the electrode structure further comprises performing a chemical mechanical planarization process to form the electrode structure that is substantially comprised of the first conductive material with a peripheral boundary comprising the first conductive hydrogen barrier layer, and wherein the first conductive material is planarized to form a second uppermost surface that is substantially co-planar with a third uppermost surface of the etch stop layer.

Example 2f: The method of example 2a, wherein depositing the dielectric layer comprises: using a second atomic layer deposition process to conformally deposit the ferroelectric material comprising: one of: bismuth ferrite (BFO), BFO with a first doping material wherein the first doping material is one of: lanthanum, or elements from lanthanide series of periodic table; lead zirconium titanate (PZT) or PZT with a second doping material, wherein the second doping material is one of: La or Nb; a relaxor ferroelectric material which includes one of lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), or Barium titanium-barium strontium titanium (BT-BST); a perovskite material which includes one of: $BaTiO_3$, $PbTiO_3$, $KNbO_3$, or $NaTaO_3$; hexagonal ferroelectric which includes one of: $YMnO_3$, or $LuFeO_3$; hexagonal ferroelectrics of a type $h-RMnO_3$, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulI(Tm), ytterbium (Yb), or yttrium (Y); Hafnium (Hf), Zirconium (Zr), Aluminum (Al), Silicon (Si), their oxides or their alloyed oxides; hafnium oxides of the form $Hf_{(1-x)}E_xO_y$, where E includes one of: Al, Ca, Ce, Dy, Er, Gd, Ge, La, Sc, Si, Sr, Sn, Zr, or Y, wherein 'x' and 'y' are first and second fractions, respectively; $Al_{(1-x)}Sc_{(x)}N$, $Ga_{(1-x)}Sc_{(x)}N$, $Al_{(1-x)}Y_{(x)}N$ or $Al_{(1-x-y)}Mg_{(x)}Nb_{(y)}N$, where 'x' and 'y' are third and fourth fractions, respectively; $HfO_2$ doped with one of: Al, Ca, Ce, Dy, Er, Gd, Ge, La, Sc, Si, Sr, Sn, or Y; niobate type compounds $LiNbO_3$, $LiTaO_3$, lithium iron tantalum oxy fluoride, barium strontium niobate, sodium barium niobate, or potassium strontium niobate; or an improper ferroelectric material which includes one of: [PTO/STO]n or [LAO/STO]n, where 'n' is between 1 to 100, wherein the second atomic layer deposition process is carried out at a temperature between 160 and 400 degrees Celsius.

Example 2g: The method of example 2a, wherein depositing the dielectric layer comprises: using a third atomic layer deposition process to conformally deposit the dielectric layer comprising the paraelectric material, the paraelectric material comprising $SrTiO_3$, $Ba_{(x)}Sr_{(y)}TiO_3$ (where x is −0.05, and y is 0.95), $HfZrO_2$, Hf—Si—O, or La-substituted $PbTiO_3$.

Example 2h: The method of example 2a, wherein depositing the second dielectric comprises a third atomic layer deposition or a chemical vapor deposition process to deposit a material comprising $Al_xO_y$, $HfO_x$, $ZrO_x$, $TaO_x$, $TiO_x$, $AlSiO_x$, $HfSiO_x$, $TaSiO_x$, AlN, ZrN, or HfN.

Example 2i: The method of example 2a, wherein depositing the second dielectric comprises utilizing a plurality of processing operations where a first operation comprises utilizing a physical vapor deposition (PVD) process to deposit a material comprising a metal and oxygen, such as but not limited to $Al_xO_y$, $HfO_x$, $ZrO_x$, $TaO_x$, $TiO_x$, $AlSiO_x$, $HfSiO_x$, $TaSiO_x$, or a metal and nitrogen, such as, but not limited to AlN, ZrN, or HfN, wherein x is substantially equal to 2, and wherein y is an integer.

Example 2j: The method of example 2a, wherein forming the trench capacitor further comprises performing a chemical mechanical planarization process to form an uppermost surface comprising the second electrode layer surrounded by an annular ring of the dielectric layer, wherein the annular ring of the dielectric layer is further surrounded by the first electrode layer.

Example 2k: The method of example 2a, wherein prior to deposition of the first electrode layer the second process includes forming a spacer comprising a silicon nitride, silicon carbide or carbon doped silicon nitride on the sidewalls of the trench.

Example 2l: The method of example 27, wherein the amorphous, greater than 90% film density hydrogen barrier material is a first; amorphous, greater than 90% film density hydrogen barrier material, wherein prior to depositing the second dielectric, the method further comprises: depositing a third dielectric comprising a second amorphous, greater than 90% film density hydrogen barrier material on the trench capacitor and on the second dielectric; and masking the third dielectric and etching and removing the third dielectric and the second dielectric from the adjacent logic region.

Example 2m: The method of example 2a, wherein forming the via electrode further comprises forming an opening in the third dielectric prior to depositing the second conductive hydrogen barrier layer, wherein the opening exposes the second electrode layer.

Example 2n: The method of example 2a, wherein forming the third dielectric comprises depositing a material of the first dielectric.

Example 2o: The method of example 2a, wherein forming the third dielectric comprises depositing a material comprising silicon, nitrogen or silicon, nitrogen and carbon.

Example 2p: A method of fabricating a device structure, the method comprising: forming an electrode structure in a memory region by a first process comprising: etching a first opening in an etch stop layer and exposing a first conductive interconnect below the etch stop layer; depositing a first conductive hydrogen barrier layer in the first opening; and depositing a first conductive material on the first conductive hydrogen barrier layer; depositing a first dielectric comprising an amorphous, greater than 90% film density hydrogen barrier material on the electrode structure; forming a trench capacitor by a second process comprising: forming a cylindrical trench in the first dielectric, the cylindrical trench exposing at least a portion of the electrode structure; depositing a first electrode layer on a base and on sidewalls of the cylindrical trench; depositing a dielectric layer comprising a ferroelectric material or a paraelectric material on the first electrode layer; and depositing a second electrode layer on the dielectric layer; depositing a second dielectric comprising a less than 90% film density material on the etch stop layer in an adjacent logic region; forming a via electrode on the trench capacitor by a third process comprising: depositing a second conductive hydrogen barrier layer on the second electrode layer; and depositing a second conductive material on the second conductive hydrogen barrier layer; forming a second opening in the second dielectric and in the etch stop layer; and depositing a conductive material in the second opening to form a via structure on a second conductive interconnect.

Example 2q: The method of 2p, wherein depositing the second conductive hydrogen barrier layer further comprises depositing on a portion of the dielectric layer but not on the first electrode layer.

Example 2r: The method of 2p, wherein prior to depositing the second dielectric, the method further comprises: depositing a third dielectric comprising silicon and nitrogen or silicon, nitrogen and carbon on the trench capacitor and on the second dielectric; and masking the third dielectric and etching and removing the third dielectric and the second dielectric from the adjacent logic region.

Example 2s: A method of fabricating a device structure, the method comprising: depositing an etch stop layer on a first conductive interconnect in a memory region and on a second conductive interconnect formed in an adjacent logic region; forming an electrode structure comprising a first conductive hydrogen barrier layer on the first conductive interconnect and a first conductive material on the first conductive hydrogen barrier layer; depositing a second dielectric comprising a less than 90% film density material on the etch stop layer and on the electrode structure; masking and etching the second dielectric to remove it from the memory region; depositing a second dielectric comprising 100morphousamorphous, greater than 90% film density hydrogen barrier material in the memory region; forming a trench capacitor by a first process comprising: forming a trench in the second dielectric, the trench exposing at least a portion of the electrode structure; depositing a first electrode layer on a base and on sidewalls of the trench; depositing a dielectric layer comprising a ferroelectric material or a paraelectric material on the first electrode layer; and depositing a second electrode layer on the dielectric layer; depositing a third dielectric comprising a hydrogen barrier material on the second dielectric; forming a via electrode on the trench capacitor by a second process comprising: forming a first opening in the third dielectric, the first opening exposing the second electrode layer; depositing a second conductive hydrogen barrier layer on the second electrode layer; and depositing a second conductive material on the second conductive hydrogen barrier layer; forming a second opening in the third dielectric, in the first dielectric and in the etch stop layer; and depositing a conductive material in the second opening to form a via structure on the second conductive interconnect.

Example 2t: The method of 2s, herein the via structure is formed prior to forming the via electrode.

Example 2u: The method of 2p, wherein the third dielectric is a bilayer stack comprising a first layer comprising a hydrogen barrier material and a second layer on the first layer, the second layer comprising an interlayer dielectric.

Example 3a: A device comprising: a first electrode structure and a second electrode structure within an etch stop layer comprising an insulator, the first electrode structure laterally separated from the second electrode structure, wherein the first electrode structure and the second electrode structure comprise: a first conductive hydrogen barrier layer; and a first conductive fill material on the first conductive hydrogen barrier layer; a planar capacitor comprising a first ferroelectric material or a first paraelectric material on least a portion of the first electrode structure; an encapsulation layer on the planar capacitor; a dielectric on the encapsulation layer; and a via electrode on at least a portion of the planar capacitor, the via electrode comprising: a second conductive hydrogen barrier layer; and a second conductive fill material on the second conductive hydrogen barrier layer; a trench within the dielectric, the trench on the second electrode structure; a spacer along a sidewall of the trench; a non-planar capacitor within the trench, the non-planar capacitor comprising: a bottom electrode that is substantially conformal along a base of the trench and the spacer, wherein the bottom electrode is in contact with the second electrode structure; a dielectric layer substantially conformal to the bottom electrode, the dielectric layer comprising a second ferroelectric material or a second paraelectric material; and a top electrode in contact with the dielectric layer.

Example 3b: The device of example 3a, wherein the first ferroelectric material and the second ferroelectric material comprises one of: bismuth ferrite (BFO), BFO with a doping material wherein the doping material is one of: lanthanum, or elements from lanthanide series of periodic table; lead zirconium titanate (PZT), or PZT with a doping material, wherein the doping material is one of: La or Nb; a relaxor ferroelectric material which includes one of: lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), or Barium titanium-barium strontium titanium (BT-BST); a perovskite material which includes one of: $BaTiO_3$, $PbTiO_3$, $KNbO_3$, or $NaTaO_3$; hexagonal ferroelectric which includes one of: $YmnO_3$, or $LuFeO_3$; hexagonal ferroelectrics of a type h-$RmnO_3$, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), Thulium™, ytterbium (Yb), or yttrium (Y); Hafnium (Hf), Zirconium (Zr), Aluminum (Al), Silicon (Si), their oxides or their alloyed oxides; hafnium oxides of the form $Hf_{(1-x)}ExOy$, where E includes one of: Al, Ca, Ce, Dy, Er, Gd, Ge, La, Sc, Si, Sr, Sn, Zr, or Y, wherein 'x' and 'y' are first and second fractions, respectively; $Al_{(1-x)}Sc_{(x)}N$, $Ga_{(1-x)}Sc_{(x)}N$, $Al_{(1-x)}Y_{(x)}N$ or $Al_{(1-x-y)}Mg_{(x)}Nb_{(y)}N$, wherein 'x' and 'y' are third and fourth fractions, respectively; $HfO_2$ doped with one of: Al, Ca, Ce, Dy, Er, Gd, Ge, La, Sc, Si, Sr, Sn, or Y; or niobate type compounds $LiNbO_3$, $LiTaO_3$, lithium iron tantalum oxy fluoride, barium strontium niobate, sodium barium niobate, or potassium strontium niobate; or an improper ferroelectric material which includes one of: [PTO/STO]n or [LAO/STO]n, where 'n' is between 1 to 100, or wherein the first paraelectric material and the second paraelectric material comprise $SrTiO_3$, $Ba_{(x)}Sr_{(y)}TiO_3$ (where x is −0.05, and y is 0.95), $HfZrO_2$, Hf—Si—O, or La-substituted $PbTiO_3$.

Example 3c: The device of example 3b, wherein the planar capacitor comprises the first paraelectric material and the non-planar capacitor comprises the second ferroelectric material, or the planar capacitor comprises the first ferroelectric material and the non-planar capacitor comprises the first paraelectric material.

Example 3d: The device of example 3b, wherein the planar capacitor comprises the first ferroelectric material and the non-planar capacitor comprises the second ferroelectric material.

Example 3e: The device of example 3b, wherein the planar capacitor comprises the first paraelectric material and the non-planar capacitor comprises the second paraelectric material.

Example 3f: The device of example 3b, wherein the planar capacitor comprises a first vertical thickness and the non-planar capacitor comprises a second vertical thickness, wherein the second vertical thickness is at least two times greater than the first vertical thickness.

Example 3g: The device of example 3a, wherein the encapsulation layer is further in contact with the spacer.

Example 3h: The device of example 3a, wherein the encapsulation layer comprises SiN, carbon doped SiN, $Al_xO_y$, $HfO_x$, $AlSiO_x$, $ZrO_x$, $TiO_x$, $AlSiO_x$, $HfSiO_x$, $TaSiO_x$, AlN, ZrN, or HfN, and wherein the spacer comprises SiN, carbon doped SiN, $Al_xO_y$, $HfO_x$, $AlSiO_x$, $ZrO_x$, $TiO_x$, $AlSiO_x$, $HfSiO_x$, $TaSiO_x$, AlN, ZrN, or HfN, wherein x is substantially equal to 2, and wherein y is an integer, and wherein the encapsulation layer and the spacer include a same material.

Example 3i: The device of example 3a, wherein the encapsulation layer comprises SiN, carbon doped SiN, $Al_xO_y$, $HfO_x$, $AlSiO_x$, $ZrO_x$, $TiO_x$, $AlSiO_x$, $HfSiO_x$, $TaSiO_x$, AlN, ZrN, or HfN, and wherein the spacer comprises SiN, carbon doped SiN, $Al_xO_y$, $HfO_x$, $AlSiO_x$, $ZrO_x$, $TiO_x$, $AlSiO_x$, $HfSiO_x$, $TaSiO_x$, AlN, ZrN, or HfN, wherein x is substantially equal to 2, and wherein y is an integer, and wherein the encapsulation layer and the spacer include different materials.

Example 3j: The device of example 3d, wherein the first ferroelectric material and the second ferroelectric material comprise a same material.

Example 3k: The device of example 3e, wherein the first paraelectric material and the second paraelectric material comprise a same material.

Example 3l: The device of example 3a, wherein the dielectric is an amorphous, greater than 90% film density hydrogen barrier material comprising $Al_xO_y$, $HfO_x$, $AlSiO_x$, $ZrO_x$, $TiO_x$, $AlSiO_x$, $HfSiO_x$, $TaSiO_x$, AlN, ZrN, or HfN, wherein x is substantially equal to 2, and wherein y is an integer.

Example 3m: The device of example 3a, wherein the encapsulation layer and the spacer comprise a substantially similar thickness.

Example 3n: The device of example 3a, wherein the second conductive hydrogen barrier layer comprises: a lateral portion in contact with an uppermost surface of the planar capacitor; and substantially vertical portions adjacent to the dielectric.

Example 3o: The device of example 3a, wherein the planar capacitor and the via electrode have a combined vertical thickness that is equal to a vertical thickness of the non-planar capacitor.

Example 3p: The device of example 3a, wherein the dielectric comprises a less than 90% film density material such as but not limited to $SiO_2$, SiOC, SiC, or $SiO_2$ doped with F.

Example 3q: The device of example 3a, wherein the first conductive hydrogen barrier layer and the second conductive hydrogen barrier layer comprise TiAlN with greater than 30 atomic percent AlN, TaN with greater than 30 atomic percent N, TiSiN with greater than 20 atomic percent SiN, TaC, TiC, WC, WN, carbonitrides of Ta, Ti or W, TiO, $Ti_2O$, $WO_3$, $SnO_2$, ITO, IGZO, zinc oxide, or METGLAS series of alloys.

Example 3r: The device of example 3a, wherein the first conductive hydrogen barrier layer and the second conductive hydrogen barrier layer comprise different materials.

Example 3s: The device of example 3a, wherein the first conductive hydrogen barrier layer and the second conductive hydrogen barrier layer comprise a thickness of least 1 nm.

Example 3t: The device of example 3a, wherein the first conductive hydrogen barrier layer laterally surrounds the first conductive fill material, and wherein the planar capacitor is not in contact with the first conductive hydrogen barrier layer.

Example 3u: The device of example 3a, wherein the first conductive hydrogen barrier layer laterally surrounds the first conductive fill material, and wherein a portion of the first conductive hydrogen barrier layer and a portion of the first conductive fill material are in contact with a lower most surface of the planar capacitor.

Example 3v: The device of example 3a, wherein the first electrode structure and the second electrode structure further comprise a first liner layer directly between the first conductive hydrogen barrier layer and the first conductive fill material and wherein the first liner layer comprises a material that is different from a material of the first conductive hydrogen barrier layer.

Example 3w: The device of example 3a, wherein the via electrode further comprises a second liner layer between the second conductive hydrogen barrier layer and the second conductive fill material, and wherein the second liner layer comprises a material that is different from a material of the second conductive hydrogen barrier layer.

Example 3x: A device comprising: a first electrode structure and a second electrode structure within an etch stop layer comprising an insulator, the first electrode structure laterally separated from the second electrode structure, wherein the first electrode structure and the second electrode structure comprise: a first conductive hydrogen barrier layer; and a first conductive fill material on the first conductive hydrogen barrier layer; a planar capacitor comprising a first ferroelectric material or a first paraelectric material on least a portion of the first electrode structure; a dielectric comprising an amorphous, greater than 90% film density hydrogen barrier material on the planar capacitor and on the etch stop layer; and a via electrode on at least a portion of the planar capacitor, the via electrode comprising: a second conductive hydrogen barrier layer; and a second conductive fill material on the second conductive hydrogen barrier layer; a trench within the dielectric, the trench on the second electrode structure; a non-planar cylindrical capacitor within the trench, the non-planar cylindrical capacitor comprising: a bottom electrode that is substantially conformal along a base and sidewall of the trench, wherein the bottom electrode is in contact with the second electrode structure; a dielectric layer substantially conformal to the bottom electrode, the dielectric layer comprising a second ferroelectric material or a second paraelectric material; and a top electrode in contact with the dielectric layer.

Example 3y: The device of example 3x, wherein the dielectric is an amorphous, greater than 90% film density hydrogen barrier material comprising $Al_xO_y$, $HfO_x$, $AlSiO_x$, $ZrO_x$, $TiO_x$, $AlSiO_x$, $HfSiO_x$, $TaSiO_x$, AlN, ZrN, or HfN, wherein x is substantially equal to 2, and wherein y is an integer.

Example 3z: The device of example 3x, wherein the non-planar cylindrical capacitor is tapered.

Example 3aa: A device comprising: a first electrode structure and a second electrode structure within an etch stop layer comprising an insulator, the first electrode structure laterally separated from the second electrode structure, wherein the first electrode structure and the second electrode structure comprise: a first conductive hydrogen barrier layer; and a first conductive fill material on the first conductive hydrogen barrier layer; a planar capacitor comprising a first ferroelectric material or a first paraelectric material on least a portion of the first electrode structure; an encapsulation layer on the planar capacitor; a dielectric on the encapsulation layer the dielectric comprising an amorphous, greater than 90% film density hydrogen barrier material; and a via electrode on at least a portion of the planar capacitor, the via electrode comprising: a second conductive hydrogen barrier layer; and a second conductive fill material on the second conductive hydrogen barrier layer; a trench within the dielectric, the trench on the second electrode structure; a non-planar capacitor within the trench, the non-planar capacitor comprising: a bottom electrode that is substantially conformal along a base and sidewall of the trench, wherein the bottom electrode is in contact with the second electrode structure and the encapsulation layer; a dielectric layer substantially conformal to the bottom electrode, the dielectric layer comprising a second ferroelectric material or a second paraelectric material; and a top electrode in contact with the dielectric layer.

Example 3ab: The device of example 3aa, wherein the encapsulation layer comprises SiN and wherein the encapsulation layer is further adjacent to the bottom electrode.

Example 3ac: The device of example 3aa, wherein the first conductive hydrogen barrier layer and the second conductive hydrogen barrier layer comprise different materials, and wherein the first conductive hydrogen barrier layer and the second conductive hydrogen barrier layer comprise a thickness of least 1 nm.

Example 4a: A method of fabricating a device structure, the method comprising: forming a first electrode structure and a second electrode structure, the forming comprising: etching a first opening and a second opening in an etch stop layer; depositing a conductive hydrogen barrier layer in the first opening and in the second opening; and depositing a conductive material on the conductive hydrogen barrier layer in the first opening and in the second opening; forming a planar capacitor on the first electrode structure by depositing a material layer stack comprising a first ferroelectric material or a first paraelectric material and etching the material layer stack; forming an encapsulation layer comprising a hydrogen barrier insulator material on the planar capacitor and on the etch stop layer; depositing a dielectric on the encapsulation layer; forming a trench capacitor by a second process comprising: forming a trench in the dielectric, the trench exposing at least a portion of the second electrode structure; forming a spacer along a sidewall of the trench; forming a first electrode on a base of the trench and on the spacer; forming a dielectric layer comprising a second ferroelectric material or a second paraelectric material on the first electrode; and forming a second electrode on the dielectric layer.

Example 4b: The method of example 4a, wherein depositing the dielectric layer comprises: using a first atomic layer deposition process to conformally deposit the second ferroelectric material comprising: one of bismuth ferrite (BFO), BFO with a first doping material wherein the first doping material is one of: lanthanum, or elements from lanthanide series of periodic table; lead zirconium titanate (PZT) or PZT with a second doping material, wherein the second doping material is one of: La, or Nb; a relaxor ferroelectric material which includes one of: lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), or Barium titanium-barium strontium titanium (BT-BST); a perovskite material which includes one of: $BaTiO_3$, $PbTiO_3$, $KNbO_3$, or $NaTaO_3$; hexagonal ferroelectric which includes one of: $YMnO_3$, or $LuFeO_3$; hexagonal ferroelectrics of a type $h-RMnO_3$, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); Hafnium (Hf), Zirconium (Zr), Aluminum (Al), Silicon (Si), their oxides or their alloyed oxides; hafnium oxides of the form $Hf_{(1-x)}ExOy$, where E includes Al, Ca, Ce, Dy, Er, Gd, Ge, La, Sc, Si, Sr, Sn, Zr, or Y, wherein 'x' and 'y' are first and second fractions, respectively; $Al_{(1-x)}Sc_{(x)}N$, $Ga_{(1-x)}Sc_{(x)}N$, $Al_{(1-x)}Y_{(x)}N$ or $Al_{(1-x-y)}Mg_{(x)}Nb_{(y)}N$, wherein 'x' and 'y' are third and fourth fractions, respectively; $HfO_2$ doped with one of: Al, Ca, Ce, Dy, Er, Gd, Ge, La, Sc, Si, Sr, Sn, or Y; niobate type compounds $LiNbO_3$, $LiTaO_3$, lithium iron tantalum oxy fluoride, barium strontium niobate, sodium barium niobate, or potassium strontium niobate; or an improper ferroelectric material which includes one of [PTO/STO]n or [LAO/STO]n, where 'n' is between 1 to 100, wherein the first atomic layer deposition process is carried out at a temperature between 160 and 400 degrees Celsius; and wherein depositing the material layer stack comprises: using a second atomic layer deposition process to conformally deposit the first paraelectric material comprising: one of $SrTiO_3$, $Ba_{(x)}Sr_{(y)}TiO_3$ (where x is −0.05, and y is 0.95), $HfZrO_2$, Hf—Si—O, or La-substituted $PbTiO_3$.

Example 4c: The method of example 4a, wherein depositing the dielectric layer comprises: using a third atomic layer deposition process to conformally deposit the dielectric layer comprising the second paraelectric material, the second paraelectric material comprising $SrTiO_3$, $Ba_{(x)}Sr_{(y)}TiO_3$ (where x is −0.05, and y is 0.95), $HfZrO_2$, Hf—Si—O, or La-substituted $PbTiO_3$, wherein the third atomic layer deposition process is carried out at a temperature between 160 and 400 degrees Celsius; and wherein depositing the first ferroelectric material comprises using a fourth atomic layer deposition process to conformally deposit the dielectric layer comprising one of: bismuth ferrite (BFO), BFO with a first doping material wherein the first doping material is one of: lanthanum, or elements from lanthanide series of periodic table; or lead zirconium titanate (PZT), or PZT with a second doping material, wherein the second doping material is one of: La or Nb; a relaxor ferroelectric material which includes one of: lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), or Barium titanium-barium strontium titanium (BT-BST); a perovskite material which includes one of: $BaTiO_3$, $PbTiO_3$, $KNbO_3$, or $NaTaO_3$; a hexagonal ferroelectric which includes one of: $YMnO_3$, or $LuFeO_3$; a hexagonal ferroelectric of a type h-$RMnO_3$, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); Hafnium (Hf), Zirconium (Zr), Aluminum (Al), Silicon (Si), their oxides or their alloyed oxides; hafnium oxides as $Hf_{(1-x)}ExOy$, where E includes one of: Al, Ca, Ce, Dy, er, Gd, Ge, La, Sc, Si, Sr, Sn, Zr, or Y, wherein 'x' and 'y' are first and second fractions, respectively; $Al_{(1-x)}Sc_{(x)}N$, $Ga_{(1-x)}Sc_{(x)}N$, $Al_{(1-x)}Y_{(x)}N$ or $Al_{(1-x-y)}Mg_{(x)}Nb_{(y)}N$, where 'x' and 'y' are third and fourth fractions, respectively; $HfO_2$ doped with one of: Al, Ca, Ce, Dy, Er, Gd, Ge, La, Sc, Si, Sr, Sn, or Y; niobate type compounds $LiNbO_3$, $LiTaO_3$, lithium iron tantalum oxy fluoride, barium strontium niobate, sodium barium niobate, or potassium strontium niobate; or an improper ferroelectric material which includes one of: [PTO/STO]n or [LAO/STO]n, where 'n' is between 1 to 100, wherein the fourth atomic layer deposition process is carried out at a temperature between 160 and 400 degrees Celsius.

Example 4d: The method of example 4a, wherein the conductive hydrogen barrier layer is a first conductive hydrogen barrier layer, wherein the conductive material is a first conductive material, and wherein the method further comprises forming a via electrode on the planar capacitor, the forming comprising: forming an opening in the dielectric and in the encapsulation layer; depositing a second conductive hydrogen barrier layer in the second opening and on at least a portion of a first uppermost surface of the planar capacitor; and depositing a second conductive material on the second conductive hydrogen barrier layer.

Example 4e: The method of example 4a, wherein depositing the encapsulation layer comprises depositing a layer of SiN, carbon doped SiN, $Al_xO_y$, $HfO_x$, $AlSiO_x$, $ZrO_x$, $TiO_x$, $AlSiO_x$, $HfSiO_x$, $TaSiO_x$, AlN, ZrN, or HfN, and wherein the spacer comprises SiN, carbon doped SiN, $Al_xO_y$, $HfO_x$, $AlSiO_x$, $ZrO_x$, $TiO_x$, $AlSiO_x$, $HfSiO_x$, $TaSiO_x$, AlN, ZrN, or HfN, wherein x is substantially equal to 2, and wherein y is an integer.

Example 4f: The method of example 4e, wherein depositing the encapsulation layer further comprises depositing to a thickness of at least 3 nm.

Example 4g: The method of example 4a, wherein depositing the dielectric comprises depositing an amorphous, greater than 90% film density hydrogen barrier material comprising $Al_xO_y$, $HfO_x$, $AlSiO_x$, $ZrO_x$, $TiO_x$, $AlSiO_x$, $HfSiO_x$, $TaSiO_x$, AlN, ZrN, or HfN, wherein x is substantially equal to 2, and wherein y is an integer.

Example 4h: wherein forming the spacer comprises depositing a spacer layer in the trench and etching the spacer layer to form the spacer along the sidewall of the trench but removing the spacer layer from the base of the trench.

Example 4i: The method of example 4e, wherein forming the spacer comprises depositing a spacer layer in the trench and etching the spacer layer to form the spacer along the sidewall of the trench but removing the spacer layer from the base of the trench.

Example 4j: The method of example 4i, wherein the spacer layer comprises a same material as a material of the encapsulation layer.

Example 4k: The method of example 4a, wherein depositing the dielectric comprises a less than 90% film density material such as but not limited to $SiO_2$, SiOC, SiC, or $SiO_2$ doped with F.

Example 4l: The method of example 4a, wherein forming the trench comprises forming an opening comprising a first lateral thickness that is greater than a second lateral thickness of the second electrode structure.

Example 4m: A method of fabricating a device structure, the method comprising: forming a first electrode structure and a second electrode structure, the forming comprising: etching a first opening and a second opening in an etch stop layer; depositing a conductive hydrogen barrier layer in the first opening and in the second opening; and depositing a conductive material on the conductive hydrogen barrier layer in the first opening and in the second opening; forming a planar capacitor on the first electrode structure by depositing a material layer stack comprising a first ferroelectric material or a first paraelectric material and etching the material layer stack; forming an encapsulation layer comprising a hydrogen barrier insulator material on the planar capacitor and on the etch stop layer; depositing a dielectric comprising an amorphous, greater than 90% film density hydrogen barrier material on the encapsulation layer; forming a trench capacitor by a second process comprising: forming a trench in the dielectric and in the encapsulation layer, the trench exposing at least a portion of the second electrode structure; depositing a first electrode layer on a base of the trench and along a sidewall of the trench; depositing a dielectric layer comprising a second ferroelectric material or a second paraelectric material on the first electrode layer; and depositing a second electrode layer on the dielectric layer.

Example 4n: The method of example 4m, wherein forming the trench further comprises etching the dielectric and the encapsulation layer to expose the second electrode structure; depositing the first electrode layer, the dielectric layer and the second electrode layer above the dielectric and planarizing the second electrode layer, the dielectric layer and the first electrode layer from above the dielectric to form the trench capacitor comprising a first electrode, a dielectric layer and a second electrode.

Example 4o: The method of example 4m, wherein depositing the dielectric comprises depositing to a thickness that is at least 1.5 times a vertical thickness of the planar capacitor.

Example 4p: A method of fabricating a device structure, the method comprising: forming a first electrode structure and a second electrode structure, the forming comprising: etching a first opening and a second opening in an etch stop layer; depositing a conductive hydrogen barrier layer in the first opening and in the second opening; and depositing a conductive material on the conductive hydrogen barrier layer in the first opening and in the second opening; forming a planar capacitor on the first electrode structure by depositing a material layer stack comprising a first ferroelectric material or a first paraelectric material and etching the material layer stack; depositing a sacrificial dielectric on the planar capacitor; forming a trench capacitor by a second process comprising: forming a trench in the sacrificial dielectric, the trench exposing at least a portion of the second electrode structure; depositing a first electrode layer on a base of the trench and along a sidewall of the trench; depositing an oxide layer comprising a second ferroelectric material or a second paraelectric material on the first electrode layer; depositing a second electrode layer on the oxide layer; and planarizing to form a first electrode, a second electrode and a dielectric layer therebetween; removing the sacrificial dielectric; depositing an encapsulation layer on a first upper and sidewall surfaces of the planar capacitor and on a second upper and sidewall surfaces of the trench capacitor; depositing a dielectric on the encapsulation layer; and performing a planarization process.

Example 4q: The method of example 4p, wherein forming the trench comprises forming a cylindrical trench.

Example 4r: The method of example 4p, herein forming the trench comprises forming a tapered cylindrical trench.

Example 4s: The method of example 4p, wherein forming the encapsulation layer comprises depositing the encapsulation layer to a thickness of at least 3 nm and wherein the planarization process planarizes the dielectric comprising a substantially planar surface above the encapsulation layer.

Example 4t: The method of example 4p, wherein the method further comprises: etching an opening through the dielectric and the encapsulation layer to expose an uppermost surface of the planar capacitor; and forming a via electrode comprising a conductive hydrogen barrier in contact with the uppermost surface.

Example 5a: A device comprising: a first conductive interconnect and a second conductive interconnect within a first dielectric in a first level, the first conductive interconnect laterally separated from the second conductive interconnect; a second level above the first level, the second level comprising: a first electrode structure on the first conductive interconnect and a second electrode structure on the second conductive interconnect, wherein the first electrode structure and the second electrode structure comprise: a first conductive hydrogen barrier layer; and a first conductive fill material on the first conductive hydrogen barrier layer; an etch stop layer comprising an insulator, the etch stop layer laterally adjacent to the first electrode structure and the second electrode structure; a first memory device comprising a first ferroelectric material or a first paraelectric material on least a portion of the first electrode structure, wherein the first memory device comprises a planar topography; an encapsulation layer on the first memory device and on at least a portion of the etch stop layer; a second dielectric on the encapsulation layer, and a via electrode on at least a portion of the first memory device, the via electrode comprising: a second conductive hydrogen barrier layer comprising a lateral portion in contact with the first memory device and substantially vertical portions adjacent to the second dielectric; and a second conductive fill material on the second conductive hydrogen barrier layer; a third dielectric comprising an amorphous, greater than 90% film density hydrogen barrier material adjacent to the second dielectric; a trench within the third dielectric, the trench on the second electrode structure; a second memory device within the trench, the second memory device comprising: a bottom electrode substantially conformal to a base and to a sidewall of the trench, and wherein the bottom electrode is in contact with the second electrode structure; a dielectric layer substantially conformal to the bottom electrode wherein the dielectric layer comprises a second ferroelectric material or a second paraelectric material; and a top electrode comprising in contact with the dielectric layer.

Example 5b: The device of example 5a, wherein the second dielectric comprises $SiO_2$, SiOC, SiC, or $SiO_2$ doped with F, and wherein the third dielectric comprises $Al_xO_y$, $HfO_x$, $AlSiO_x$, $ZrO_x$, $TiO_x$, $AlSiO_x$, $HfSiO_x$, $TaSiO_x$, AlN, ZrN, or HfN, wherein x is substantially equal to 2, and wherein y is an integer.

Example 5c: The device of example 5a, wherein the sidewall of the trench is substantially vertical.

Example 5d: The device of example 5a, wherein the sidewall of the trench is tapered.

Example 5e: The device of example 5d, wherein the top electrode comprises a lateral thickness that increases with height.

Example 5f: The device of example 5a, wherein the encapsulation layer is vertically between the third dielectric and the etch stop layer, and wherein the encapsulation layer is directly adjacent to a lower portion of the bottom electrode.

Example 5g: The device of example 5a, wherein the first memory device further comprises: a first electrode on the first electrode structure, the first electrode comprising a first conductive ferroelectric oxide; a dielectric oxide layer on the first electrode; and a second electrode on the dielectric layer, the second electrode comprising a second conductive ferroelectric oxide.

Example 5h: The device of example 5a, wherein the dielectric oxide layer comprises the first paraelectric material, and wherein the dielectric layer comprises the second ferroelectric material.

Example 5i: The device of example 5a, wherein the dielectric oxide layer comprises a second ferroelectric dielectric layer, and wherein the dielectric layer comprises the second ferroelectric material.

Example 5j: The device of example 5a, wherein the first electrode, the second electrode, the bottom electrode and the top electrode comprise a Ti, Ta, W, or Ru or nitrides of Ti, Ta, W, or Ru.

Example 5k: The device of example 5a, wherein the first electrode, the second electrode, the bottom electrode and the top electrode comprise a thickness of at least 1 nm.

Example 5l: The device of example 5a, wherein the second memory device comprises a first vertical thickness that is at least two times greater than a second vertical thickness of the first memory device.

Example 5m: The device of example 5a, wherein the encapsulation layer comprises a thickness of at least 5 nm and wherein the encapsulation layer is not between the third dielectric and the etch stop layer.

Example 5n: A device comprising: a first conductive interconnect and a second conductive interconnect within a first dielectric in a first level, the first conductive interconnect laterally separated from the second conductive interconnect; a second level above the first level, the second level comprising: a first electrode structure on the first conductive interconnect and a second electrode structure on the second conductive interconnect, wherein the first electrode structure and the second electrode structure comprise: a first conductive hydrogen barrier layer; and a first conductive fill material on the first conductive hydrogen barrier layer; an etch stop layer comprising an insulator, the etch stop layer laterally adjacent to the first electrode structure and the second electrode structure; a first memory device comprising a first ferroelectric material or a first paraelectric material on least a portion of the first electrode structure, wherein the first memory device comprises a planar topography; a second dielectric comprising an amorphous, greater than 90% film density hydrogen barrier material adjacent to the second dielectric on the first memory device, and a via electrode on at least a portion of the first memory device, the via electrode comprising: a second conductive hydrogen barrier layer comprising a lateral portion in contact with the first memory device and substantially vertical portions adjacent to the second dielectric; and a second conductive fill material on the second conductive hydrogen barrier layer; a third dielectric adjacent to the second dielectric; a trench within the third dielectric, the trench on the second electrode structure; a spacer adjacent to a sidewall of the trench; a second memory device within the trench, the second memory device comprising: a bottom electrode substantially conformal to a base and to the spacer, and wherein the bottom electrode is in contact with the second electrode structure; a dielectric layer substantially conformal to the bottom electrode; and a top electrode in contact with the dielectric layer.

Example 5o: The device of example 5n, wherein the encapsulation layer comprises a thickness of at least 3 nm and wherein the encapsulation layer is not between the third dielectric and the etch stop layer.

Example 5p: The device of example 5n, wherein the second dielectric comprises $Al_xO_y$, $HfO_x$, $AlSiO_x$, $ZrO_x$, $TiO_x$, $AlSiO_x$, $HfSiO_x$, $TaSiO_x$, AlN, ZrN, or HfN, wherein x is substantially equal to 2, and wherein y is an integer, and wherein the third dielectric comprises $SiO_2$, SiOC, SiC, or $SiO_2$ doped with F.

Example 5q: A system comprising: a processor; a communication interface communicatively coupled to the processor; and a memory coupled to the processor, wherein the memory comprises: bit-cells, wherein one of the bit-cells includes: a first conductive interconnect and a second conductive interconnect within a first dielectric in a first level, the first conductive interconnect laterally separated from the second conductive interconnect; a second level above the first level, the second level comprising: a first electrode structure on the first conductive interconnect and a second electrode structure on the second conductive interconnect, wherein the first electrode structure and the second electrode structure comprise: a first conductive hydrogen barrier layer; and a first conductive fill material on the first conductive hydrogen barrier layer; an etch stop layer comprising an insulator, the etch stop layer laterally adjacent to the first electrode structure and the second electrode structure; a first memory device comprising a first ferroelectric material or a first paraelectric material on least a portion of the first electrode structure, wherein the first memory device comprises a planar topography; an encapsulation layer on the first memory device and on at least a portion of the etch stop layer; a second dielectric on the encapsulation layer, and a via electrode on at least a portion of the first memory device, the via electrode comprising: a second conductive hydrogen barrier layer comprising a lateral portion in contact with the first memory device and substantially vertical portions adjacent to the second dielectric; and a second conductive fill material on the second conductive hydrogen barrier layer; a third dielectric comprising an amorphous, greater than 90% film density hydrogen barrier material adjacent to the second dielectric; a trench within the third dielectric, the trench on the second electrode structure; a second memory device within the trench, the second memory device comprising: a bottom electrode substantially conformal to a base and to a sidewall of the trench, and wherein the bottom electrode is in contact with the second electrode structure; a dielectric layer substantially conformal to the bottom electrode wherein the dielectric layer comprises a second ferroelectric material or a second paraelectric material; and a top electrode comprising in contact with the dielectric layer.

Example 5r: The device of example 5n, wherein the cylindrical trench is tapered, wherein the first memory device comprises a first vertical thickness and the via electrode comprises a second vertical thickness, wherein the second memory device comprises a third vertical thickness and where a combined sum of the first vertical thickness and the second vertical thickness is substantially equal to the third vertical thickness.

Example 6a: A method of fabricating a device structure, the method comprising: forming a first electrode structure and a second electrode structure, the forming comprising: etching a first opening and a second opening in an etch stop layer; depositing a conductive hydrogen barrier layer in the first opening and in the second opening; and depositing a conductive material on the conductive hydrogen barrier layer in the first opening and in the second opening; forming a planar capacitor on the first electrode structure by depositing a material layer stack comprising a first ferroelectric material or a first paraelectric material and etching the material layer stack; forming an encapsulation layer comprising a hydrogen barrier insulator material on the planar capacitor and on the etch stop layer; depositing a first dielectric on the encapsulation layer; masking and removing the first dielectric from above the second electrode structure; depositing a second dielectric comprising an amorphous, greater than 90% film density hydrogen barrier material above the second electrode structure; forming a trench capacitor by a second process comprising: forming a trench in the second dielectric, the trench exposing at least a portion of the second electrode structure; forming a first electrode on a base of the trench and along a sidewall of the trench; forming a dielectric layer comprising a second ferroelectric material or a second paraelectric material on the first electrode; and forming a second electrode on the dielectric layer.

Example 6b: The method of example 6a, wherein the second dielectric is deposited on the etch stop layer.

Example 6c: The method of example 6b, wherein the encapsulation layer is further deposited on the etch stop layer and on the second electrode structure, and wherein prior to deposition of the second dielectric, the encapsulation layer is etched and removed from above the second electrode structure.

Example 6d: The method of example 6c, wherein forming the trench further comprises etching the encapsulation layer prior to formation of the first electrode.

Example 6e: The method of example 6c, wherein depositing the second dielectric comprises depositing to a thickness that is at least 1.5 times greater than a vertical thickness of the planar capacitor.

Example 6f: The method of example 6a, wherein the second dielectric is deposited on the encapsulation layer, wherein the second dielectric is deposited to a thickness that is least 1.5 times greater than a vertical thickness of the planar capacitor.

Example 6g: The method of example 6a, wherein the conductive hydrogen barrier layer is a first conductive hydrogen barrier layer, wherein the conductive material is a first conductive material, and wherein the method further comprises forming a via electrode on the planar capacitor, the forming comprising: forming an opening in the first dielectric and in the encapsulation layer; depositing a second conductive hydrogen barrier layer in the second opening and on at least a portion of a first uppermost surface of the planar capacitor; and depositing a second conductive material on the second conductive hydrogen barrier layer.

Example 6h: The method of example 6g, wherein the method further comprises: depositing a third dielectric comprising a SiN, carbon doped SiN, $Al_xO_y$, $HfO_x$, $AlSiO_x$, $ZrO_x$, $TiO_x$, $AlSiO_x$, $HfSiO_x$, $TaSiO_x$, AlN, ZrN, or HfN material on the second dielectric and on the first dielectric, wherein x is substantially equal to 2, and wherein y is an integer; and forming a via opening in the third dielectric above the trench capacitor; and forming a via interconnect on the second electrode.

Example 6i: A method of fabricating a device structure, the method comprising: forming a first electrode structure and a second electrode structure, the forming comprising: etching a first opening and a second opening in an etch stop layer; depositing a conductive hydrogen barrier layer in the first opening and in the second opening; and depositing a conductive material on the conductive hydrogen barrier layer in the first opening and in the second opening; forming a planar capacitor on the first electrode structure by depositing a material layer stack comprising a first ferroelectric material or a first paraelectric material and etching the material layer stack; depositing a first dielectric comprising an amorphous, greater than 90% film density hydrogen barrier material on the planar capacitor; masking and removing the first dielectric from above the second electrode structure; depositing a second dielectric on the etch stop layer and on the second electrode structure; forming a trench capacitor by a second process comprising: forming a trench in the second dielectric, the trench exposing at least a portion of the second electrode structure; forming a spacer along sidewalls of the trench; forming a first electrode on a base of the trench and in contact with the spacer; forming a dielectric layer comprising a second ferroelectric material or a second paraelectric material on the first electrode; and forming a second electrode on the dielectric layer.

Example 6j: The method of example 6i, wherein forming the spacer comprises depositing a spacer layer comprising one of: SiN, carbon doped SiN, $Al_xO_y$, $HfO_x$, $AlSiO_x$, $ZrO_x$, $TiO_x$, $AlSiO_x$, $HfSiO_x$, $TaSiO_x$, AlN, ZrN, or HfN, where x is substantially 2, and wherein y is an integer in the trench and etching the spacer layer to form the spacer along the sidewall of the trench but removing the spacer layer from the base of the trench.

Example 6k: The method of example 6j, wherein depositing the spacer layer further comprises depositing to a thickness of at least 3 nm.

Example 6l: The method of example 6i, wherein depositing the first dielectric comprises depositing an amorphous, greater than 90% film density hydrogen barrier material comprising $Al_xO_y$, $HfO_x$, $AlSiO_x$, $ZrO_x$, $TiO_x$, $AlSiO_x$, $HfSiO_x$, $TaSiO_x$, AlN, ZrN, or HfN, wherein x is substantially 2, and wherein y is an integer, and depositing the second dielectric comprises depositing a less than 90% film density material such as but not limited to $SiO_2$, SiOC, SiC, or $SiO_2$ doped with F.

Example 6m: The method of example 6, wherein the conductive hydrogen barrier layer is a first conductive hydrogen barrier layer, wherein the conductive material is a first conductive material, and wherein the method further comprises forming a via electrode on the planar capacitor, the forming comprising: forming an opening in the first dielectric; depositing a second conductive hydrogen barrier layer in the second opening and on at least a portion of a first uppermost surface of the planar capacitor; and depositing a second conductive material on the second conductive hydrogen barrier layer.

Example 6n: The method of example 6m, wherein the conductive hydrogen barrier layer is a first conductive hydrogen barrier layer, wherein the conductive material is a first conductive material, and wherein the method further comprises forming a via electrode on the planar capacitor, the forming comprising: forming an opening in the first dielectric; depositing a second conductive hydrogen barrier layer in the second opening and on at least a portion of a first uppermost surface of the planar capacitor; and depositing a second conductive material on the second conductive hydrogen barrier layer.

Example 6o: The method of example 6n, wherein the method further comprises: depositing a third dielectric comprising a SiN, carbon doped SiN, $Al_xO_y$, $HfO_x$, $AlSiO_x$, $ZrO_x$, $TiO_x$, $AlSiO_x$, $HfSiO_x$, $TaSiO_x$, AlN, ZrN, or HfN material on the second dielectric and on the first dielectric, wherein x is substantially 2, and wherein y is an integer; and forming a via opening in the third dielectric above the trench capacitor; and forming a via interconnect on the second electrode.

Example 6p: A method of fabricating a device structure, the method comprising: forming a first electrode structure on a first conductive interconnect and a second electrode structure on a second conductive interconnect, the forming comprising: etching a first opening and a second opening in an etch stop layer above the first conductive interconnect and the second conductive interconnect; depositing a first conductive hydrogen barrier layer in the first opening and in the second opening; and depositing a first conductive material on the first conductive hydrogen barrier layer in the first opening and in the second opening; forming a planar capacitor on the first electrode structure by depositing a material layer stack comprising a first paraelectric material and etching the material layer stack; forming an encapsulation layer comprising a hydrogen barrier insulator material on the planar capacitor and on the etch stop layer; depositing a first dielectric on the encapsulation layer; masking and removing the first dielectric from above the second electrode structure; depositing a second dielectric comprising an amorphous, greater than 90% film density hydrogen barrier material above the second electrode structure; forming a trench capacitor by a second process comprising: forming a trench in the second dielectric, the trench exposing at least a portion of the second electrode structure; forming a first electrode on a base of the trench and along a sidewall of the trench; forming a dielectric layer comprising a ferroelectric material on the first electrode; forming a second electrode on the dielectric layer; forming a via electrode on the planar capacitor, the forming comprising: forming an opening in the first dielectric and in the encapsulation layer; depositing a second conductive hydrogen barrier layer in the second opening and on at least a portion of a first uppermost surface of the planar capacitor; and depositing a second conductive material on the second conductive hydrogen barrier layer.

Example 6q: The method of example 6p, wherein forming the trench further comprises depositing a first electrode layer, an oxide dielectric layer and a second electrode layer above the second dielectric and planarizing and removing the second electrode layer, the oxide dielectric layer and the first electrode layer from above the second dielectric to form the trench capacitor comprising the first electrode, the dielectric layer and the second electrode.

Example 6r: The method of example 6p, wherein depositing the first conductive hydrogen barrier layer and the second conductive hydrogen barrier layer comprises depositing one of: TiAlN with greater than 30 atomic percent AlN, TaN with greater than 30 atomic percent N, TiSiN with greater than 20 atomic percent SiN, Ta carbide (TaC), Ti carbide (TiC), tungsten carbide (WC), tungsten nitride (WN), carbonitrides of Ta, Ti, W, TiO, $Ti_2O$, $WO_3$, $SnO_2$, ITO, IGZO, zinc oxide, or METGLAS series of alloys using an atomic layer deposition process.

Example 6s: The method of example 6p, further comprises depositing the first conductive hydrogen barrier layer and the second conductive hydrogen barrier layer to a thickness of less than 5 nm.

Example 7a: A device comprising: a first electrode structure and a second electrode structure within an etch stop layer comprising an insulator, the first electrode structure laterally separated from the second electrode structure, wherein the first electrode structure and the second electrode structure comprise: a first conductive hydrogen barrier layer; and a first conductive fill material on the first conductive hydrogen barrier layer; a planar capacitor comprising a first ferroelectric material or a first paraelectric material between a pair of conductive electrodes, the planar capacitor on least a portion of the first electrode structure; an encapsulation layer on the planar capacitor; a dielectric on the encapsulation layer the dielectric comprising an amorphous, greater than 90% film density hydrogen barrier material; and a via electrode on at least a portion of the planar capacitor, the via electrode comprising: a second conductive hydrogen barrier layer; and a second conductive fill material on the second conductive hydrogen barrier layer; a dielectric structure within the dielectric, the dielectric structure above the second electrode structure, wherein the dielectric structure comprises an amorphous, greater than 90% film density hydrogen barrier material; a trench within the dielectric structure, the trench on the second electrode structure; a non-planar capacitor within the trench, the non-planar capacitor comprising: a bottom electrode that is substantially conformal along a base and sidewall of the trench, wherein the bottom electrode is in contact with the second electrode structure and the encapsulation layer; a dielectric layer substantially conformal to the bottom electrode, the dielec- tric layer comprising a second ferroelectric material or a second paraelectric material; and a top electrode in contact with the dielectric layer.

Example 7b: The device of example 7a, wherein the dielectric is on and in contact with the etch stop layer.

Example 7c: The device of example 7a, wherein the encapsulation layer further extends between the dielectric structure and the etch stop layer.

Example 7d: The device of example 7a, wherein the encapsulation layer is further in contact with the bottom electrode.

Example 7e: The device of example 7a, wherein the dielectric structure laterally surrounding the non-planar capacitor comprises a lateral thickness that is at least two times greater than a thickness of the dielectric structure.

Example 7f: The device of example 7a, wherein the dielectric comprises $SiO_2$, SiOC, SiC, or $SiO_2$ doped with F, and wherein the amorphous, greater than 90% film density hydrogen barrier material comprises $Al_xO_y$, $HfO_x$, $AlSiO_x$, $ZrO_x$, $TiO_x$, $AlSiO_x$, $HfSiO_x$, $TaSiO_x$, AlN, ZrN, SiN, SiN doped with carbon or HfN, wherein x is substantially equal to 2, and wherein y is an integer.

Example 7g: The device of example 7a, wherein the dielectric structure is a first dielectric structure, wherein the non-planar capacitor is a first non-planar capacitor, and wherein the device further comprises: a third electrode structure laterally separated from the second electrode structure, the third electrode structure comprising the first conductive hydrogen barrier layer; a second trench in the dielectric; a second dielectric structure within the dielectric, the second dielectric structure above the third electrode structure, wherein the second dielectric structure comprises the amorphous, greater than 90% film density hydrogen barrier material; the second trench within the second dielectric structure; a second non-planar capacitor within the second trench, the second non-planar capacitor substantially identical to the first non-planar capacitor.

Example 7h: The device of example 7g, wherein the first dielectric structure and the second dielectric structure are separated by at least 5 nm.

Example 7i: The device of example 7g, wherein the encapsulation layer extends between the second dielectric structure and the etch stop layer, and wherein the encapsulation layer is in contact with a bottom electrode of the second non-planar capacitor.

Example 7j: The device of example 7a, wherein the first ferroelectric material and the second ferroelectric material comprises one of: bismuth ferrite (BFO), BFO with a doping material wherein the doping material is one of lanthanum, or elements from lanthanide series of periodic table; lead zirconium titanate (PZT) or PZT with a doping material, wherein the doping material is one of: La, or Nb; a relaxor ferroelectric material which includes one of: lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), or Barium titanium-barium strontium titanium (BT-BST); a perovskite material which includes one of: $BaTiO_3$, $PbTiO_3$, $KNbO_3$, or $NaTaO_3$; hexagonal ferroelectric which includes one of: $YMnO_3$, or $LuFeO_3$; hexagonal ferroelectrics of a type h-$RMnO_3$, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); Hafnium (Hf), Zirconium (Zr), Aluminum (Al), Silicon (Si), their oxides or their alloyed oxides; hafnium oxides of the form $Hf_{(1-x)}ExOy$, where E includes one of: Al, Ca, Ce, Dy, Er, Gd, Ge, La, Sc, Si, Sr, Sn, Zr, or Y, wherein 'x' and 'y' are first and second fractions, respectively; $Al_{(1-x)}Sc_{(x)}N$, $Ga_{(1-x)}Sc_{(x)}N$, $Al_{(1-x)}Y_{(x)}N$ or $Al_{(1-x-y)}Mg_{(x)}Nb_{(y)}N$, where 'x' and 'y' are third and fourth fractions, respectively; $HfO_2$ doped with one of: Al, Ca, Ce, Dy, Er, Gd, Ge, La, Sc, Si, Sr, Sn, or Y; or niobate type compounds $LiNbO_3$, $LiTaO_3$, lithium iron tantalum oxy fluoride, barium strontium niobate, sodium barium niobate, or potassium strontium niobate; or an improper ferroelectric material which includes one of: [PTO/STO]n or [LAO/STO]n, where 'n' is between 1 to 100, or wherein the first paraelectric material and the second paraelectric material comprise $SrTiO_3$, $Ba_{(x)}Sr_{(y)}TiO_3$ (where x is −0.05, and y is 0.95), $HfZrO_2$, Hf—Si—O, or La-substituted $PbTiO_3$, wherein the planar capacitor comprises the first paraelectric material and the non-planar capacitor comprises the second ferroelectric material.

Example 7k: The device of example 7j, wherein the planar capacitor comprises the first paraelectric material and the non-planar capacitor comprises the second ferroelectric material.

Example 7l: The device of example 7a, wherein the first conductive hydrogen barrier layer and the second conductive hydrogen barrier layer comprise TiAlN with greater than 30 atomic percent AlN, TaN with greater than 30 atomic percent N, TiSiN with greater than 20 atomic percent SiN, TaC, TiC, WC, WN, carbonitrides of Ta, Ti or W, TiO, $Ti_2O$, $WO_3$, $SnO_2$, ITO, IGZO, zinc oxide or METGLAS series of alloys.

Example 7m: A method of fabricating a device structure, the method comprising: forming a first electrode structure and a second electrode structure, the forming comprising: etching a first opening and a second opening in an etch stop layer; depositing a conductive hydrogen barrier layer in the first opening and in the second opening; and depositing a conductive material on the conductive hydrogen barrier layer in the first opening and in the second opening; forming a planar capacitor on the first electrode structure by depositing a material layer stack comprising a first ferroelectric material or a first paraelectric material and etching the material layer stack; forming an encapsulation layer comprising a hydrogen barrier insulator material on the planar capacitor and on the etch stop layer; depositing a dielectric on the encapsulation layer; forming a dielectric structure within the dielectric; forming a trench capacitor by a second process comprising: forming a trench in the dielectric, the trench exposing at least a portion of the second electrode structure; depositing a first electrode layer on a base and on sidewalls of the trench; depositing a dielectric layer comprising a second ferroelectric material or a second paraelectric material on the first electrode layer; and depositing a second electrode layer on the dielectric layer.

Example 7n: The device of example 7m, wherein the conductive hydrogen barrier layer is a first conductive hydrogen barrier layer, wherein the conductive material is a first conductive material, and wherein the method further comprises forming a via electrode on the planar capacitor, the forming comprising: forming an opening in the dielectric and in the encapsulation layer; depositing a second conductive hydrogen barrier layer in the second opening and on at least a portion of a first uppermost surface of the planar capacitor; and depositing a second conductive material on the second conductive hydrogen barrier layer.

Example 7o: The device of example 7m, wherein forming the dielectric structure comprises: etching the dielectric to form a pocket opening and stopping the etching on the encapsulation layer; depositing an insulator comprising a greater than 90% film density hydrogen barrier material in the pocket opening, on the encapsulation layer and on the dielectric; and planarizing the insulator.

Example 7p: The device of example 7m, wherein forming the first electrode structure and the second electrode structure further comprises performing a chemical mechanical planarization process to form the first electrode structure and the second electrode structure comprising the conductive material laterally surrounded by the conductive hydrogen barrier layer, and wherein the conductive material is planarized to form a first uppermost surface that is substantially co-planar with a second uppermost surface of the etch stop layer.

Example 7q: A system comprising: a processor; a communication interface communicatively coupled to the processor; and a memory coupled to the processor, wherein the memory comprises: bit-cells, wherein one of the bit-cells includes: a first electrode structure and a second electrode structure within an etch stop layer comprising an insulator, the first electrode structure laterally separated from the second electrode structure, wherein the first electrode structure and the second electrode structure comprise: a first conductive hydrogen barrier layer; and a first conductive fill material on the first conductive hydrogen barrier layer; a planar capacitor comprising a first ferroelectric material or a first paraelectric material between a pair of conductive electrodes, the planar capacitor on least a portion of the first electrode structure; an encapsulation layer on the planar capacitor; a dielectric on the encapsulation layer the dielectric comprising an amorphous, greater than 90% film density hydrogen barrier material; and a via electrode on at least a portion of the planar capacitor, the via electrode comprising: a second conductive hydrogen barrier layer; and a second conductive fill material on the second conductive hydrogen barrier layer; a dielectric structure within the dielectric, the dielectric structure above the second electrode structure, wherein the dielectric structure comprises an amorphous, greater than 90% film density hydrogen barrier material; a trench within the dielectric structure, the trench on the second electrode structure; a non-planar capacitor within the trench, the non-planar capacitor comprising: a bottom electrode that is substantially conformal along a base and sidewall of the trench, wherein the bottom electrode is in contact with the second electrode structure and the encapsulation layer; a dielectric layer substantially conformal to the bottom electrode, the dielectric layer comprising a second ferroelectric material or a second paraelectric material; and a top electrode in contact with the dielectric layer.

Example 7r: The device of example 7q, wherein the dielectric comprises $Al_xO_y$, $HfO_x$, $AlSiO_x$, $ZrO_x$, $TiO_x$, $AlSiO_x$, $HfSiO_x$, $TaSiO_x$, AlN, ZrN, or HfN, wherein x is substantially equal to 2, and wherein y is an integer, and wherein the first conductive hydrogen barrier layer and the second conductive hydrogen barrier layer comprise TiAlN with greater than 30 atomic percent AlN, TaN with greater than 30 atomic percent N, TiSiN with greater than 20 atomic percent SiN, Ta carbide (TaC), Ti carbide (TiC), tungsten carbide (WC), tungsten nitride (WN), carbonitrides of Ta, Ti, W, TiO, $Ti_2O$, $WO_3$, $SnO_2$, ITO, IGZO, zinc oxide or METGLAS series of alloys.

What is claimed is:

1. A method of fabricating a device structure, the method comprising:
   forming a first electrode structure and a second electrode structure, the forming comprising:
      etching a first opening and a second opening in an etch stop layer;
      depositing a conductive hydrogen barrier layer in the first opening and in the second opening; and
      depositing a conductive material on the conductive hydrogen barrier layer in the first opening and in the second opening;
   forming a planar capacitor on the first electrode structure by depositing a material layer stack comprising a first ferroelectric material or a first paraelectric material and etching the material layer stack;
   forming an encapsulation layer comprising a hydrogen barrier insulator material on the planar capacitor and on the etch stop layer;
   depositing a first dielectric on the encapsulation layer;
   masking and removing the first dielectric from above the second electrode structure;
   depositing a second dielectric comprising an amorphous, greater than 90% film density hydrogen barrier material above the second electrode structure; and
   forming a trench capacitor by a second process comprising:
      forming a trench in the second dielectric, the trench exposing at least a portion of the second electrode structure;
      forming a first electrode on a base of the trench and along a sidewall of the trench;
      forming a dielectric layer comprising a second ferroelectric material or a second paraelectric material on the first electrode; and
      forming a second electrode on the dielectric layer.

2. The method of claim 1, wherein the second dielectric is deposited on the etch stop layer.

3. The method of claim 2, wherein the encapsulation layer is further deposited on the etch stop layer and on the second electrode structure, and wherein prior to deposition of the second dielectric, the encapsulation layer is etched and removed from above the second electrode structure.

4. The method of claim 3, wherein depositing the second dielectric comprises depositing to a thickness that is at least 1.5 times greater than a vertical thickness of the planar capacitor.

5. The method of claim 1, wherein forming the trench further comprises forming a spacer along sidewalls of the trench prior to formation of the first electrode.

6. The method of claim 1, wherein the second dielectric is deposited on the encapsulation layer, wherein the second dielectric is deposited to a thickness that is least 1.5 times greater than a vertical thickness of the planar capacitor.

7. The method of claim 1, wherein depositing the dielectric layer comprises:
   using a first atomic layer deposition process to conformally deposit the second ferroelectric material comprising one of:
      bismuth ferrite (BFO) or BFO with a first doping material, wherein the first doping material is one of: lanthanum or elements from lanthanide series of periodic table;
      lead zirconium titanate (PZT) or PZT with a second doping material, wherein the second doping material is one of La or Nb;
      a relaxor ferroelectric material which includes one of: lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), or barium titanium-barium strontium titanium (BT-BST);
      a perovskite material which includes one of: $BaTiO_3$, $PbTiO_3$, $KNbO_3$;
      a first hexagonal ferroelectric which includes one of: $YMnO_3$ or $LuFeO_3$;
      a second hexagonal ferroelectric of a type $RMnO_3$, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y);
      hafnium (Hf), zirconium (Zr), aluminum (Al), silicon (Si), their oxides, or their alloyed oxides;
      hafnium oxides of a form $Hf_{(1-x)}E_xO_y$, where E includes one of Al, Ca, Ce, Dy, Er, Gd, Ge, La, Sc, Si, Sr, Sn, Zr, or Y, wherein 'x' and 'y' are first and second fractions, respectively;
      $Al_{(1-x)}Sc_{(x)}$, $Ga_{(1-x)}Sc_{(x)}$, $Al_{(1-x)}Y_{(x)}$ or $A_{(1-x-y)}Mg_{(x)}Nb_{(y)}$N, wherein 'x' and 'y' are third and fourth fractions, respectively;
      $HfO_2$ doped with one of: Al, Ca, Ce, Dy, Er, Gd, Ge, La, Sc, Si, Sr, Sn, or Y, wherein 'x' is a fraction;
      $LiNbO_3$, $LiTaO_3$, lithium iron tantalum oxy fluoride, barium strontium niobate, sodium barium niobate, or potassium strontium niobate; or
      an improper ferroelectric material which includes one of: [PTO/STO]n or [LAO/STO]n, where 'n' is between 1 and 100, wherein the first atomic layer deposition process is carried out at a temperature between 160 and 400 degrees Celsius, and
   wherein depositing the material layer stack comprises:
      using a second atomic layer deposition process to conformally deposit the first paraelectric material comprising:
         one of: $SrTiO_3$, $Ba_{(x)}Sr_{(y)}TiO_3$, $HfZrO_2$, Hf—Si—O, or La-substituted $PbTiO_3$,
         wherein the second atomic layer deposition process is carried out at a temperature between 160 and 400 degrees Celsius.

8. The method of claim 1, wherein the conductive hydrogen barrier layer is a first conductive hydrogen barrier layer, wherein the conductive material is a first conductive material, and wherein the method further comprises forming a via electrode on the planar capacitor, the forming the via electrode comprising:
   forming a third opening in the first dielectric and in the encapsulation layer;
   depositing a second conductive hydrogen barrier layer in the third opening and on at least a portion of a first uppermost surface of the planar capacitor; and
   depositing a second conductive material on the second conductive hydrogen barrier layer.

9. The method of claim 8, wherein the method further comprises:
   depositing a third dielectric comprising a SiN, carbon doped SiN, $Al_xO_y$, $HfO_x$, $AlSiO_x$, $ZrO_x$, $TiO_x$, $AlSiO_x$, $HfSiO_x$, $TaSiO_x$, AlN, ZrN, or HfN material on the second dielectric and on the first dielectric, wherein x is substantially 2, and wherein y is an integer;

forming a via opening in the third dielectric above the trench capacitor; and forming a via interconnect on the second electrode.

10. A method of fabricating a device structure, the method comprising:
  forming a first electrode structure on a first conductive interconnect and a second electrode structure on a second conductive interconnect, the forming comprising:
    etching a first opening and a second opening in an etch stop layer above the first conductive interconnect and the second conductive interconnect;
    depositing a first conductive hydrogen barrier layer in the first opening and in the second opening; and
    depositing a first conductive material on the first conductive hydrogen barrier layer in the first opening and in the second opening;
  forming a planar capacitor on the first electrode structure by depositing a material layer stack comprising a first paraelectric material and etching the material layer stack;
  forming an encapsulation layer comprising a hydrogen barrier insulator material on the planar capacitor and on the etch stop layer;
  depositing a first dielectric on the encapsulation layer;
  masking and removing the first dielectric from above the second electrode structure;
  depositing a second dielectric comprising an amorphous, greater than 90% film density hydrogen barrier material above the second electrode structure;
  forming a trench capacitor by a second process comprising:
    forming a trench in the second dielectric, the trench exposing at least a portion of the second electrode structure;
    forming a first electrode on a base of the trench and along a sidewall of the trench;
    forming a dielectric layer comprising a ferroelectric material on the first electrode; and
    forming a second electrode on the dielectric layer; and
  forming a via electrode on the planar capacitor, the forming the via electrode comprising:
    forming a third opening in the first dielectric and in the encapsulation layer;
    depositing a second conductive hydrogen barrier layer in the third opening and on at least a portion of a first uppermost surface of the planar capacitor; and
    depositing a second conductive material on the second conductive hydrogen barrier layer.

11. The method of claim 10, wherein the forming the trench capacitor further comprises depositing a first electrode layer, an oxide dielectric layer and a second electrode layer above the second dielectric and planarizing and removing the second electrode layer, the oxide dielectric layer and the first electrode layer from above the second dielectric to form the trench capacitor comprising the first electrode, the dielectric layer and the second electrode.

12. The method of claim 10, wherein depositing the first conductive hydrogen barrier layer and the second conductive hydrogen barrier layer comprises depositing one of: TiAlN with greater than 30 atomic percent AlN, TaN with greater than 30 atomic percent nitrogen, TiSiN with greater than 20 atomic percent SiN, Ta carbide, Ti carbide, tungsten carbide, tungsten nitride, carbonitrides of Ta, Ti, W, TiO, Ti$_2$O, WO$_3$, SnO$_2$, ITO, IGZO, zinc oxide, or METGLAS series of alloys using an atomic layer deposition process.

13. The method of claim 10 further comprises depositing the first conductive hydrogen barrier layer and the second conductive hydrogen barrier layer to a thickness of less than 5 nm.

14. A method of fabricating a device structure, the method comprising:
  forming a first electrode structure and a second electrode structure on a same level within an etch stop layer;
  forming a planar capacitor on the first electrode structure by a first depositing a first material layer stack comprising a first ferroelectric material or a first paraelectric material and etching the first material layer stack;
  forming an encapsulation layer on the planar capacitor;
  forming a first dielectric structure on the encapsulation layer;
  forming a cylindrical trench in a second dielectric structure comprising an amorphous, greater than 90% film density hydrogen barrier material, wherein the second dielectric structure is formed laterally adjacent to the first dielectric structure and above the second electrode structure; and
  forming a trench capacitor by a process, comprising:
    forming a first electrode on a base of the cylindrical trench;
    forming a dielectric layer comprising a second ferroelectric material or a second paraelectric material on the first electrode; and
    forming a second electrode on the dielectric layer.

15. The method of claim 14, wherein forming the encapsulation layer comprises depositing one of: SiN, carbon doped SiN, Al$_x$O$_y$, HfO$_x$, AlSiO$_x$, ZrO$_x$, TiO$_x$, AlSiO$_x$, HfSiO$_x$, TaSiO$_x$, AlN, ZrN, or HfN, where x is substantially 2, and wherein y is an integer.

16. The method of claim 14, wherein forming the second dielectric structure comprises depositing one of Al$_x$O$_y$, HfO$_x$, AlSiO$_x$, ZrO$_x$, TiO$_x$, AlSiO$_x$, HfSiO$_x$, TaSiO$_x$, AlN, ZrN, or HfN, where x is substantially 2, and wherein y is an integer, and wherein forming the first dielectric structure comprises depositing a less than 90% film density material such as but not limited to SiO$_2$, SiOC, SiC, or SiO$_2$ doped with F.

17. The method of claim 14, wherein depositing the dielectric layer comprises:
  using a first atomic layer deposition process to conformally deposit the second ferroelectric material comprising one of:
    bismuth ferrite (BFO) or BFO with a first doping material wherein the first doping material is one of: lanthanum or elements from lanthanide series of periodic table;
    lead zirconium titanate (PZT) or PZT with a second doping material, wherein the second doping material is one of La or Nb;
    a relaxor ferroelectric material which includes one of lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), or barium titanium-barium strontium titanium (BT-BST);
    a perovskite material which includes one of: BaTiO$_3$, PbTiO$_3$, KNbO$_3$, or NaTaO$_3$;
    a first hexagonal ferroelectric which includes one of: YMnO$_3$ or LuFeO$_3$;
    a second hexagonal ferroelectric of a type h-RMnO$_3$, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y);

Hafnium (Hf), Zirconium (Zr), Aluminum (Al), Silicon (Si), their oxides or their alloyed oxides;

Hafnium oxides of a form $Hf_{(1-x)}E_xO_y$, where E includes one of Al, Ca, Ce, Dy, Er, Gd, Ge, La, Sc, Si, Sr, Sn, Zr, or Y, wherein 'x' and 'y' are first and second fractions, respectively;

$Al_{(1-x)}Sc_{(x)}$, $Ga_{(1-x)}Sc_{(x)}$, $Al_{(1-x)}Y_{(x)}$ or $Al_{(1-x-y)}Mg_{(x)}Nb_{(y)}$, wherein 'x' and 'y' are third and fourth fractions, respectively;

$HfO_2$ doped with one of: Al, Ca, Ce, Dy, Er, Gd, Ge, La, Sc, Si, Sr, Sn, or Y;

$LiNbO_3$, $LiTaO_3$, lithium iron tantalum oxy fluoride, barium strontium niobate, sodium barium niobate, or potassium strontium niobate; or an improper ferroelectric material which includes one of: [PTO/STO]n or [LAO/STO]n, where 'n' is between 1 and 100, wherein the first atomic layer deposition process is carried out at a temperature between 160 and 400 degrees Celsius, and wherein forming the first material layer stack further comprises:

depositing a third electrode material on the first electrode structure;

depositing the first ferroelectric material or the first paraelectric material on the third electrode material; and depositing a fourth electrode material on the first ferroelectric material, and wherein etching the first material layer stack is performed prior to forming the cylindrical trench.

18. The method of claim 14 further comprising forming a via electrode on the planar capacitor, wherein forming the via electrode comprises:

forming a first opening in the first dielectric structure and in the encapsulation layer;

depositing a conductive hydrogen barrier layer in the first opening and on at least a portion of a first uppermost surface of the planar capacitor; and depositing a second conductive material on the conductive hydrogen barrier layer, wherein the planar capacitor comprises a first vertical thickness, the via electrode comprises a second vertical thickness and the trench capacitor comprises a third vertical thickness, wherein the third vertical thickness is equal to a combined thickness of the first vertical thickness and the second vertical thickness.

19. The method of claim 14, wherein forming the cylindrical trench further comprises etching a second opening in the encapsulation layer formed above the second electrode structure.

* * * * *